US009268063B2

(12) United States Patent
Idei et al.

(10) Patent No.: US 9,268,063 B2
(45) Date of Patent: Feb. 23, 2016

(54) COLORED RADIATION-SENSITIVE COMPOSITION, COLORED CURED FILM, COLOR FILTER, COLORED PATTERN FORMING METHOD, COLOR FILTER PRODUCTION METHOD, SOLID-STATE IMAGE SENSOR, AND IMAGE DISPLAY DEVICE

(71) Applicant: FUJIFILM Corporation, Minato-ku, Tokyo (JP)

(72) Inventors: Hiroaki Idei, Shizuoka (JP); Yushi Kaneko, Shizuoka (JP); Seiichi Hitomi, Shizuoka (JP); Kazuya Oota, Shizuoka (JP); Yousuke Murakami, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/489,631

(22) Filed: Sep. 18, 2014

(65) Prior Publication Data

US 2015/0010856 A1 Jan. 8, 2015

Related U.S. Application Data

(63) Continuation of application No. PCT/JP2013/057399, filed on Mar. 15, 2013.

(30) Foreign Application Priority Data

Mar. 19, 2012 (JP) ................................ 2012-062847
Feb. 15, 2013 (JP) ................................ 2013-027767

(51) Int. Cl.

| | |
|---|---|
| ***G03F 7/004*** | (2006.01) |
| ***G02B 5/20*** | (2006.01) |
| ***G02B 1/04*** | (2006.01) |
| ***G03F 7/033*** | (2006.01) |
| ***G03F 7/00*** | (2006.01) |
| ***G03F 7/105*** | (2006.01) |
| ***G02B 5/23*** | (2006.01) |
| ***B29D 11/00*** | (2006.01) |

(52) U.S. Cl.

CPC ............ *G02B 1/04* (2013.01); *B29D 11/00634* (2013.01); *G02B 5/201* (2013.01); *G02B 5/23* (2013.01); *G03F 7/0007* (2013.01); *G03F 7/033* (2013.01); *G03F 7/105* (2013.01)

(58) Field of Classification Search

CPC ....... G03F 7/0007; G03F 7/031; G03F 7/032; G03F 7/033; G03F 7/037; G02B 5/223

USPC ....................................... 430/7, 270.1, 281.1

See application file for complete search history.

(56) References Cited

U.S. PATENT DOCUMENTS

| | | | | |
|---|---|---|---|---|
| 6,509,125 | B1 | 1/2003 | Ito et al. | |
| 2006/0222969 | A1 * | 10/2006 | Jonoshita et al. | 430/7 |

FOREIGN PATENT DOCUMENTS

| | | | |
|---|---|---|---|
| JP | 2000-162429 | A | 6/2000 |
| JP | 2011-022237 | A * | 2/2011 |
| JP | 2011-095732 | A | 5/2011 |
| JP | 2011-157478 | A | 8/2011 |
| JP | 2012-177911 | A | 9/2012 |
| JP | 2012-208474 | A | 10/2012 |
| WO | WO 2011/040628 | A1 * | 4/2011 |

OTHER PUBLICATIONS

Computer-generated translation of JP 2011-022237 (Feb. 2011).*
International Search Report of PCT/JP2013/057399 dated May 14, 2013 [PCT/ISA/210], 5 pages in Japanese and English English Translation.
Written Opinion of PCT/JP2013/057399 dated May 14, 2013 [PCT/ISA/237], 2 pages.
International Preliminary Report on Patentability and Written Opinion, mailed Sep. 23, 2014, issued in corresponding International Application No. PCT/JP2013/057399, 7 pages in English.
Notice of Reasons for Rejection, dated Feb. 3, 2015, issued in corresponding JP Application No. 2013-027767, 11 pages in English and Japanese.

* cited by examiner

*Primary Examiner* — John A McPherson
(74) *Attorney, Agent, or Firm* — Sughrue Mion, PLLC

(57) ABSTRACT

Colored radiation-sensitive composition includes (A) a dye multimer, (B) an alkali-soluble resin containing at least one kind of repeating unit selected from a group consisting of a repeating unit represented by the following Formula (b1) and a repeating unit represented by the following Formula (b2), (C) a polymerizable compound, and (D) a photopolymerization initiator. In the formulae, each of $R^1$ and $R^4$ independently represents a hydrogen atom, an aryl group, or an alkyl group, and among these, an aryl group is preferable. $R^2$ represents a hydrogen atom or a methyl group, $R^3$ represents an alkylene group having 2 or 3 carbon atoms, and m represents an integer from 1 to 15.

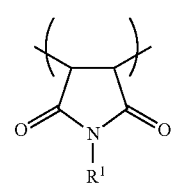

(b1)

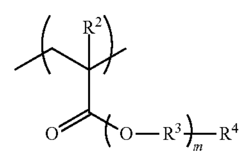

(b2)

37 Claims, No Drawings

COLORED RADIATION-SENSITIVE COMPOSITION, COLORED CURED FILM, COLOR FILTER, COLORED PATTERN FORMING METHOD, COLOR FILTER PRODUCTION METHOD, SOLID-STATE IMAGE SENSOR, AND IMAGE DISPLAY DEVICE

CROSS-REFERENCE TO RELATED APPLICATIONS

This application is a Continuation of PCT International Application No. PCT/JP2013/57399, filed Mar. 15, 2013, which claims priority under 35 U.S.C. §119(a) to Japanese Patent Application No. 2012-062847, filed Mar. 19, 2012 and Japanese Patent Application No. 2013-027767, filed Feb. 15, 2013. Each of the above application(s) is hereby expressly incorporated by reference, in its entirety, into the present application.

BACKGROUND OF THE INVENTION

1. Field of the Invention

The present invention relates to a colored radiation-sensitive composition which is suitable as a color resist used for forming color pixels, a colored cured film and a color filter which use the colored radiation-sensitive composition, a production method thereof, and a solid-state image sensor and an image display device which include the color filter.

2. Description of the Related Art

In recent years, as a digital camera, a camera-equipped cellular phone, and the like have come into wide use, and a demand for a solid-state image sensor such as a CCD image sensor has greatly increased. As a key device of these displays or optical devices, a color filter is used, and it is increasingly required for the color filter to have a higher degree of sensitivity and to be miniaturized. Generally, the color filter has colored patterns of three primary colors including red (R), green (G), and blue (B) and plays a role of separating transmitted light into the three primary colors.

Colorants used for the color filter are commonly required to have the following properties. That is, it is required for the colorants to have light absorptivity preferable for color reproducibility, not to have optical disorders such as uneven optical density that results in light scattering, color unevenness, or rough texture, to exhibit excellent toughness, for example, heat resistance, light fastness, or the like, during the production thereof or under the condition in which the colorants are used, to have great molar absorptivity, and to be able to be formed into a thin film.

One of the examples of methods for producing the color filter includes a pigment dispersion method. The method for producing a color filter by using the pigment dispersion method by means of a photolithography or an inkjet method is stable with respect to light or heat since this method uses a pigment. However, the pigment is in the form of fine particles, and as a result, problems such as light scattering, color unevenness, and rough texture arise in some cases. In order to solve the problems, micronization of the pigment is performed. However, there is a problem in that it is difficult for the micronized pigment to have dispersion stability.

Examples of the method for producing the color filter that can replace the pigment dispersion method include a method of using a dye as a coloring material. In a composition, a dye is present in a dissolved state, and accordingly, light scattering, color unevenness, or rough texture caused by a pigment can be inhibited. The heat resistance or light fastness of a dye is poorer than that of a pigment. Therefore, in recent years, for the purpose of improving toughness, preventing migration of the color of dye to other layers, and the like, attempts at ameliorating dyes have been made (for example, see JP2011-95732A and JP2000-162429A).

SUMMARY OF THE INVENTION

By the method of making a dye into a multimer as described in JP2011-95732A and JP2000-162429A, the migration of color or sublimation can be inhibited, but the heat resistance needs to be further improved to a sufficient degree for practical use. Moreover, if a dye is made into a multimer by polymerization, a new problem such as deterioration of pattern formability arises, and accordingly, a solution to the problem is required.

The present invention has been made to solve the above problem, and an object thereof is to provide a colored radiation-sensitive composition which is formed into a colored cured film having excellent toughness and heat resistance even when a dye is used as a coloring material, makes it possible to form a colored pattern having excellent linearity, and inhibits residues from being generated in a pattern non-formation area.

Another object of the present invention is to provide a colored cured film which uses the colored radiation-sensitive composition and having excellent toughness, a color filter which has the colored cured film, a colored pattern, a color filter, and a production method thereof.

A third object of the present invention is to provide a pattern forming method which makes it possible to form a colored pattern having excellent color characteristics and a color filter production method.

A fourth object of the present invention is to provide a solid-state image sensor and an image display device (a liquid crystal display device, an organic EL display device, or the like) which have a color filter having excellent color characteristics.

As a result of thorough examination, the present inventors found that the above problem can be solved by using a dye multimer and an alkali-soluble resin having a specific partial structure, and completed the present invention.

The present invention is constituted as follows.

<1> A colored radiation-sensitive composition containing (A) a dye multimer, (B) an alkali-soluble resin containing at least one kind of repeating unit selected from a group consisting of a repeating unit represented by the following Formula (b1) and a repeating unit represented by the following Formula (b2), (C) a polymerizable compound, and (D) a photopolymerization initiator.

[Chem. 1]

(b1)

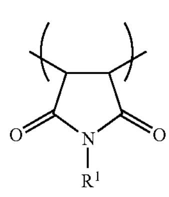

In the Formula (b1), $R^1$ represents a hydrogen atom, an aryl group, or an alkyl group.

[Chem. 2]

(b2)

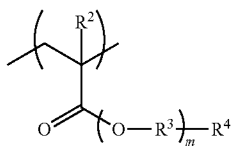

In the Formula (b2), $R^2$ represents a hydrogen atom or a methyl group; $R^3$ represents an alkylene group having 2 or 3 carbon atoms; $R^4$ represents a hydrogen atom, an aryl group, or an alkyl group; m represents an integer from 1 to 15; and when m is 2 to 15, plural $R^3$s may be the same as or different from each other.

<2> The colored radiation-sensitive composition according to <1>, in which the (B) alkali-soluble resin is a polymer containing at least one kind of repeating unit selected from a group consisting of a repeating unit represented by the following Formula (b1') and a repeating unit represented by the following Formula (b2').

[Chem. 3]

(b1')

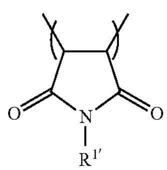

[Chem. 4]

(b2')

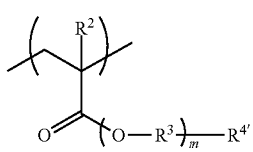

In the Formula (b1'), $R^2$ represents an aryl group.

In the Formula (b2'), $R^2$ represents a hydrogen atom or a methyl group; $R^3$ represents an alkylene group having 2 or 3 carbon atoms; $R^{4'}$ represents an aryl group; m represents an integer from 1 to 15; and when m is 2 to 15, plural $R^3$s may be the same as or different from each other.

<3> The colored radiation-sensitive composition according to <1> or <2>, in which each m in the Formula (b2) and the Formula (b2') represents an integer from 1 to 5.

<4> The colored radiation-sensitive composition according to any one of <1> to <3>, in which the (B) alkali-soluble resin is a copolymer containing at least one kind of repeating unit represented by the Formula (b1) and at least one kind of repeating unit represented by the Formula (b2).

<5> The colored radiation-sensitive composition according to any one of <1> to <4>, in which an acid value of the (B) alkali-soluble resin is 50 mg KOH/g to 200 mg KOH/g.

<6> The colored radiation-sensitive composition according to any one of <1> to <3>, in which the (A) dye multimer has a partial structure derived from a dye selected from a dipyrromethene dye, an azo dye, an anthraquinone dye, a triphenylmethane dye, a xanthene dye, a cyanine dye, a squarylium dye, a quinophthalone dye, a phthalocyanine dye, and a subphthalocyanine dye.

<7> The colored radiation-sensitive composition according to any one of <1> to <6>, further containing (E) a pigment.

<8> The colored radiation-sensitive composition according to <7>, in which the (E) pigment is a pigment selected from an anthraquinone pigment, a diketopyrrolopyrrole pigment, a phthalocyanine pigment, a quinophthalone pigment, an isoindoline pigment, an azomethine pigment, and a dioxazine pigment.

<9> The colored radiation-sensitive composition according to any one of <1> to <8>, in which the (D) photopolymerization initiator is an oxime compound.

<10> The colored radiation-sensitive composition according to any one of <1> to <9> that is used for forming a colored layer of a color filter.

<11> A colored cured film obtained by curing the colored radiation-sensitive composition according to any one of <1> to <10>.

<12> A color filter having the colored cured film according to <11>.

<13> A colored pattern forming method including a colored radiation-sensitive composition forming step of forming a colored radiation-sensitive composition layer by applying the colored radiation-sensitive composition according to any one of <1> to <9> onto a support, a light exposure step of exposing the colored radiation-sensitive composition layer to light in the form of a pattern, and a pattern forming step of forming a colored pattern by developing and removing an unexposed portion.

<14> A color filter production method including a colored radiation-sensitive composition layer forming step of forming a colored radiation-sensitive composition layer by applying the colored radiation-sensitive composition according to any one of <1> to <10> onto a support, a light exposure step of exposing the colored radiation-sensitive composition layer to light in the form of a pattern, and a pattern forming step of forming a colored pattern by developing and removing an unexposed portion.

<15> A solid-state image sensor having the color filter according to <12> or a color filter produced by the color filter production method according to <14>.

<16> An image display device having the color filter according to <12> or a color filter produced by the color filter production method according to <14>.

According to the present invention, it is possible to provide a colored radiation-sensitive composition which makes it possible to form a colored cured film having excellent toughness and heat resistance even when a dye is used as a coloring material and to form a colored pattern having excellent linearity and to inhibit generation of residues.

Moreover, if the colored radiation-sensitive composition of the present invention is used, it is possible to provide a colored cured film having excellent toughness, a color filter using the film, a colored pattern, a color filter and a production method thereof, and a high-performance solid-state image sensor and an image display device using the color filter.

DESCRIPTION OF THE PREFERRED EMBODIMENTS

Hereinafter, the colored radiation-sensitive composition, colored cured film, pattern forming method, color filter production method, solid-state image sensor, and image display device of the present invention will be described in detail.

The constituents of the present invention will be described as follows based on typical embodiments of the present invention, but the present invention is not limited to the embodiments.

In the present specification, if there is a description that does not indicate whether a group (atomic group) is substituted or unsubstituted, it means that the group includes a group (atomic group) not having a substituent and a group (atomic group) having a substituent. For example, an "alkyl group" includes not only an alkyl group not having a substituent (unsubstituted alkyl group) but also an alkyl group having a substituent (substituted alkyl group).

Further, in the present specification, "actinic rays" or "radiation" means, for example, a bright line spectrum of a mercury lamp, far-ultraviolet represented by an excimer laser, extreme ultraviolet (EUV radiation), X-rays, electron beams, and the like. Moreover, in the present invention, "light" means actinic rays or radiation. In the present specification, unless otherwise specified, "light exposure" includes not only exposure to light of a mercury lamp, far-ultraviolet represented by an excimer laser, X-rays, EUV radiation, and the like but also drawing utilizing particle beams such as electron beams and ion beams.

In the present specification, a range of numerical values that is described using "xx to yy" means a range that has a numerical value "xx" as a lower limit and a numerical value "yy" as a upper limit.

In the present specification, the total solid contents refers to a total mass of components remaining when a solvent is excluded from the entire composition of a colored radiation-sensitive composition.

Moreover, in the present specification, "(meth)acrylate" represents either or both of "acrylate" and "methacrylate"; "(meth)acryl" represents either or both of "acryl" and "methacryl"; and "(meth)acryloyl" represents either or both of "acryloyl" and "methacryloyl".

In the present specification, a "monomer" refers to a compound which is distinguished from an "oligomer" or a "polymer" and has a weight average molecular weight of 2,000 or less. Moreover, in the present specification, a "polymerizable compound" refers to a compound having a polymerizable functional group and may be a monomer or a polymer. The polymerizable functional group refers to a group involved in a polymerization reaction.

In the present specification, a term "step" includes not only an independent step, but also steps that are not clearly distinguished from other steps if an intended action of the steps is obtained.

[Colored Radiation-Sensitive Composition]

The colored radiation-sensitive composition of the present invention contains (A) a dye multimer, (B) an alkali-soluble resin containing at least one kind of repeating unit selected from a group consisting of a repeating unit represented by the following Formula (b1) and a repeating unit represented by the following Formula (b2) (hereinafter, appropriately referred to as a "specific alkali-soluble resin), (C) a polymerizable compound, and (D) a photopolymerization initiator. If necessary, the composition may also contain (E) a pigment.

The action of the present invention is unclear. However, the present inventors assume the action as below. If the specific alkali-soluble resin, which has at least one of the repeating unit represented by Formula (b1) having appropriate hydrophilicity and the repeating unit represented by Formula (b2) having appropriate hydrophilicity, is used, affinity between the resin and the coexisting dye multimer may be further improved compared to a case in which a general alkali-soluble resin having only an acidic group is used. Moreover, due to excellent alkali-solubility of the specific alkali-soluble resin, even when a fine pattern is formed, occurrence of defect of a colored pattern may be inhibited, and a colored pattern having excellent linearity may be formed. Further, since the dye multimer is stably present in the specific alkali-soluble resin, heat resistance of the formed cured film may be improved. In a preferable embodiment of the present invention, the specific alkali-soluble resin has an aryl group on the terminal of a maleimide structure or on the terminal of an alkyleneoxy group. Accordingly, affinity between the resin and the dye multimer is further improved, and the effects of the present invention are excellently exhibited.

Hereinafter, each of the components used in the colored radiation-sensitive composition of the present invention will be described. First, the specific alkali-soluble resin, which is an important constituent of the present invention, will be described.

(B) Alkali-Soluble Resin Containing at Least One Kind of Repeating Unit Selected from Group Consisting of Repeating Unit Represented by Formula (b1) and Repeating Unit Represented by Formula (b2)

In the present invention, the specific alkali-soluble resin is soluble in a developer used in a developing step and particularly preferably in an alkaline developer. The resin is a polymer having at least one of the repeating unit represented by the following Formula (b1) and repeating unit represented by the following Formula (b2). Moreover, as long as the effects of the present invention are not diminished, the colored radiation-sensitive composition of the present invention may contain other alkali-soluble resins that have none of the repeating unit represented by the following Formula (b1) and repeating unit represented by the following Formula (b2), in addition to the specific alkali-soluble resin.

[Chem. 5]

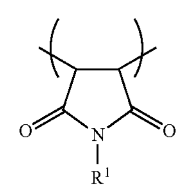

(b1)

In the Formula (b1), $R^1$ represents a hydrogen atom, an aryl group, or an alkyl group.

When $R^1$ represents an alkyl group, examples of the alkyl group include a linear alkyl group having 1 to 10 carbon atoms, an alkyl group having 3 to 10 carbon atoms and a branch chain, a cyclic alkyl group having 5 to 20 carbon atoms, and the like. More specifically, examples of the alkyl group include a methyl group, an ethyl group, a t-butyl group, a cyclohexyl group, and the like.

The alkyl group may have a substituent. Examples of the substituent that can be introduced into the alkyl group include a phenyl group, a carbonyl group, an alkoxy group, a hydroxy group, an amino group, and the like.

When $R^1$ represents an aryl group, examples of the aryl group include an aryl group having a monocyclic structure, an aryl group having a polycyclic structure, an aryl group having a condensed ring structure, a heteroaryl group containing a hetero atom, and the like. More specifically, examples of the aryl group include a phenyl group, a naphthyl group, a biphenyl group, a benzimidazolyl group, a pyridyl group, a furyl group, and the like.

The aryl group may have a substituent, and examples of the substituent that can be introduced into the aryl group include an alkyl group such as a methyl group, an ethyl group, a t-butyl group, or a cyclohexyl group, an alkoxy group such as a methoxy group, a carboxy group, a hydroxy group, an amino group, a nitro group, a chloro group, a bromo group, and the like.

Among these, an embodiment in which $R^1$ in Formula (b1) is an aryl group, that is, an embodiment in which R1 is a repeating unit represented by the following Formula (b1') is preferable. Particularly, an embodiment in which $R^1$ is a phenyl group not having a substituent is preferable.

[Chem. 6]

(b1')

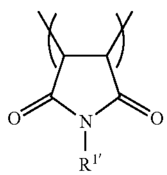

[Chem. 7]

(b2)

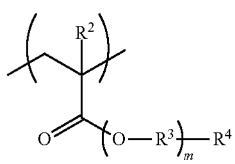

In the Formula (b2), $R^2$ represents a hydrogen atom or a methyl group; $R^3$ represents an alkylene group having 2 or 3 carbon atoms; $R^4$ represents a hydrogen atom, an aryl group, or an alkyl group; and m represents an integer from 1 to 15.

When $R^4$ represents an alkyl group, examples of the alkyl group include a linear alkyl group having 1 to 20 carbon atoms, an alkyl group having 1 to 20 carbon atoms and a branch chain, a cyclic alkyl group having 5 to 20 carbon atoms, and the like. More specifically, examples of the alkyl group include a methyl group, an ethyl group, a t-butyl group, a cyclohexyl group, a 2-ethylhexyl group, and the like.

The alkyl group may have a substituent, and examples of the substituent that can be introduced into the alkyl group include a phenyl group, a carbonyl group, an alkoxy group, and the like.

When R4 represents an aryl group, examples of the aryl group include an aryl group having a monocyclic structure, an aryl group having a polycyclic structure, an aryl group having a condensed ring structure, a heteroaryl group having a hetero atom, and the like. More specifically, examples of the aryl group include a phenyl group, a naphthyl group, an anthranil group, a biphenyl group, a benzimidazolyl group, an indolyl group, an imidazolyl group, an oxazolyl group, a carbazolyl group, a pyridyl group, a furyl group, and the like.

The aryl group may have a substituent, and examples of the substituent that can be introduced into the aryl group include an alkyl group such as a nonyl group, a methyl group, an ethyl group, a t-butyl group, or a cyclohexyl group, an alkoxy group such as a methoxy group, a carboxy group, a hydroxy group, an amino group, a nitro group, a chloro group, a bromo group, and the like.

Among these, an embodiment in which R4 is an aryl group, that is, an embodiment in which R4 is a repeating unit represented by the following Formula (b2') is preferable. R4 is particularly preferably a phenyl group, a 4-hydroxyphenyl group, a 4-nonylphenyl group, a cumyl group, or a 4-isopropylphenyl group.

[Chem. 8]

(b2')

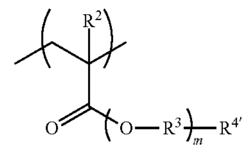

In the Formula (b2) and Formula (b2'), m is preferably 1 to 5, and particularly preferably 1 to 2.

Examples of polymerizable unsaturated monomers, which are for synthesizing a polymer having the repeating unit represented by the Formula (b1) and the repeating unit represented by the Formula (b2), include the following.

Among the polymerizable unsaturated monomers, examples of N-position-substituted maleimides which can form the repeating unit represented by Formula (b1) include N-(substituted) arylmaleimide such as N-phenylmaleimide, N-o-methyphenylmaleimide, N-m-methyphenylmaleimide, N-p-methylphenylmaleimide, N-o-methoxyphenylmaleimide, N-m-methoxyphenylmaleimide, N-p-methoxyphenylmaleimide, p-nitrophenylmaleimide, and 1,3,5-trichlorophenylmaleimide, N-methylmaleimide, N-ethylmaleimide, N-t-butylmaleimide, N-benzylmaleimide, N-cyclohexylmaleimide, 3-maleimidopropionic acids, and the like.

Among these N-position-substituted maleimides, N-phenylmaleimide and N-cyclohexylmaleimide are particularly preferable.

One kind of the N-position-substitued maleimides can be used singly, or two or more kinds thereof can be used by being mixed with each other.

Examples of the polymerizable unsaturated monomers that can form the repeating unit represented by the Formula (b2) include ethylene oxide (EO)-modified (meth)acrylate of phenol, EO- or propylene oxide (PO)-modified (meth)acrylate of p-cumylphenol, EO-modified (meth)acrylate of nonylphenol, PO-modified (meth)acrylate of nonylphenol, and the like. The polymerizable unsaturated monomers that can form the repeating unit represented by the Formula (b2) are not limited to the examples. Moreover, one kind of the polymerizable unsaturated monomers may be used singly, or two or more kinds thereof may be used concurrently.

Among the polymerizable unsaturated monomers that can form the repeating unit represented by Formula (b2), EO- or PO-modified (meth)acrylate of p-cumylphenol is most preferable.

Examples of commercially available products of the monomers include Aronix M102, M110, M117, and M120 (manufactured by TOAGOSEI CO., LTD.), and the like.

It is preferable for the alkali-soluble resin of the present invention to be able to be developed by a weakly alkaline aqueous solution. Accordingly, it is preferable for the alkali-soluble resin to contain, as a copolymerization component, repeating units having an acid group (hereinafter, appropriately referred to as "other alkali-soluble repeating units") other than the repeating unit represented by the Formula (b1) and the repeating unit represented by Formula (b2).

The acid group is not particularly limited, and examples thereof include a carboxyl group, a phenolic hydroxyl group, a carboxylic anhydride group, and the like. Among these, a carboxyl group is particularly preferable. One kind of these acid groups may be used singly, or two or more kinds thereof may be used.

Examples of the polymerizable unsaturated monomers having a carboxyl group include unsaturated monocarboxylic acids such as (meth)acrylic acid, crotonic acid, a-chloro-acrylic acid, and cinnamic acid; unsaturated dicarboxylic acid or anhydrides thereof, such as maleic acid, maleic anhydride, fumaric acid, itaconic acid, itaconic anhydride, citraconic acid, citraconic anhydride, and mesaconic acid; unsaturated polycarboxylic acid having a valency of 3 or higher or anhydrides thereof; mono[(meth)acryloyloxyalkyl]esters of polycarboxylic acid having a valency of 2 or higher, such as mono[2-(meth)acryloyloxyethyl]succinate and mono[2-(meth)acryloyloxyethyl]phthalate; mono(meth)acrylates of polymers having a carboxyl group and a hydroxyl group on both terminals thereof, such as ω-carboxypolycaprolactone mono(meth)acryalte; and the like.

Among these carboxyl group-containing unsaturated monomers, (meth)acrylates, mono[2-(meth)acryloyloxy-ethyl]succinate, and the like are particularly preferable. One kind of the carboxyl group-containing unsaturated monomers can be used singly, or two or more kinds thereof can be used by being mixed with each other.

When the specific alkali-soluble resin according to the present invention contains the repeating unit having an acid group, the content of the resin may be determined such that the acid value of the specific alkali-soluble resin falls within a preferable range described below.

Preferable examples of the specific alkali-soluble resin according to the present invention include (B1) a resin containing the repeating unit represented by Formula (b1) in an amount of 5% by mass to 40% by mass and other alkali-soluble repeating units in an amount of 10% by mass to 50% by mass, (B2) a resin containing the repeating unit represented by Formula (b2) in an amount of 5% by mass to 40% by mass and other alkali-soluble repeating units in an amount of 10% by mass to 50% by mass, (B3) a resin containing the repeating unit represented by Formula (b1) in an amount of 5% by mass to 20% by mass, the repeating unit represented by Formula (b2) in an amount of 5% by mass to 20% by mass, and other alkali-soluble repeating units in an amount of 10% by mass to 50% by mass, and the like.

The acid value of the specific alkali-soluble resin according to the present invention is preferably 50 mg KOH/g to 200 mg KOH/g, and more preferably 80 mg KOH/g to 170 mg KOH/g.

Moreover, the molecular weight (Mw) thereof is preferably 5,000 to 100,000 and more preferably 10,000 to 50,000.

For the various purposes including control of physical properties, the specific alkali-soluble resin according to the present invention may further contain repeating units derived from other polymerizable unsaturated monomers in addition to the above repeating units.

Examples of other polymerizable unsaturated monomers (hereinafter, referred to as "other unsaturated monomers") include macromonomers having a mono(meth)acryloyl group on the terminal of a polymer molecular chain (hereinafter, simply referred to as "macromonomers"), such as polystyrene, polymethyl(meth)acrylate, poly-n-butyl(meth)acrylate, and polysiloxane;

aromatic vinyl compounds such as styrene, a-methylstyrene, o-vinyltoluene, m-vinyltoluene, p-vinyltoluene, p-chlorostyrene, o-methoxystyrene, m-methoxystyrene, p-methoxystyrene, o-vinylbenzylmethylether, m-vinylbenzylmethylether, p-vinylbenzylmethylether, o-vinylbenzylglycidylether, m-vinylbenzylglycidylether, and p-vinylbenzylglycidylether;

indenes such as indene and 1-methylindene;

unsaturated carboxylic acid esters such as methyl (meth)acrylate, ethyl (meth)acrylate, n-propyl (meth)acrylate, i-propyl (meth)acrylate, n-butyl (meth)acrylate, i-butyl (meth)acrylate, sec-butyl (meth)acrylate, t-butyl (meth)acrylate, 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, 4-hydroxybutyl (meth)acrylate, allyl (meth)acrylate, benzyl (meth)acrylate, cyclohexyl (meth)acrylate, phenyl (meth)acrylate, 2-methoxyethyl (meth)acrylate, 2-phenoxyethyl (meth)acrylate, methoxydiethylene glycol (meth)acrylate, methoxytriethylene glycol (meth)acrylate, methoxypropylene glycol (meth)acrylate, methoxydipropylene glycol (meth)acrylate, isobornyl (meth)acrylate, dicyclopentadienyl (meth)acrylate, and 2-hydroxy-3-phenoxypropyl (meth)acrylate;

unsaturated carboxylic acid amino alkyl esters such as 2-aminoethyl (meth)acrylate, 2-dimethylaminoethyl (meth)acrylate, 2-aminopropyl (meth)acrylate, 2-dimethylaminopropyl acrylate, 3-aminopropyl (meth)acrylate, and 3-dimethylaminopropyl (meth)acrylate;

unsaturated carboxylic acid glycidyl esters such as glycidyl (meth)acrylate;

carboxylic acid vinyl esters such as vinyl acetate, vinyl propionate, vinyl butyrate, and vinyl benzoate;

unsaturated ethers such as vinyl methyl ether, vinyl ethyl ether, and allyl glycidyl ether;

vinyl cyanide compounds such as (meth)acrylonitrile, a-chloroacrylonitrile, and vinylidene cyanide;

unsaturated amides such as (meth)acrylamide, a-chloroacrylamide, and N-2-hydroxyethyl (meth)acrylamide;

aliphatic conjugated dienes such as 1,3-butadiene, isoprene, and chloroprene; and the like.

Among other unsaturated monomers described above, macromonomers, 2-hydroxyethyl (meth)acrylate, benzyl (meth)acrylate, and glycerol (meth)acrylate are preferable. Moreover, among the macromonomers, polystyrene macromonomers and polymethyl (meth)acrylate macromonomers are particularly preferable.

One kind of other unsaturated monomers described above can be used singly, or two or more kinds thereof can be used by being mixed with each other.

Further, in order to improve crosslinking efficiency, the specific alkali-soluble resin may have a polymerizable group on the side chain thereof. For example, polymers having an allyl group, a (meth)acryl group, an allyloxy alkyl group, or the like on the side chain thereof are also useful.

It is also preferable for the specific alkali-soluble resin to have an epoxy group on the side chain thereof. In order to introduce an epoxy group into the specific alkali-soluble resin, for example, an epoxy group-containing monomer (hereinafter, referred to as a "monomer for introducing an epoxy group" in some cases) may be polymerized as a monomer component. Examples of the epoxy group-containing monomer include glycidyl (meth)acrylate, 3,4-epoxycyclohexylmethyl (meth)acrylate, o-(alternatively, m- or p-)vinylbenzyl glycidyl ether, and the like. One kind of the monomer for introducing an epoxy group may be used singly, or two or more kinds thereof may be used. When the monomer component for obtaining the specific alkali-soluble resin also contains the monomer for introducing an epoxy group, the content of the monomer is not particularly limited. However, the content is within a range of 5% by mass to 50% by mass, and preferably within a range of 10% by mass to 30% by mass of the entire monomer component.

Specific examples (example compounds) of the (B) specific alkali-soluble resin according to the present invention will be shown below. However, the present invention is not limited to the following compounds as long as the compounds are not outside the scope of the present invention. Moreover, the numbers assigned to each repeating unit indicate the content of the repeating unit with respect to the copolymerization components in terms of mass.

[Chem. 9]

J1

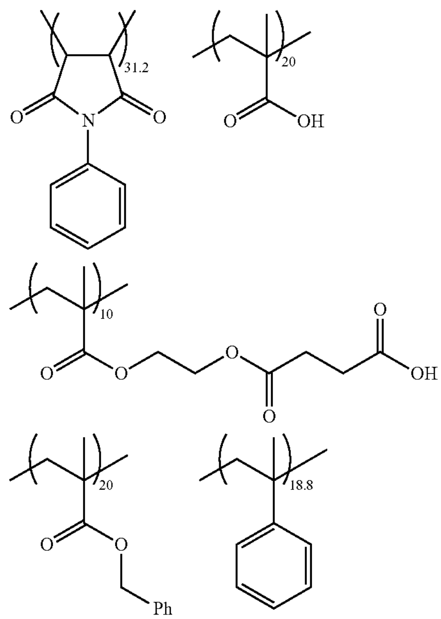

J2

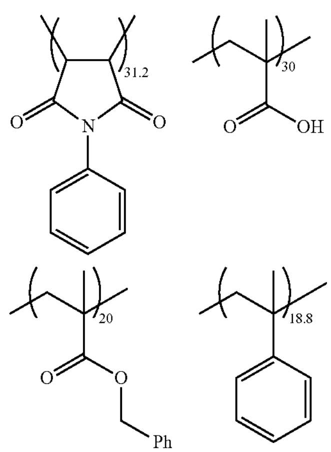

J3

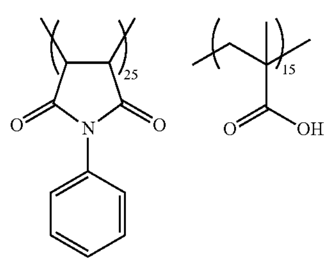

-continued

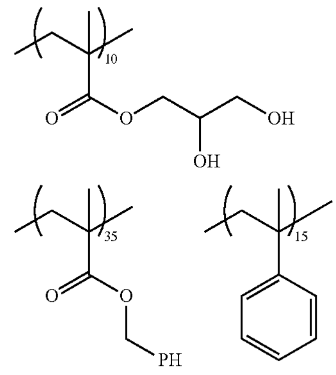

J4

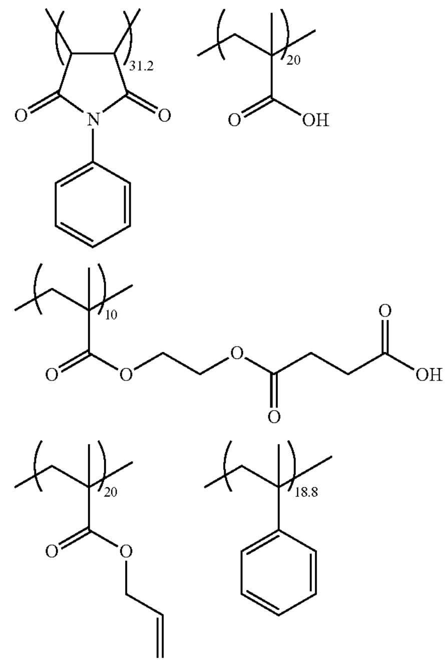

[Chem. 10]

J5

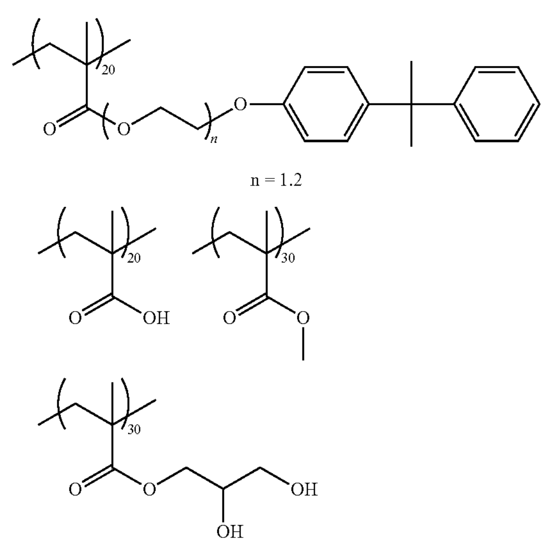

-continued
J6
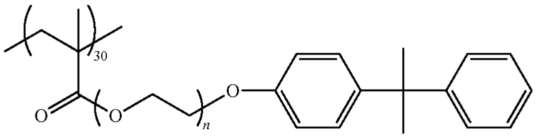
n = 1.2
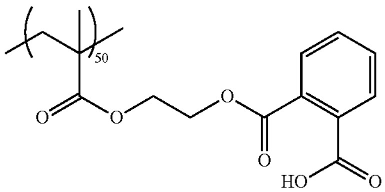
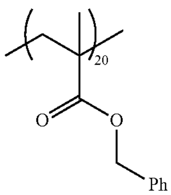
J7
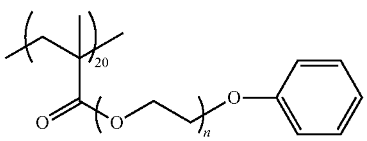
n = 4
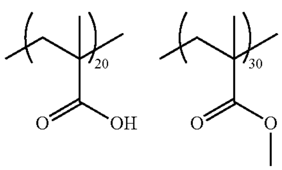
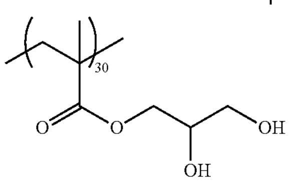
J8
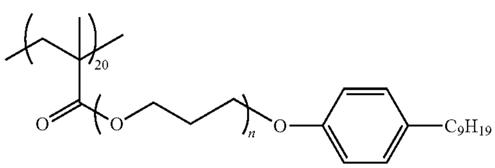
n = 4
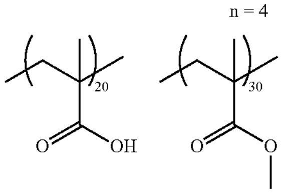
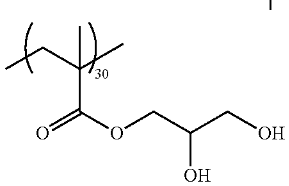
-continued
J9
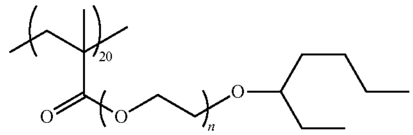
n = 2
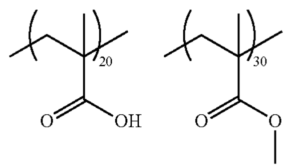
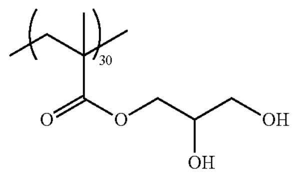
J10
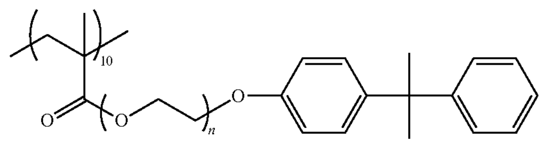
n = 1.2
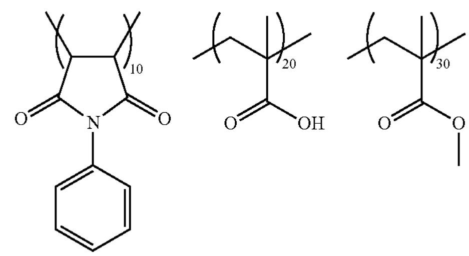
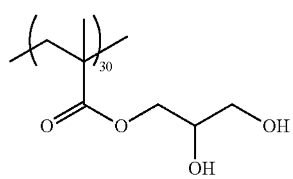
[Chem. 11]
J11
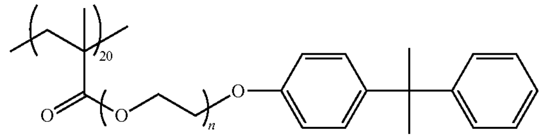
n = 10
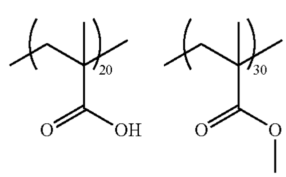

-continued
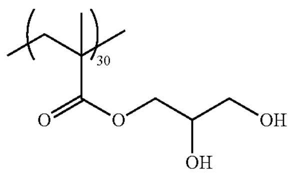
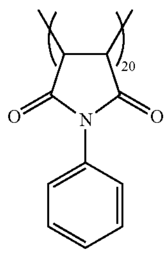
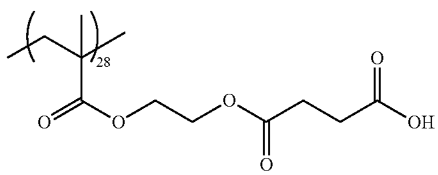
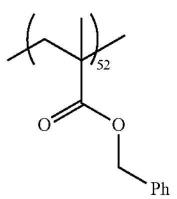
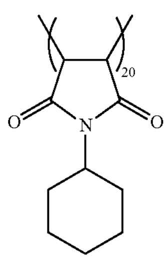
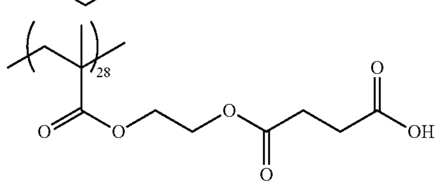
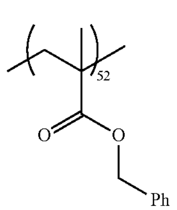
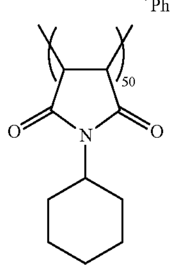
-continued
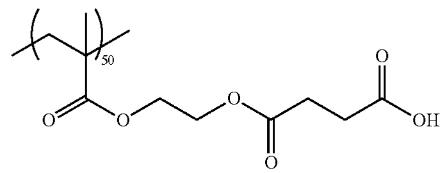
J12
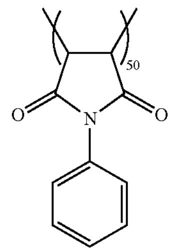
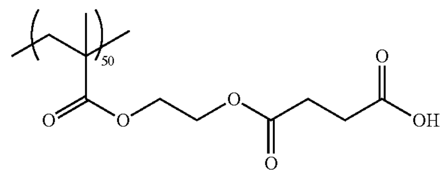
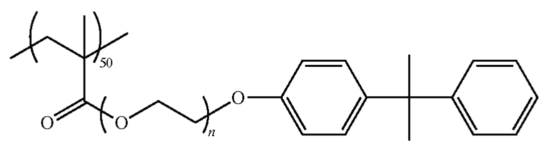
n = 1.2
J13
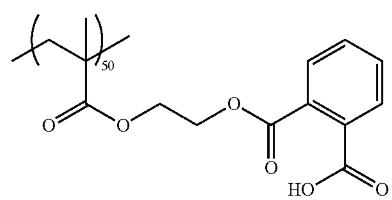
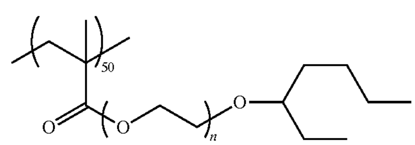
n = 2
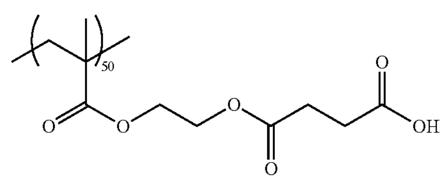
[Chem. 12]
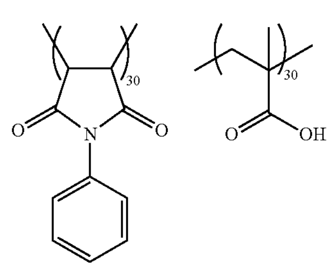

-continued

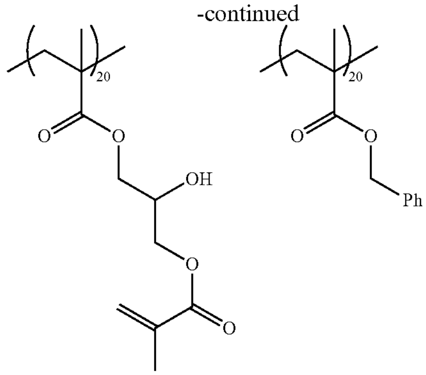

The (B) specific alkali-soluble resin according to the present invention can be synthesized by the following method.

The alkali-soluble resin containing the repeating unit represented by Formula (b1) can be synthesized by the method described in paragraph 0108 of JP4752649B. Moreover, the alkali-soluble resin containing the repeating unit represented by Formula (b2) can be synthesized by the method described in paragraphs 0144 to 0148 of JP2009-282114A.

The content of the (B) specific alkali-soluble resin in the colored radiation-sensitive composition is preferably 0.1% by mass to 50% by mass, more preferably 0.1% by mass to 30% by mass, and particularly preferably 1% by mass to 7% by mass with respect to the solid contents in the colored radiation-sensitive composition.

[(A) Dye Multimer]

The colored radiation-sensitive composition of the present invention contains at least one kind of dye multimer (hereinafter, simply referred to as a "dye multimer (A)" in some cases).

More specifically, the dye multimer (A) is a multimer having a partial structure, which has a dye skeleton of which a maximum absorption wavelength is present in a range of 400 nm to 780 nm, in the molecular structure thereof. The dye multimer (A) includes the structure of a dimer, a trimer, a polymer, and the like. Among these, a polymer containing a repeating unit having a partial structure that has a dye skeleton is preferable. In the colored radiation-sensitive composition of the present invention, the dye multimer (A) functions as, for example, a colorant.

In the present invention, the dye multimer (A) is preferably a dye multimer containing at least one kind of repeating unit (structural unit) having a dye partial structure that is shown in Formula (A), Formula (B), and Formula (C) which will be described later.

Hereinafter, dye-derived partial structures in the dye multimer (A), preferable structures of the dye multimer (A), functional groups (substituent group A which will be described later) that may contained in the dye multimer (A), and preferable physical properties of the dye multimer (A) will be described in detail.

The "dye-derived partial structure" refers to a structure which is formed when hydrogen atoms are removed from a specific dye (hereinafter, also referred to as a "dye compound") that can form a dye structure which will be described later, and can be linked to a dye multimer linkage portion (a polymer chain, a core of dendrimer, and the like).

(Dye-Derived Partial Structure)

The dye-derived partial structure (hereinafter, also referred to as a "dye structure") in the dye multimer (A) is not particularly limited, and various structures having known dye structures can be used. Examples of the known dye structures include dye structures and the like derived from a dye selected from an azo dye, an azomethine dye, (an indoaniline dye, an indophenol dye, or the like), a dipyrromethene dye, a quinone dye (a benzoquinone dye, a naphthoquinone dye, an anthraquinone dye, an anthrapyridone dye, or the like), a carbonium dye (a diphenylmethane dye, a triphenylmethane dye, a xanthene dye, an acridine dye, or the like), a quinonimine dye (an oxazine dye, a thiazine dye, or the like), an azine dye, a polymethine dye (an oxonol dye, a merocyanine dye, an arylidene dye, a styryl dye, a cyanine dye, a squarylium dye, a croconium dye, or the like), a quinophthalone dye, a phthalocyanine dye, a subphthalocyanine dye, a perinone dye, an indigo dye, a thioindigo dye, a quinoline dye, a nitro dye, a nitroso dye, and a metal complex dye of these.

Among these dye structures, from the viewpoint of color characteristics, dye multimers having a partial structure derived from a dye selected from a dipyrromethene dye, an azo dye, an anthraquinone dye, a triphenylmethane dye, a xanthenes dye, a cyanine dye, a squarylium dye, a quinophthalone dye, a phthalocyanine dye, and a subphthalocyanine dye are preferable.

Specific pigment compounds that can form a dye structure are described in "New edition, Dye Handbook" (edited by The Society of Synthetic Organic Chemistry, Japan; MARUZEN, Co., Ltd., 1970), "Color index" (The Society of Dyers and Colourists), "Dye Handbook" (Gen Ookawa et al; Kodansha Ltd., 1986), and the like.

In the dye multimer (A) according to the present invention, a hydrogen atom in the dye structure may be substituted with a substituent selected from the following substituent group A.

<Substituent Group A>

Examples of the substituent that the dye multimer may have include a halogen atom, an alkyl group, a cycloalkyl group, a polycyclic alkyl group, an alkenyl group, a cycloalkenyl group, a polycyclic alkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoyl amino group, an alkyl or arylsulfonylamino group, a mercapto group, an alkylthio group, an arylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, a silyl group, and the like. These will be described in detail below.

Examples of the substituent include a halogen atom (for example, a fluorine atom, a chlorine atom, a bromine atom, or an iodine atom); a linear or branched alkyl group (linear or branched substituted or unsubstituted alkyl group preferably having 1 to 30 carbon atoms, for example, methyl, ethyl, n-propyl, isopropyl, t-butyl, n-octyl, 2-chloroethyl, 2-cyanoethyl, 2-ethylhexyl); a cycloalkyl group (preferably a substituted or unsubstituted cycloalkyl group having 3 to 30 carbon atoms, for example, cyclohexyl or cyclopentyl); a polycyclic alkyl group, for example, a group having a polycyclic structure such as a bicycloalkyl group (preferably a substituted or unsubstituted bicycloalkyl group having 5 to 30 carbon atoms, for example, bicyclo[1,2,2]heptan-2-yl or bicyclo[2,2,2]octan-3-yl or a tricycloalkyl group among these a monocyclic cycloalkyl group and a bicycloalkyl group are preferable, and a monocyclic cycloalkyl group is particularly preferable);

a linear or branched alkenyl group (a linear or branched substituted or unsubstituted alkenyl group, which is preferably an alkenyl group having 2 to 30 carbon atoms, for example, vinyl, allyl, prenyl, geranyl, or oleyl); a cycloalkenyl group (preferably a substituted or unsubstituted cycloalkenyl group having 3 to 30 carbon atoms, for example, 2-cyclopenten-1-yl or 2-cyclohexen-1-yl); a polycyclic alkenyl group (for example, a bicycloalkenyl group which is preferably a substituted or unsubstituted bicycloalkenyl group having 5 to 30 carbon atoms, for example, bicyclo[2,2,1]hepto-2-en-1-yl or bicyclo[2,2,2]octo-2-en-4-yl, or a tricycloalkenyl group; among these, a monocyclic cycloalkenyl group is particularly preferable); an alkynyl group (preferably a substituted or unsubstituted alkynyl group having 2 to 30 carbon atoms, for example, an ethynyl, propargyl, or trimethylsilyl ethynyl group);

an aryl group (preferably a substituted or unsubstituted aryl group having 6 to 30 carbon atoms, for example, phenyl, p-tolyl, naphthyl, m-chlorophenyl, or o-hexadecanoyl aminophenyl); a heterocyclic group (preferably a substituted or unsubstituted, saturated or unsaturated, aromatic or non-aromatic, and monocyclic or ring-condensed 5- to 7-membered heterocyclic group, more preferably a heterocyclic group of which ring-constituting atoms are selected from carbon atoms, nitrogen atoms, and sulfur atoms, and which has at least any one of hetero atoms including a nitrogen atom, an oxygen atom, and a sulfur atom, and even more preferably a 5- or 6-membered aromatic heterocyclic group having 3 to 30 carbon atoms, for example, 2-furyl, 2-thienyl, 2-pyridyl, 4-pyridyl, 2-pyrimidinyl, or 2-benzothiazolyl); a cyano group; a hydroxyl group; a nitro group; a carboxyl group;

an alkoxy group (preferably a substituted or unsubstituted alkoxy group having 1 to 30 carbon atoms, for example, methoxy, ethoxy, isopropoxy, t-butoxy, n-octyloxy, or 2-methoxyethoxy); an aryloxy group (preferably a substituted or unsubstituted aryloxy group having 6 to 30 carbon atoms, for example, phenoxy, 2-methylphenoxy, 2,4-di-t-amylphenoxy, 4-t-butylphenoxy, 3-nitrophenoxy, or 2-tetradecanoylaminophenoxy); a silyloxy group (preferably a silyloxy group having 3 to 20 carbon atoms, for example, trimethylsilyloxy or t-butyldimethylsilyloxy); a heterocyclic oxy group (preferably a substituted or unsubstituted heterocyclic oxy group having 2 to 30 carbon atoms; a heterocycle portion of the heterocyclic oxy group is preferably the heterocycle portion explained for the heterocyclic group described above; the heterocyclic oxy group is, for example, 1-phenyltetrazol-5-oxy or 2-tetrahydropyranyloxy);

an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy); a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy); an alkoxycarbonyloxy group (preferably a substituted or unsubstituted alkoxy carbonyloxy group having 2 to 30 carbon atoms, for example, methoxycarbonyloxy, ethoxycarbonyloxy, t-butoxycarbonyloxy, or n-octylcarbonyloxy); an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxy carbonyloxy);

an amino group (preferably an amino group, a substituted or unsubstituted alkylamino group having 1 to 30 carbon atoms, a substituted or unsubstituted arylamino group having 6 to 30 carbon atoms, or a heterocyclic amino group having 0 to 30 carbon atoms, for example, amino, methylamino, dimethylamino, anilino, N-methyl-anilino, diphenylamino, or N-1,3,5-triazin-2-ylamino); an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, for example, formylamino, acetylamino, pivaloylamino, lauroylamino, benzoylamino, or 3,4,5-tri-n-octyloxyphenyl carbonylamino); an aminocarbonylamino group (preferably a substituted or unsubstituted aminocarbonylamino group having 1 to 30 carbon atoms, for example, carbamoylamino, N,N-dimethylaminocarbonylamino, N,N-diethylaminocarbonylamino, or morpholinocarbonylamino); an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxycarbonylamino);

an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino); a sulfamoylamino group (preferably a substituted or unsubstituted sulfamoylamino group having 0 to 30 carbon atoms, for example, sulfamoylamino, N,N-dimethylaminosulfonylamino, or N-n-octylaminosulfonylamino); an alkyl or aryl sulfonylamino group (preferably a substituted or unsubstituted alkyl sulfonylamino group having 1 to 30 carbon atoms, or a substituted or unsubstituted aryl sulfonylamino group having 6 to 30 carbon atoms, for example, methyl sulfonylamino, butyl sulfonylamino, phenyl sulfonylamino, 2,3,5-trichlorophenylsulfonylamino, or p-methylphenylsulfonylamino), a mercapto group;

an alkylthio group (preferably a substituted or unsubstituted alkylthio group having 1 to 30 carbon atoms, for example, methylthio, ethylthio, or n-hexadecylthio); an arylthio group (preferably a substituted or unsubstituted arylthio group having 6 to 30 carbon atoms, for example, phenylthio, p-chlorophenylthio, or m-methoxyphenylthio); a heterocyclic thio group (preferably a substituted or unsubstituted heterocyclic thio group having 2 to 30 carbon atoms, in which a heterocycle portion is preferably the heterocycle portion explained for the heterocyclic group described above, for example, 2-benzothiazolylthio or 1-phenyltetrazol-5-ylthio); a sulfamoyl group (preferably a substituted or unsubstituted sulfamoyl group having 0 to 30 carbon atoms, for example, N-ethylsufamoyl, N-(3-dodecyloxypropyl) sulfamoyl, N,N-dimethylsulfamoyl, N-acetylsulfamoyl, N-benzoylsulfamoyl, or N—(N'-phenylcarbamoyl)sulfamoyl); a sulfo group;

an alkyl or aryl sulfinyl group (preferably a substituted or unsubstituted alkyl sulfinyl group having 1 to 30 carbon atoms or a substituted or unsubstituted aryl sulfinyl group having 6 to 30 carbon atoms, for example, methyl sulfinyl, ethyl sulfinyl, phenyl sulfinyl, or p-methylphenyl sulfinyl); an alkyl or aryl sulfonyl group (preferably a substituted or unsubstituted alkyl sulfonyl group having 1 to 30 carbon atoms or a substituted or unsubstituted aryl sulfonyl group having 6 to 30 carbon atoms, for example, methyl sulfonyl, ethyl sulfonyl, phenyl sulfonyl, or p-methylphenyl sulfonyl);

an acyl group (preferably a formyl group, a substituted or unsubstituted alkyl carbonyl group having 2 to 30 carbon atoms, or a substituted or unsubstituted aryl carbonyl group having 7 to 30 carbon atoms, for example, acetyl, pivaloyl, 2-chloroacetyl, stearoyl, benzoyl, or p-n-octyloxyphenylcarbonyl); an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl);

an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl); a carbamoyl group (preferably a substituted or unsubstituted carbamoyl group having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl); an aryl or heterocyclic azo group (preferably a substituted or unsubstituted arylazo group having 6 to 30 carbon atoms, or a substituted or unsubstituted heterocyclic azo group having 3 to 30 carbon atoms (in which a heterocycle portion is preferably the heterocycle portion explained for the heterocyclic group described above), for example, phenylazo, p-chlorophenylazo, or 5-ethylthio-1,3,4-thiadiazol-2-ylazo); an imide group (preferably a substituted or unsubstituted imide group having 2 to 30 carbon atoms, for example, N-succinimide or N-phthalimide); a phosphino group (preferably a substituted or unsubstituted phosphino group having 2 to 30 carbon atoms, for example, dimethylphosphino, diphenylphosphino, or methyl phenoxyphosphino); a phosphinyl group (preferably a substituted or unsubstituted phosphinyl group having 2 to 30 carbon atoms, for example, phosphinyl, dioctyloxyphosphinyl, or diethoxyphosphinyl);

a phosphinyloxy group (preferably a substituted or unsubstituted phosphinyloxy group having 2 to 30 carbon atoms, for example, diphenoxyphosphinyloxy or dioctyloxyphosphinyloxy); a phosphinylamino group (preferably a substituted or unsubstituted phosphinylamino group having 2 to 30 carbon atoms, for example, dimethoxyphosphinylamino or dimethylaminophosphinylamino); and a silyl group (preferably a substituted or unsubstituted silyl group having 3 to 30 carbon atoms, for example, trimethyl silyl, t-butyl dimethyl silyl, or phenyl dimethyl silyl).

Among the above functional groups, in the functional groups having hydrogen atoms, the portion of hydrogen atoms in the functional groups may be substituted with any one of the above groups. Examples of the functional groups that can be introduced as substituents include an alkylcarbonylaminosulfonyl group, an arylcarbonylaminosulfonyl group, an alkylsulfonylaminocarbonyl group, and an arylsulfonylaminocarbonyl group, and specific examples thereof include methylsulfonylaminocarbonyl, p-methylphenylsulfonylaminocarbonyl, acetylaminosulfonyl, and benzoylaminosulfonyl groups.

Particularly preferable dyes (dye compounds) that can form the dye-derived partial structure in the dye multimer (A) will be described in detail.

(Dipyrromethene Dye)

One of the embodiments of the dye multimer (A) according to the present invention is a dye multimer which has a partial structure derived from the dipyrromethene dye shown below as a partial structure of the dye moiety.

In the present invention, as the dipyrromethene dye, a dipyrromethene compound and a dipyrromethene metal complex compound obtained from a dipyrromethene compound with a metal or a metal compound are preferable.

Moreover, in the present invention, a compound having a dipyrromethene structure is referred to as a dipyrromethene compound, and a complex in which a metal or a metal compound is coordinated to the compound having a dipyrromethene structure is referred to as a dipyrromethene metal complex compound.

As the dipyrromethene metal complex compound, a dipyrromethene metal complex compound obtained from a dipyrromethene compound represented by the following Formula (M) with a metal or a metal compound and a tautomer thereof are preferable. Among these, a dipyrromethene metal complex compound represented by the following Formula (7) and a dipyrromethene metal complex compound represented by the following Formula (8) are exemplified as preferable embodiments, and the dipyrromethene metal complex compound represented by the following Formula (8) is most preferable.

<<Dipyrromethene Metal Complex Compound Obtained from Dipyrromethene Compound Represented by Formula (M) with Metal or a Metal Compound, and Tautomer Thereof>>

One of the preferable embodiments of the dye structure in the dye multimer (A) is a dye structure that contains, as a dye moiety, a complex (hereinafter, appropriately referred to as a "specific complex") in which a compound (dipyrromethene compound) represented by the following Formula (M) or a tautomer thereof is coordinated to a metal or a metal compound.

[Chem. 13]

(M)

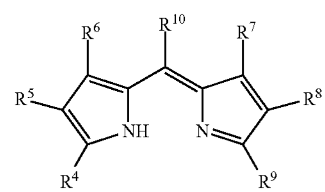

In Formula (M), each of $R^4$ to $R^{10}$ independently represents a hydrogen atom or a monovalent substituent. Here, $R^4$ and $R^9$ do not form a ring by being bonded to each other.

When the compound represented by Formula (M) is introduced into the structural unit represented by Formula (A) to Formula (C), which will be described later, or into the multimer represented by Formula (D), the introduction site is not particularly limited. However, in view of synthesis suitability, the compound is preferably introduced at one of the sites including $R^4$ to $R^9$, more preferably introduced at one of the sites including $R^4$, $R^6$, $R^7$, and $R^9$, and even more preferably introduced at one of the sites including $R^4$ and $R^9$.

When $R^4$ to $R^9$ in Formula (M) represent a monovalent substituent, examples of the monovalent substituent include the substituents exemplified in the above section of Substituent Group A.

When the monovalent substituent represented by $R^4$ to $R^9$ in Formula (M) is a group that can be further substituted, the group may further have the substituents described for $R^4$ to $R^9$, and when the group has two or more substituents, these substituents may be the same as or different from each other.

In Formula (M), $R^4$ and $R^5$, $R^5$ and $R^6$, $R^7$ and $R^8$, and $R^8$ and $R^9$ may independently form a 5-, 6-, or 7-membered saturated or unsaturated ring by being bonded to each other respectively. Here, $R^4$ and $R^9$ do not form a ring by being bonded to each other. When the formed 5-, 6-, or 7-membered ring is a group that can be further substituted, the ring may be substituted with the substituents described for $R^4$ to $R^9$, and when the ring is substituted with two or more substituents, these substituents may be the same as or different from each other.

In Formula (M), when $R^4$ and $R^5$, $R^5$ and $R^6$, $R^7$ and $R^8$, and $R^8$ and $R^9$ independently form a 5-, 6-, or 7-membered saturated or unsaturated ring not having a substituent by being bonded to each other respectively, examples of the 5-, 6-, or 7-membered saturated or unsaturated ring not having a substituent include a pyrrole ring, a furan ring, a thiophene ring, a pyrazole ring, an imidazole ring, a triazole ring, an oxazole ring, a thiazole ring, pyrrolidine ring, a piperidine ring, a cyclopentene ring, a cyclohexene ring, a benzene ring, a pyridine ring, a pyrazine ring, and a pyridazine ring, and among these, a benzene ring or a pyridine ring is preferable.

$R^{10}$ in Formula (M) preferably represents a hydrogen atom, a halogen atom, an alkyl group, an aryl group, or a heterocyclic group. The halogen atom, alkyl group, aryl group, and heterocyclic group respectively have the same definition as that of the halogen atom, alkyl group, aryl group, and heterocyclic group described in the above section of Substituent Group A, and a preferable range thereof is also the same.

When $R^{10}$ represents an alkyl group, an aryl group, or a heterocyclic group, if the alkyl group, aryl group, and heterocyclic group are groups that can be further substituted, they may be substituted with the substituents described in the above section of Substituent Group A. If the groups are substituted with two or more substituents, the substituents may be the same as or different from each other.

~Metal or Metal Compound~

In the present invention, the specific complex is a complex in which the dipyrromethene compound represented by the Formula (M) or a tautomer thereof is coordinated to a metal or a metal compound.

The metal or metal compound may be any types of metal or metal compound as long as they can form a complex, and include a divalent metal atom, a divalent metal oxide, a divalent metal hydroxide, and a divalent metal chloride. Examples of the metal or metal compound include metals such as Zn, Mg, Si, Sn, Rh, Pt, Pd, Mo, Mn, Pb, Cu, Ni, Co, and Fe, metal chlorides such as AlCl, InCl, FeCl, $TiCl_2$, $SnCl_2$, $SiCl_2$, and $GeCl_2$, metal oxides such as TiO and VO, and metal hydroxides such as $Si(OH)_2$.

Among these, in view of the stability, spectral characteristics, heat resistance, light fastness, and production suitability of the complex, Fe, Zn, Mg, Si, Pt, Pd, Mo, Mn, Cu, Ni, Co, TiO, or VO is preferable, Zn, Mg, Si, Pt, Pd, Cu, Ni, Co, or VO is more preferable, and Zn is most preferable.

Next, a more preferable range of the specific complex of the compound represented by Formula (M) in the present invention will be described.

A preferable range of the specific complex in the present invention is a range in which in Formula (M) each of R4 and R9 is independently a hydrogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an amino group, an anilino group, a heterocyclic amino group, a carbonamide group, a ureido group, an imide group, an alkoxycarbonylamino group, an aryloxycarbonylamino group, a sulfonamide group, an azo group, an alkylthio group, an arylthio group, a heterocyclic thio group, an alkylsulfonyl group, an arylsulfonyl group, or a phosphinoylamino group; each of $R^5$ and $R^8$ is independently a hydrogen atom, a halogen atom, an alkyl group, an alkenyl group, an aryl group, a heterocyclic group, a hydroxyl group, a cyano group, a nitro group, an alkoxy group, an aryloxy group, a heterocyclic oxy group, an acyl group, an alkoxycarbonyl group, an aryloxycarbonyl group, a carbamoyl group, an imide group, an alkoxycarbonylamino group, a sulfonamide group, an azo group, an alkylthio group, an arylthio group, a heterocyclic thio group, an alkylsulfonyl group, an arylsulfonyl group, or a sulfamoyl group; each of $R^6$ and $R^7$ is independently a hydrogen atom, a halogen atom, an alkyl group, an alkenyl group, an aryl group, a heterocyclic group, a silyl group, a hydroxyl group, a cyano group, an alkoxy group, an aryloxy group, a heterocyclic oxy group, an acyl group, an alkoxycarbonyl group, a carbamoyl group, an anilino group, a carbonamide group, a ureido group, an imide group, an alkoxycarbonylamino group, a sulfonamide group, an azo group, an alkylthio group, an arylthio group, a heterocyclic thio group, an alkylsulfonyl group, an arylsulfonyl group, a sulfamoyl group, or a phosphinoylamino group; $R^{16}$ is a hydrogen atom, a halogen atom, an alkyl group, an aryl group, or a heterocyclic group; and the metal or metal compound is Zn, Mg, Si, Pt, Pd, Mo, Mn, Cu, Ni, Co, TiO, or V═O.

A more preferable range of the specific complex in the present invention is a range in which in Formula (M), each of $R^4$ and $R^9$ is independently a hydrogen atom, an alkyl group, an alkenyl group, an aryl group, a heterocyclic group, a cyano group, an acyl group, an alkoxycarbonyl group, a carbamoyl group, an amino group, a heterocyclic amino group, a carbonamide group, a ureido group, an imide group, an alkoxycarbonylamino group, an aryloxycarbonylamino group, a sulfonamide group, an azo group, an alkylsulfonyl group, an arylsulfonyl group, or a phosphinoylamino group; each of $R^5$ and $R^8$ is independently an alkyl group, an alkenyl group, an aryl group, a heterocyclic group, a cyano group, a nitro group, an acyl group, an alkoxycarbonyl group, an aryloxycarbonyl group, a carbamoyl group, an imide group, an alkylsulfonyl group, an aryl sulfonyl group, or a sulfamoyl group; each of $R^6$ and $R^7$ is independently a hydrogen atom, an alkyl group, an alkenyl group, an aryl group, a heterocyclic group, a cyano group, an acyl group, an alkoxycarbonyl group, a carbamoyl group, a carbonamide group, a ureido group, an imide group, an alkoxycarbonylamino group, a sulfonamide group, an alkylthio group, an arylthio group, a heterocyclic thio group, an alkylsulfonyl group, an arylsulfonyl group, or a sulfamoyl group; $R^{16}$ is a hydrogen atom, a halogen atom, an alkyl group, an aryl group, or a heterocyclic group; and the metal or metal compound is Zn, Mg, Si, Pt, Pd, Cu, Ni, Co, or V═O.

A particularly preferable range of the specific complex in the present invention is a range in which in Formula (M), each of $R^4$ and $R^9$ is independently a hydrogen atom, an alkyl group, an aryl group, a heterocyclic group, an amino group, a heterocyclic amino group, a carbonamino group, a ureido group, an imide group, an alkoxycarbonylamino group, a sulfonamide group, an azo group, an alkylsulfonyl group, an arylsulfonyl group, or a phosphinoylamino group; each of $R^5$ and $R^8$ is independently an alkyl group, an aryl group, a heterocyclic group, a cyano group, an acyl group, an alkoxycarbonyl group, a carbamoyl group, an alkylsulfonyl group, or an arylsulfonyl group; each of $R^6$ and $R^7$ is independently a hydrogen atom, an alkyl group, an aryl group, or a heterocyclic group; $R^{10}$ is a hydrogen atom, an alkyl group, an aryl group, or a heterocyclic group; and the metal or metal compound is Zn, Cu, Co, or V═O.

Moreover, the dipyrromethene metal complex compound represented by Formula (7) or Formula (8), which will be described later in detail, is also a particularly preferable embodiment of the dipyrromethene dye.

<<Dipyrromethene Metal Complex Compound Represented by Formula (7)>>

One of the preferable embodiments of the dye structure in the dye multimer (A) is a dye structure derived from the dipyrromethene metal complex compound represented by the following Formula (7).

[Chem. 14]

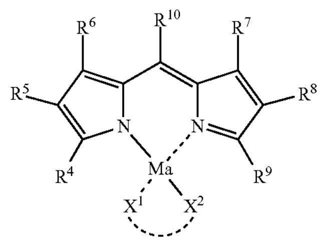

(7)

In Formula (7), each of $R^4$ to $R^9$ independently represents a hydrogen atom or a monovalent substituent, and $R^{10}$ represents a hydrogen atom, a halogen atom, an alkyl group, an aryl group, or a heterocyclic group. Ma represents a metal atom or a metal compound. $X^1$ represents a group that can be bonded to Ma, $X^2$ represents a group that neutralizes the charge of Ma, and $X^1$ and $X^2$ may form a 5-, 6-, or 7-membered ring together with Ma by being bonded to each other. Here, $R^4$ and $R^9$ do not form a ring by being bonded to each other.

Moreover, the dipyrromethene metal complex compound represented by Formula (7) includes a tautomer.

When the dipyrromethene metal complex compound represented by Formula (7) is introduced into the structural unit represented by Formula (A) to Formula (C), which will be described later, or into the multimer represented by Formula (D), the introduction site is not particularly limited. However, in view of synthesis suitability, the compound is preferably introduced at one of the sites including $R^4$ to $R^9$, more preferably introduced at one of the sites including $R^4$, $R^6$, $R^7$, and $R^9$, and even more preferably introduced at one of the sites including $R^4$ and $R^9$.

When the dye multimer (A) has an alkali-soluble group, as a method of introducing the alkali-soluble group, a method of bonding the alkali-soluble group to one, two, or more substituents among $R^4$ to $R^{10}$, $X^1$, and $X^2$ in the Formula (7) can be used. Among these substituents, one of the $R^4$ to $R^9$ and $X^1$ is preferable, one of the $R^4$, $R^6$, $R^7$, and $R^9$ is more preferable, and one of the $R^4$ and $R^9$ is even more preferable.

The dipyrromethene metal complex compound represented by Formula (7) may have a functional group other than the alkali-soluble group, as long as the effects of the present invention are not diminished.

$R^4$ to $R^9$ in Formula (7) have the same definition as $R^4$ to $R^9$ in the the Formula (M), and preferable embodiments thereof are also the same.

In Formula (7), Ma represents a metal atom or a metal compound. The metal atom or metal compound may be any type as long as it is a metal atom or a metal compound that can form a complex, and includes a divalent metal atom, a divalent metal oxide, a divalent metal hydroxide, or a divalent metal chloride.

Examples of the metal atom or metal compound include metals such as Zn, Mg, Si, Sn, Rh, Pt, Pd, Mo, Mn, Pb, Cu, Ni, Co, and Fe, metal chlorides such as AlCl, InCl, FeCl, $TiCl_2$, $SnCl_2$, $SiCl_2$, and $GeCl_2$, metal oxides such as TiO and VO, and metal hydroxides such as $Si(OH)_2$.

Among these, in view of stability, spectral characteristics, heat resistance, light fastness, and production suitability of the complex, as the metal atom or metal compound, Fe, Zn, Mg, Si, Pt, Pd, Mo, Mn, Cu, Ni, Co, TiO, and V═O are preferable, Zn, Mg, Si, Pt, Pd, Cu, Ni, Co, and V═O are more preferable, Zn, Co, V═O, and Cu are particularly preferable, and Zn is most preferable.

In Formula (7), $R^{10}$ represents a hydrogen atom, a halogen atom, an alkyl group, an aryl group, or a heterocyclic group, and is preferably a hydrogen atom.

In Formula (7), $X^1$ may be any group as long as the group can be bonded to Ma, and specific examples thereof include water, alcohols (for example, methanol, ethanol, and propanol), and compounds disclosed in "Metal Chelates" ([1] Takeichi Sakaguchi and Kagehira Ueno (1995, Nankodo Co., Ltd.), [2] (1996), [3] (1997), and the like). Among these, in view of production thereof, water, a carboxylic acid compound, and alcohols are preferable, and water and a carboxylic acid compound are more preferable.

In Formula (7), examples of the "group that neutralizes the charge of Ma" represented by $X^2$ include a halogen atom, a hydroxyl group, a carboxylic acid group, a phosphoric acid group, a sulfonic acid group, and the like. Among these, in view of production thereof, a halogen atom, a hydroxyl group, a carboxylic acid group, and a sulfonic acid group are preferable, and a hydroxyl group and a carboxylic acid group are more preferable.

In Formula (7), $X^1$ and $X^2$ may form a 5-, 6-, or 7-membered ring together with Ma by being bonded to each other. The formed 5-, 6-, or 7-membered ring may be a saturated or unsaturated ring. In addition, the 5-, 6-, or 7-membered ring may be constituted only with carbon atoms or may form a heterocycle having at least one atom selected from a nitrogen atom, an oxygen atom, or/and a sulfur atom.

In a preferable embodiment of the compound represented by Formula (7), each of $R^4$ to $R^9$ independently represents the group described as the preferable embodiment of $R^4$ to $R^9$; $R^{10}$ represents the group described as the preferable embodiment of $R^{10}$, Ma is Zn, Cu, Co, or V═O; $X^1$ is water or a carboxylic acid compound; $X^2$ is a hydroxyl group or a carboxylic acid group; and $X^1$ and $X^2$ may form a 5- or 6-membered ring by being bonded to each other.

<<Dipyrromethene Metal Complex Compound Represented by Formula (8)>>

One of the preferable embodiments of the dye structure in the dye multimer (A) is a dye structure derived from a dipyrromethene metal complex compound represented by the following Formula (8).

[Chem. 15]

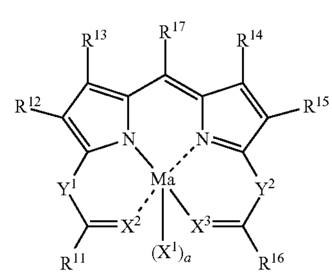

(8)

In Formula (8), each of $R^{11}$ and $R^{16}$ independently represents an alkyl group, an alkenyl group, an aryl group, a heterocyclic group, an alkoxy group, an aryloxy group, an alkylamino group, an arylamino group, or a heterocyclic amino group. Each of $R^{12}$ to $R^{15}$ independently represents a hydrogen atom, or a substituent. $R^{17}$ represents a hydrogen atom, a halogen atom, an alkyl group, an aryl group, or a heterocyclic group. Ma represents a metal atom or a metal compound. Each of $X^2$ and $X^3$ independently represents NR (R represents a hydrogen atom, an alkyl group, an alkenyl group, an aryl group, a heterocyclic group, an acyl group, an alkylsulfonyl group, or an arylsulfonyl group), a nitrogen atom, an oxygen atom or a sulfur atom. Each of $Y^1$ and $Y^2$ independently represents $NR^c$ ($R^c$ represents a hydrogen atom, an alkyl group, an alkenyl group, an aryl group, a heterocyclic group, an acyl group, an alkylsulfonyl group, or an arylsulfonyl group), a nitrogen atom or a carbon atom. $R^{11}$ and $Y^1$ may form a 5-, 6-, or 7-membered ring by being bonded to each other, and $R^{16}$ and $Y^2$ may form a 5-, 6-, or 7-membered ring by being bonded to each other. $X^1$ represents a group that can be bonded to Ma, and a represents 0, 1, or 2.

Moreover, the dipyrromethene metal complex compound represented by Formula (8) includes a tautomer.

The site at which the dipyrromethene metal complex compound represented by Formula (8) is introduced into the structural unit represented by Formula (A) to Formula (C), which will be described later, or into the multimer represented by Formula (D) is not particularly limited, as long as the effects of the present invention are not diminished. However, the site is preferably at least one of the $R^{11}$ to $R^{17}$, $X^1$, $Y^1$, and $Y^2$. Among these, in view of synthesis suitability, it is preferable for the compound to be introduced at one of the $R^{11}$ to $R^{16}$ and $X^1$. In a more preferable embodiment, the compound is inserted at one of the $R^{11}$, $R^{13}$, $R^{14}$, and $R^{16}$. In an even more preferable embodiment, the compound is inserted at one of the $R^{11}$ and $R^{16}$.

When the dye multimer (A) uses the alkali-soluble group, if a dye monomer or a structural unit having the alkali-soluble group is used, as a method for introducing the alkali-soluble group, it is possible to use a method of introducing the alkali-soluble group into one, two, or more substituents among $R^{11}$ to $R^{17}$, $X^1$, $Y^1$, and $Y^2$ in the Formula (8). Among these substituents, one of the $R^{11}$ to $R^{16}$ and $X^1$ is preferable, one of the $R^{11}$, $R^{13}$, $R^{14}$, and $R^{16}$ is more preferable, and one of the $R^{11}$ and $R^{16}$ is even more preferable.

The dipyrromethene metal complex compound represented by Formula (8) may have a functional group other than the alkali-soluble group, as long as the effects of the present invention are not diminished.

In Formula (8), $R^{12}$ to $R^{15}$ have the same definition as $R^5$ to $R^8$ in the Formula (M), and preferable embodiments thereof are also the same. $R^{17}$ has the same definition as $R^{10}$ in the Formula (M), and preferable embodiments thereof are also the same. Ma has the same definition as Ma in the Formula (7), and preferable embodiments thereof are also the same.

More specifically, among $R^{12}$ to $R^{15}$ in the Formula (8), as $R^{12}$ and $R^{15}$, an alkoxycarbonyl group, an aryloxycarbonyl group, a carbamoyl group, an alkylsulfonyl group, an arylsulfonyl group, a nitrile group, an imide group, or a carbamoylsulfonyl group is preferable, an alkoxycarbonyl group, an aryloxycarbonyl group, a carbamoyl group, an alkylsulfonyl group, a nitrile group, an imide group, or a carbamoylsulfonyl group is more preferable, an alkoxycarbonyl group, an aryloxycarbonyl group, a carbamoyl group, a nitrile group, an imide group, or a carbamoylsulfonyl group is even more preferable, and an alkoxycarbonyl group, an aryloxycarbonyl group, or a carbamoyl group is particularly preferable.

As $R^{13}$ and $R^{14}$, a substituted or unsubstituted alkyl group, a substituted or unsubstituted aryl group, and a substituted or unsubstituted heterocyclic group are preferable, and a substituted or unsubstituted alkyl group and a substituted or unsubstituted aryl group are more preferable. Specific examples of the more preferable alkyl group, aryl group, and heterocyclic group include the same specific examples as exemplified for $R^6$ and $R^7$ of Formula (M).

In Formula (8), $R^{11}$ and $R^{16}$ represents an alkyl group (a linear, branched, or cyclic alkyl group preferably having 1 to 36 carbon atoms and more preferably having 1 to 12 carbon atoms, for example, a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, or a 1-adamantyl group), an alkenyl group (an alkenyl group preferably having 2 to 24 carbon atoms and more preferably having 2 to 12 carbon atoms, for example, a vinyl group, an allyl group, or a 3-buten-1-yl group), an aryl group (an aryl group preferably having 6 to 36 carbon atoms and more preferably having 6 to 18 carbon atoms, for example, a phenyl group or a naphthyl group), a heterocyclic group (a heterocyclic group preferably having 1 to 24 carbon atoms and more preferably having 1 to 12 carbon atoms, for example, a 2-thienyl group, a 4-pyridyl group, a 2-furyl group, a 2-pyrimidinyl group, a 2-pyridyl group, a 2-benzothiazolyl group, a 1-imidazolyl group, a 1-pyrazolyl group, or a benzotriazol-1-yl group), an alkoxy group (an alkoxy group preferably having 1 to 36 carbon atoms and more preferably having 1 to 18 carbon atoms, for example, a methoxy group, an ethoxy group, a propyloxy group, a butoxy group, a hexyloxy group, a 2-ethylhexyloxy group, a dodecyloxy group, or a cyclohexyloxy group), an aryloxy group (an aryloxy group preferably having 6 to 24 carbon atoms and more preferably having 1 to 18 carbon atoms, for example, a phenoxy group or a naphthyloxy group), an alkylamino group (an alkylamino group preferably having 1 to 36 carbon atoms and more preferably having 1 to 18 carbon atoms, for example, a methylamino group, an ethylamino group, a propylamino group, a butylamino group, a hexylamino group, a 2-ethylhexylamino group, an isopropylamino group, a t-butylamino group, a t-octylamino group, a cyclohexylamino group, a N,N-diethylamino group, a N,N-dipropylamino group, a N,N-dibutylamino group, or N-methyl-N-ethylamino group), an arylamino group (an arylamino group preferably having 6 to 36 carbon atoms and more preferably having 6 to 18 carbon atoms, for example, a phenylamino group, a naphthylamino group, a N,N-diphenylamino group, or a N-ethyl-N-phenylamino group), or a heterocyclic amino group (a heterocyclic amino group preferably having 1 to 24 carbon atoms and more preferably having 1 to 12 carbon atoms, for example, a 2-aminopyrrole group, a 3-aminopyrazole group, a 2-aminopyridine group, or a 3-aminopyridine group).

Among the above groups, as $R^{11}$ and $R^{16}$, an alkyl group, an alkenyl group, an aryl group, a heterocyclic group, an alkylamino group, an arylamino group, and a heterocyclic amino group are preferable, an alkyl group, an alkenyl group, an aryl group, and a heterocyclic group are more preferable, an alkyl group, an alkenyl group, and an aryl group are even more preferable, and an alkyl group is particularly preferable.

In Formula (8), when the alkyl group, alkenyl group, aryl group, heterocyclic group, alkoxy group, aryloxy group, alkylamino group, arylamino group, or heterocyclic amino group represented by $R^{11}$ and $R^{16}$ is a group that can be further substituted, the group may be substituted with the substituents described in the above section of Substituent Group A. When the group is substituted with two or more substituents, these substituents may be the same as or different from each other.

In Formula (8), each of $X^2$ and $X^3$ independently represents NR, a nitrogen atom, an oxygen atom, or a sulfur atom. Here, R represents a hydrogen atom, an alkyl group (a linear, branched, or cyclic alkyl group preferably having 1 to 36 carbon atoms and more preferably having 1 to 12 carbon atoms, for example, a methyl group, an ethyl group, a propyl group, an isopropyl group, a butyl group, an isobutyl group, a t-butyl group, a hexyl group, a 2-ethylhexyl group, a dodecyl group, a cyclopropyl group, a cyclopentyl group, a cyclohexyl group, or a 1-adamantyl group), an alkenyl group (an alkenyl group preferably having 2 to 24 carbon atoms and more preferably having 2 to 12 carbon atoms, for example, a vinyl group, an allyl group, or a 3-buten-1-yl group), an aryl group (an aryl group preferably having 6 to 36 carbon atoms and more preferably having 6 to 18 carbon atoms, for example, a phenyl group or a naphthyl group), a heterocyclic group (a heterocyclic group preferably having 1 to 24 carbon atoms and more preferably having 1 to 12 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, or a benzotriazol-1-yl group), an acyl group (an acyl group preferably having 1 to 24 carbon atoms and more preferably having 2 to 18 carbon atoms, for example, an acetyl group, a pivaloyl group, a 2-ethylhexyl group, a benzoyl group, or a cyclohexanoyl group), an alkylsulfonyl group (an alkylsulfonyl group preferably having 1 to 24 carbon atoms and more preferably having 1 to 18 carbon atoms, for example, a methylsulfonyl group, an ethylsulfonyl group, an isopropylsulfonyl group, or a cyclohexylsulfonyl group), or an arylsulfonyl group (an arylsulfonyl group preferably having 6 to 24 carbon atoms and more preferably having 6 to 18 carbon atoms, for example, a phenylsulfonyl group or a naphthylsulfonyl group).

In Formula (8), each of $Y^1$ and $Y^2$ independently represents $NR^c$, a nitrogen atom, or a carbon atom. $R^c$ has the same definition as R of $X^2$ and $X^3$, and the preferable embodiments thereof are also the same.

In Formula (8), $R^{11}$ and $Y^1$ may form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, or a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a piperidine ring, a piperazine ring, a pyridazine ring, a quinoline ring, or a quinazoline ring), or a 7-membered ring (for example, a cycloheptane ring or a hexamethylene imine ring) together with a carbon atom by being bonded to each other.

In the Formula (8), $R^{16}$ and $Y^2$ may form a 5-membered ring (for example, a cyclopentane ring, a pyrrolidine ring, a tetrahydrofuran ring, a dioxolane ring, a tetrahydrothiophene ring, a pyrrole ring, a furan ring, a thiophene ring, an indole ring, a benzofuran ring, or a benzothiophene ring), a 6-membered ring (for example, a cyclohexane ring, a piperidine ring, a piperazine ring, a morpholine ring, a tetrahydropyran ring, a dioxane ring, a pentamethylene sulfide ring, a dithiane ring, a benzene ring, a piperidine ring, a piperazine ring, a pyridazine ring, a quinoline ring, or a quinazoline ring), or a 7-membered ring (for example, a cycloheptane ring or a hexamethylene imine ring) together with a carbon atom by being bonded to each other.

In Formula (8), when the 5-, 6-, and 7-membered rings that $R^{11}$ and $Y^1$ as well as $R^{16}$ and $Y^2$ form by being bonded to each other are substitutable rings, the rings may be substituted with the substituents described in the above section of Substituent Group A. When the rings are substituted with two or more substituents, these substituents may be the same as or different from each other.

In Formula (8), it is preferable for each of $R^{11}$ and $R^{16}$ to be independently a monovalent substituent of which an −Es value as a steric parameter is 1.5 or greater. The −Es value is more preferably 2.0 or greater, even more preferably 3.5 or greater, and particularly preferably 5.0 or greater.

The −Es value as a steric parameter is a parameter that represents steric bulkiness of a substituent. As the value, the −Es' value disclosed in the document (J. A. Macphee, et al, Tetrahedron, Vol. 34, pp 3553-3562, and Chemistry Special Edition 107, Structure-activity Correlation and Drug Design, edited by Toshio Fujita, published Feb. 20, 1986 (Kagaku-Doujin Publishing Company, Inc.)) is used.

In Formula (8), $X^1$ represents a group that can be bonded to Ma. Specific examples thereof include the same group as represented by $X^1$ in the Formula (7), and the preferable embodiments are also the same. a represents 0, 1, or 2.

In a preferable embodiment of the compound represented by Formula (8), each of $R^{12}$ to $R^{15}$ independently represents the group described as the preferable embodiment of $R^5$ to $R^8$ in the Formula (M); $R^{17}$ represents the group described as the preferable embodiment of $R^{16}$ in the Formula (M); Ma represents Zn, Cu, Co, or V═O; $X^2$ represents NR (R represents a hydrogen atom or an alkyl group), a nitrogen atom, or an oxygen atom; $X^3$ represents NR (R represents a hydrogen atom or an alkyl group) or an oxygen atom; $Y^1$ represents $NR^c$ ($R^c$ represents a hydrogen atom or an alkyl group), a nitrogen atom, or a carbon atom; $Y^2$ represents a nitrogen atom or a carbon atom; each of $R^{11}$ and $R^{16}$ is independently an alkyl group, an aryl group, a heterocyclic group, an alkoxy group, or an alkylamino group; $X^1$ represents a group bonded via an oxygen atom; and a represents 0 or 1. $R^{11}$ and $Y^1$ may form a 5- or 6-membered ring by being bonded to each other; or $R^{16}$ and $Y^2$ may form a 5- or 6-membered ring by being bonded to each other.

In a more preferable embodiment of the compound represented by Formula (8), each of $R^{12}$ to $R^{15}$ independently represents the group described as the preferable embodiment of $R^5$ to $R^8$ in the compound represented by Formula (M); $R^{17}$ represents the preferable embodiment described as the preferable embodiment of $R^{10}$ in the Formula (M); Ma is Zn; $X^2$ and $X^3$ are oxygen atoms; $Y^1$ is NH; $Y^2$ is a nitrogen atom; each of and $R^{16}$ is independently an alkyl group, an aryl group, a heterocyclic group, an alkoxy group, or an alkylamino group; $X^1$ is a group bonded via an oxygen atom; and a is 0 or 1. $R^{11}$ and $Y^1$ may form a 5- or 6-membered ring by being bonded to each other; or $R^{16}$ and $Y^2$ may form a 5- or 6-membered ring by being bonded to each other.

In view of a coloring ability, the molar absorption coefficient of the dipyrromethene metal complex compound represented by the Formula (7) and Formula (8) is preferably as high as possible. Moreover, in view of improving color purity, the maximum absorption wavelength λmax is preferably 520 nm to 580 nm and more preferably 530 nm to 570 nm. If the value is within this range, it is possible to prepare a color filter having excellent color reproducibility by using the colored radiation-sensitive composition of the present invention.

Further, an absorbance at the maximum absorption wavelength (λmax) of the dye multimer (A) having a dye structure derived from a dipyrromethene dye is preferably 1,000 times or higher, more preferably 10,000 times or higher, and even more preferably 100,000 times or higher than the absorbance at 450 nm. If the ratio is in this range, particularly when a blue color filter is prepared using the colored radiation-sensitive composition of the present invention, a color filter having a higher transmissivity can be formed. In addition, the maximum absorption wavelength and molar absorption coefficient are measured by a spectrophotometer Cary 5 (manufactured by Varian).

From the viewpoint of solubility, it is preferable for the melting point of the dipyrromethene metal complex compound represented by Formula (7) and Formula (8) not to be too high.

The dipyrromethene metal complex compound represented by the Formula (7) and Formula (8) can be synthesized by the method described in U.S. Pat. No. 4,774,339A, U.S. Pat. No. 5,433,896A, JP2001-240761A, JP2002-155052A, JP3614586B, Aust. J. Chem, 1965, 11, 1835-1845, J. H. Boger et al., Heteroatom Chemistry, Vol. 1, No. 5,389 (1990), and the like. Specifically, the method described in paragraphs 0131 to 0157 of JP2008-292970A can be used.

Specific examples of the dipyrromethene dye will be shown below, but the present invention is not limited thereto.

[Chem. 16]

(PM-1)

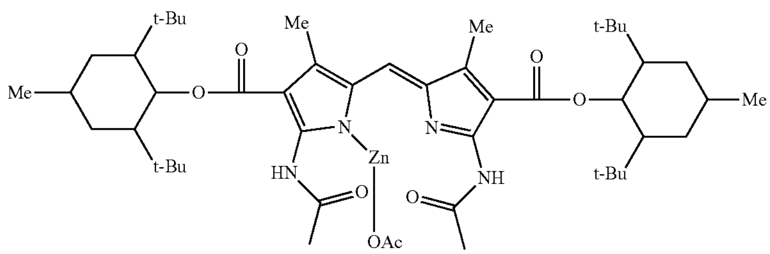

(PM-2)

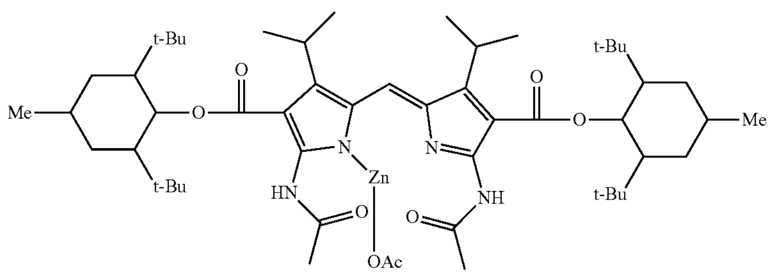

(PM-3)

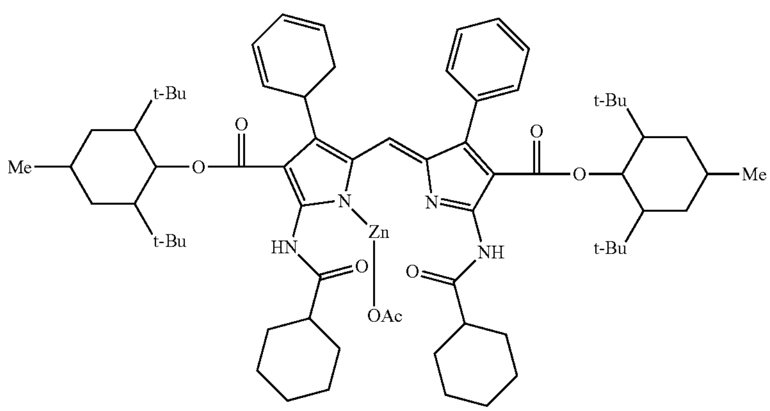

(PM-4)

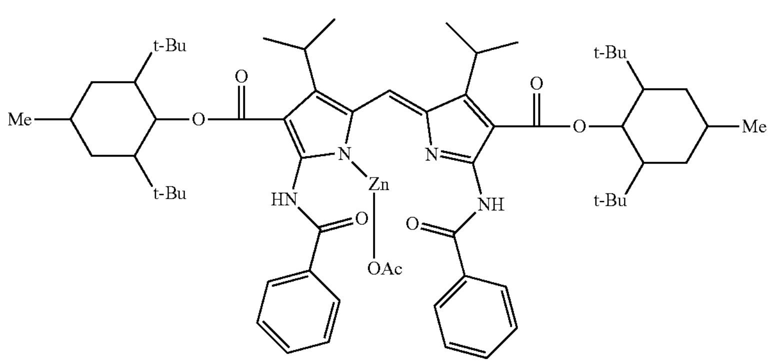

-continued
(PM-5)
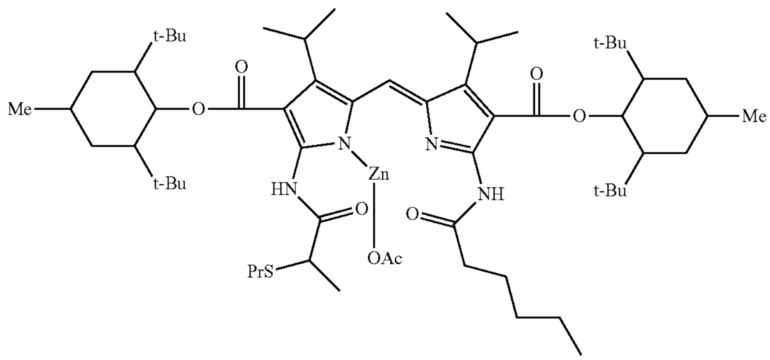
(PM-6)
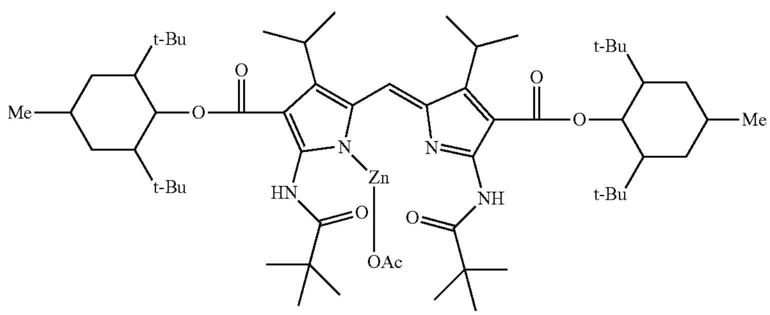
(PM-7)
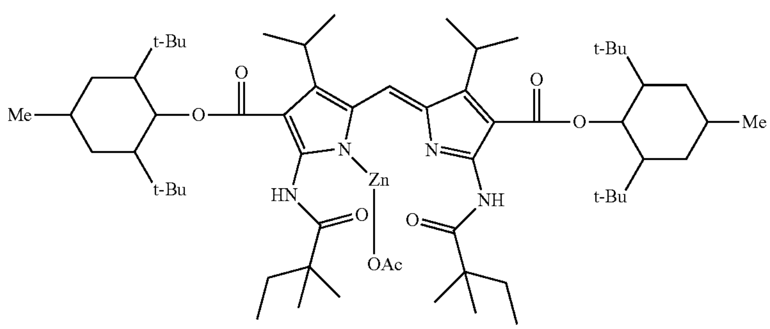
(PM-8)
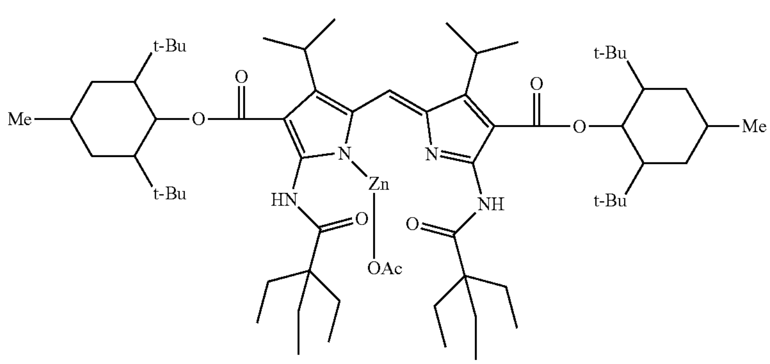

-continued
(PM-9)
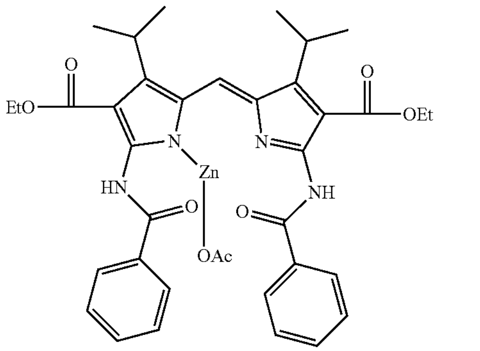
(PM-10)
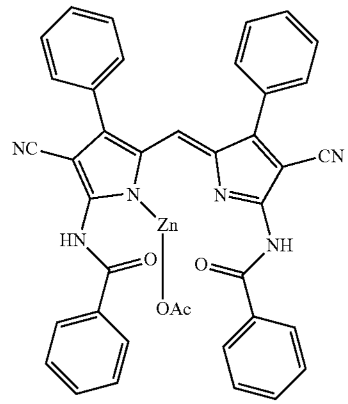
[Chem. 17]
(PM-11)
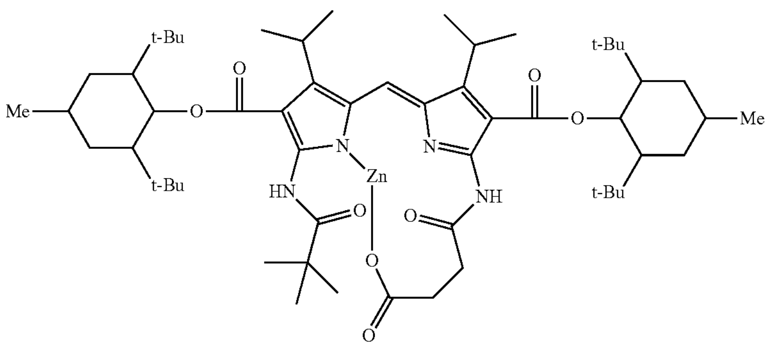
(PM-12)
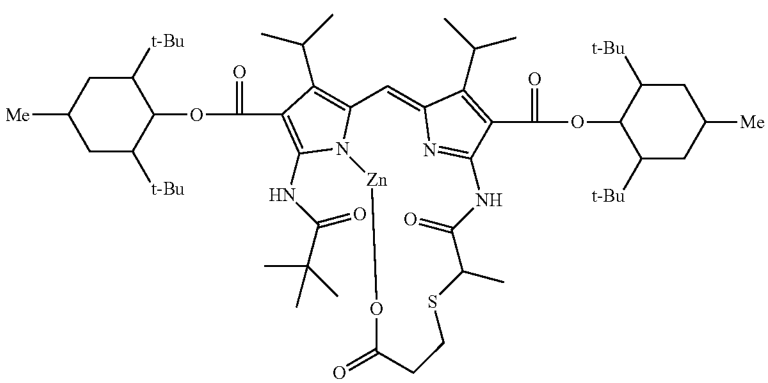
(PM-13)
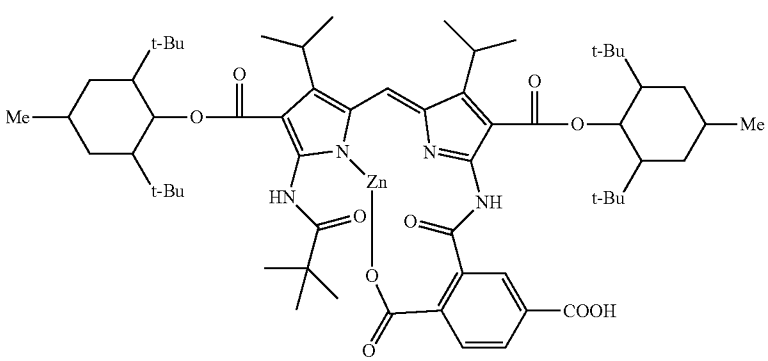

-continued
(PM-14)
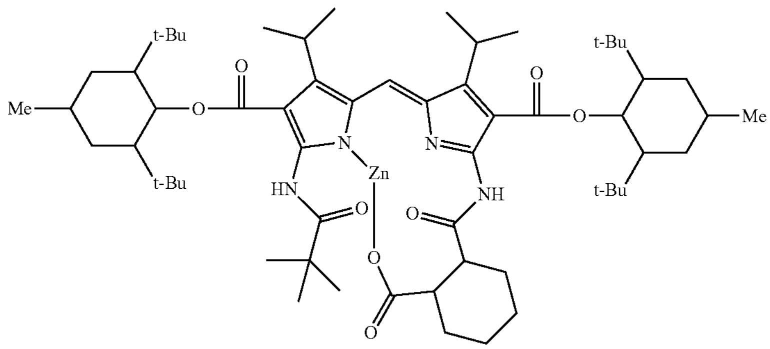
(PM-15)
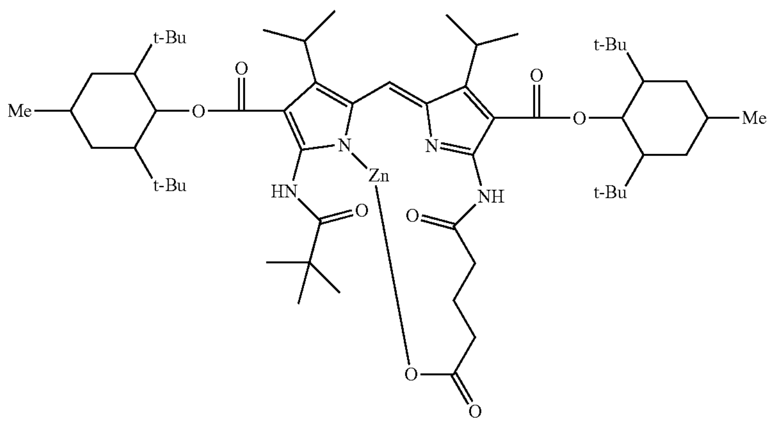
(PM-16)
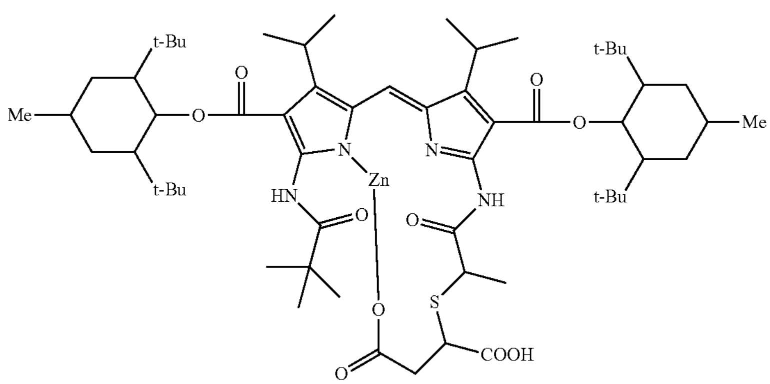
(PM-17)
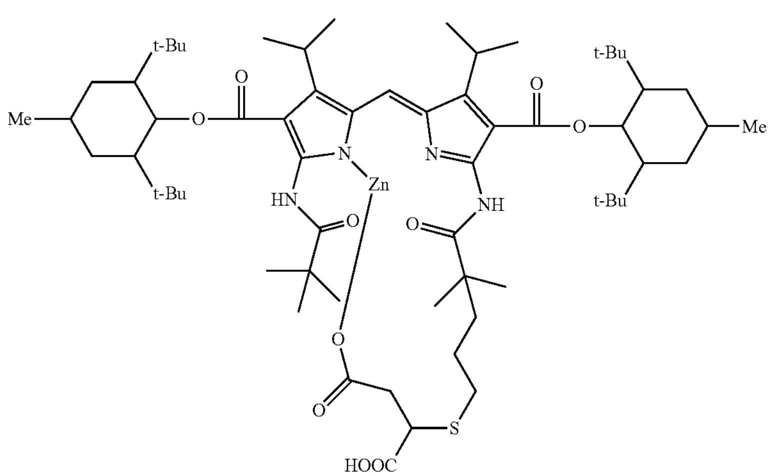

-continued (PM-18)

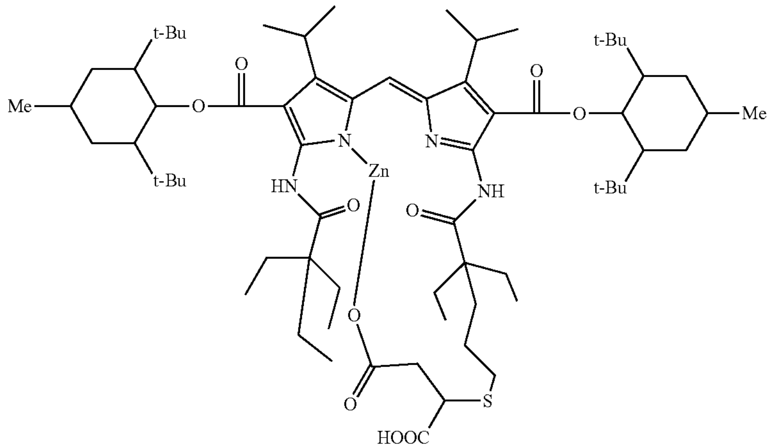

Among the above specific examples, from the viewpoint of color characteristics and heat resistance, (PM-8) and (PM-18) are particularly preferable.

(Azo Dye)

One of the preferable embodiments of the dye multimer (A) according to the present invention is a dye multimer that has an azo dye (azo compound)-derived partial structure as a partial structure of the dye moiety. In the present invention, the azo compound collectively refers to a compound having a dye moiety containing an N═N group in a molecule thereof The azo dye can be used by being appropriately selected from known azo dyes (for example, substituted azobenzene (specific examples thereof include (AZ-4) to (AZ-6) and the like which will be described later)).

As the azo dye, azo dyes known as a magenta dye and a yellow dye can be used, and among these, azo dyes represented by the following Formula (d), Formula (e), Formula (g), Formula (I-1), Formula (I-2), and Formula (V) are particularly preferable.

<<Magenta Dye>>

Preferable examples of the azo dye include an azo dye represented by the following Formula (d) that is a magenta dye.

[Chem. 18]

Formula (d)

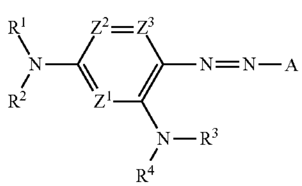

In Formula (d), each of $R^1$ to $R^4$ independently represents a hydrogen atom, an alkyl group, an alkenyl group, an aryl group, a heterocyclic group, an acyl group, an alkoxycarbonyl group, an aryloxycarbonyl group, a carbamoyl group, an alkylsulfonyl group, or an arylsulfonyl group; A represents an aryl group or an aromatic heterocyclic group; each of $Z^1$ to $Z^3$ independently represents —C($R^5$)═ or —N═; and $R^5$ represents a hydrogen atom or a substituent.

Each of the substituents in Formula (d) will be described in detail.

In Formula (d), each of $R^1$ to $R^4$ independently represents a hydrogen atom, an alkyl group (a linear, branched, or cyclic alkyl group preferably having 1 to 36 carbon atoms and more preferably having 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, or 1-adamantyl), an alkenyl group (an alkenyl group preferably having 2 to 24 carbon atoms more preferably having 2 to 12 carbon atoms, for example, vinyl, allyl, or 3-buten-1-yl), an aryl group (an aryl group preferably having 6 to 36 carbon atoms and more preferably having 6 to 18 carbon atoms, for example, phenyl or naphthyl), a heterocyclic group (a heterocyclic group preferably having 1 to 24 carbon atoms more preferably having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl, or benzotriazol-1-yl), an acyl group (an acyl group preferably having 1 to 24 carbon atoms and more preferably having 2 to 18 carbon atoms, for example, acetyl, pivaloyl, 2-ethylhexyl, benzoyl, or cyclohexanoyl), an alkoxycarbonyl group (an alkoxycarbonyl group preferably having 1 to 10 carbon atoms and more preferably having 1 to 6 carbon atoms, for example, methoxycarbonyl or ethoxycarbonyl), an aryloxycarbonyl group (an aryloxycarbonyl group preferably having 6 to 15 carbon atoms and more preferably having 6 to 10 carbon atoms, for example, phenoxycarbonyl), a carbamoyl group (a carbamoyl group preferably having 1 to 8 carbon atoms and more preferably having 2 to 6 carbon atoms, for example, dimethylcarbamoyl), an alkylsulfonyl group (an alkylsulfonyl group preferably having 1 to 24 carbon atoms and more preferably having 1 to 18 carbon atoms, for example, methylsulfonyl, ethylsulfonyl, isopropylsulfonyl, or cyclohexylsulfonyl), or an arylsulfonyl group (an arylsulfonyl group preferably having 6 to 24 carbon atoms and more preferably having 6 to 18 carbon atoms, for example, phenylsulfonyl or naphthylsulfonyl).

Preferably, each of $R^1$ and $R^3$ independently is an alkyl group, an alkenyl group, an aryl group, or a heterocyclic group. Preferably, each of $R^2$ and $R^4$ independently is a hydrogen atom or an alkyl group.

When $R^1$ to $R^4$ are substitutable groups, for example, these groups may be substituted with the substituents described in the above section of Substituent Group A. When these groups have two or more substituents, these substituents may be the same as or different from each other.

$R^1$ and $R^2$, $R^1$ and $R^5$ (in a case where $Z^1$ or $Z^2$ represents —C($R^5$)═), $R^3$ and $R^4$, and $R^3$ and $R^5$ (in a case where $Z^1$ represents —C($R^5$)═) may form a 5- or 6-membered ring by being bonded to each other.

Each of $Z^1$ to $Z^3$ independently represents —C($R^5$)═ or —N═, and $R^5$ represents a hydrogen atom or a substituent. Examples of the substituent represented by $R^5$ include the substituents exemplified in the above section of substituents. When the substituent represented by $R^5$ is a group that can be further substituted, the group may be substituted with, for example, the substituents described in the above section of Substituent Group A. When the group is substituted with two or more substituents, these substituents may be the same as or different from each other.

Regarding $Z^1$ to $Z^3$, $Z^1$ is preferably —N═, $Z^2$ is preferably —C($R^5$)═ or —N═, and $Z^3$ is preferably —C($R^5$)═. $Z^1$ is more preferably —N═, and $Z^2$ and $Z^3$ are more preferably —C($R^5$)═.

A represents an aryl group or an aromatic heterocyclic group. The aryl group and aromatic heterocyclic group represented by A may further have, for example, the substituents described in the above section of substituents. When the groups are substituted with two or more substituents, these substituents may be the same as or different from each other.

A is preferably an aromatic heterocyclic group. More preferably, examples of A include an imidazole ring, a pyrazole ring, a triazole ring, a thiazole ring, an oxazole ring, a 1,2,4-thiadiazole ring, a 1,3,4-thiadiazole ring, a pyridine ring, a pyrimidine ring, a pyrazine ring, a benzopyrazole ring, a benzothiazole ring, and the like.

In Formula (d), the site at which the polymerizable group involved in multimerization (formation of the dye multimer (A)) is introduced is not particularly limited. However, in view of synthesis suitability, the polymerizable group is preferably introduced at one, two, or more sites among $R^1$, $R^2$, and A, and more preferably introduced at $R^1$ and/or A.

The azo dye represented by Formula (d) is more preferably an azo dye represented by the following Formula (d')

[Chem. 19]

Formula (d')

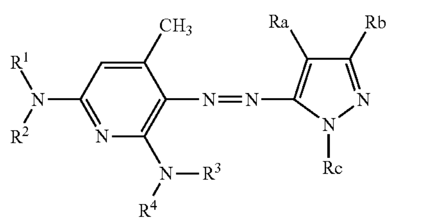

In Formula (d'), $R^1$ to $R^4$ have the same definition as $R^1$ to $R^4$ in the Formula (d), and the preferable range thereof is also the same. Ra represents an electron-attracting group having a Hammett substituent constant σp of 0.2 or greater, and Rb represents a hydrogen atom or a monovalent substituent. Rc represents an alkyl group, an alkenyl group, an aryl group, a heterocyclic group, an acyl group, an alkoxycarbonyl group, a carbamoyl group, an alkylsulfonyl group, or an arylsulfonyl group.

Examples of the substituent represented by Rb include the substituents exemplified in the above section of Substituent Group A.

Suitable examples of the azo dye also include an azo dye represented by the following Formula (e) that is a magenta dye.

[Chem. 20]

Formula (e)

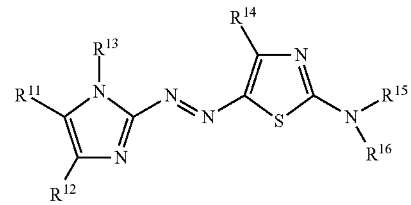

In Formula (e), each of $R^{11}$ to $R^{16}$ independently represents a hydrogen atom or a monovalent substituent. $R^{11}$ and $R^{12}$, and $R^{15}$ and $R^{16}$ may independently form a ring by being bonded to each other respectively.

Each of the substituents in Formula (e) will be described in detail.

Each of $R^{11}$ to $R^{16}$ independently represents a hydrogen atom or a monovalent substituent. Examples of the monovalent substituent include a halogen atom, an alkyl group having 1 to 30 carbon atoms (herein, refers to a saturated aliphatic group including a cycloalkyl group and a bicycloalkyl group), an alkenyl group having 2 to 30 carbon atoms (herein, refers to an unsaturated aliphatic group having a double bond, including a cycloalkenyl group and a bicycloalkenyl group), an alkynyl group having 2 to 30 carbon atoms, an aryl group having 6 to 30 carbon atoms, a heterocyclic group having 3 to 30 carbon atoms, a cyano group, an aliphatic oxy group having 1 to 30 carbon atoms, an aryloxy group having 6 to 30 carbon atoms, an acyloxy group having 2 to 30 carbon atoms, a carbamoyloxy group having 1 to 30 carbon atoms, an aliphatic oxycarbonyloxy group having 2 to 30 carbon atoms, an aryloxycarbonyloxy group having 7 to 30 carbon atoms, an amino group having 0 to 30 carbon atoms (including an alkylamino group, an anilino group, and a heterocyclic amino group), an acylamino group having 2 to 30 carbon atoms, an aminocarbonylamino group having 1 to 30 carbon atoms, an aliphatic oxycarbonylamino group having 2 to 30 carbon atoms, an aryloxycarbonylamino group having 7 to 30 carbon atoms, a sulfamoylamino group having 0 to 30 carbon atoms, an alkyl or aryl sulfonylamino group having 1 to 30 carbon atoms, an alkylthio group having 1 to 30 carbon atoms, an arylthio group having 6 to 30 carbon atoms, a sulfamoyl group having 0 to 30 carbon atoms, an alkyl or aryl sulfinyl group having 1 to 30 carbon atoms, an alkyl or aryl sulfonyl group having 1 to 30 carbon atoms, an acyl group having 2 to 30 carbon atoms, an aryloxycarbonyl group having 6 to 30 carbon atoms, an aliphatic oxycarbonyl group having 2 to 30 carbon atoms, a carbamoyl group having 1 to 30 carbon atoms, an aryl or heterocyclic azo group having 3 to 30 carbon atoms, and an imide group. Each of these groups may further have a substituent.

Each of $R^{11}$ and $R^{12}$ preferably independently represents a hydrogen atom, a heterocyclic group, or a cyano group, and more preferably represents a cyano group.

Each of $R^{13}$ and $R^{14}$ preferably independently represents a hydrogen atom, a substituted or unsubstituted alkyl group, or a substituted or unsubstituted aryl group, and more preferably represents a substituted or unsubstituted alkyl group.

Each of $R^{15}$ and $R^{16}$ preferably independently represents a hydrogen atom, a substituted or unsubstituted alkyl group, or a substituted or unsubstituted aryl group, and more preferably represents a substituted or unsubstituted alkyl group.

In Formula (e), the site at which the polymerizable group involved in multimerization (formation of the dye multimer (A)) is introduced is not particularly limited. However, in view of synthesis suitability, the polymerizable group is preferably introduced at one, two, or more sites among $R^{13}$, $R^{15}$, and $R^{16}$, more preferably introduced at $R^{13}$ and/or $R^{15}$, and even more preferably introduced at $R^{13}$.

Among the above azo dyes, the azo dye represented by Formula (e) is more preferable as a magenta dye.

—Yellow Dye—

Preferable examples of the azo dyes include the azo dyes (including a tautomer thereof) as yellow dyes represented by the following Formula (I-1), Formula (I-2), and Formula (V).

[Chem. 21]

Formula (I-1)

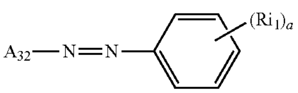

Formula (I-2)

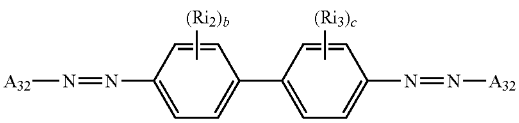

In Formula (I-1) and Formula (I-2), each of $Ri_1$, $Ri_2$, and $Ri_3$ independently represents a monovalent substituent, and a represents an integer from 0 to 5. When a is 2 or greater, two adjacent $Ri_1$s may be linked to each other to form a condensed ring. Each of b and c independently represents an integer from 0 to 4. When b and c are 1 or greater, two adjacent $Ri_1$s may be linked to each other to form a ring. $A_{32}$ represents the following Formula (IA), Formula (IB), or Formula (IC).

[Chem. 22]

Formula (IA)

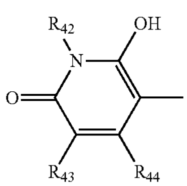

In Formula (IA), $R_{42}$ represents a hydrogen atom, an alkyl group, or an aryl group; $R_{43}$ represents a monovalent substituent; and $R_{44}$ represents a hydrogen atom, an alkyl group, or an aryl group.

[Chem. 23]

Formula (IB)

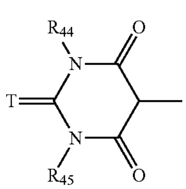

In Formula (IB), each of $R_{44}$ and $R_{45}$ independently represents a hydrogen atom, an alkyl group, or an aryl group; and T represents an oxygen atom or a sulfur atom.

[Chem. 24]

Formula (IC)

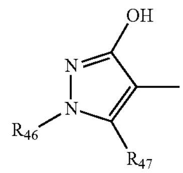

In Formula (IC), $R_{46}$ represents a hydrogen atom, an alkyl group, or an aryl group; and $R_{47}$ represents a monovalent substituent.

Examples of the monovalent substituent represented by $Ri_1$, $Ri_2$, and $Ri_3$ in Formula (I-1) and Formula (I-2) include the substituents exemplified in the above section of Substituent Group A. More specific examples of the monovalent substituent include an alkyl group (a linear, branched, or cyclic alkyl group preferably having 1 to 10 carbon atoms and more preferably having 1 to 5 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl, or 1-adamantyl), an aryl group (an aryl group preferably having 6 to 36 carbon atoms and more preferably having 6 to 18 carbon atoms, for example, a phenyl, naphthyl, or a sulfonamide group), an alkenyl group (a linear, branched, or cyclic alkenyl group preferably having 1 to 10 carbon atoms more preferably having 1 to 5 carbon atoms, for example, vinyl, allyl, prenyl, geranyl, or oleyl), a sulfo group, and a sulfamoyl group (preferably an alkylsulfamoyl group having 1 to 10 carbon atoms). Among these, an alkyl group having 1 to 5 carbon atoms and an alkylsulfamoyl group having 1 to 10 carbon atoms are particularly preferable. a is preferably 1 to 3, and b and c are preferably 1 to 3.

In Formula (IA), $R_{42}$ represents a hydrogen atom, an alkyl group, or an aryl group and is preferably an alkyl group having 1 to 5 carbon atoms and a phenyl group. Examples of the monovalent substituent represented by $R_{43}$ include the substituents exemplified in the above section of Substituent Group A, and among these, a cyano group and a carbamoyl group are particularly preferable. $R_{44}$ represents a hydrogen atom, an alkyl group, or an aryl group and is particularly preferably an alkyl group having 1 to 5 carbon atoms and a phenyl group In Formula (IB), T represents an oxygen atom or a sulfur atom and is preferably an oxygen atom. Each of $R_{44}$ and $R_{45}$ independently represents a hydrogen atom, an alkyl group, or an aryl group, and is particularly preferably an alkyl group having 1 to 5 carbon atoms and a phenyl group.

In Formula (IC), $R_{46}$ represents a hydrogen atom, an alkyl group, or an aryl group, and is particularly preferably an alkyl group having 1 to 5 carbon atoms and a phenyl group. Examples of the monovalent substituent represented by $R_{47}$ include the substituents exemplified in the above section of Substituent Group A. Among these, a hydrogen atom, an alkyl group and an aryl group are preferable, and an alkyl group having 1 to 5 carbon atoms and a phenyl group are particularly preferable.

[Chem. 25]

Formula (V)

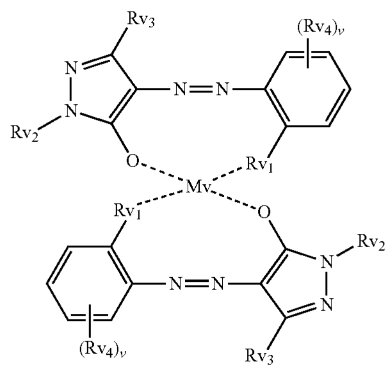

In Formula (V), My represents Cr or Co, and $Rv_1$ represents an oxygen atom or —COO—. Each of $Rv_2$ and $Rv_3$ independently represents a hydrogen atom, an alkyl group, or an aryl group. v represents an integer from 0 to 4, and $Rv_4$ represents a monovalent substituent. When v is 2 or greater, adjacent $Rv_4$s may be linked to each other to form a ring.

$Rv_2$ and $Rv_3$ are particularly preferably an alkyl group having 1 to 5 carbon atoms or a phenyl group. Examples of the monovalent substituent represented by $Rv_4$ include the substituents exemplified in the above section of Substituent Group A. Among these, an alkyl group, an aryl group, a nitro group, a sulfamoyl group, and a sulfo group are particularly preferable, and an alkyl group having 1 to 5 carbon atoms, a phenyl group, and a nitro group are most preferable.

Among the above azo dyes, the azo dyes represented by Formula (I-1), Formula (I-2), and Formula (V) are preferable as yellow dyes.

Specific examples of the azo dyes will be shown below, but the present invention is not limited thereto.

[Chem. 26]

(AZ-1)

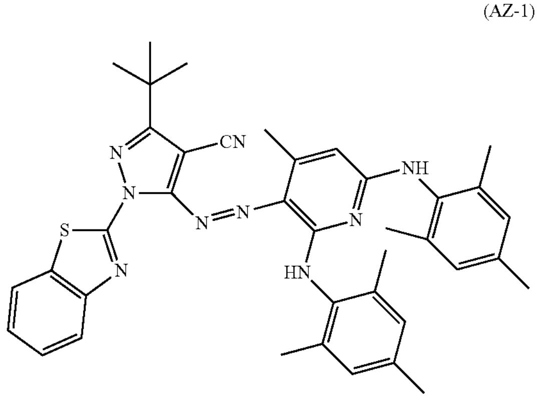

-continued (AZ-2)

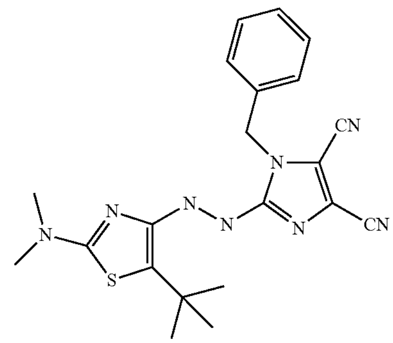

(AZ-3)

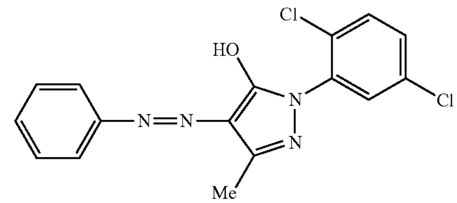

(AZ-4)

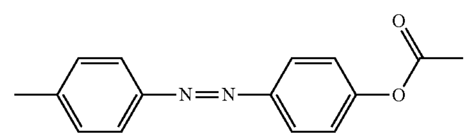

(AZ-5)

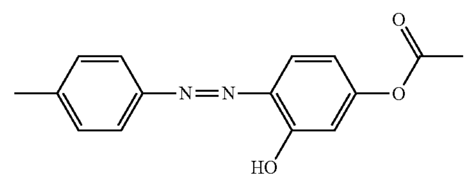

(AZ-6)

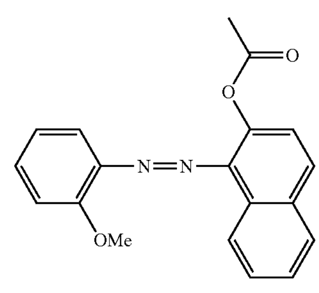

[Chem.27]

(Az-7)

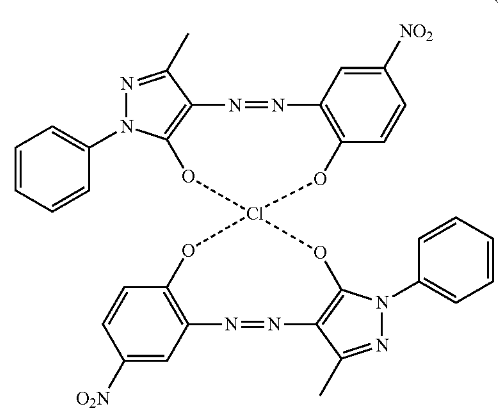

-continued
(AZ-8)
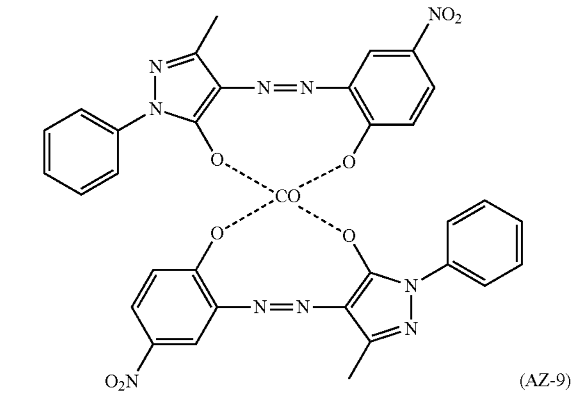
(AZ-9)
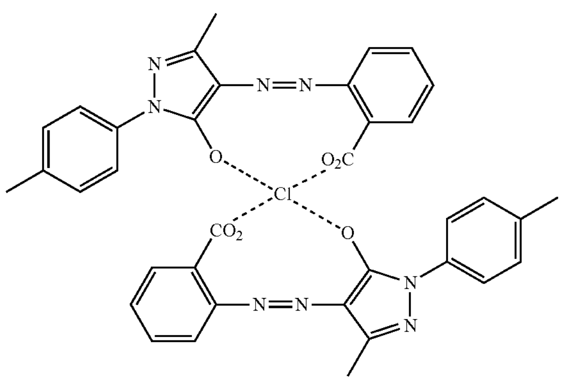
(AZ-10)
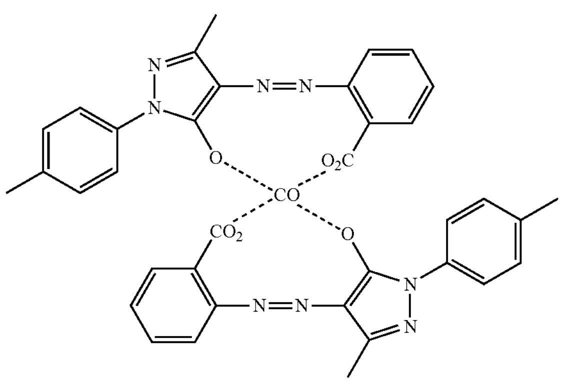
[Chem. 28]
(2-1)
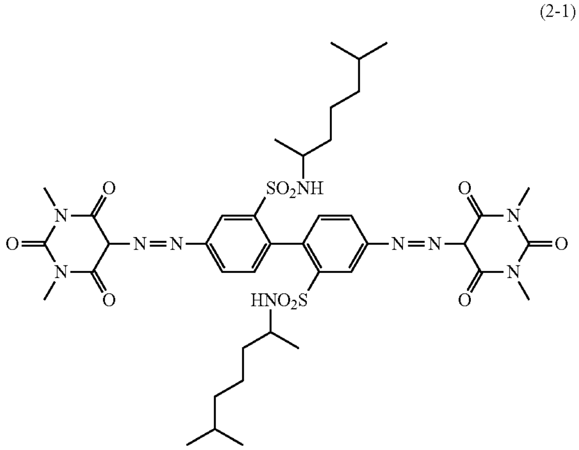
-continued
(2-2)
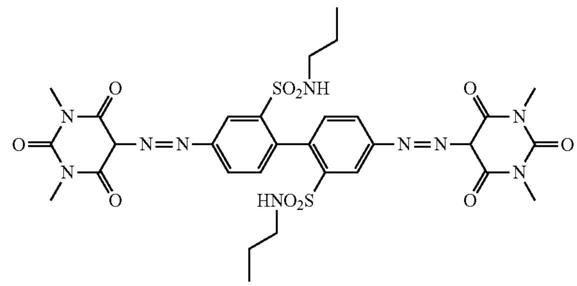
(2-3)
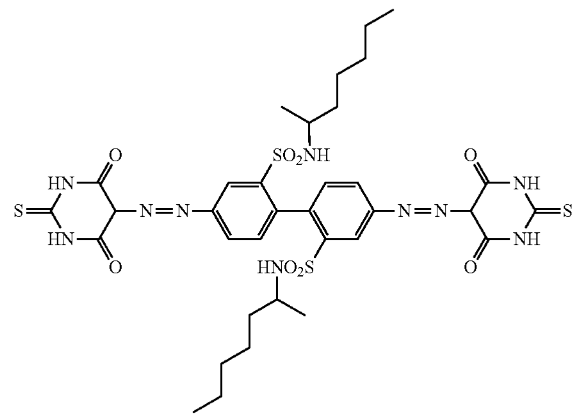
(2-4)
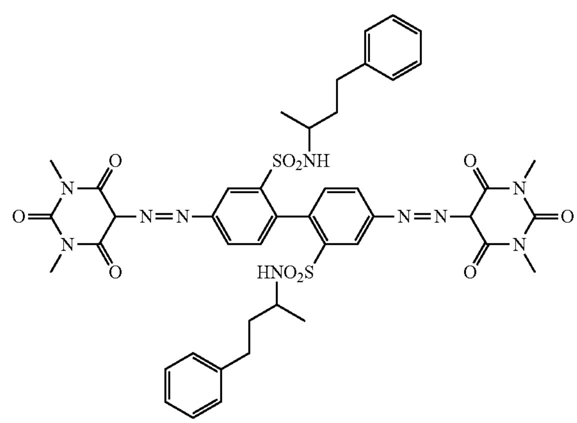
[Chem. 29]
(3-1)
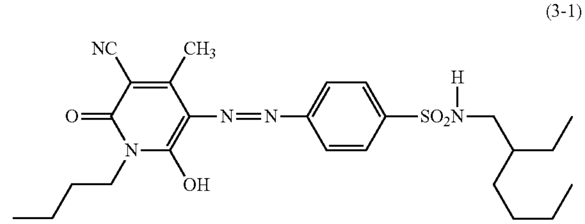

-continued (3-2)

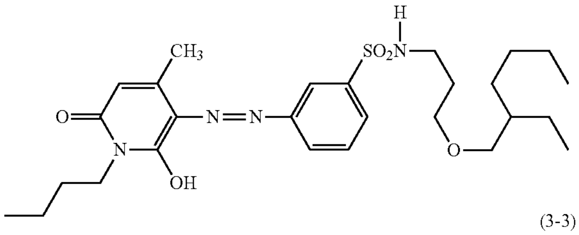

(3-3)

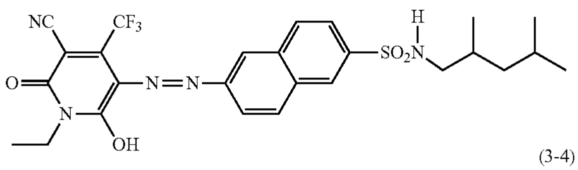

(3-4)

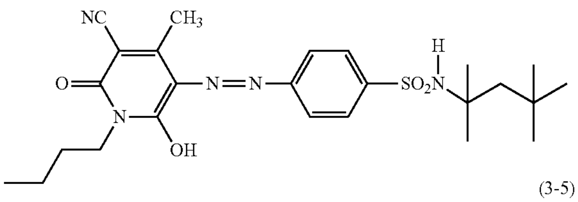

(3-5)

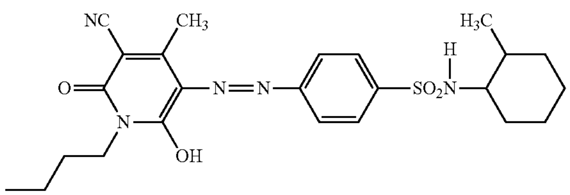

[Chem. 30]

(3-12)

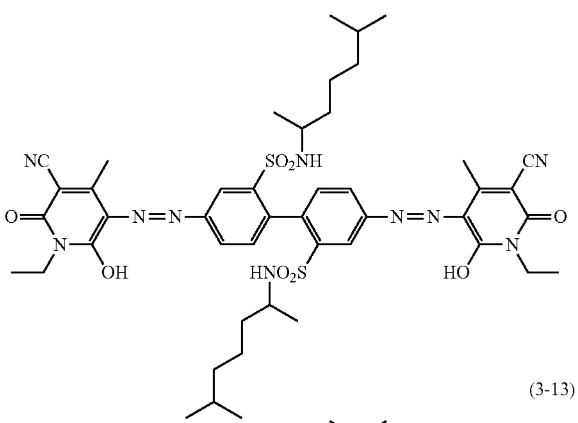

(3-13)

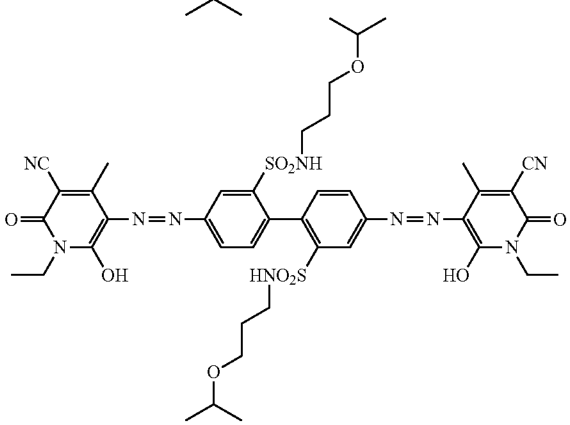

-continued (3-14)

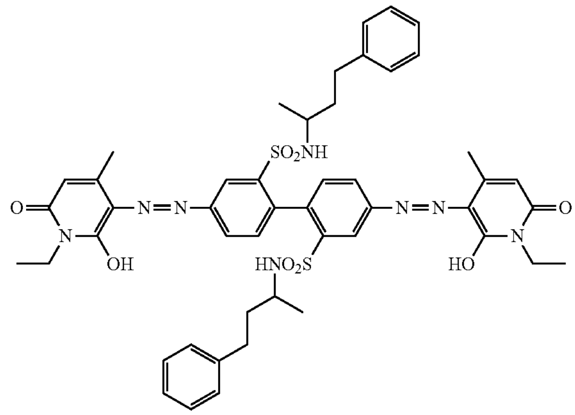

(3-15)

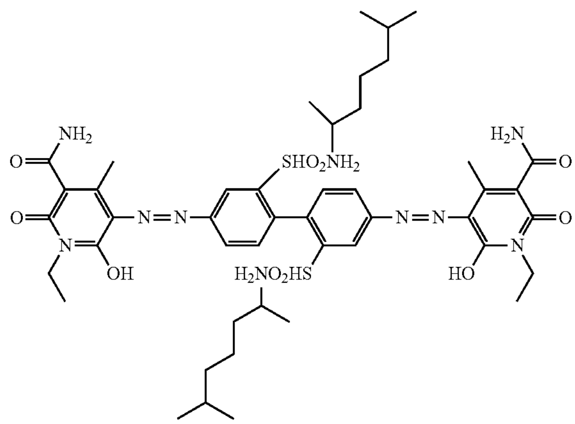

Among the above specific examples, in view of color characteristics and heat resistance, (AZ-7) and (AZ-8), (2-1), (2-2), (2-4), (3-1) to (3-5), and (3-12) to (3-15) are particularly preferable.

(Anthraquinone Dye)

One of the preferable embodiments of the dye multimer (A) according to the present invention is a dye multimer having a partial structure derived from an anthraquinone dye (anthraquinone compound). Such a dye multimer (A) includes a dye multimer that has, as a partial structure of a dye moiety, a partial structure derived from a compound (anthraquinone compound) represented by the following Formulae (AQ-1) to (AQ-3). The anthraquinone compounds in the present invention collectively refer to compounds having a dye moiety containing an anthraquinone skeleton in a molecule thereof.

[Chem. 31]

Formula (AQ-1)

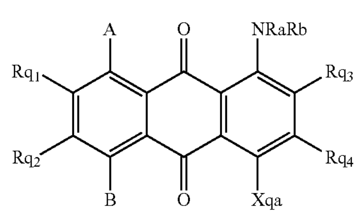

-continued

Formula (AQ-2)

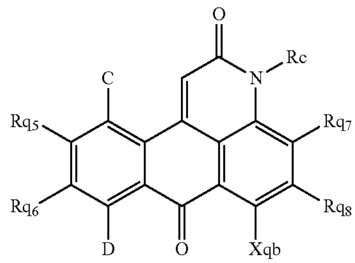

Formula (AQ-3)

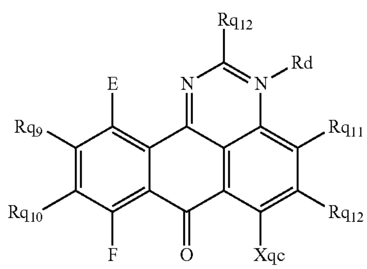

In Formula (AQ-1), each of A and B independently represents an amino group, a hydroxyl group, an alkoxy group, or a hydrogen atom. Xqa represents $ORqa_1$ or $NRqa_2Rqa_3$. Each of $Rqa_1$ to $Rqa_3$ independently represents a hydrogen atom, an alkyl group, or an aryl group, and $Rq_1$ to $Rq_4$ represent substituents. The substituents that $Rq_1$ to $Rq_4$ may have are the same substituents as exemplified in the above section of Substituent Group A. Each of Ra and Rb independently represents a hydrogen atom, an alkyl group, or an aryl group.

In Formula (AQ-2), C and D have the same definition as A and B in Formula (AQ-1). Xqb represents $ORqb_1$ or $NRqb_2Rqb_3$. Each of $Rqb_1$ to $Rqb_3$ independently represents a hydrogen atom, an alkyl group, or an aryl group, and $Rq_5$ to $Rq_8$ represents substituents. $Rq_5$ to $Rq_8$ have the same definition as $Rq_1$ to $Rq_4$ in Formula (AQ-1). Rc has the same definition as Ra or Rb in Formula (AQ-1).

In Formula (AQ-3), E and F have the same definition as A and B in Formula (AQ-1). Xqc represents $ORqc_1$ or $NRqc_2Rqc_3$. Each of $Rqc_1$ to $Rqc_3$ independently represents a hydrogen atom, an alkyl group, or an aryl group. $Rq_9$ to $Rq_{12}$ have the same definition as $Rq_1$ to $Rq_4$ in Formula (AQ-1). Rd has the same definition as Ra or Rb in Formula (AQ-1).

In Formula (AQ-1), A and B are preferably a hydrogen atom. Xqa is preferably $ORqa_1$ ($Rqa_1$ represents a hydrogen atom, an alkyl group having 1 to 5 carbon atoms, or a phenyl group) or $NRqa_2Rqa_3$ ($Rqa_2$ represents a hydrogen atom, and $Rqa_3$ represents an alkyl group having 1 to 5 carbon atoms or a phenyl group). $R_{q1}$ to $R_{q4}$ are preferably a hydrogen atom, a halogen atom, or an alkoxy group. Ra is preferably a hydrogen atom, and Rb is preferably a hydrogen atom, an alkyl group having 1 to 5 carbon atoms, or a phenyl group.

In Formula (AQ-2), C and D are preferably a hydrogen atom. Xqb is preferably $ORqb_1$ ($Rqb_1$ represents a hydrogen atom, an alkyl group having 1 to 5 carbon atoms, or a phenyl group) or $NRqb_2Rqb_3$ ($Rqb_2$ represents a hydrogen atom, and $Rqb_3$ represents an alkyl group having 1 to 5 carbon atoms or a phenyl group). $Rq_5$ to $Rq_8$ are preferably a hydrogen atom, a halogen atom, or an alkoxy group. Rc is preferably a hydrogen atom, an alkyl group having 1 to 5 carbon atoms, or a phenyl group.

In Formula (AQ-3), E and F are preferably a hydrogen atom. Xqc is preferably $ORqc_1$ ($Rqc_1$ represents a hydrogen atom, an alkyl group having 1 to 5 carbon atoms, or a phenyl group) or $NRqc_2Rqc_3$ ($Rqc_2$ represents a hydrogen atom, and $Rqc_3$ represents an alkyl group having 1 to 5 carbon atoms or a phenyl group). $Rq_9$ to $Rq_{12}$ are preferably a hydrogen atom, a halogen atom, or an alkoxy group. Rd is preferably a hydrogen atom, an alkyl group having 1 to 5 carbon atoms, or a phenyl group.

Specific examples of the anthraquinone dyes will be shown below, but the present invention is not limited thereto.

[Chem. 32]

(aq-1)

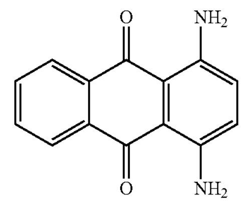

(aq-2)

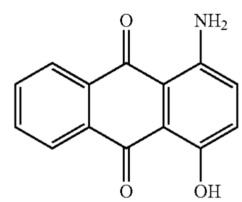

(aq-3)

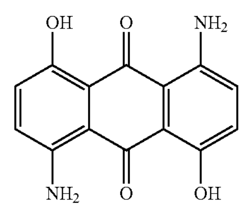

(aq-4)

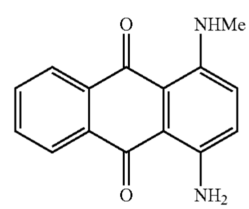

(aq-5)

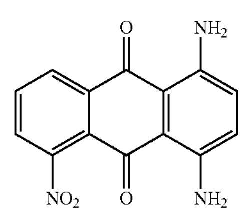

(aq-6)

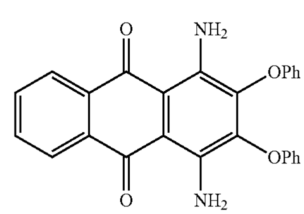

-continued (aq-7)

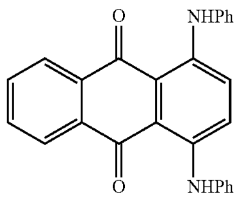

(aq-8)

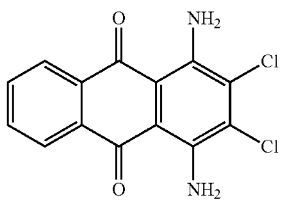

(aq-9)

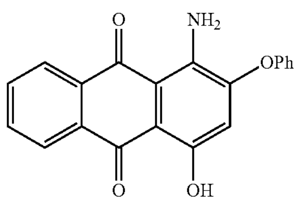

(aq-10)

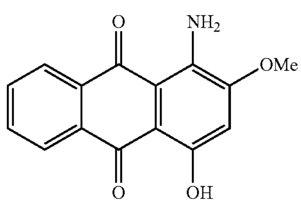

(aq-11)

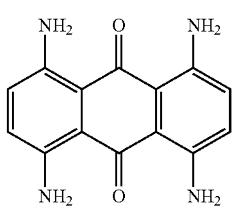

(aq-12)

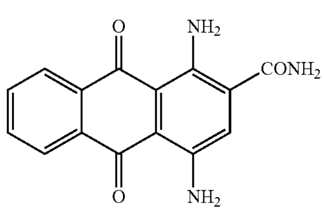

(aq-13)

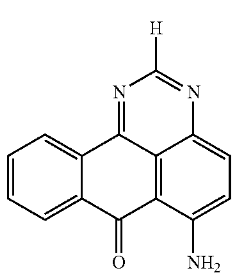

-continued (aq-14)

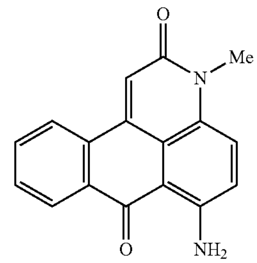

Among the above specific examples, in view of color characteristics and heat resistance, (aq-1) to (aq-4), (aq-13), and (aq-14) are particularly preferable.

(Triphenylmethane Dye)

One of the embodiments of the dye multimer according to the present invention is a dye multimer having a partial structure derived from a triphenylmethane dye (triphenylmethane compound). The dye multimer (A) includes a dye multimer that has, as a partial structure of a dye moiety, a partial structure derived from a compound (triphenylmethane compound) represented by the following Formula (TP). The triphenylmethane compounds in the present invention collectively refer to compounds having a dye moiety containing a triphenylmethane skeleton in a molecule thereof

[Chem. 33]

Formula (TP)

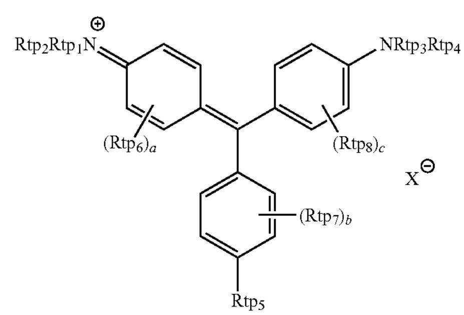

In Formula (TP), each of $Rtp_1$ to $Rtp_4$ independently represents a hydrogen atom, an alkyl group, or an aryl group. $Rtp_5$ represents a hydrogen atom, an alkyl group, an aryl group, or $NRtp_9Rtp_{10}$ ($Rtp_9$ and $Rtp_{10}$ represent a hydrogen atom, an alkyl group, or an aryl group). $Rtp_6$, $Rtp_7$, and $Rtp_8$ represent substituents. a, b, and c represent an integer from 0 to 4. When a, b, and c are 2 or greater, $Rtp_6$, $Rtp_7$, and $Rtp_8$ may be linked to each other respectively to form a ring. $X^-$ represents an anion.

$Rtp_1$ to $Rtp_6$ are preferably a hydrogen atom, a linear or branched alkyl group having 1 to 5 carbon atoms, and a phenyl group. $Rtp_5$ is preferably a hydrogen atom or $NRtp_9Rtp_{10}$, and most preferably $NRtp_9Rtp_{10}$. $Rtp_9$ and $Rtp_{10}$ are preferably a hydrogen atom, a linear or branched alkyl group having 1 to 5 carbon atoms, or a phenyl group. As the substituents represented by $Rtp_6$, $Rtp_7$, and $Rtp_8$, the substituents exemplified in the above section of Substituent Group A can be used. Particularly, a linear or branched alkyl group having 1 to 5 carbon atoms, an alkenyl group having 1 to 5 carbon atoms, an aryl group having 6 to 15 carbon atoms, a carboxyl group, or a sulfo group is preferable, and a linear or branched alkyl group having 1 to 15 carbon atoms, an alkenyl group having 1 to 5 carbon atoms, a phenyl group, or a carboxyl group is more preferable. Particularly, $Rtp_6$ and $Rtp_8$ are preferably an alkyl group having 1 to 5 carbon atoms, and $Rtp_7$ is preferably an alkenyl group (particularly preferably a phenyl group formed when two adjacent alkenyl groups are linked to each other), a phenyl group, or a carboxyl group.

Each of a, b, and c independently represents an integer from 0 to 4. Particularly, a and b are preferably 0 to 1, and c is preferably 0 to 2.

$X^-$ represents an anion. Specific examples of $X^-$ include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion and a benzoate anion, organic sulfonate anions such as a benzene sulfonate anion, a toluene sulfonate anion, and trifluoromethane sulfonate anion, organic phosphate anions such as an octyl phosphate anion, a dodecyl phosphate anion, an octadecyl phosphate anion, a phenyl phosphate anion, and a nonyl phenyl phosphate anion, and the like. $X^-$ may be linked to the dye skeleton, and may be linked to a portion (polymer chain or the like) of the dye multimer.

$X^-$ is preferably a fluorine anion, a chlorine anion, a bromine anion, an iodine anion, a perchlorate anion, or a carboxylic acid anion, and most preferably a perchlorate anion or a carboxylic acid anion.

Specific examples of the compounds represented by Formula (TP) will be shown below, but the present invention is not limited thereto.

[Chem. 34]

(tp-1)

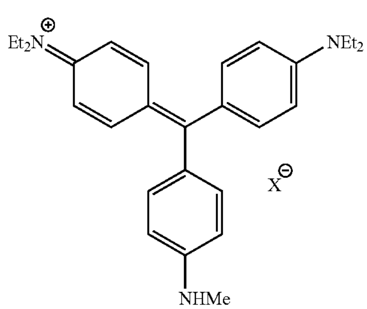

(tp-2)

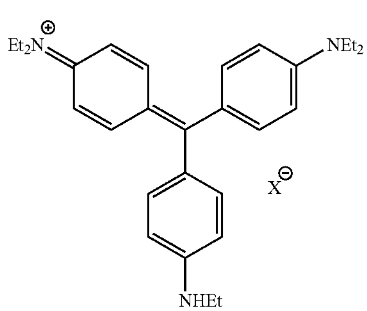

-continued (tp-3)

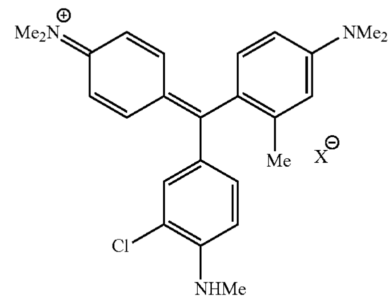

(tp-4)

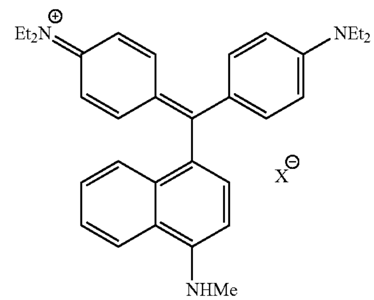

(tp-5)

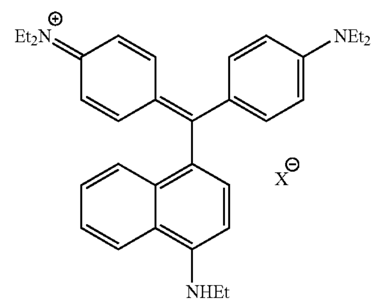

(tp-6)

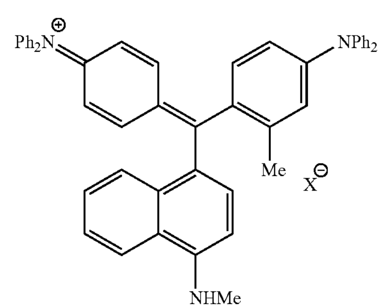

(tp-7)

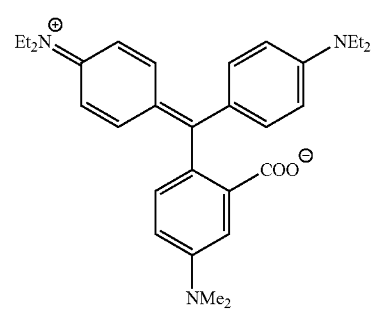

(tp-8)
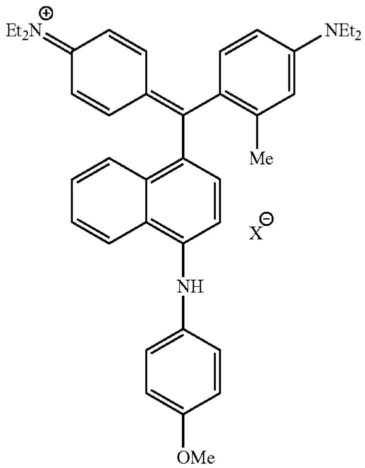
(tp-9)
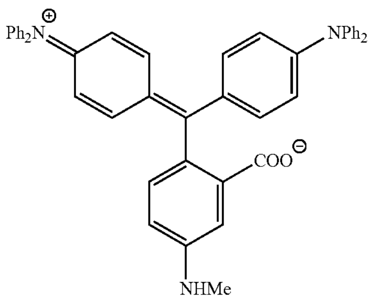
[Chem. 35]
(tp-10)
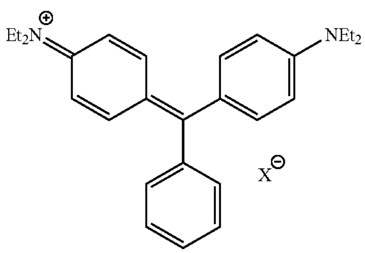
(tp-11)
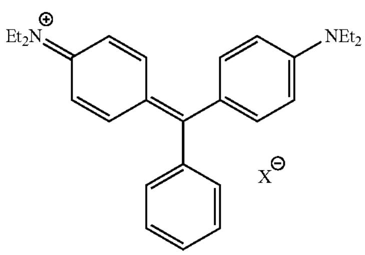
(tp-12)
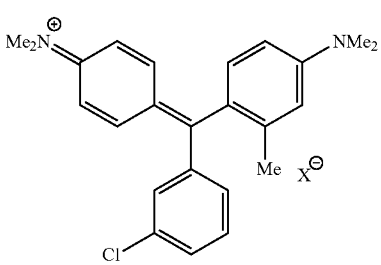
(tp-13)
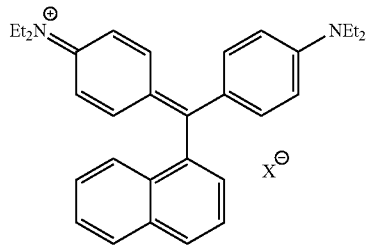
(tp-14)
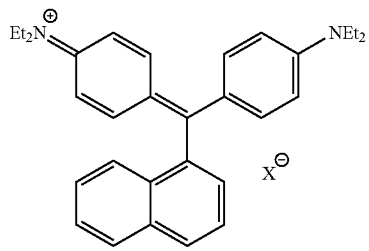
(tp-15)
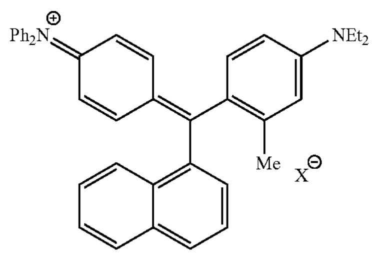
(tp-16)
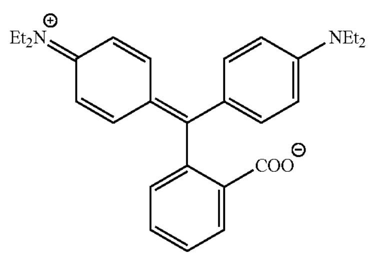
(tp-17)
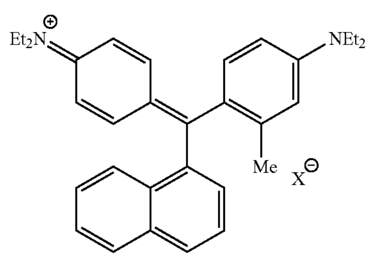
(tp-18)
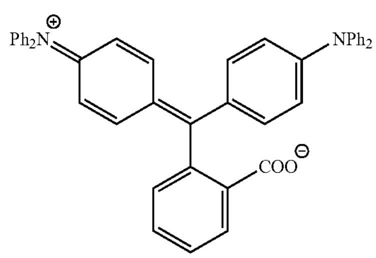
Among the above specific examples, in view of color characteristics and heat resistance, (tp-4), (tp-5), (tp-6), and (tp-8) are particularly preferable.

(Xanthene Dye)

A preferable embodiment of the dye multimer in the present invention is a dye multimer having a partial structure derived from a xanthene dye (xanthene compound). Such a dye multimer (A) include a dye multimer that has, as a partial structure of a dye moiety, a partial structure derived from a xanthene compound represented by the following Formula (J).

[Chem. 36]

Formula (J)

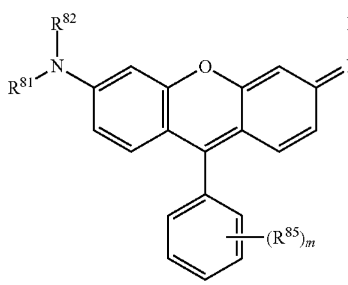

In Formula (J), each of $R^{81}$, $R^{82}$, $R^{83}$, and $R^{84}$ independently represents a hydrogen atom or a monovalent substituent. Each $R^{85}$ independently represents a monovalent substituent, and m represents an integer from 0 to 5. $X^-$ represents an anion.

The substituents that $R^{81}$ to $R^{84}$ and $R^{85}$ in General Formula (J) may have have the same definition as the substituents exemplified in the above section of Substituent Group A.

In Formula (J), $R^{81}$ and $R^{82}$, $R^{83}$ and $R^{84}$, and $R^{85}$s in a case where m is 2 or greater may independently form a 5-, 6-, or 7-membered saturated ring or a 5-, 6-, or 7-membered unsaturated ring respectively by being bonded to each other. When the formed 5-, 6-, or 7-membered ring is a group that can be further substituted, the ring may be substituted with the substituents described for $R^{81}$ to $R^{85}$. When the ring is substituted with two or more substituents, these substituents may be the same as or different from each other.

In Formula (J), when $R^{81}$ and $R^{82}$, $R^{83}$ and $R^{84}$, and $R^{85}$s in a case where m is 2 or greater independently form 5-, 6-, and 7-membered saturated rings not having a substituent or form 5-, 6-, and 7-membered unsaturated rings respectively by being bonded to each other, examples of the 5-, 6-, and 7-membered saturated rings not having a substituent or the 5-, 6-, and 7-membered unsaturated rings include a pyrrole ring, a pyran ring, a thiophene ring, a pyrazole ring, an imidazole ring, a triazole ring, an oxazole ring, a thiazole ring, a pyrrolidine ring, a piperidine ring, a cyclopentene ring, a cyclohexene ring, a benzene ring, a pyridine ring, a pyrazine ring, and a pyridazine ring, and among these, a benzene ring and a pyridine ring are preferable.

$R^{82}$ and $R^{83}$ are particularly preferably a hydrogen atom, $R^{81}$ and $R^{84}$ are particularly preferably a substituted or unsubstituted phenyl group. $R^{85}$ is preferably a halogen atom, a linear or branched alkyl group having 1 to 5 carbon atoms, a sulfo group, a sulfonamide group, or a carboxyl group. The substituent that the phenyl group represented by $R^{81}$ and $R^{84}$ has is most preferably a hydrogen atom, a halogen atom, a linear or branched alkyl group having 1 to 5 carbon atoms, a sulfo group, a sulfonamide group, or a carboxyl group.

$X^-$ represents an anion. Specific examples of $X^-$ include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion, a benzoate anion, organic sulfonate anions such as a benzene sulfonate anion, a toluene sulfonate anion, and a trifluoromethane sulfonate anion, organic phosphate anions such as an octyl phosphate anion, a dodecyl phosphate anion, an octadecyl phosphate anion, a phenyl phosphate anion, and a nonyl phenyl phosphate anion, and the like. $X^-$ may be linked to the dye skeleton, or may be linked to a portion (polymer chain or the like) of the dye multimer.

$X^-$ is preferably a fluorine anion, a chlorine anion, a bromine anion, an iodine anion, a perchlorate anion, or a carboxylic acid anion, and most preferably a perchlorate anion or a carboxylic acid anion.

The compound having the xanthene skeleton represented by Formula (J) can be synthesized by methods described in documents. Specifically, the methods described in Tetrahedron Letters, 2003, Vol. 44, No. 23, pp 4355-4360, Tetrahedron, 2005, Vol. 61, No. 12, pp 3097-3106, and the like can be used.

Specific examples of the xanthene compounds will be shown below, but the present invention is not limited thereto.

[Chem. 37]

(1a)

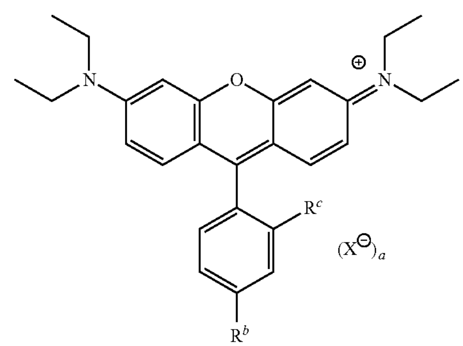

(1b)

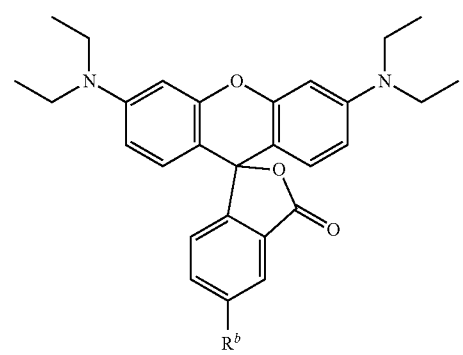

(1b-1)

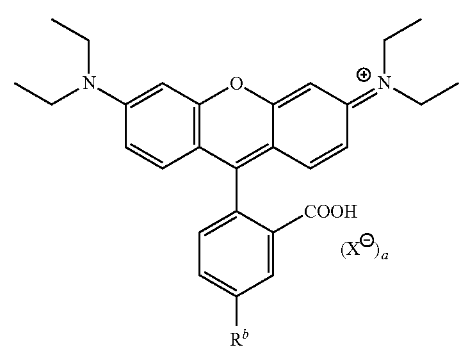

-continued (1c)

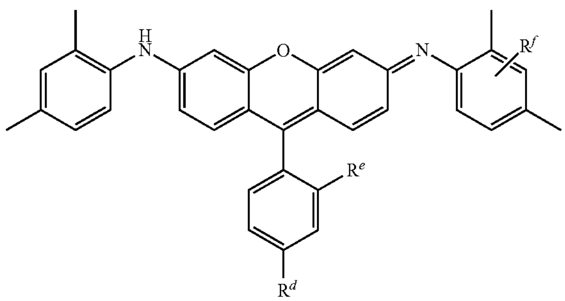

(1d)

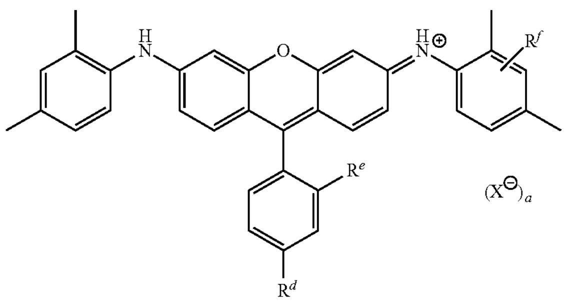

(1e)

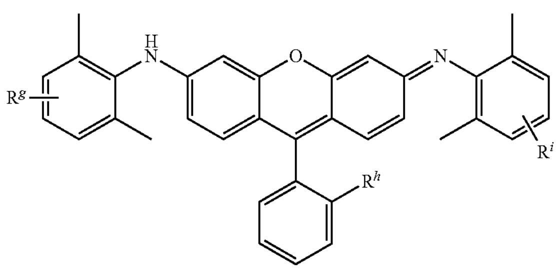

(1f)

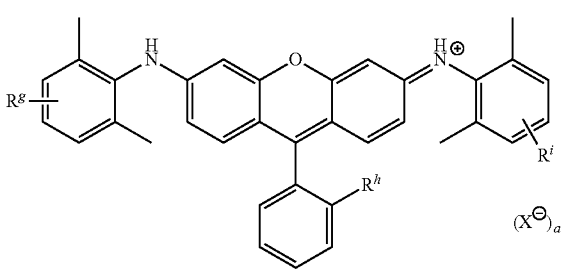

In Formulae (1a) to (1f), each of $R^b$ and $R^e$ independently represents a hydrogen atom, —$SO_3$—, —$CO_2H$, or —$SO_2NHR^a$. Each of $R^d$, $R^e$, and $R^f$ independently represents —$SO_3$—, —$SO_3Na$—, or —$SO_2NHR^a$—.

Each of $R^g$, $R^h$, and $R^i$ independently represents a hydrogen atom, —$SO_3$—, —$SO_3H$—, or —$SO_2NHR^a$—.

$R^a$ represents an alkyl group having 1 to 10 carbon atoms and preferably represents a 2-ethylhexyl group. X and a have the same definition as described above.

The compound represented by Formula (1b) is a tautomer of the compound represented by Formula (1b-1).

Among the above compounds, in view of color characteristics and heat resistance, Formulae (1e) and (1f) are particularly preferable.

(Cyanine Dye)

One of the embodiments of the dye multimer according to the present invention is a dye multimer having a partial structure derived from a cyanine dye (cyanine compound). Such a dye multimer (A) includes a dye multimer that has, as a partial structure of a dye moiety, a partial structure derived from a compound (cyanine compound) represented by the following Formula (PM). The cyanine compounds in the present invention collectively refer to compounds having a dye moiety containing a cyanine skeleton in a molecule thereof

[Chem. 38]

Formula (PM)

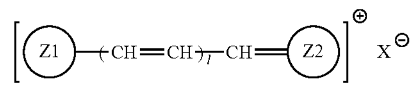

In Formula (PM), each of a ring Z1 and ring Z2 independently represents a heterocycle that may have a substituent. 1 represents an integer from 0 to 3, and $X^-$ represents an anion.

Each of the ring Z1 and the ring Z2 independently includes, for example, oxazole, benzoxazole, oxazoline, thiazole, thizoline, benzothiazole, indolenine, benzoindolenine, 1,3-thiadiazine, and the like.

The substituents that the ring Z1 and the ring Z2 may have are the same substituents exemplified in the above section of Substituent Group A. Examples of $X^-$ include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion and a benzoate anion, organic sulfonate anions such as a benzene sulfonate anion, a toluene sulfonate anion, and trifluoromethane sulfonate anion, organic phosphate anions such as an octyl phosphate anion, a dodecyl phosphate anion, an octadecyl phosphate anion, a phenyl phosphate anion, and a nonyl phenyl phosphate anion, and the like. X may be liked to the dye skeleton, or may be linked to a portion (polymer chain or the like) of the dye multimer.

The compound represented by Formula (PM) is preferably a compound represented by the following Formula (PM-2).

[Chem. 39]

Formula (PM-2)

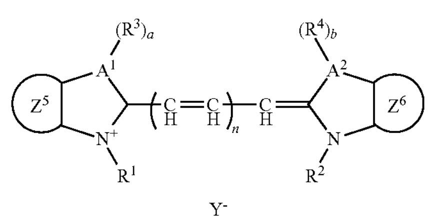

In Formula (PM-2), each of a ring $Z^5$ and a ring $Z^6$ independently represents a benzene ring that may have a substituent or a naphthalene ring that may have a substituent.

$Y^-$ represents $Cl^-$, $Br^-$, $I^-$, $ClO_4^-$, $OH^-$, a monovalent organic carboxylic acid anion, a monovalent organic sulfonate anion, a monovalent boron anion, or a monovalent organic metal complex anion. $Y^-$ may be linked to the dye skeleton, or may be linked to a portion (polymer chain or the like) of the dye multimer.

n represents an integer from 0 to 3.

Each of $A^1$ and $A^2$ independently represents an oxygen atom, a sulfur atom, a selenium atom, a carbon atom, or a nitrogen atom.

Each of $R^1$ and $R^2$ independently represents a monovalent aliphatic hydrocarbon group having 1 to 20 carbon atoms that may have a substituent.

Each of $R^3$ and $R^4$ independently represents a hydrogen atom, a monovalent aliphatic hydrocarbon group having 1 to 6 carbon atoms, or represents a divalent aliphatic hydrocarbon group having 2 to 6 carbon atoms that is formed when one $R^3$ and one $R^4$ are linked to each other.

Each of a and b independently represents an integer from 0 to 2.

In Formula (PM-2), $Y^-$ is preferably a fluorine anion, a chlorine anion, a bromine anion, an iodine anion, a perchlorate anion, or a carboxylic acid anion, and most preferably a chlorine anion, a perchlorate anion, or a carboxylic acid anion. n is preferably 1. Each of $A^1$ and $A^2$ preferably independently represents an oxygen atom, a sulfur atom, or a carbon atom, and most preferably, both the $A^1$ and $A^2$ represent a carbon atom.

Specific examples of the cyanine compounds will be shown below, but the present invention is not limited thereto.

[Chem. 40]

(pm-1)

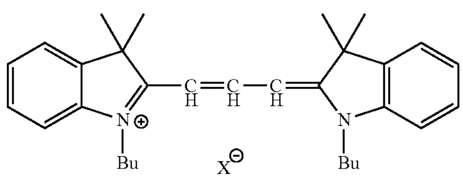

(pm-2)

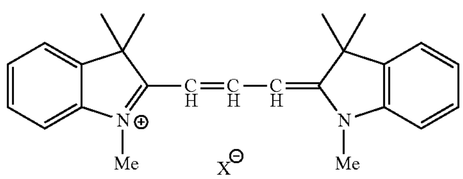

(pm-3)

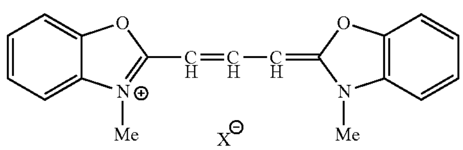

(pm-4)

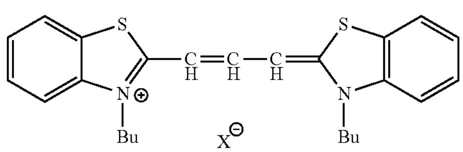

(pm-5)

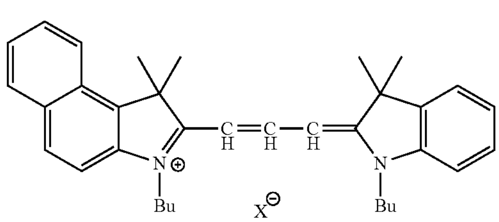

-continued (pm-6)

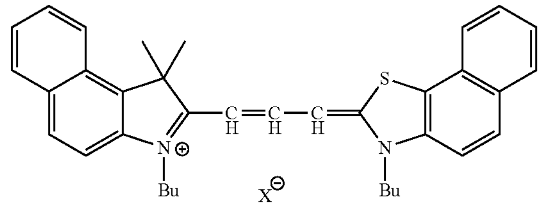

(pm-7)

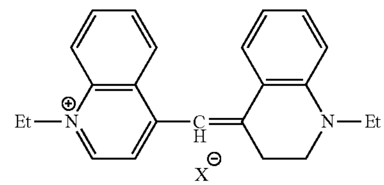

(pm-8)

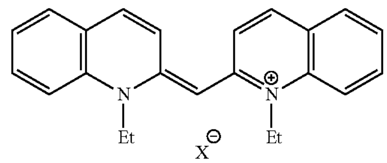

(pm-9)

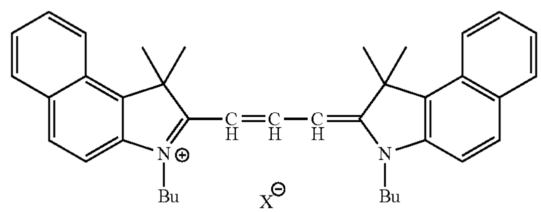

(pm-10)

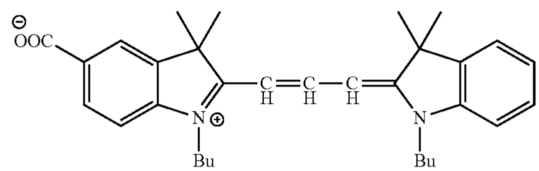

(pm-11)

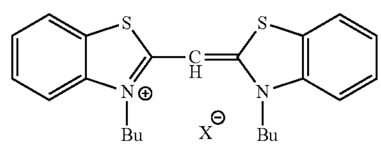

(pm-12)

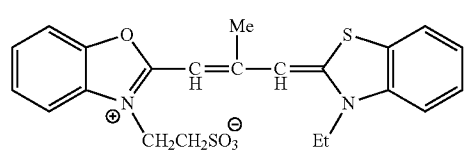

(pm-13)

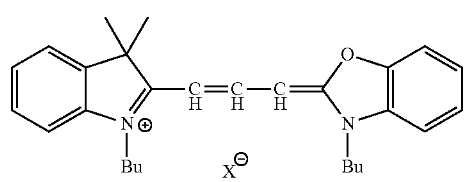

-continued (pm-14)

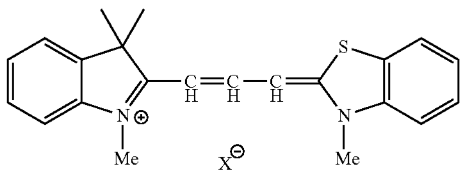

(pm-15)

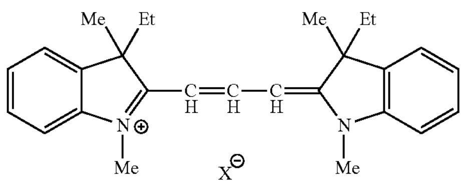

(pm-16)

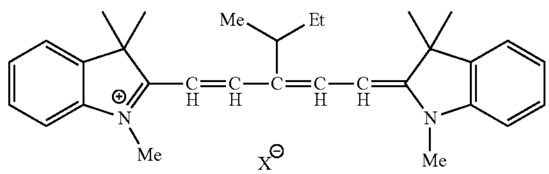

(pm-17)

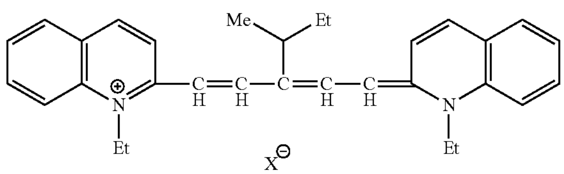

Among the specific examples, structures represented by (pm-1) to (pm-6), (pm-9), and (pm-10) are preferable, and among these, from the viewpoint of color characteristics and heat resistance, dye structures represented by (pm-1), (pm-2), and (pm-10) are particularly preferable.

(Squarylium Dye)

One of the embodiments of the dye multimer according to the present invention is a dye multimer having a partial structure derived from a squarylium dye (squarylium compound). Such a dye multimer (A) includes a resin having a dye multimer that has, as a partial structure of a dye moiety, a partial structure derived from a compound (squarylium compound) represented by the following Formula (K). The squarylium compounds in the present invention collectively refer to compounds having a dye moiety containing a squarylium skeleton in a molecule thereof

[Chem. 41]

Formula (K)

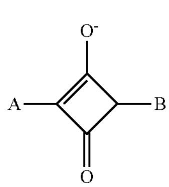

In General Formula (K), each of A and B independently represents an aryl group or a heterocyclic group. The aryl group is an aryl group preferably having 6 to 48 carbon atoms and more preferably having 6 to 24 carbon atoms, and examples thereof include phenyl, naphthyl, and the like. The heterocyclic group is preferably a 5-membered or 6-membered heterocyclic group, and examples thereof include pyrrolyl, imidazolyl, pyrazolyl, thienyl, pyridyl, pyrimidyl, pyridazyl, triazol-1-yl, thienyl, furyl, thiadiazolyl, and the like.

The compound represented by Formula (K) is particularly preferably a compound represented by the following Formula (K-1), Formula (K-2), Formula (K-3), or Formula (K-4).

[Chem. 42]

Formula (K-1)

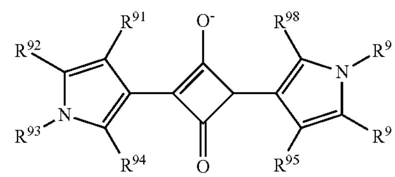

In Formula (K-1), each of $R^{91}$, $R^{92}$, $R^{94}$, $R^{95}$, $R^{96}$, and $R^{98}$ independently represents a hydrogen atom, a halogen atom, a linear or branched alkyl group, a cycloalkyl group, a linear or branched alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an amino group (including an alkylamino group and an anilino group), an acylamino group, an aminocarbonylamino group, an alkoxycarbonylamino group, an aryloxycarbonylamino group, a sulfamoylamino group, an alkyl or aryl sulfonylamino group, a mercapto group, an alkylthio group, a furylthio group, a heterocyclic thio group, a sulfamoyl group, a sulfo group, an alkyl or aryl sulfinyl group, an alkyl or aryl sulfonyl group, an acyl group, an aryloxycarbonyl group, an alkoxycarbonyl group, a carbamoyl group, an aryl or heterocyclic azo group, an imide group, a phosphino group, a phosphinyl group, a phosphinyloxy group, a phosphinylamino group, or a silyl group.

Each of $R^{93}$ and $R^{97}$ independently represents a hydrogen atom, a linear or branched alkyl group, a cycloalkyl group, a cycloalkenyl group, an alkynyl group, an aryl group, or a heterocyclic group.

$R^{91}$ and $R^{92}$, and $R^{95}$ and $R^{96}$ may respectively form a ring by being linked to each other.

The substituents that $R^{91}$, $R^{92}$, $R^{94}$, $R^{95}$, $R^{97}$, and $R^{98}$ in Formula (K-1) may have have the same definition as the substituents exemplified in the above section of Substituent Group A.

It is preferable for each of $R^{91}$ to $R^{98}$ to be independently a hydrogen atom, an alkyl group, a hydroxyl group, an amino group, an aryl group, or a heterocyclic group. More preferably, $R^{93}$, $R^{94}$, $R^{97}$, and $R^{98}$ are an alkyl group, and $R^{91}$ and $R^{92}$ and $R^{95}$ and $R^{96}$ form an aryl ring by being linked to each other. Most preferably, $R^{93}$, $R^{94}$, $R^{97}$, and $R^{98}$ are an alkyl group having 1 to 20 carbon atoms, and $R^{91}$ and $R^{92}$ and $R^{95}$ and $R^{96}$ form a benzene ring by being linked to each other.

[Chem. 43]

Formula (K-2)

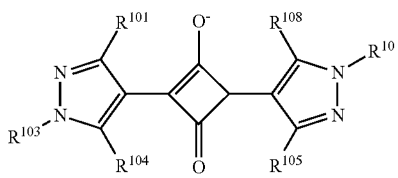

In Formula (K-2), $R^{101}$, $R^{103}$, $R^{104}$, $R^{105}$, $R^{107}$, and $R^{108}$ have the same definition as $R^{91}$, $R^{93}$, $R^{94}$, $R^{95}$, $R^{97}$, and $R^{98}$ in the Formula (K-1) respectively. $R^{103}$ and $R^{107}$ have the same definition as $R^{93}$ and $R^{97}$ in the Formula (K-1).

In Formula (K-2), $R^{101}$, $R^{103}$, $R^{104}$, $R^{105}$, $R^{107}$, and $R^{108}$ are preferably a hydrogen atom, an alkyl group, a hydroxy group, an amino group, an aryl group, or a heterocyclic group. More preferably, $R^{101}$, $R^{103}$, $R^{105}$, and $R^{107}$ are an alkyl group or an aryl group, and $R^{104}$ and $R^{108}$ are a hydroxy group or an amino group. Even more preferably, $R^{101}$, $R^{103}$, $R^{105}$, and $R^{107}$ are an alkyl group having 1 to 20 carbon atoms, and $R^{104}$ and $R^{108}$ are a hydroxy group. $R^{103}$ and $R^{107}$ are preferably a hydrogen atom, a linear or branched alkyl group, and an aryl group, and more preferably an alkyl group having 1 to 5 carbon atoms and a phenyl group.

[Chem. 44]

Formula (K-3)

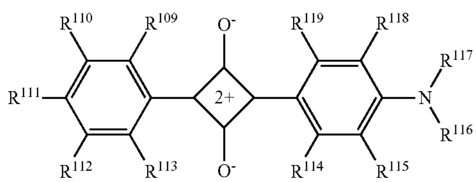

In Formula (K-3), $R^{109}$, $R^{110}$, $R^{111}$, $R^{112}$, $R^{113}$, $R^{114}$, $R^{115}$, $R^{118}$, and $R^{119}$ have the same definition as $R^{91}$, $R^{93}$, $R^{94}$, $R^{95}$, $R^{97}$, and $R^{98}$ in the Formula (K-1). $R^{116}$ and $R^{117}$ have the same definition as $R^{93}$ and $R^{97}$ in the Formula (K-1)

In Formula (K-3), $R^{109}$, $R^{110}$, $R^{111}$, $R^{112}$, $R^{113}$, $R^{114}$, $R^{115}$, $R^{118}$, and $R^{119}$ are preferably a hydrogen atom, a halogen atom, a linear or branched alkyl group, a hydroxy group, or an alkoxy group. Particularly, $R^{109}$, $R^{113}$, $R^{115}$, $R^{118}$, and $R^{119}$ are most preferably a hydrogen atom, $R^{110}$, $R^{111}$, and $R^{112}$ are most preferably a hydrogen atom or an alkoxy group, and $R^{114}$ is most preferably a hydrogen atom, a halogen atom, a hydroxy group, an alkyl group having 1 to 5 carbon atoms, or an alkoxy group having 1 to 5 carbon atoms.

[Chem. 45]

Formula (K-4)

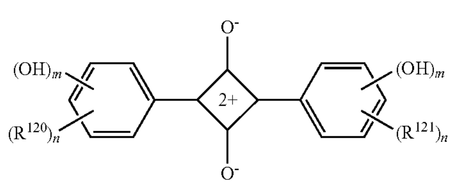

In Formula (K-4), $R^{120}$ represents a halogen atom, an alkyl group, an alkoxy group, or an alkenyl group. m represents an integer from 1 to 4, n represents an integer from 0 to 4.

$R^{120}$ is particularly preferably an alkyl group having 1 to 5 carbon atoms or an alkoxy group having 1 to 5 carbon atoms. m is preferably 1 to 3 and most preferably 3. n is preferably 0 to 3 and more preferably 0 or 1.

In the present invention, as the dye compound that can form a dye structure, from the viewpoint of color hue, the squarylium compound represented by the Formula (K-1) is preferable.

The squarylium compounds represented by the Formulae (K-1) to (K-4) can be synthesized using the method described in J. Chem. Soc., Perkin Trans. 1, 2000, p. 599.

Specific examples of the squarylium compounds represented by Formulae (K-1) to (K-4) will be shown below, but the present invention is not limited thereto.

[Chem. 46]

(sq-1)

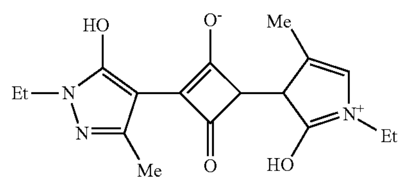

(sq-2)

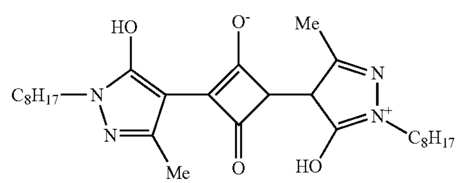

(sq-3)

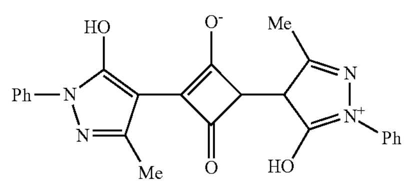

(sq-4)

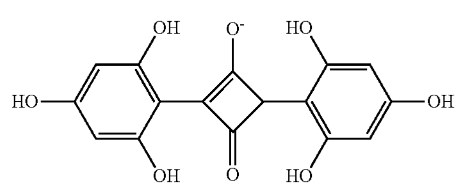

(sq-5)

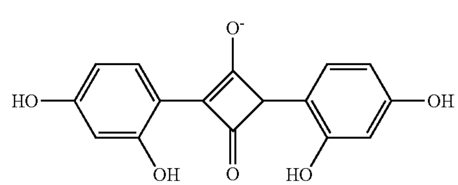

(sq-6)

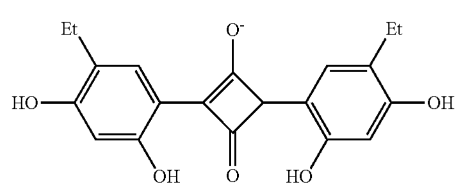

-continued (sq-7)

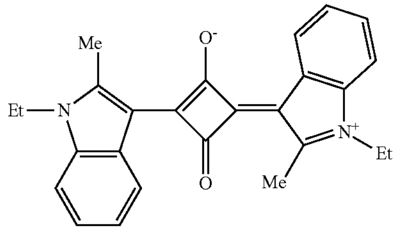

(sq-8)

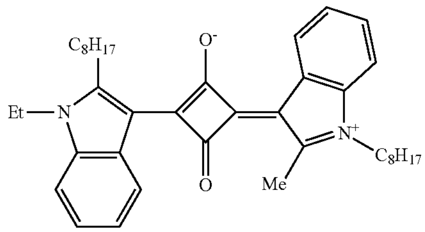

(sq-9)

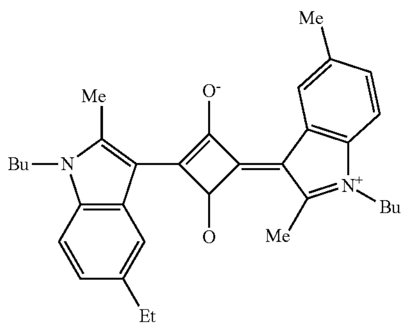

(sq-10)

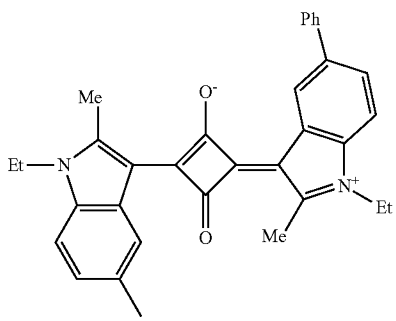

(sq-11)

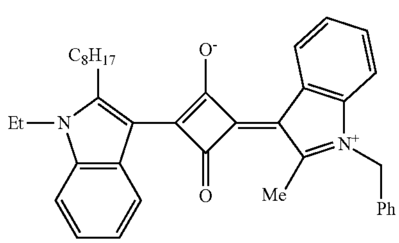

(sq-12)

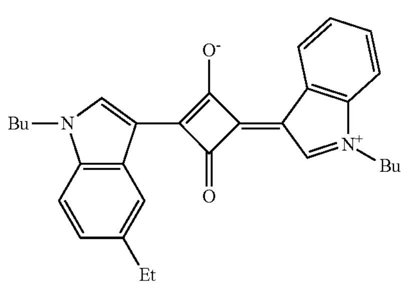

-continued (sq-13)

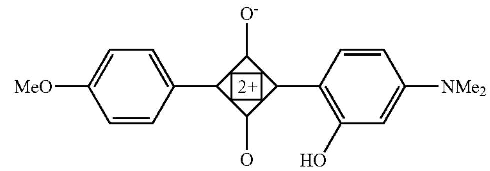

(sq-14)

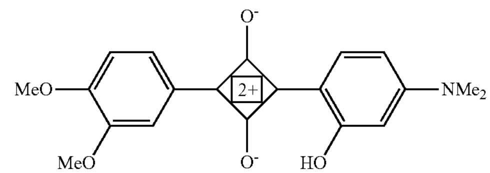

(sq-15)

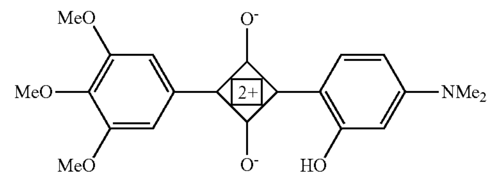

(sq-16)

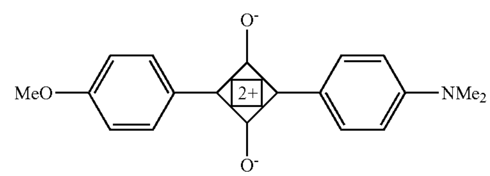

Among the above specific examples, from the viewpoint of color characteristics and heat resistance, (sq-1), (sq-2), (sq-3), (sq-7), (sq-8), (sq-9), (sq-10), (sq-11), and (sq-12) are preferable.

(Quinophthalone Dye)

One of the embodiments of the dye multimer according to the present invention is a dye multimer having a partial structure derived from a quinophthalone dye (quinophthalone compound). Such a dye multimer (A) includes a dye multimer that has, as a partial structure of a dye moiety, a partial structure derived from a compound (quinophthalone compound) represented by the following Formula (QP). The quinophthalone compound in the present invention collectively refers to compounds having a dye moiety containing a quinophthalone skeleton in a molecule thereof

[Chem. 47]

Formula (QP)

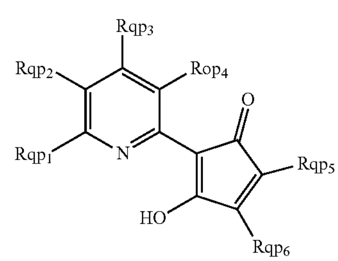

In Formula (QP), each of $Rqp_1$ to $Rqp_6$ independently represents a hydrogen atom or a substituent. When at least two out of $Rqp_1$ to $Rqp_6$ are adjacent to each other, these may form a ring by being bonded to each other, and the ring may further have a substituent.

The substituents represented by $Rqp_1$ to $Rqp_6$ represent the substituents exemplified in the above section of Substituent Group A. As the substituents represented by $Rqp_1$ to $Rqp_6$, a halogen atom, an alkyl group, an alkenyl group, and an aryl group are preferable. It is particularly preferable for $Rqp_1$ and $Rqp_2$ and $Rqp_5$ and $Rqp_6$ to form a substituted or unsubstituted phenyl ring by being linked to each other. $Rqp_3$ and $Rqp_4$ are preferably a hydrogen atom, a chlorine atom, or a bromine atom.

Examples of the substituents that the phenyl ring formed by $Rqp_1$ and $Rqp_2$ and $Rqp_5$ and $Rqp_6$ linked to each other may have include the substituents exemplified in the above section of the substituent, and among the substituents, a halogen atom, a carbamoyl group, an amino group, an alkoxy group, an aryloxy group, an alkylthio group, an arylthio group, and an alkoxycarbonyl group are preferable.

Specific examples of the compound represented by Formula (QP) will be shown below, but the present invention is not limited thereto.

[Chem. 48]

(QP-1)

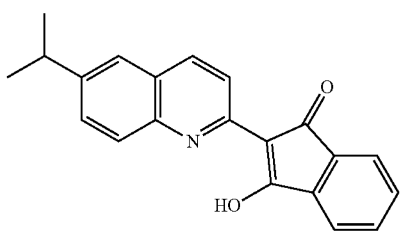

(QP-2)

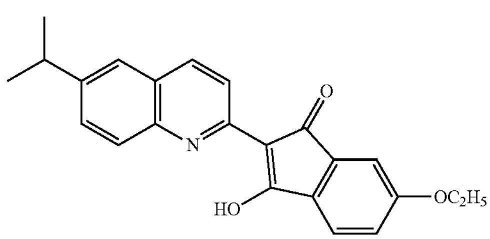

(QP-3)

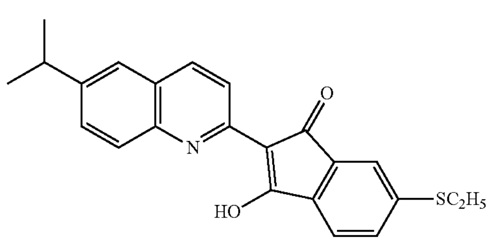

-continued (QP-4)

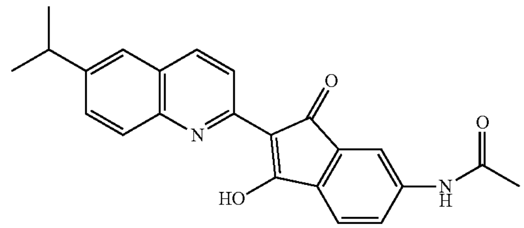

(QP-5)

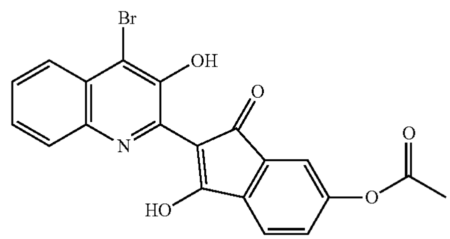

(QP-6)

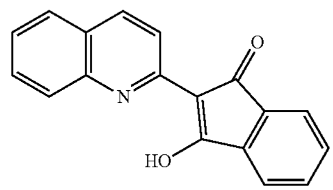

(QP-7)

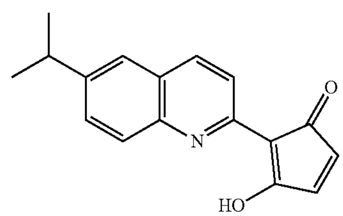

(QP-8)

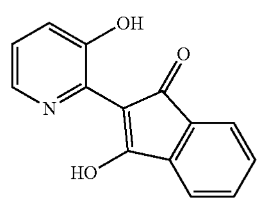

(QP-9)

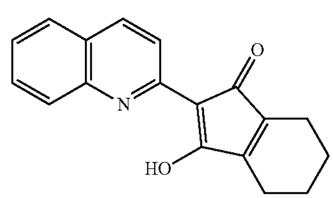

Among the above specific examples, from the viewpoint of color characteristics and heat resistance, (QP-1) to (QP-5) are preferable.

(Phthalocyanine Dye)

One of the embodiments of the dye multimer according to the present invention is a dye multimer having a partial structure derived from a phthalocyanine dye (phthalocyanine compound). Such a dye multimer (A) includes a dye multimer that has, as a partial structure of a dye moiety, a partial structure derived from a compound (phthalocyanine compound) represented by the following Formula (F). The phthalocyanine compound in the present invention collectively refers to compounds having a dye moiety containing a phthalocyanine skeleton in a molecule thereof

[Chem. 49]

Formula (F)

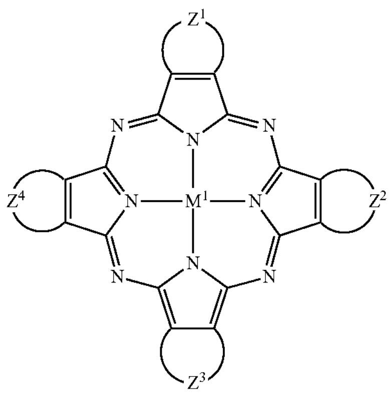

In Formula (F), $M^1$ represents metals, and each of $Z^1$, $Z^2$, $Z^3$, and $Z^4$ independently represents an atomic group that is necessary for forming a 6-membered ring constituted with atoms selected from a hydrogen atom, a carbon atom, and a nitrogen atom.

Formula (F) will be described in detail.

In Formula (F), the metals represented by $M^1$ include, for example, metal atoms such as Zn, Mg, Si, Sn, Rh, Pt, Pd, Mo, Mn, Pb, Cu, Ni, Co, and Fe, metal chlorides such as AlCl, InCl, FeCl, $TiCl_2$, $SnCl_2$, $SiCl_2$, and $GeCl_2$, metal oxides such as TiO and VO, and metal hydroxides such as $Si(OH)_2$. Among these, Cu and Zn are particularly preferable.

In Formula (F), each of $Z^1$, $Z^2$, $Z^3$, and $Z^4$ independently represents an atomic group that is necessary for forming a 6-membered ring constituted with atoms selected from a hydrogen atom, a carbon atom, and a nitrogen atom. The 6-membered ring may be a saturated or unsaturated ring and may be unsubstituted or have a substituent. Examples of the substituent include the substituents exemplified in the above section of Substituent Group A. Moreover, when the 6-membered ring has two or more substituents, these substituents may be the same as or different from each other. Further, the 6-membered ring may be condensed with another 5- or 6-membered ring.

The 6-membered ring includes a benzene ring, a cyclohexane ring, and the like.

Among residues of the phthalocyanine dye represented by Formula (F), a residue derived from a phthalocyanine dye represented by the following Formula (F-1) is particularly preferable.

[Chem. 50]

Formula (F-1)

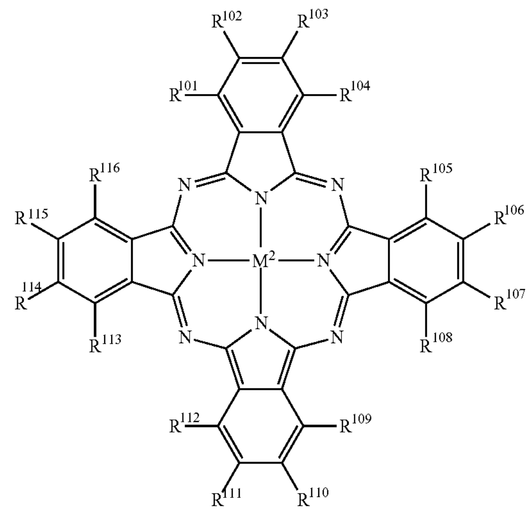

In Formula (F-1), $M^2$ has the same definition as $M^1$ in the Formula (F), and the preferable embodiments thereof are also the same.

In the Formula (F-1), each of $R^{101}$ to $R^{116}$ independently represents a hydrogen atom or a substituent. When the substituents represented by $R^{101}$ to $R^{116}$ are groups that can be further substituted, the groups may be substituted with the substituents described in the above section of Substituent Group A, and when the groups are substituted with two or more substituents, these substituents may be the same as or different from each other.

The substituents represented by $R^{101}$ to $R^{116}$ are preferably a hydrogen atom, $SO_2NR^{117}R^{118}$ ($R^{117}$ and $R^{118}$ are a hydrogen atom or a linear or branched alkyl group having 3 to 20 carbon atoms that may have a substituent), or $SR^{119}$ ($R^{119}$ is a linear or branched alkyl group having 3 to 20 carbon atoms that may have a substituent), among the above substituents.

Specific examples of compounds represented by Formula (F) will be shown below, but the present invention is not limited thereto.

[Chem. 51]

(Ph-1)

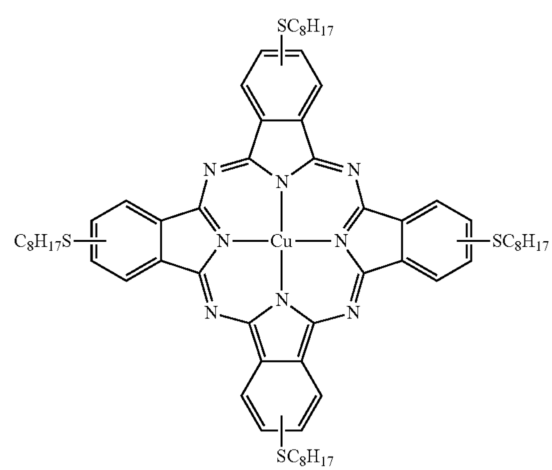

-continued (ph-2)

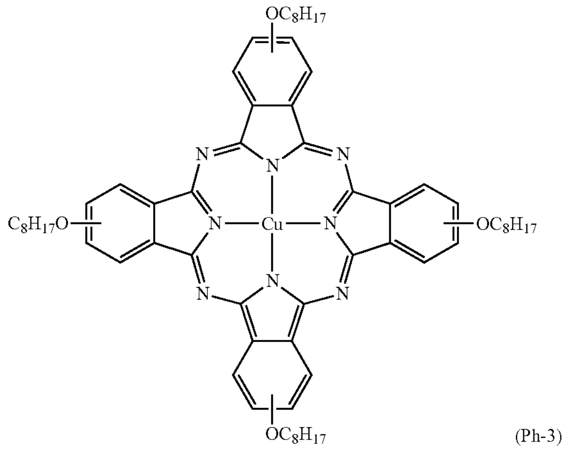

(Ph-3)

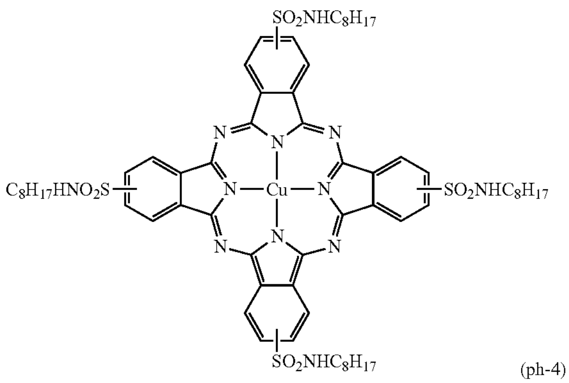

(ph-4)

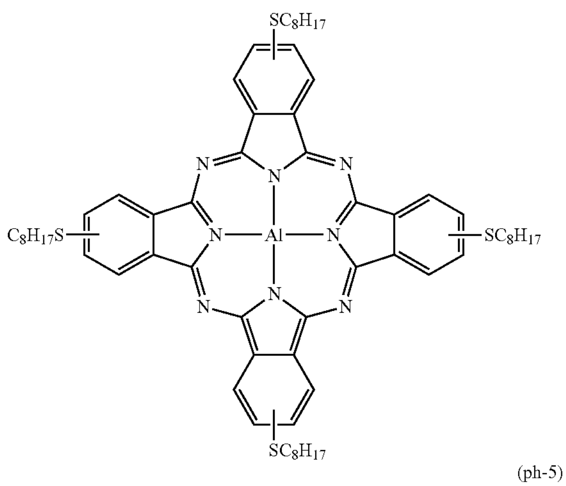

(ph-5)

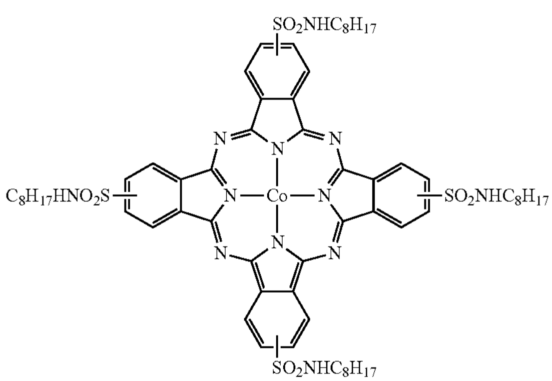

-continued (ph-6)

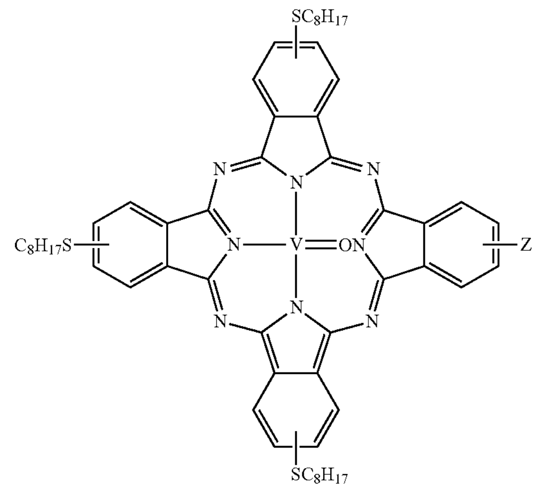

Among the above specific examples, from the viewpoint of color characteristics and heat resistance, (Ph-1) to (Ph-3) are particularly preferable.

(Subphthalocyanine Compound)

One of the embodiments of the dye multimer according to the present invention is a dye multimer having a partial structure derived from a subphthalocyanine dye (subphthalocyanine compound). Such a dye multimer (A) includes a dye multimer that has, as a partial structure of a dye moiety, a partial structure derived from a compound (subphthalocyanine compound) represented by the following Formula (SP). The subphthalocyanine compounds in the present invention collectively refer to compounds having a dye moiety including a subphthalocyanine skeleton in a molecule thereof

[Chem. 52]

Formula (SP)

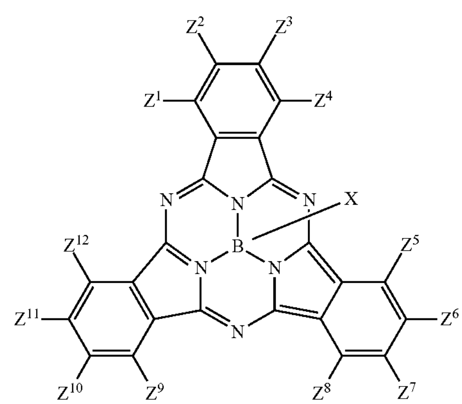

In Formula (SP), each of $Z^1$ to $Z^{12}$ independently represents a hydrogen atom, an alkyl group, an aryl group, a hydroxy group, a mercapto group, an amino group, an alkoxy group, an aryloxy group, or a thioether group. X represents an anion.

Formula (SP) will be described in detail.

The alkyl group that $Z^1$ to $Z^{12}$ in Formula (SP) may have represents a linear or branched substituted or unsubstituted alkyl group. Particularly, $Z^1$ to $Z^{12}$ preferably have 1 to 20 carbon atoms, and more preferably have 1 to 10 carbon atoms. Examples of the substituents that $Z^1$ to $Z^{12}$ may have include the substituents exemplified in the above section of Substituent Group A, and among the substituents, a fluorine atom, a hydroxy group, and a mercapto group are particularly preferable.

X in Formula (SP) represents an anion. Specific examples of X include inorganic anions such as a fluorine anion, a chlorine anion, a bromine anion, an iodine anion, a perchlorate anion, a thiocyanate anion, a phosphorous hexafluoride anion, an antimony hexafluoride anion, and a boron tetrafluoride anion, carboxylic acid anions such as an acetate anion and a benzoate anion, organic sulfonate anions such as a benzene sulfonate anion, a toluene sulfonate anion, and trifluoromethane sulfonate anion, organic phosphate anions such as an octyl phosphate anion, a dodecyl phosphate anion, an octadecyl phosphate anion, a phenyl phosphate anion, and a nonyl phenyl phosphate anion, and the like. $X^-$ may preferably be linked to a dye skeleton, or may be linked to a portion (polymer chain or the like) of the dye multimer.

X is preferably a fluorine anion, a chlorine anion, a bromine anion, an iodine anion, a perchlorate anion, a carboxylic acid anion, or a phosphate anion, and most preferably a perchlorate anion or a carboxylic acid anion.

Specific examples of subphthalocyanine compounds will be shown below, but the present invention is not limited thereto.

[Chem. 53]

(SP-1)

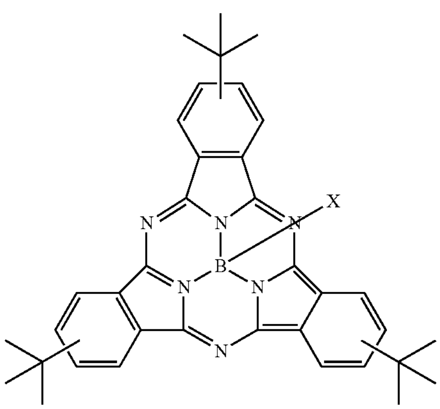

(SP-2)

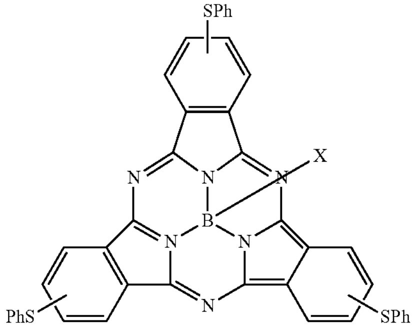

-continued (SP-3)

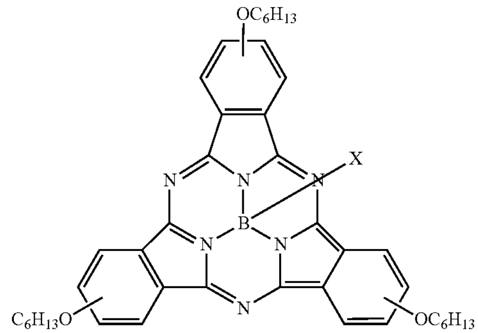

(SP-4)

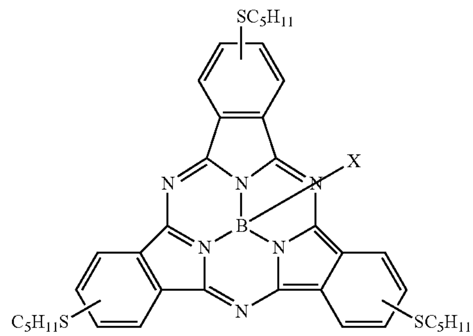

(SP-5)

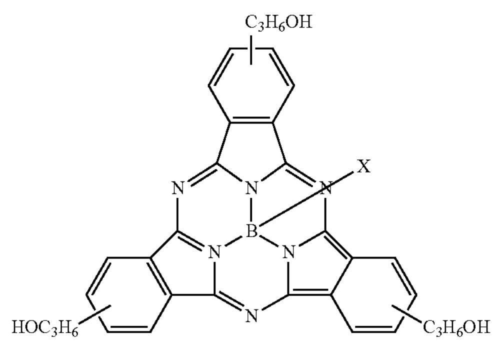

(SP-6)

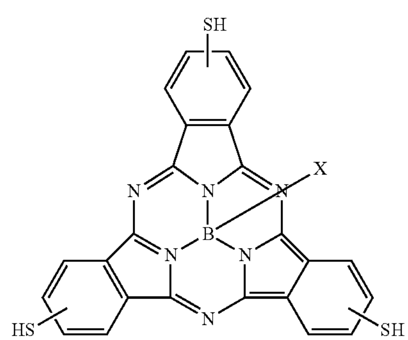

-continued (SP-7)

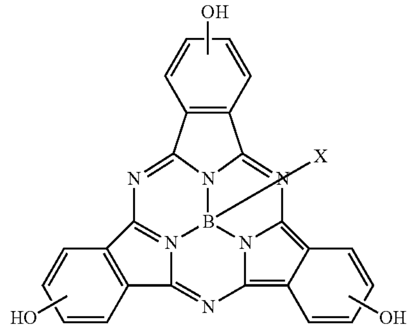

(SP-8)

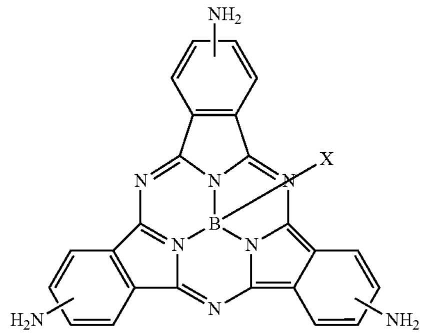

(SP-9)

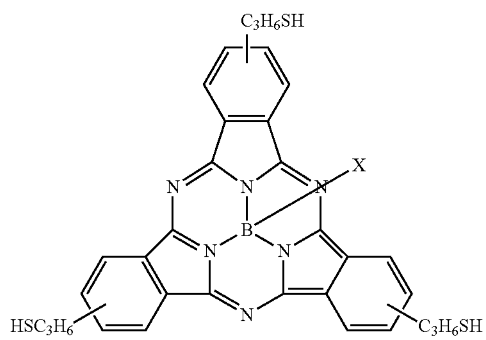

(S0-10)

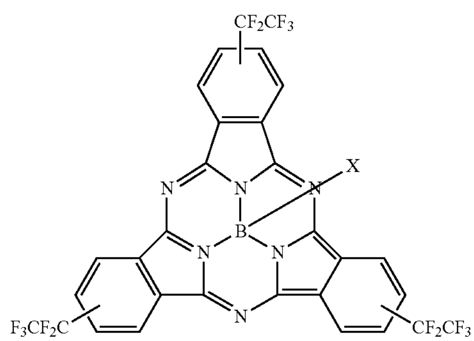

Among the above specific examples, from the viewpoint of color characteristics and heat resistance, (SP-2), (SP-3), (SP-4), (SP-5), (SP-6), and (SP-7) are particularly preferable.

(Structure of Dye Multimer Used for Colored Radiation-Sensitive Composition of the Present Invention)

It is preferable for the dye multimer (A) used for the colored radiation-sensitive composition of the present invention to be a dye multimer, which contains at least one of the structural units represented by the following Formula (A), Formula (B), and Formula (C), or to be a dye multimer represented by Formula (D). Particularly, it is more preferable for the dye multimer to contain at least one kind of structural unit (repeating unit) having a dye structure as described in the following Formula (A), Formula (B), and Formula (C).

<Structural Unit Represented by Formula (A)>

[Chem. 54]

Formula (A)

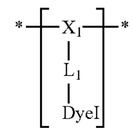

In Formula (A), $X_1$ represents a linking group formed by polymerization, and $L_1$ represents a single bond or a divalent linking group. DyeI represents a dye structure.

Hereinafter, Formula (A) will be described in detail.

In Formula (A), $X_1$ represents a linking group formed by polymerization. That is, $X_1$ represents a portion that forms a repeating unit corresponding to a main chain formed by a polymerization reaction. Moreover, the moiety represented by two *s is a repeating unit. $X_1$ is not particularly limited as long as it is a linking group formed of a known polymerizable monomer. Particularly, $X_1$ is preferably linking chains represented by the following (XX-1) to (XX-24), and most preferably (meth)acrylic linking chains represented by (XX-1) and (XX-2), styrene-based linking chains represented by (XX-10) to (XX-17), and a vinyl-based linking chain represented by (XX-24). In (XX-1) to (XX-24), * represents a moiety through which the linking chains are linked to $L_1$. Me represents a methyl group. R in (XX-18) and (XX-19) represents a hydrogen atom, an alkyl group having 1 to 5 carbon atoms, or a phenyl group.

[Chem. 55]

(XX-1)

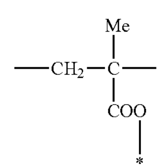

(XX-2)

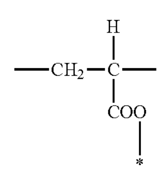

(XX-3)

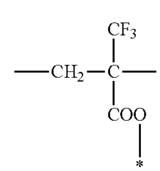

-continued
(XX-4)
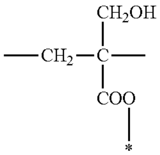
(XX-5)
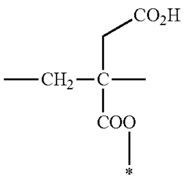
(XX-6)
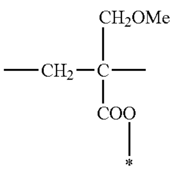
(XX-7)
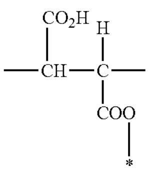
(XX-8)
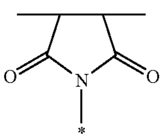
(XX-9)
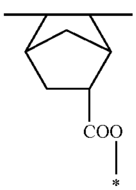
(XX-10)
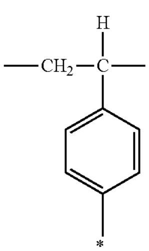
(XX-11)
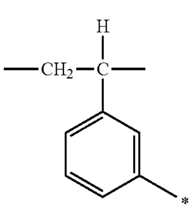
-continued
(XX-12)
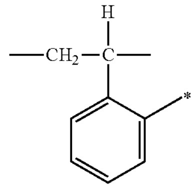
(XX-13)
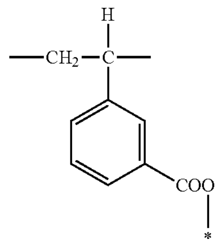
(XX-14)
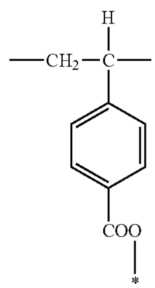
(XX-15)
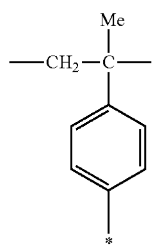
(XX-16)
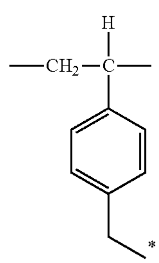
(XX-17)
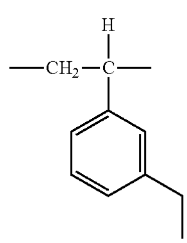

-continued (XX-18)

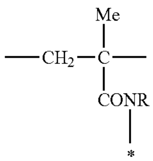

(XX-19)

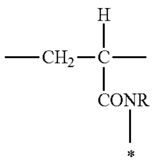

(XX-20)

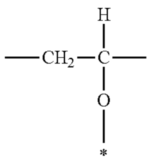

(XX-21)

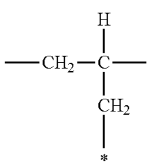

(XX-22)

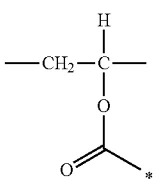

(XX-23)

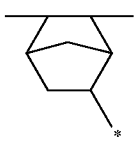

(XX-24)

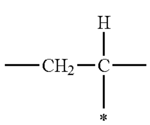

In Formula (A), $L_1$ represents a single bond or a divalent linking group. When $L^1$ represents a divalent linking group, the divalent linking group represents a substituted or unsubstituted alkylene group having 1 to 30 carbon atoms (for example, a methylene group, an ethylene group, a trimethylene group, a propylene group, or a butylene group), a substituted or unsubstituted arylene group having 6 to 30 carbon atoms (for example, a phenylene group or a naphthalene group), a substituted or unsubstituted heterocyclic linking group, —CH═CH—, —O—, —S—, —C(═O)—, $—CO_2—$, —NR—, —CONR—, $—O_2C—$, —SO—, $—SO_2—$, and a linking group formed of two or more of these linked to each other. Herein, each R independently represents a hydrogen atom, an alkyl group, an aryl group, or a heterocyclic group.

In Formula (A), DyeI represents a dye structure derived from the dye compound described above.

The dye multimer having the structure unit represented by Formula (A) can be synthesized by (1) a method of synthesizing the multimer by means of addition polymerization using a monomer having a dye residue, or (2) a method of synthesizing the multimer by causing a reaction between a polymer, which has a highly reactive functional group such as an isocyanate group, an acid anhydride group, or an epoxy group, and a dye which has a functional group (a hydroxyl group, a primary or secondary amino group, a carboxyl group, or the like) that can react with the highly reactive group.

For the addition polymerization, known addition polymerization (radical polymerization, anionic polymerization, or cationic polymerization) is applicable. Among these, it is particularly preferable for the dye multimer to be synthesized by radical polymerization, since the reaction condition can be set to be mild conditions, and the dye structure is not degraded. For the radical polymerization, known reaction conditions can be applied.

Among these, from the viewpoint of heat resistance, the dye multimer having the structural unit represented by Formula (A) in the present invention is preferably a radical polymer that is obtained by radical polymerization using a dye monomer having an ethylenically unsaturated bond.

Specific examples of structural units represented by Formula (A) will be shown below, but the present invention is not limited thereto.

[Chem. 56]

(A-dp-1)

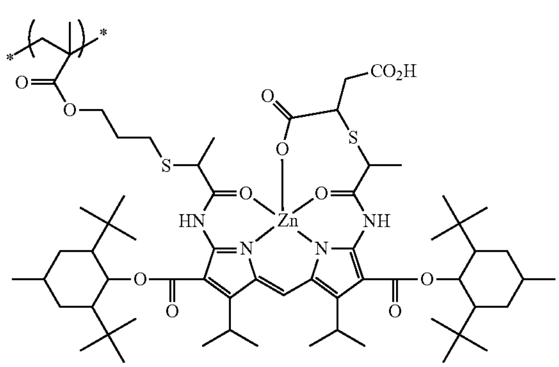

(A-dp-2)

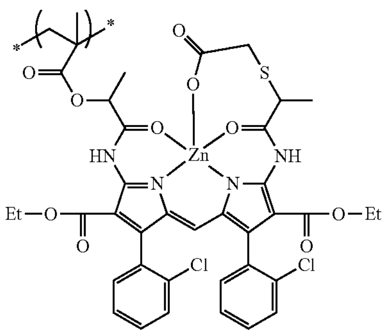

-continued
(A-dp-3)
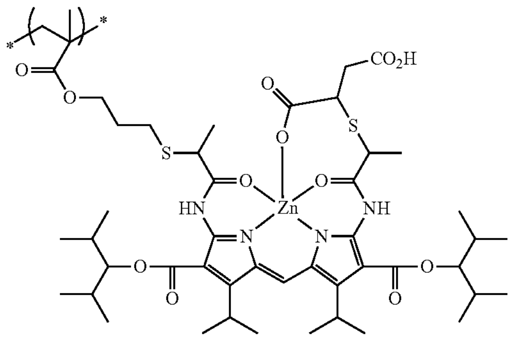
(A-dp-4)
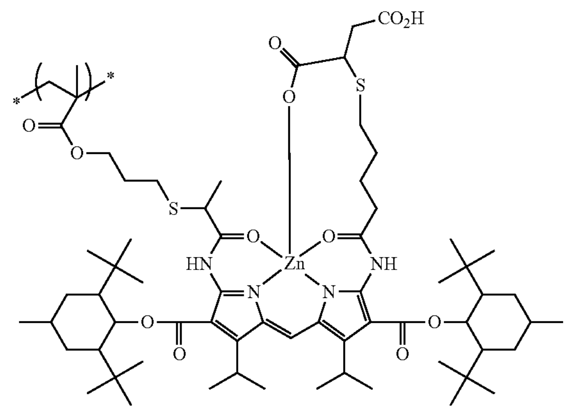
[Chem. 57]
(A-dp-5)
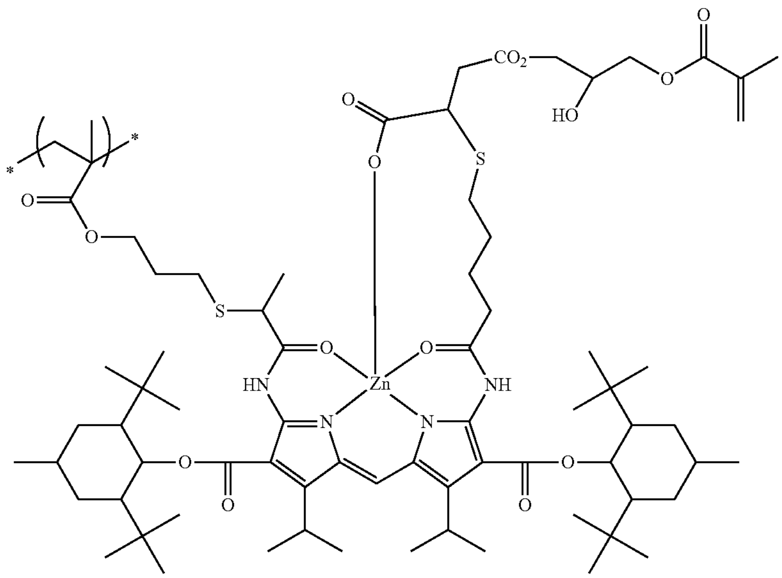
(A-dp-6)
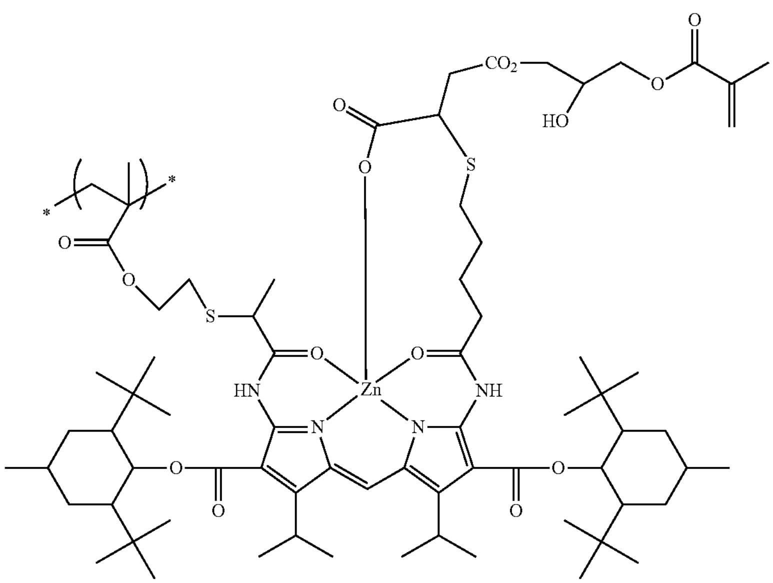

-continued
(A-dp-7)
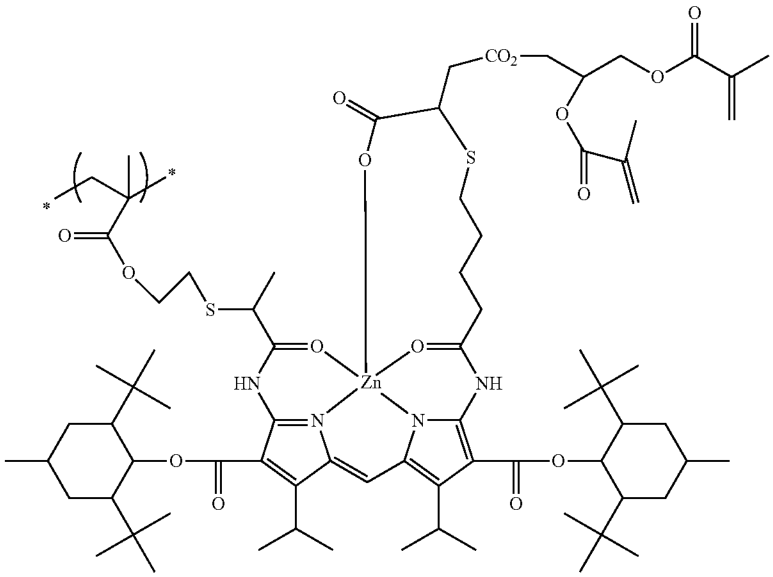
(A-dp-8)
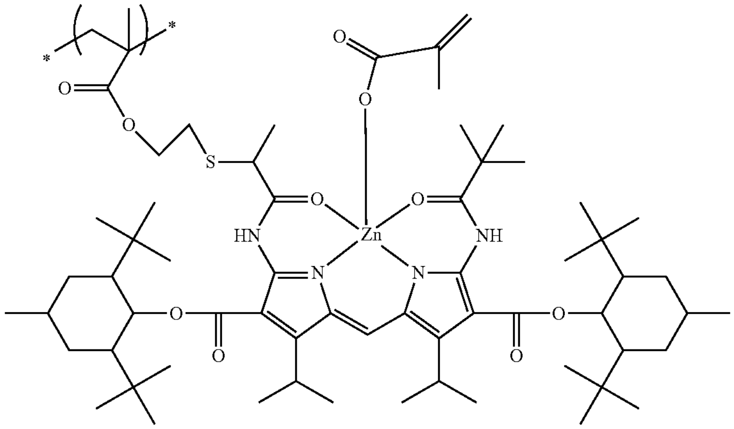
[Chem. 58]
(A-dp-9)
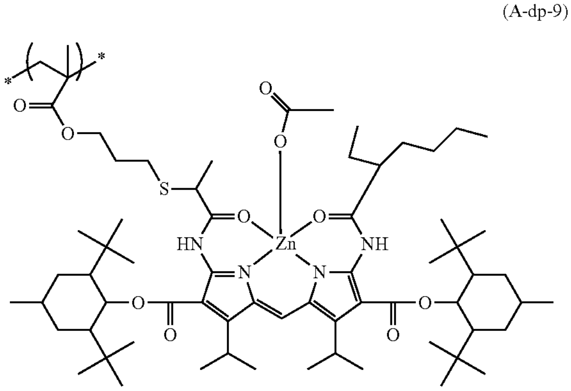
(A-dp-10)
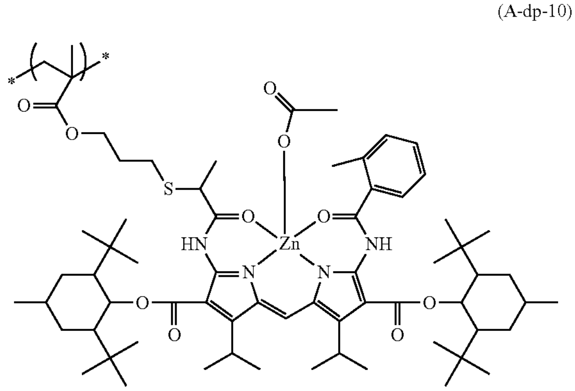

-continued
(A-dp-11)
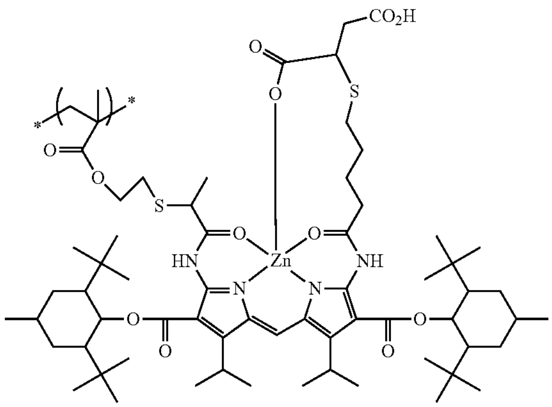
(A-dp-12)
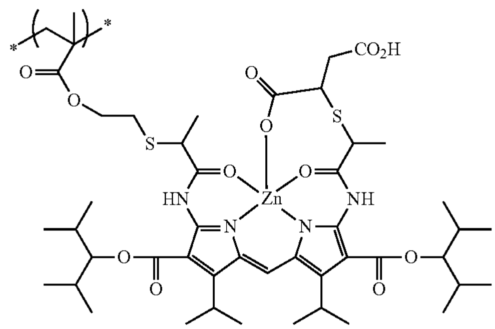
(A-dp-13)
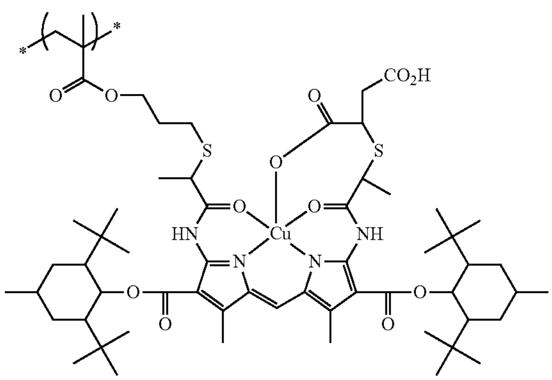
(A-dp-14)
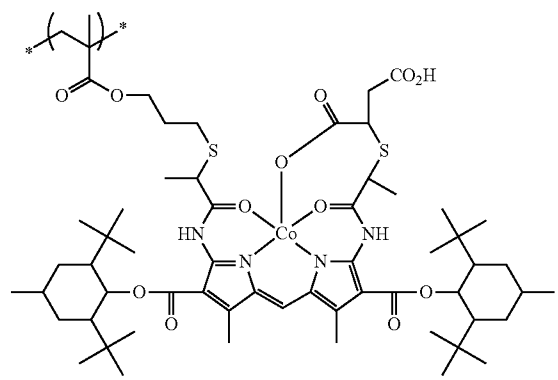
[Chem. 59]
(A-dp-15)
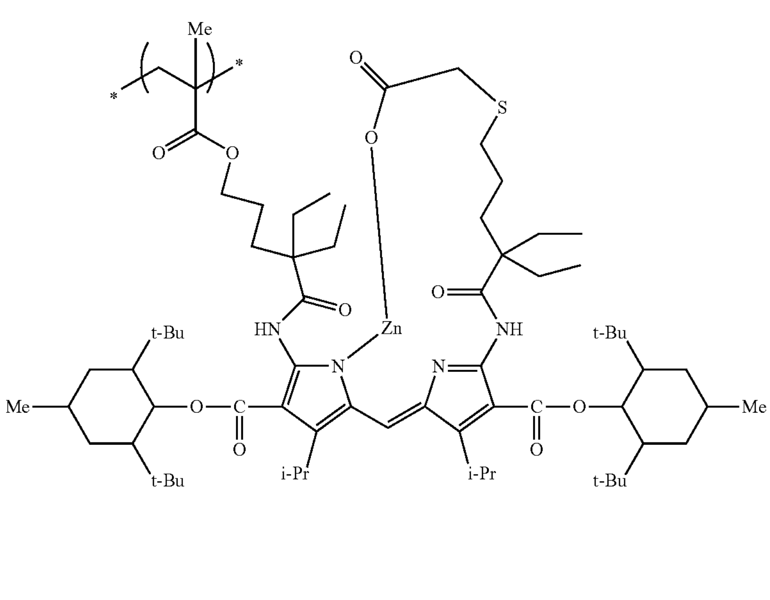

-continued
(A-dp-16)
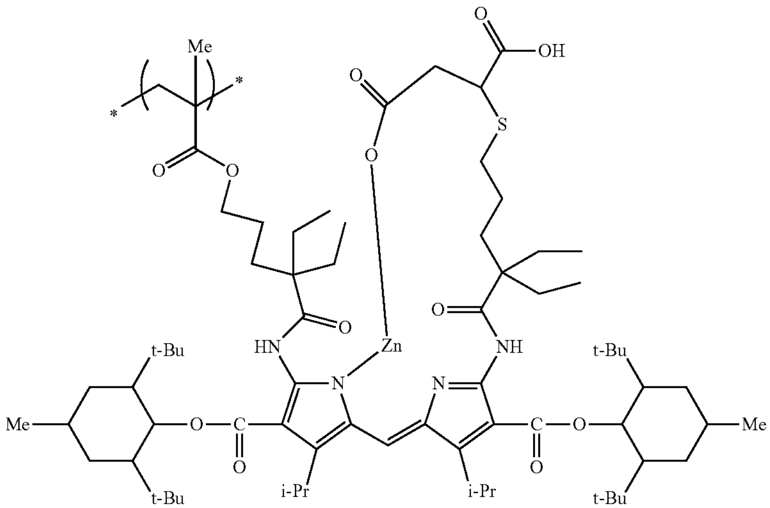
(A-dp-17)
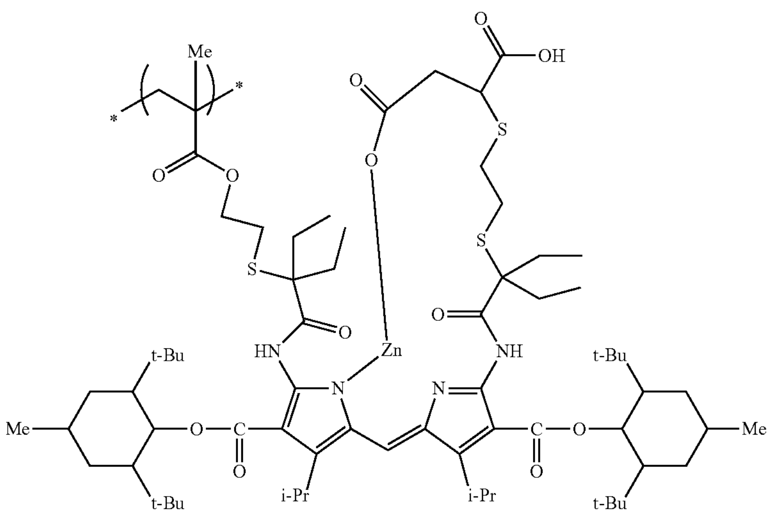
(A-dp-18)
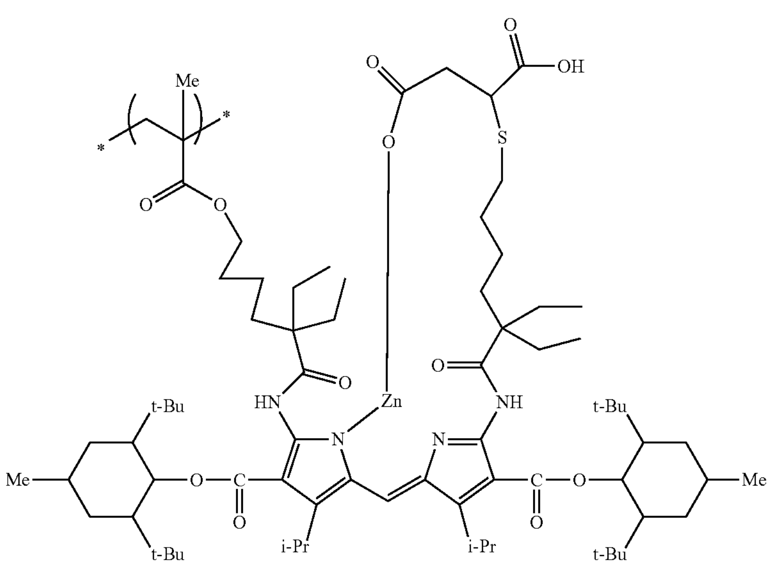

-continued
(A-dp-19)
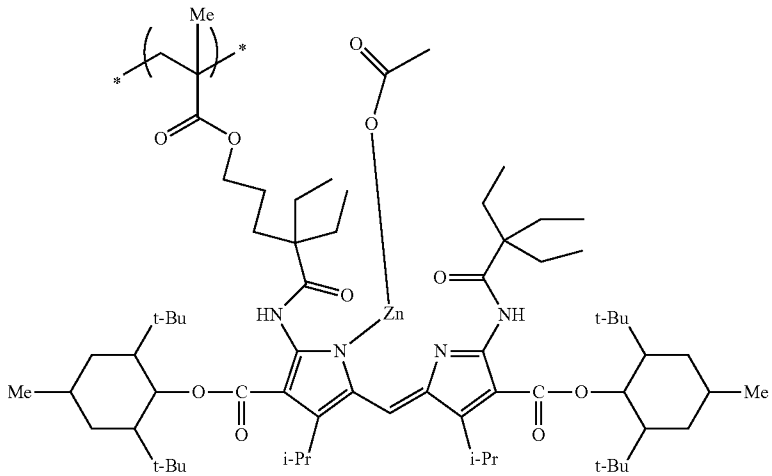
(A-dp-20)
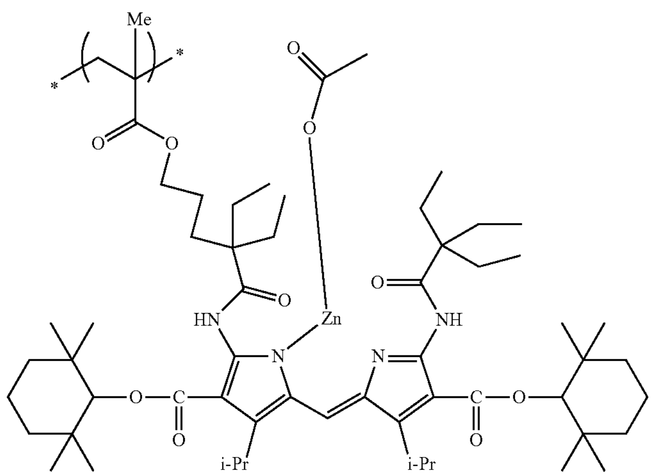
[Chem. 60]
(A-dp-21)
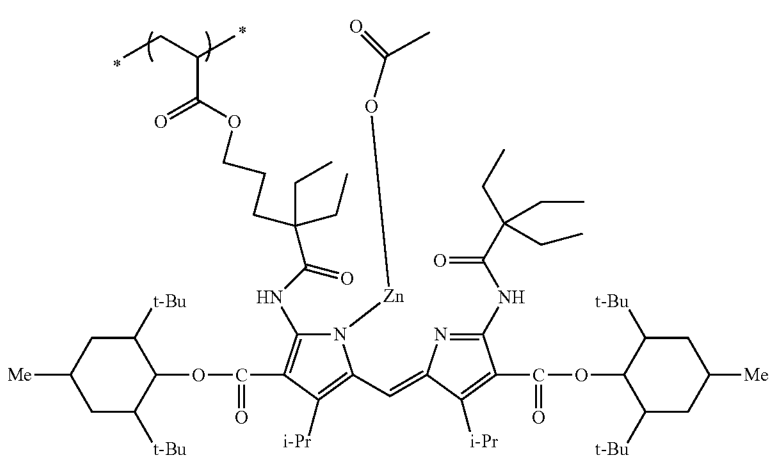

-continued
(A-dp-22)
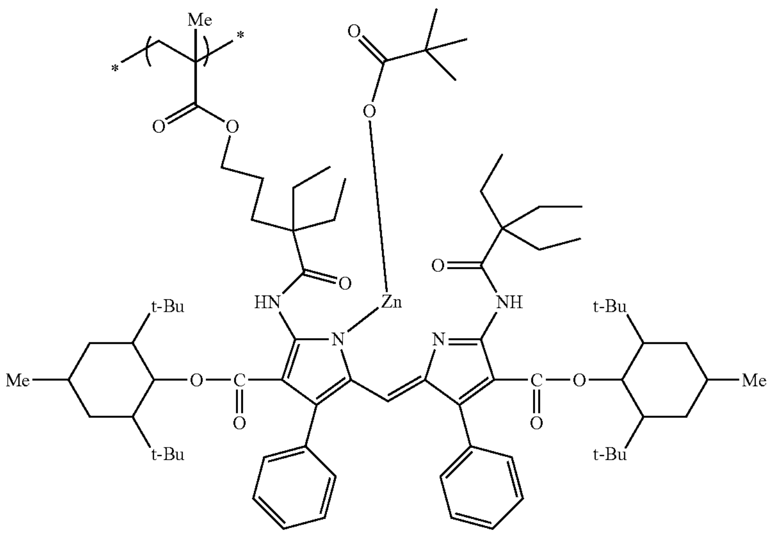
(A-dp-23)
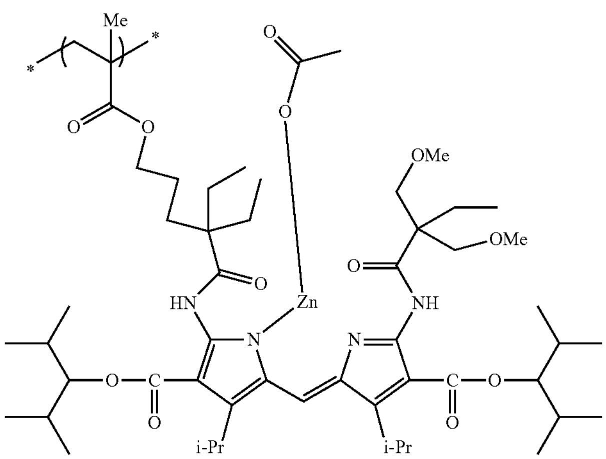
(A-dp-24)
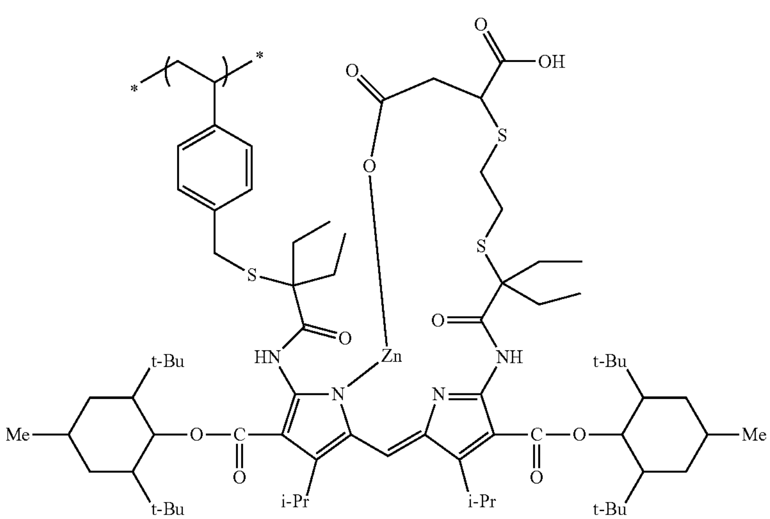

-continued
(A-dp-25)
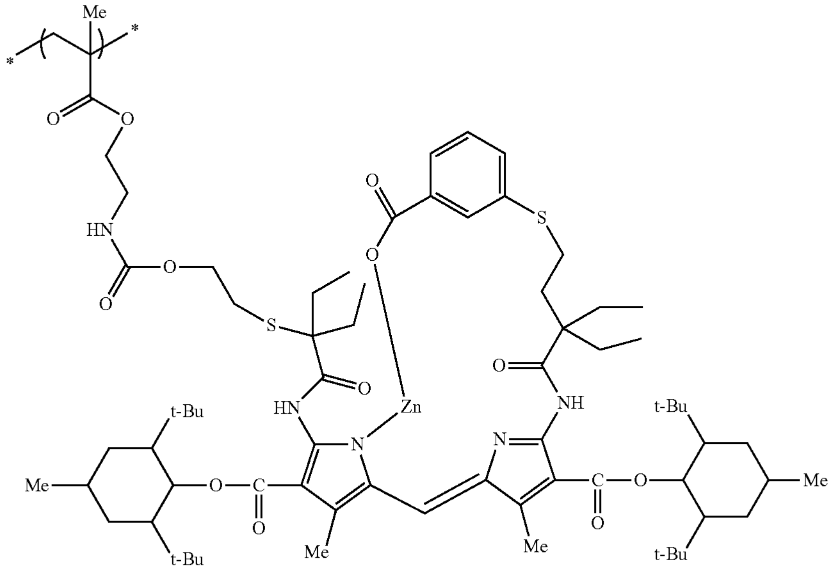
(A-dp-26)
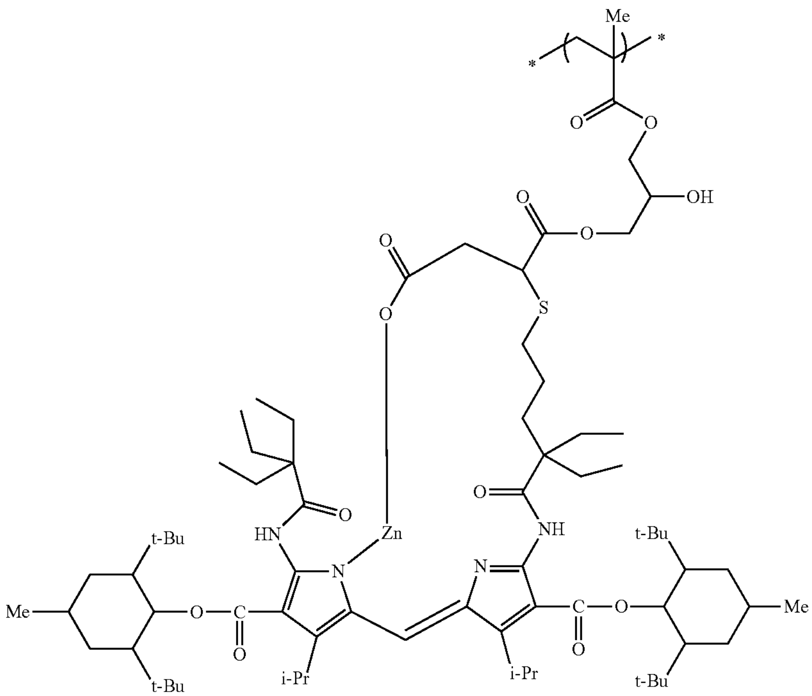
[Chem. 61]
(A-az-1)
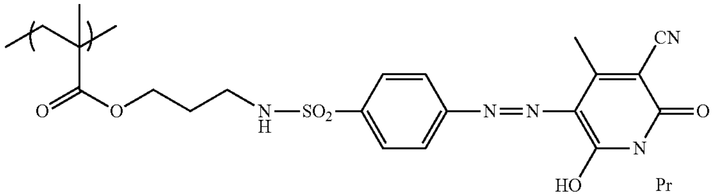

-continued
(A-az-2)
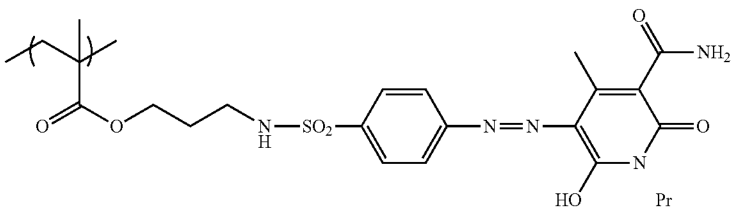
(A-az-3)
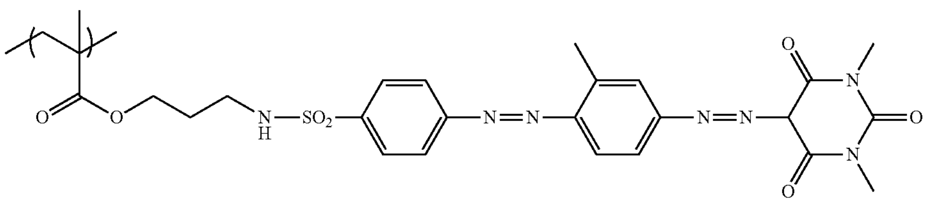
(A-az-4)
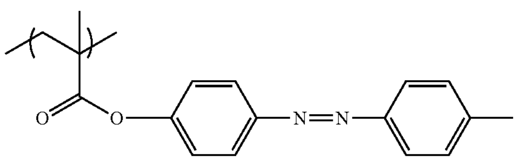
(A-az-5)
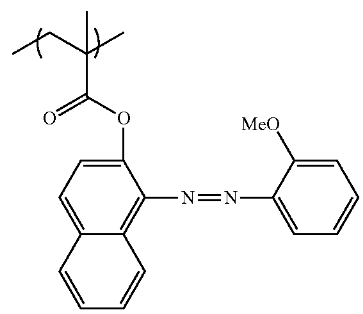
(A-az-6)
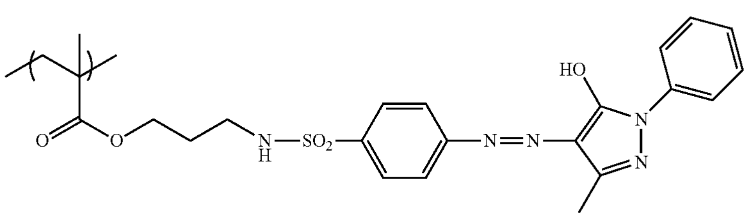
[Chem. 62]
(A-az-7)
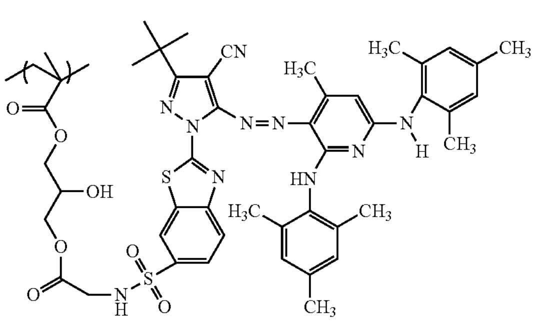
(A-az-8)
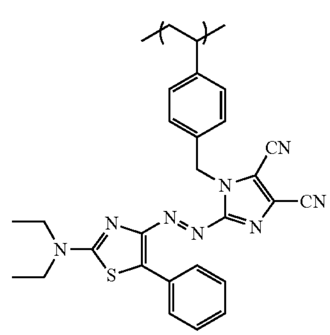

-continued
(A-az-9)
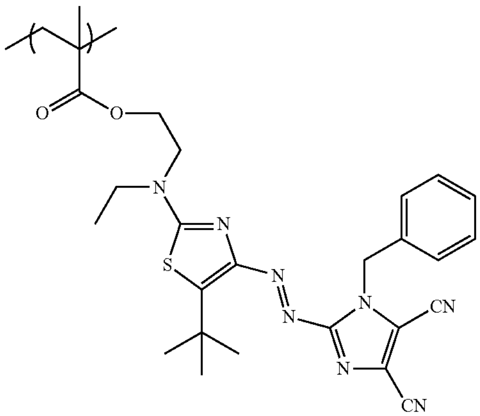
(A-az-10)
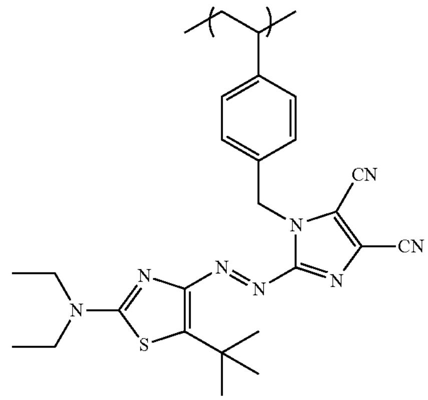
(A-az-11)
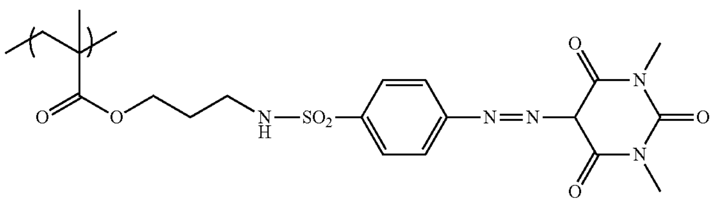
[Chem. 63]
(A-aq-1)
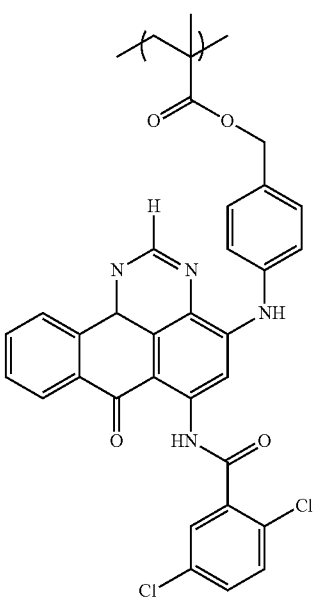
(A-aq-2
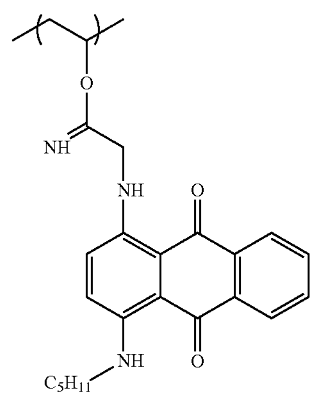

-continued
(A-aq-3)
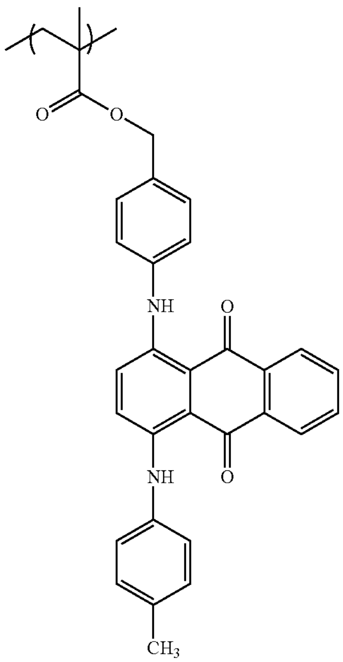
(A-aq-4)
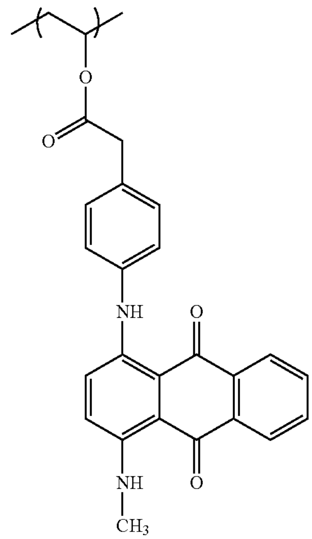
(A-aq-5)
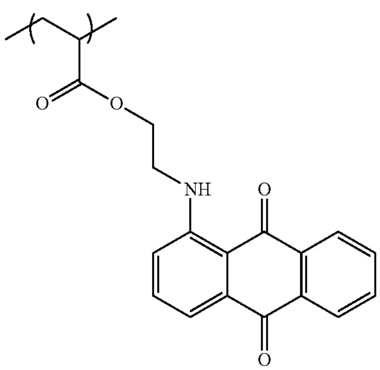
(A-aq-6)
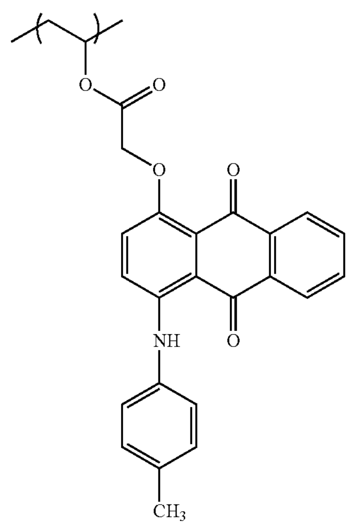
(A-aq-7)
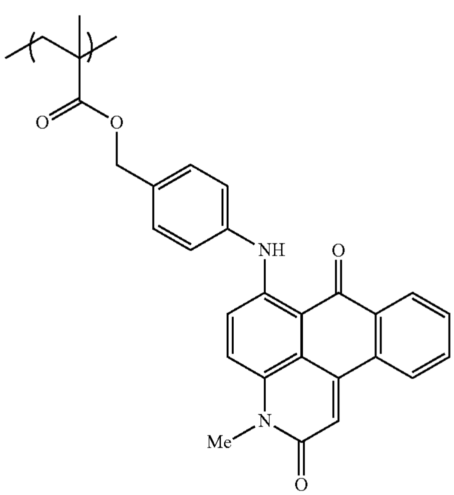
(A-aq-8)
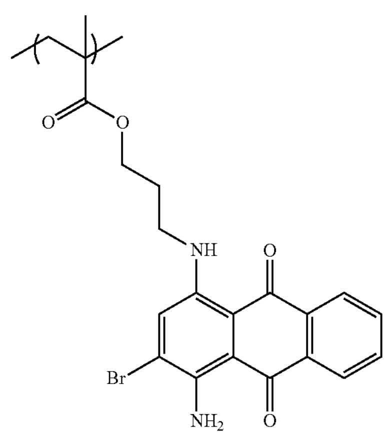

-continued
(A-aq-9)
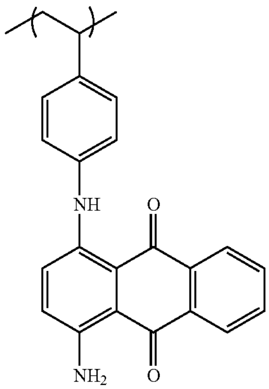
(A-aq-10)
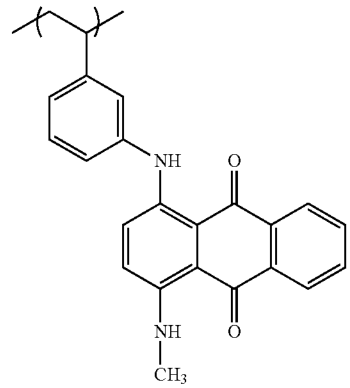
(A-aq-11)
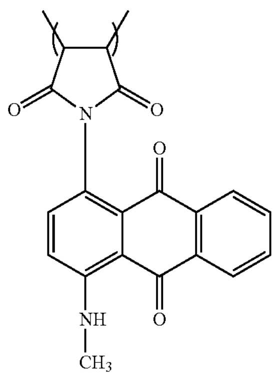
(A-aq-12)
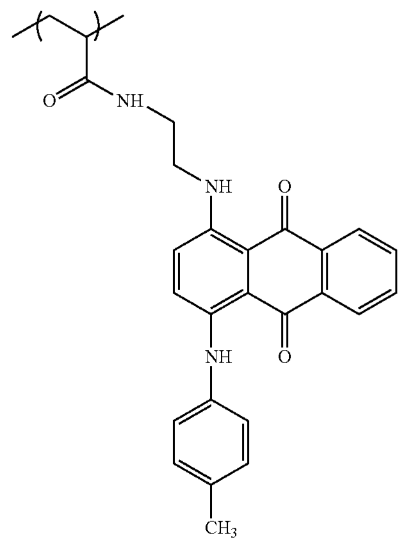
[Chem. 64]
(A-tp-1)
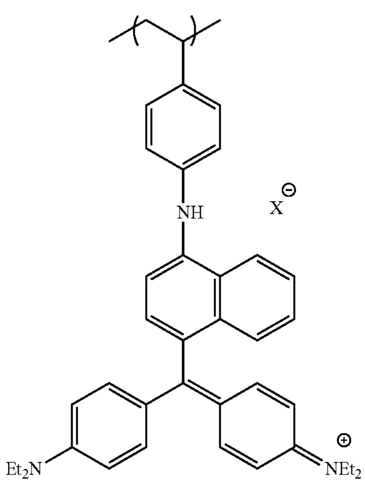
(A-tp-2)
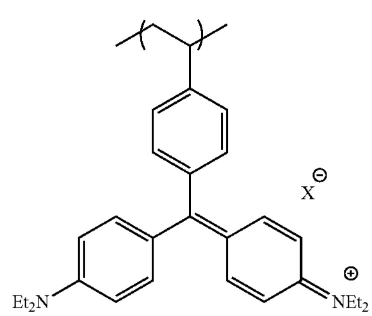

-continued
(A-tp-3)
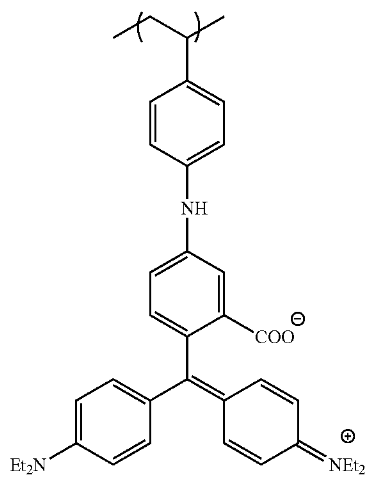
[Chem. 65]
(A-xt-1)
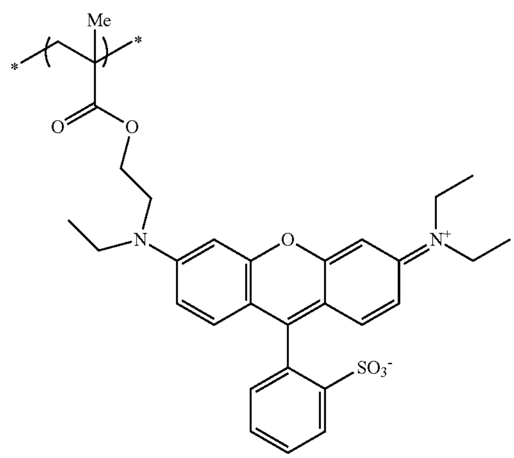
(A-xt-2)
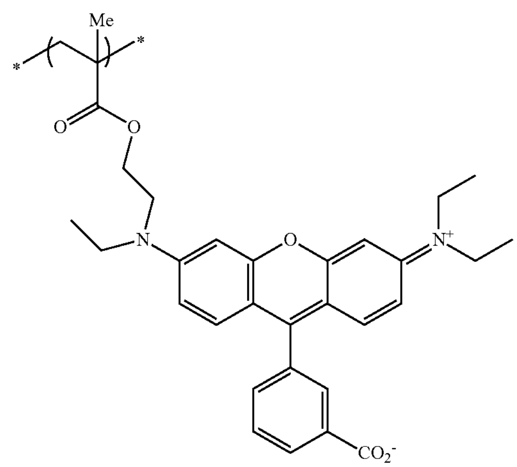
(A-xt-3)
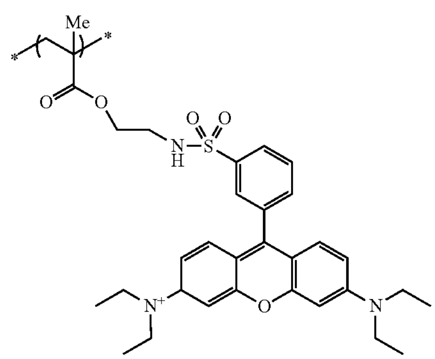
(A-xt-4)
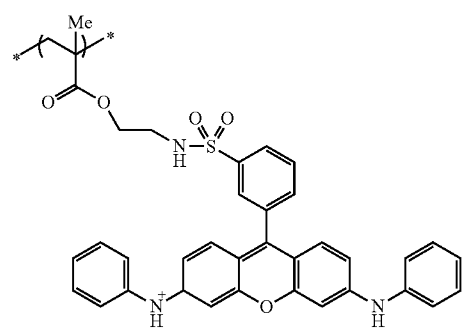

-continued
(A-xt-5)
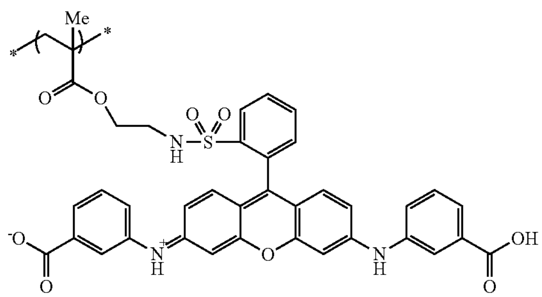
(A-xt-6)
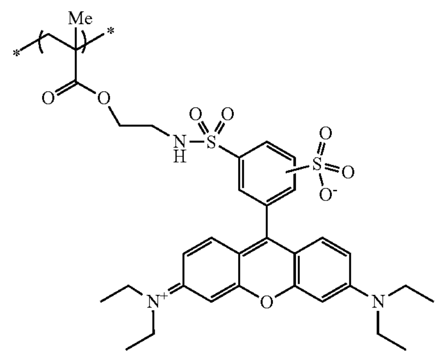
[Chem. 66}
(A-pm-1)
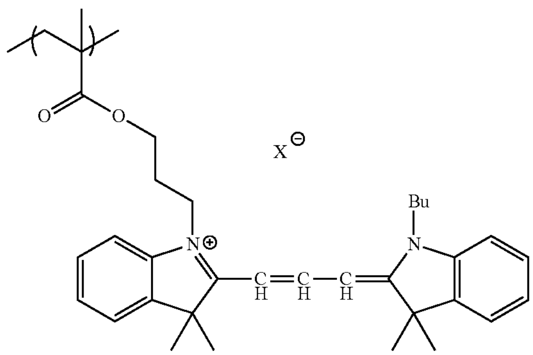
(A-pm-2)
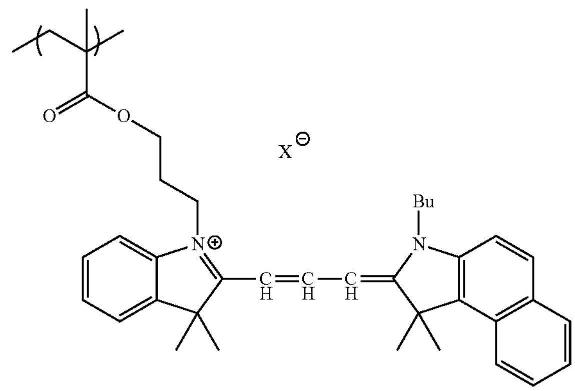
(A-pm-3)
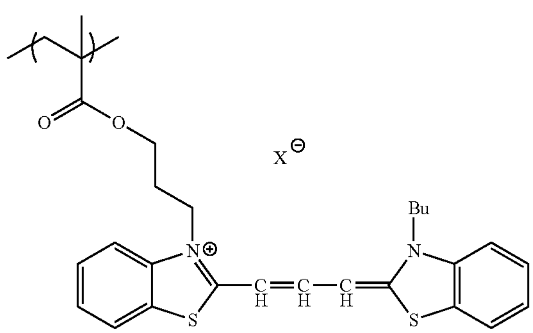
(A-pm-4)
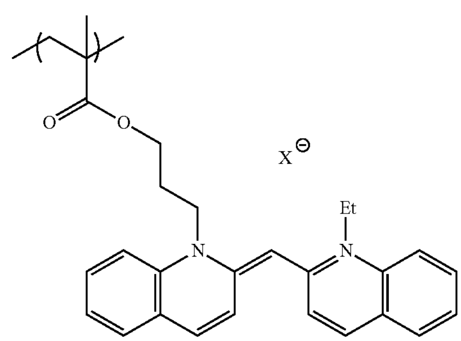
(A-pm-5)
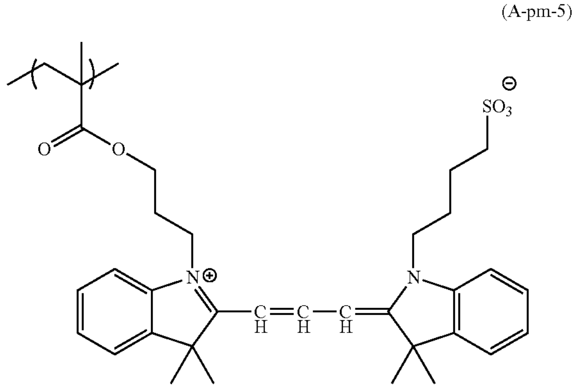
(A-pm-6)
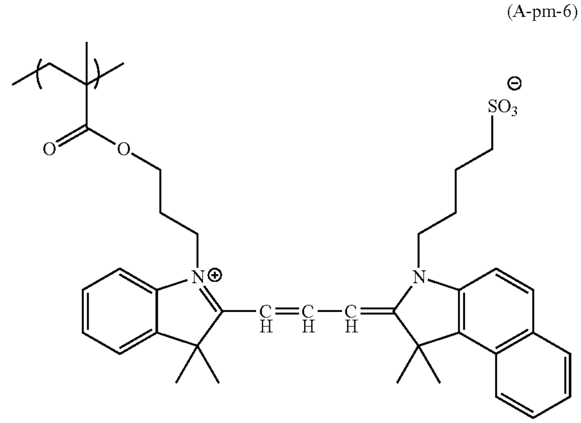

-continued
[Chem. 67]
(A-sq-1)
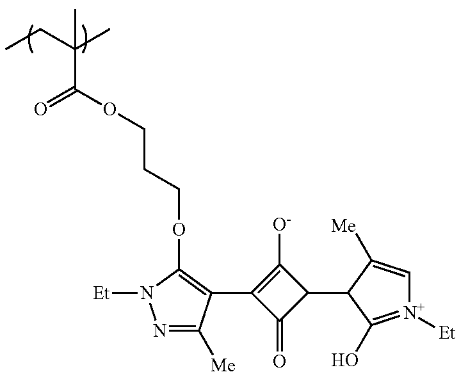
(A-sq-2)
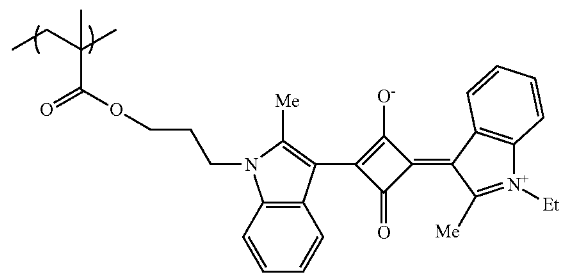
(A-sq-3)
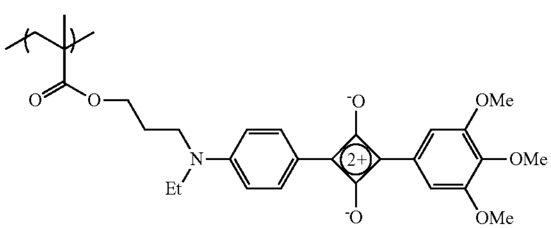
(A-sq-4)
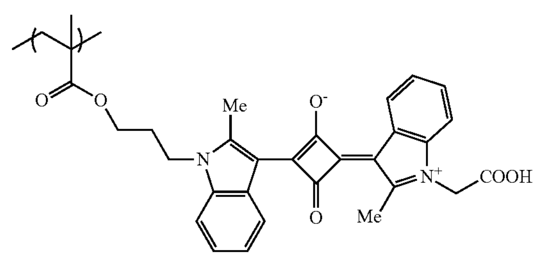
(A-sq-4)
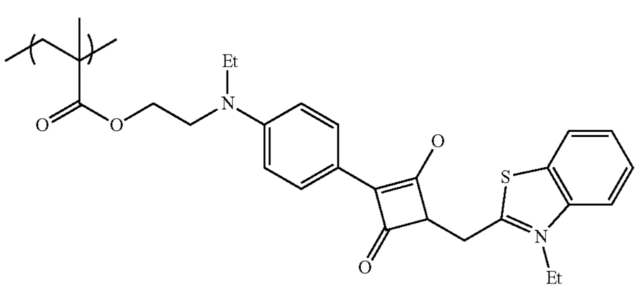
[Chem. 68]
(A-qp-1)
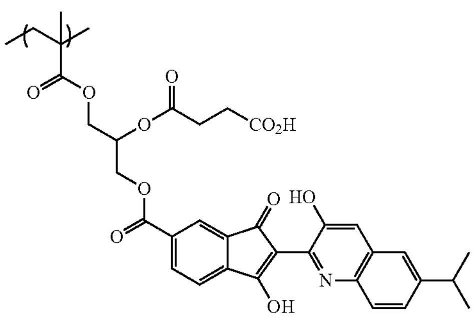
(A-qp-2)
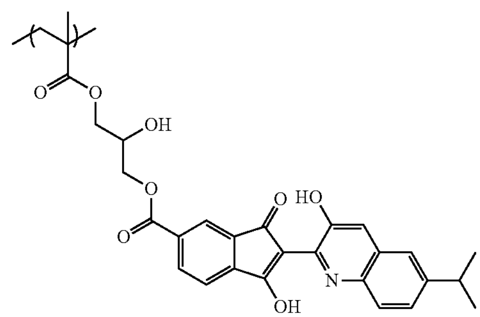

-continued
[Chem. 69]
(A-SP-1)
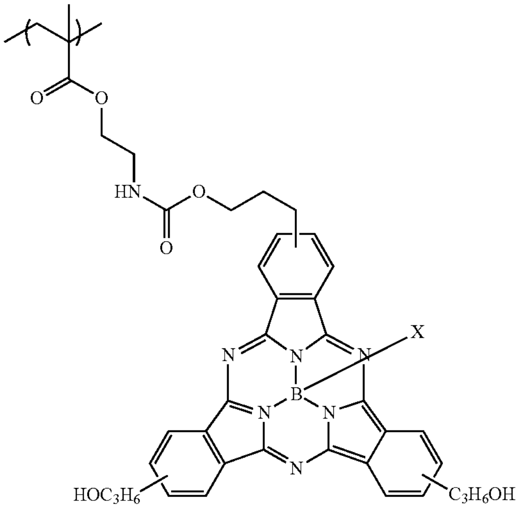
(A-SP-2)
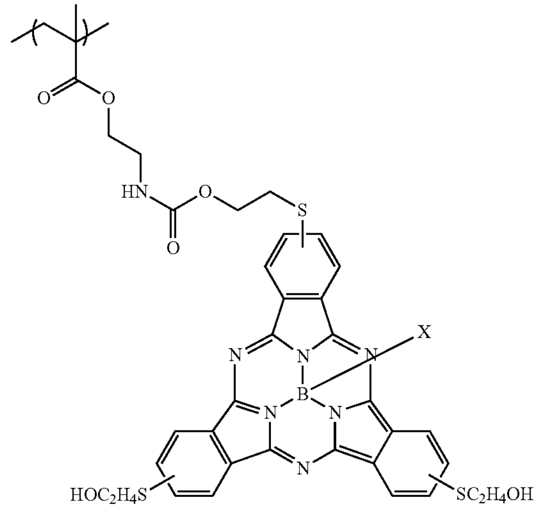
(A-SP-3)
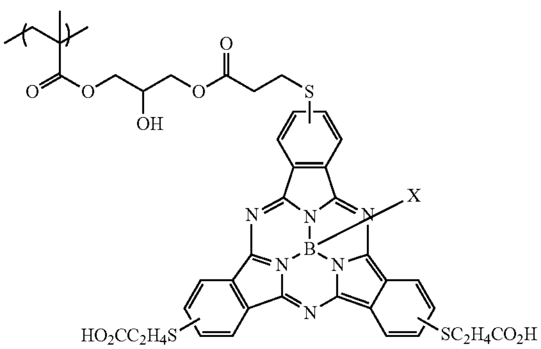
(A-SP-4)
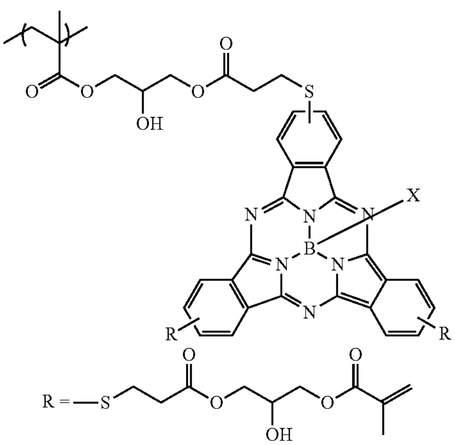
[Chem. 70]
(A-ph-1)
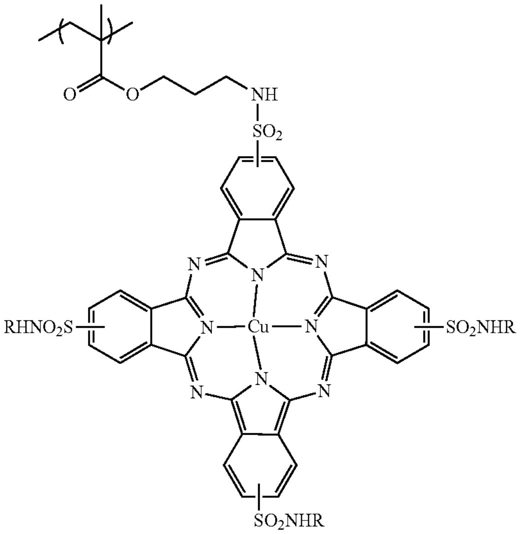
R = CH2CH2CH2OH
(A-ph-2)
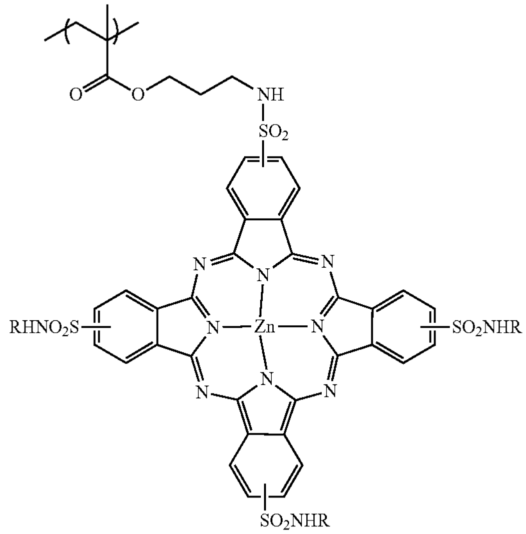
R = CH2CH2CH2OH -continued
(A-ph-3)
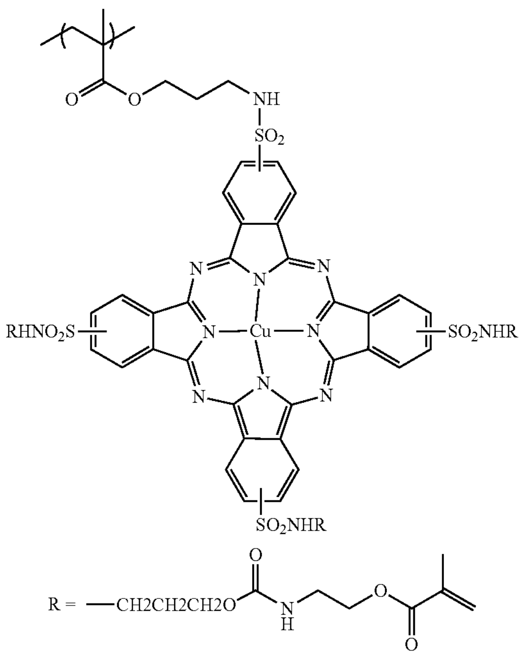
(A-ph-4)
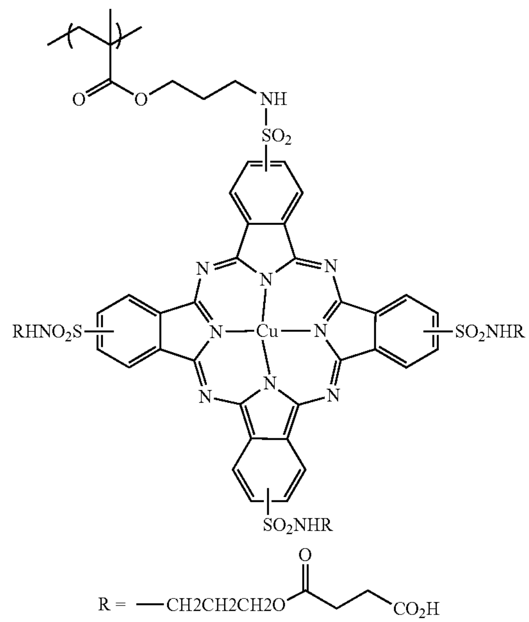
[Chem. 71]
(A-st-1)
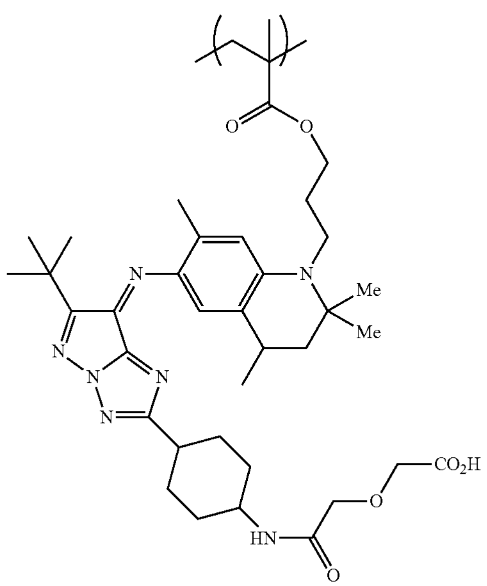
(A-st-2)
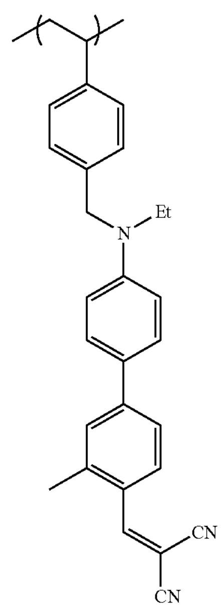

-continued (A-st-3)

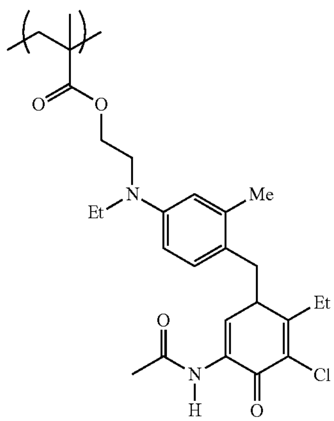

(A-st-4)

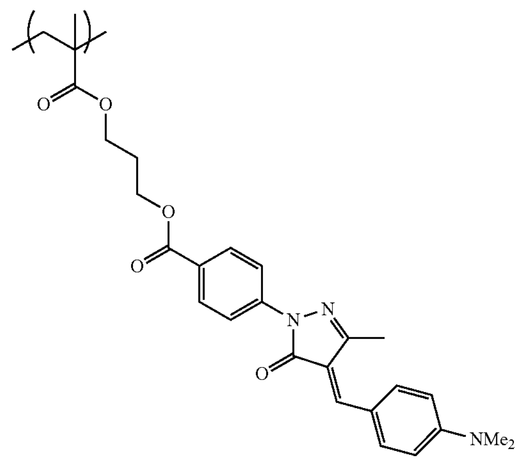

<Structural Unit Represented by Formula (B)>

Next, a structural unit represented by Formula (B) will be described in detail.

[Chem. 72]

Formula (B)

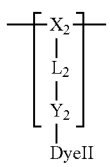

In Formula (B), $X_2$ has the same definition as $X_2$ in the Formula (A). $L_2$ has the same definition as $L_1$ in the Formula (A). $Y_2$ represents a group that can form an ionic bond or a coordinate bond with DyeII. DyeII represents a dye structure. Hereinafter, Formula (B) will be described in detail.

In Formula (B), $X_2$ has the same definition as that of $X_2$ in the Formula (A), and the preferable range thereof is also the same. $L_2$ has the same definition as $L_1$ in the Formula (A), and the preferable range thereof is also the same. $Y_2$ is preferably a group that can form an ionic bond or a coordinate bond with DyeII, and may be either an anionic group or a cationic bond. Examples of the anionic group include $COO^-$, $PO_3H^-$, $SO_3^-$, —$SO_3NH^-$, —$SO_3N^-CO$—, and the like, and among these, $COO^-$, $PO_3H^-$, and $SO_3^-$ are preferable.

Examples of the cationic group include substituted or unsubstituted onium cations (for example, ammonium, pyridinium, imidazolium, phosphonium, and the like), and among these, an ammonium cation is particularly preferable.

$Y_2$ can be bonded to an anion portion ($COO^-$, $SO_3^-$, $O^-$, or the like) or a cation portion (the onium cation described above, a metal cation, or the like) that DyeII has.

The dye multimer having the structural unit represented by Formula (B) in the present invention can be synthesized in the same manner as the dye multimer having the structural unit represented by the Formula (A).

Among these, from the viewpoint of heat resistance, it is preferable for the dye multimer having the structural unit represented by Formula (B) to be a radical polymer that is obtained by radical polymerization by using a dye monomer having an ethylenically unsaturated bond.

Specific examples of structural units represented by Formula (B) will be shown below, but the present invention is not limited thereto.

[Chem. 73]

(B-dp-1)

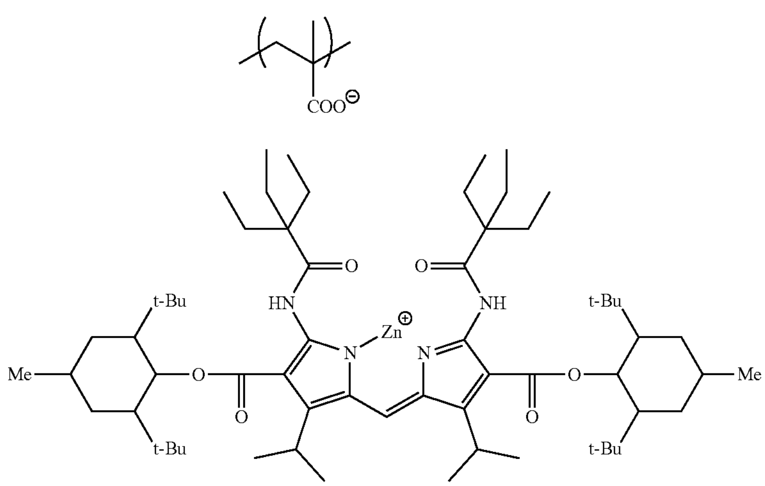

-continued
(B-dp-2)
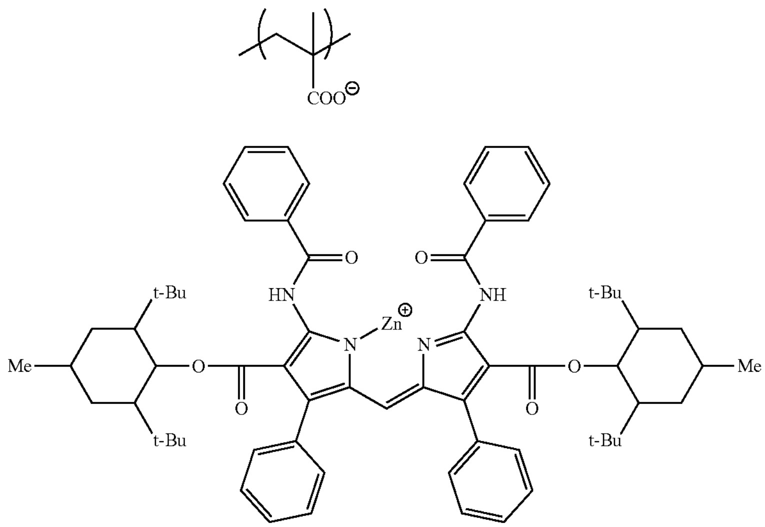
(B-tp-1)
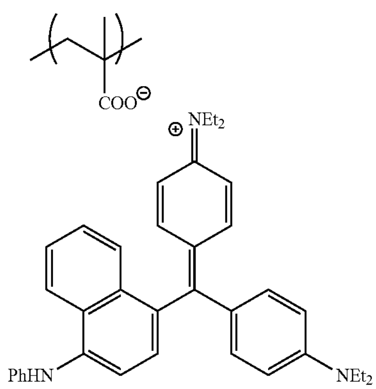
(B-tp-2)
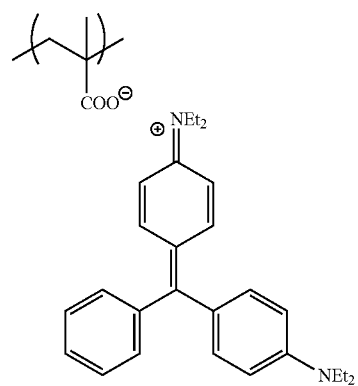
(B-pm-1)
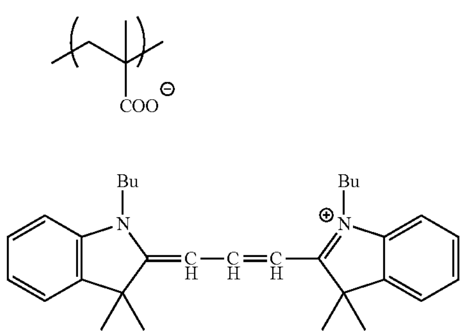

-continued (B-sp-1)

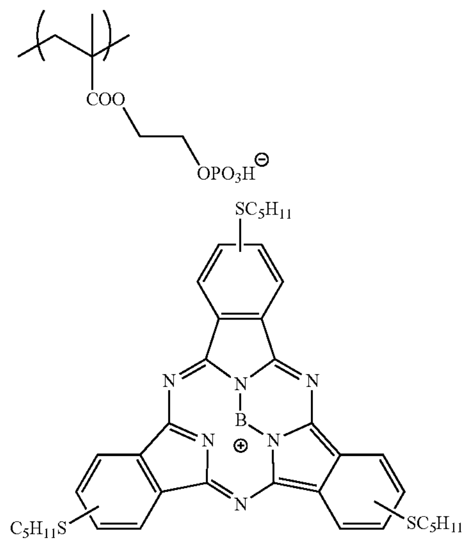

(B-pm-2)

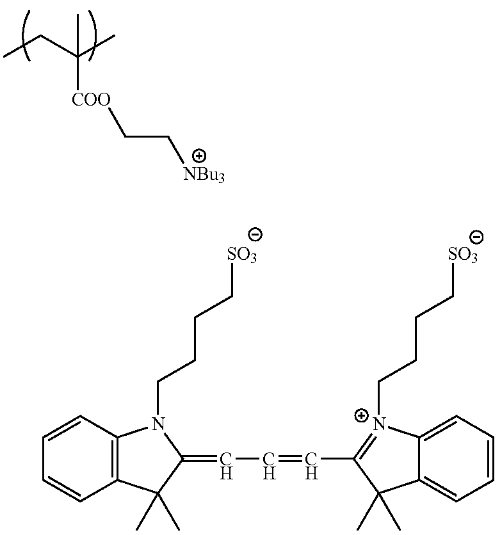

<Structural Unit Represented by Formula (C)>

[Chem. 74]

Formula (C)

$$*\!-\!\left[\text{DyeIII}\!-\!(L_3)_m\right]\!-\!*$$

In Formula (C), $L_3$ represents a single bond or a divalent linking group. DyeIII represents a partial structure of a dye, and m represents 0 or 1. Hereinafter, Formula (C) will be described in detail.

In the Formula (C), preferable examples of the divalent linking group represented by $L_3$ include a substituted or unsubstituted linear, branched, or cyclic alkylene group having 1 to 30 carbon atoms (for example, a methylene group, an ethylene group, a trimethylene group, a propylene group, or a butylene group), a substituted or unsubstituted arylene group having 6 to 30 carbon atoms (for example, a phenylene group or a naphthylene group), a substituted or unsubstituted heterocyclic linking group, —CH═CH—, —O—, —S—, —NR— (each R independently represents a hydrogen atom, an alkyl group, an aryl group, or a heterocyclic group), —C(═O)—, —SO—, —$SO_2$—, and a linking group that is formed of two or more of these groups linked to each other. m represents 0 or 1, and is preferably 1.

Specific examples that are preferably used as the divalent linking group represented by $L_3$ in Formula (C) will be shown below, but $L_3$ of the present invention is not limited thereto.

[Chem. 75]

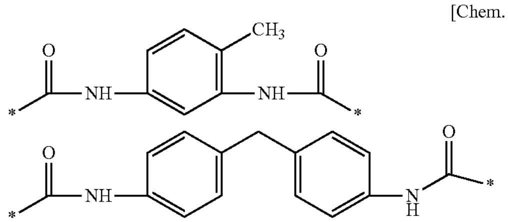

-continued

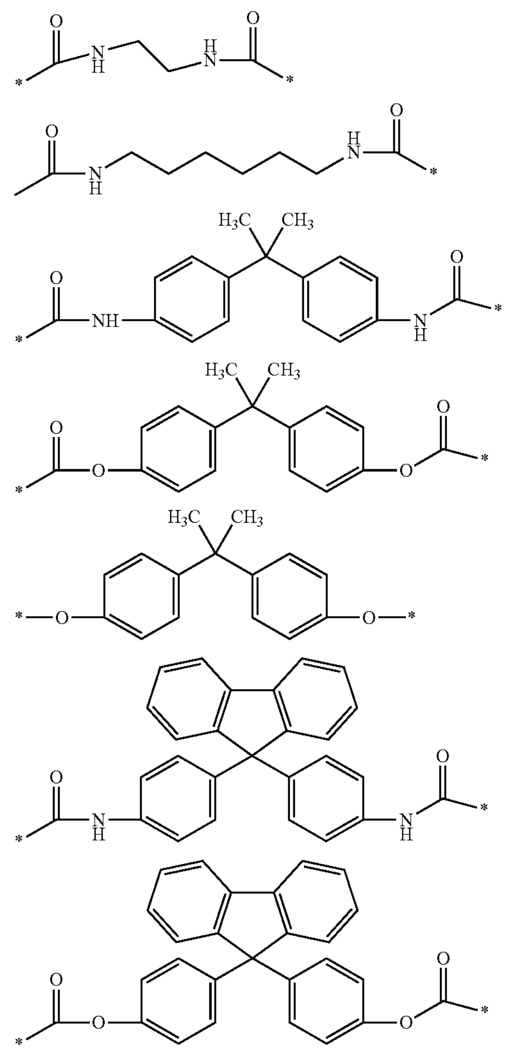

-continued

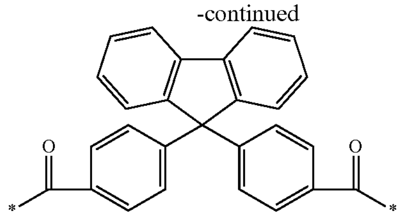

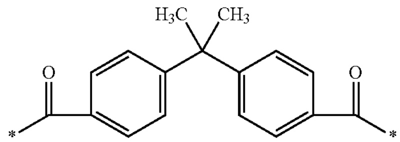

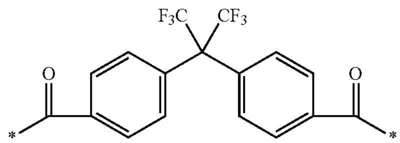

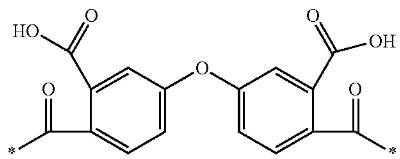

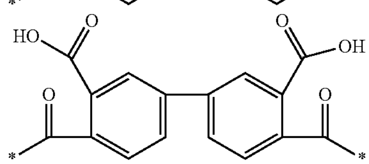

-continued

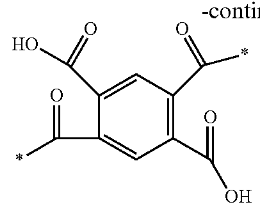

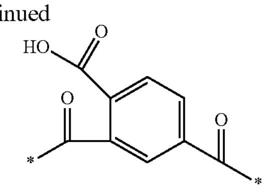

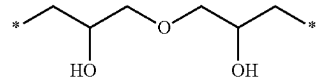

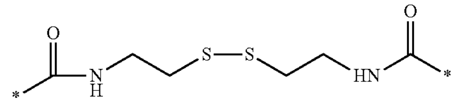

The dye multimer having the structural unit represented by Formula (C) is synthesized by sequential polymerization. Examples of the sequential polymerization include polyaddition (for example, a reaction between an diisocyanate compound and diol, a reaction between a diepoxy compound and a dicarboxylic acid, a reaction between a tetracarboxylic dianhydride and diol, or the like) and polycondensation (for example, a reaction between a dicarboxylic acid and diol, a reaction between a dicarboxylic acid and diamine, or the like). Among these, it is particularly preferable to use the polyaddition reaction to synthesize the dye multimer, since the reaction conditions can be set to be mild, and a dye structure is not degraded by the reaction. For the sequential polymerization, known reaction conditions can be applied.

Specific examples of structural units represented by Formula (C) will be shown below, but the present invention is not limited thereto.

[Chem. 76]

(C-1)

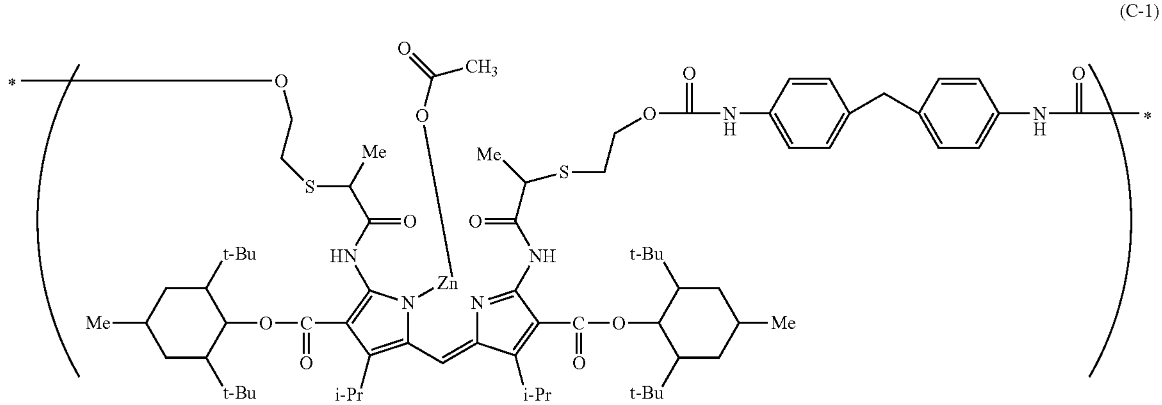

(C-2)

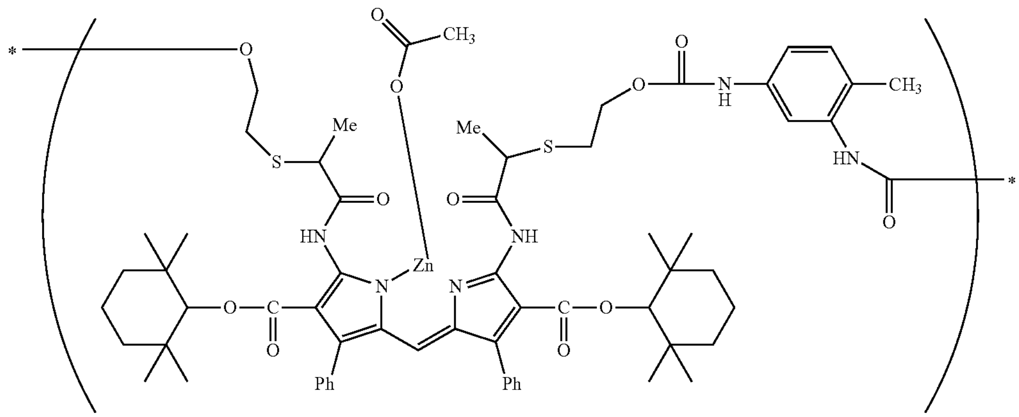

-continued
(C-3)
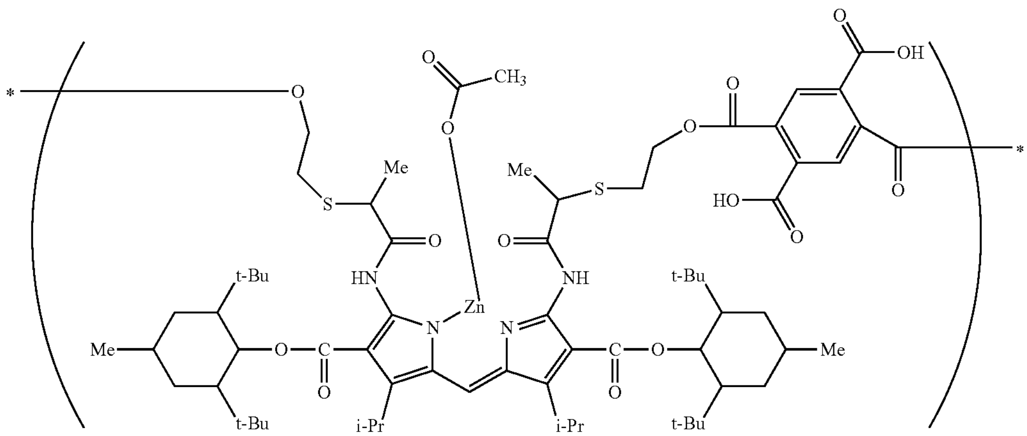
[Chem. 77]
(C-az-1)
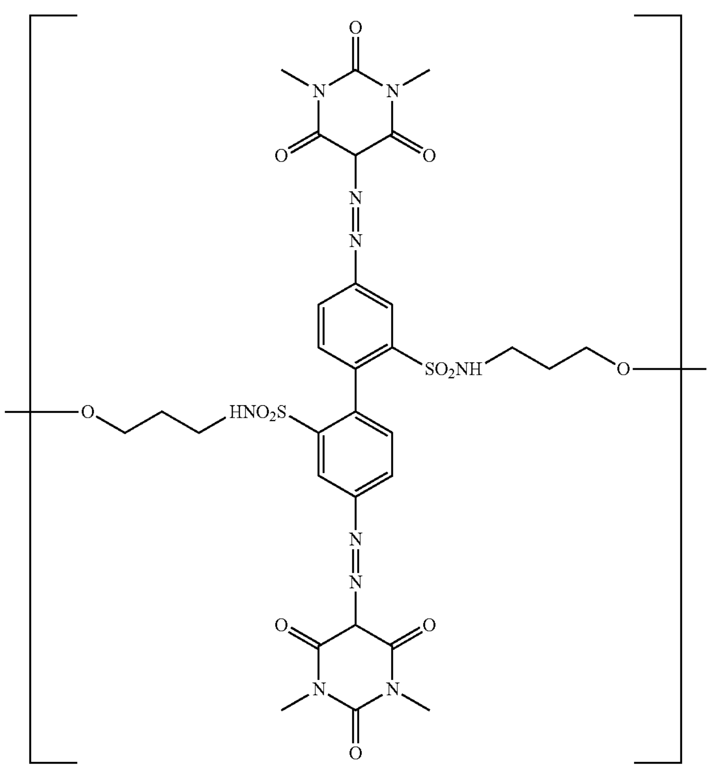
(C-pm-1)
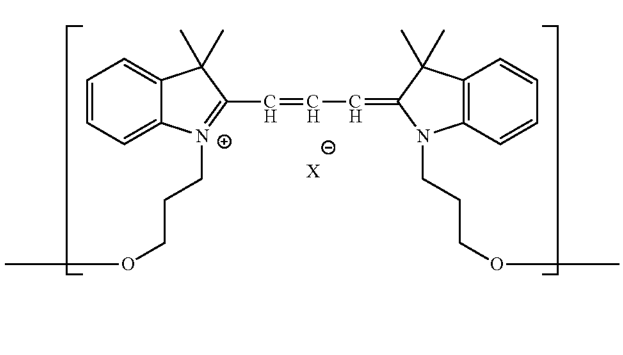

-continued (C-aq-1)

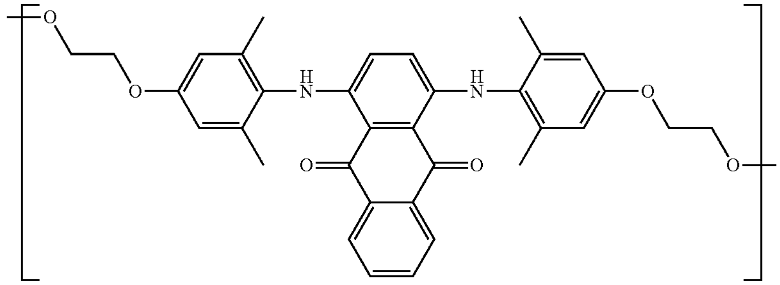

(C-sq-1)

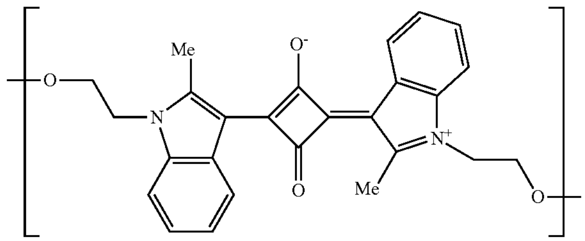

(C-az-2)

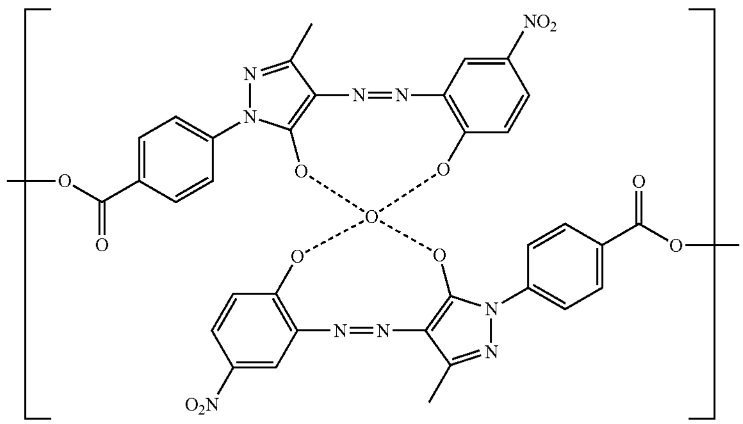

<Dye Multimer Represented by Formula (D)>

Next, a dye multimer represented by Formula (D) will be described in detail.

[Chem. 78]

$$(L_4)\!-\!(\text{DyeIV})_n \qquad \text{Formula (D)}$$

In Formula (D), $L_4$ represents a linking group having a valency of n. n represents an integer from 2 to 20. When n is 2 or greater, structures of DyeIV may be the same as or different from each other. DyeIV represents a dye structure.

In Formula (D), n is preferably 3 to 15, and particularly preferably 3 to 6.

In Formula (D), when n is 2, preferable examples of divalent linking groups represented by $L_4$ include a substituted or unsubstituted alkylene group having 1 to 30 carbon atoms (for example, a methylene group, an ethylene group, a trimethylene group, a propylene group, a butylenes group, or the like), a substituted or unsubstituted arylene group having 6 to 30 carbon atoms (for example, a phenylene group, a naphthylene group, or the like), a substituted or unsubstituted heterocyclic linking group, —CH═CH—, —O—, —S—, —NR— (each R independently represents a hydrogen atom, an alkyl group, an aryl group, or a heterocyclic group), —C(═O)—, —SO—, —$SO_2$—, and a linking group that is formed of two or more of these groups linked to each other.

When n is 3 or greater, examples of the linking group having a valency of n include linking groups which have, as a central core, substituted or unsubstituted arylene group (a 1,3,5-phenylene group, a 1,2,4-phenylene group, a 1,4,5,8-naphthalene group, or the like), a heterocyclic linking group (for example, a 1,3,5-triazine group or the like), an alkylene linking group, or the like, and are formed when the aforementioned divalent linking group is substituted.

Specific examples of $L_4$ in Formula (D) will be shown below, but the present invention is not limited thereto.

[Chem. 79]

(L4-1)

$$*-CH_2CH_2CH_2CH_2-*$$

(L4-2)

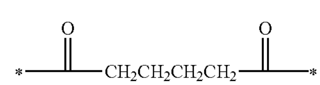

-continued
(L4-3)
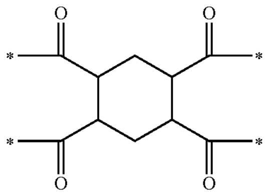
(L4-4)
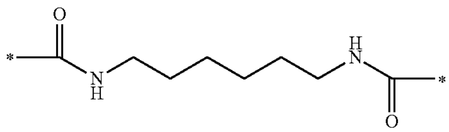
(L4-5)
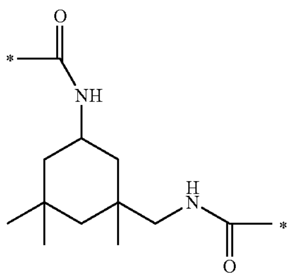
(L4-6)
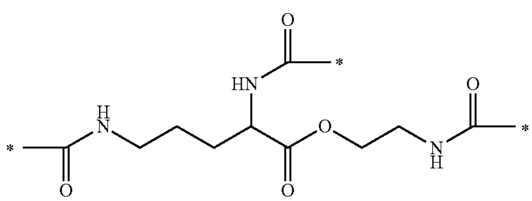
(L4-7)
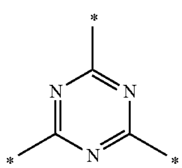
(L4-8)
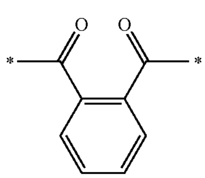
(L4-9)
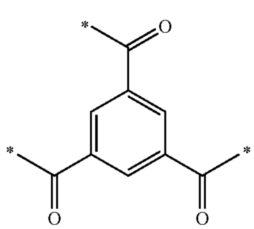
-continued
(L4-10)
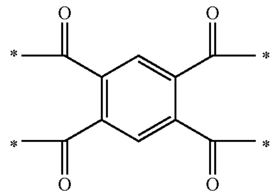
(L4-11)
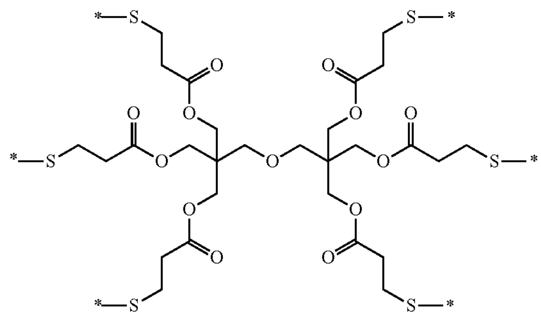
(L4-12)
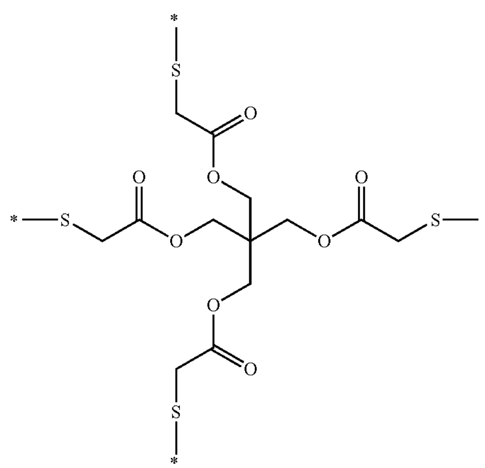
(L4-13)
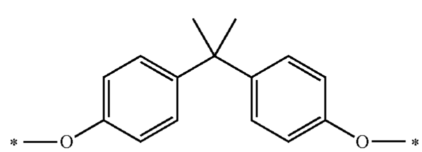
(L4-14)
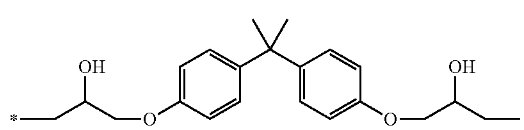
Specific examples of DyeIV in Formula (D) will be shown below, but the present invention is not limited thereto

[Chem. 80]

(D-sq-1)

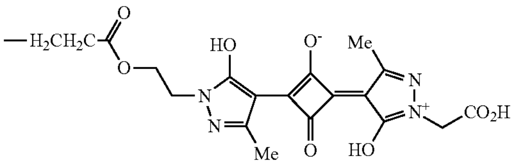

(D-az-1)

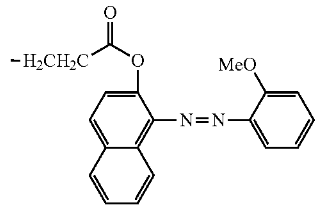

(D-az-2)

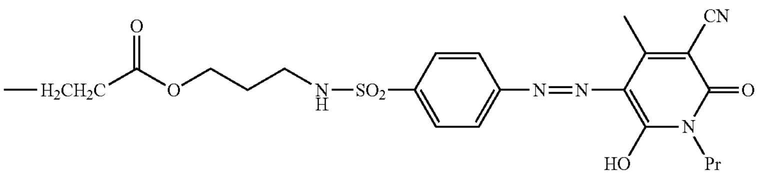

(D-tp-1)

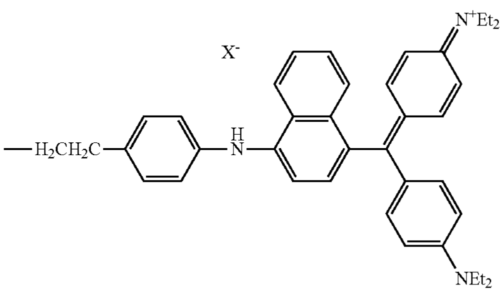

(D-sp-1)

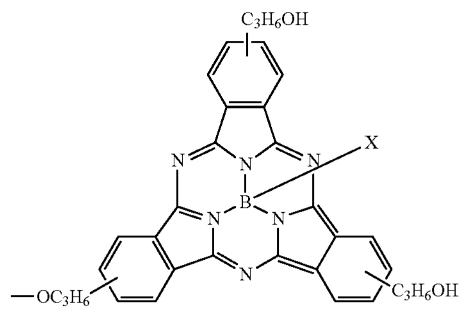

(D-qp-1)

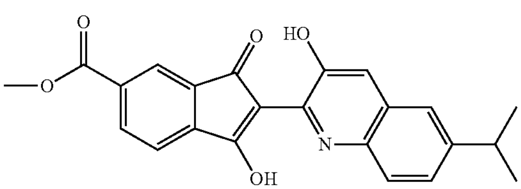

(D-xt-1)

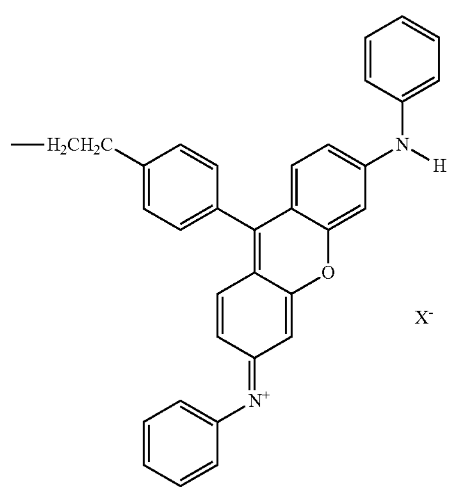

(D-az-3)

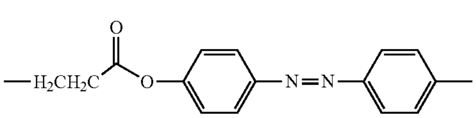

(D-aq-1)

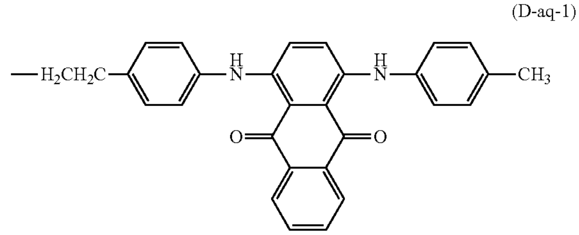

Among the dye multimer having the structural unit represented by Formula (A), Formula (B), and/or Formula (C) and the dye multimer represented by Formula (D), in the dye multimer having the structural unit represented by Formula (A) and Formula (C) and the dye multimer represented by Formula (D), the partial structures derived from a dye are linked to each other through a covalent bond in the molecular structure. Accordingly, the colored radiation-sensitive composition containing such a dye multimer has excellent heat resistance. Therefore, if the colored radiation-sensitive composition is used for a pattern forming process including a high-temperature process, it is preferable since an effect of inhibiting color migration to another colored pattern adjacent thereto is obtained. Moreover, the compound represented by Formula (A) is particularly preferable since the compound makes it easy to control the molecular weight of the dye multimer.

(Polymerizable Group that the Dye Multimer (A) has)

It is preferable for the dye multimer (A) of the present invention to have a polymerizable group.

As the polymerizable group, known polymerizable groups that can be crosslinked by a radical, an acid, or heat can be used, and examples thereof include groups having an ethylenically unsaturated bond, cyclic ether groups (an epoxy group and a oxetane group), methylol groups, and the like. Particularly, groups having an ethylenically unsaturated bond are preferable, (meth)acryloyl groups are more preferable, and (meth)acryloyl groups derived from glycidyl (meth)acrylate and 3,4-epoxy-cyclohexyl methyl (meth)acrylate are most preferable.

As the method of introducing the polymerizable group, there are (1) a method of introducing the polymerizable group by modifying the dye multimer with a polymerizable group-containing compound, (2) a method of introducing the polymerizable group by copolymerizing the dye multimer with a polymerizable group-containing compound, and the like. Hereinafter, the methods will be described in detail.

—(1) Method of Introducing Polymerizable Group by Modifying Dye Mulitmer with Polymerizable Group-Containing Compound—

As the method of introducing the polymerizable group by modifying the dye multimer with a polymerizable group-containing compound, known methods can be used without particular limitation. For example, from the viewpoint of production, (a) a method of causing a reaction between a carboxylic acid contained in the dye multimer and an unsaturated bond-containing epoxy compound, (b) a method of causing a reaction between a hydroxyl group or an amino group contained in the dye multimer and an unsaturated bond-containing isocyanate compound, and (c) a method of causing a reaction between an epoxy compound contained in the dye multimer and an unsaturated bond-containing carboxylic acid compound are preferable.

Examples of the unsaturated bond-containing epoxy compound in (a) a method of causing a reaction between a carboxylic acid contained in the dye multimer and an unsaturated bond-containing epoxy compound include glycidyl methacrylate, glycidyl acrylate, allylglycidyl ether, 3,4-epoxy-cyclohexylmethyl acrylate, 3,4-epoxy-cyclohexylmethyl methacrylate, and the like. Particularly, glycidyl methacrylate, and 3,4-epoxy-cyclohexylmethyl methacrylate are preferable since these compounds have crosslinking properties and storage stability. Known conditions can be used as the reaction conditions.

Examples of the unsaturated bond-containing isocyanate compound in (b) a method of causing a reaction between a hydroxyl group or an amino group contained in the dye multimer and an unsaturated bond-containing isocyanate compound include 2-isocyanatoethyl methacrylate, 2-isocyanatoethyl acrylate, 1,1-bis(acryloyloxymethyl)ethyl isocyanate, and the like. Among these, 2-isocyanatoethyl methacrylate is preferable since this compound has excellent crosslinking properties and storage stability. Known conditions can be used as the reaction conditions.

As the unsaturated bond-containing carboxylic acid compound in (c) a method of causing a reaction between an epoxy compound contained in the dye multimer and an unsaturated bond-containing carboxylic acid compound, any carboxylic acid compounds can be used without particular limitation as long as the compound has a known (meth)acryloyloxy group. Among these, methacrylic acid and acrylic acid are preferable, and methacrylic acid is particularly preferable since this acid has excellent crosslinking properties and storage stability. Known conditions can be used as the reaction conditions.

<(2) Method of Introducing Polymerizable Group by Copolymerizing Dye Monomer and Polymerizable Group-Containing Compound>

—Method of Introducing Polymerizable Group by Copolymerizing Dye Monomer and Polymerizable Group-Containing Compound—

As (2) a method of introducing a polymerizable group by copolymerizing a dye monomer and a polymerizable group-containing compound, any known methods can be used without particular limitation. Among these, (d) a method of copolymerizing a radically polymerizable dye monomer with a polymerizable group-containing compound that can be radically polymerized, and (e) a method of copolymerizing a dye monomer that can be subjected to polyaddition with a polymerizable group-containing compound that can be subjected to polyaddition are preferable.

Examples of the polymerizable group-containing compound that can be radically polymerized in (d) a method of copolymerizing a radically polymerizable dye monomer with a polymerizable group-containing compound that can be radically polymerized particularly include an allyl group-containing compound (for example, allyl (meth)acrylate or the like), an epoxy group-containing compound (for example, glycidyl (meth)acrylate, 3,4-epoxy-cyclohexyl methyl (meth)acrylate), an oxetane group-containing compound (for example, 3-methyl-3-oxetanyl methyl (meth)acrylate or the like), and a methylol group-containing compound (for example, N-(hydroxymethyl)acrylamide or the like). Among these, an epoxy group-containing compound and an oxetane group-containing compound are particularly preferable. Known conditions can be used as the reaction conditions.

Examples of the polymerizable group-containing compound that can be subjected to polyaddition in (e) a method of copolymerizing a dye monomer that can be subjected to polyaddition with a polymerizable group-containing compound that can be subjected to polyaddition include an unsaturated bond-containing diol compound (for example, 2,3-dihydroxypropyl (meth)acrylate), and the like. Known conditions can be used as the reaction conditions.

As the method of introducing a polymerizable group, a method of causing a reaction between a carboxylic acid contained in the dye multimer and an unsaturated bond-containing epoxy compound is most preferable.

The amount of the polymerizable group contained in the dye multimer (A) is preferably 0.1 mmol to 2.0 mmol, more preferably 0.2 mmol to 1.5 mmol, and most preferably 0.3 mmol to 1.0 mmol, with respect to 1 g of the dye multimer (A).

As the method of introducing a polymerizable group, a method of causing a reaction between a carboxylic acid contained in the dye multimer and an unsaturated bond-containing epoxy compound is most preferable.

The amount of the polymerizable group contained in the dye multimer (A) is preferably 0.1 mmol to 2.0 mmol, more preferably 0.2 mmol to 1.5 mmol, and most preferably 0.3 mmol to 1.0 mmol, with respect to 1 g of the dye multimer (A).
Specific examples of structural units that the polymerizable group has will be shown below, but the present invention is not limited thereto.
[Chem. 81]
(G-1)
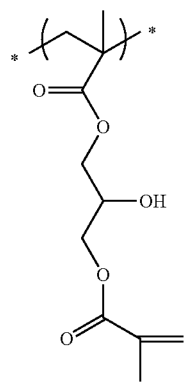
(G-2)
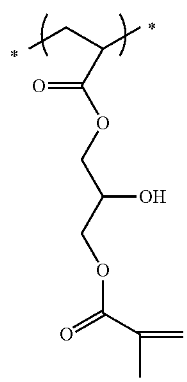
(G-3)
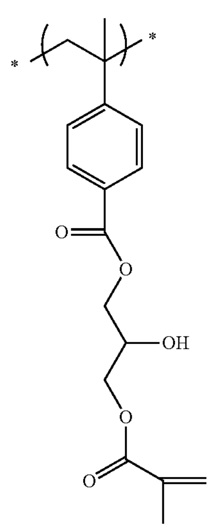
-continued
(G-4)
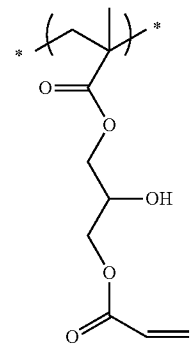
(G-5
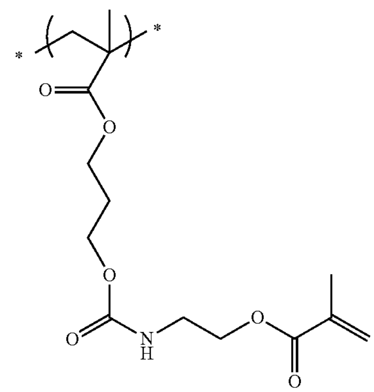
(G-6)
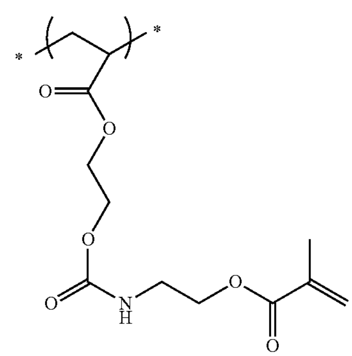
(G-7)
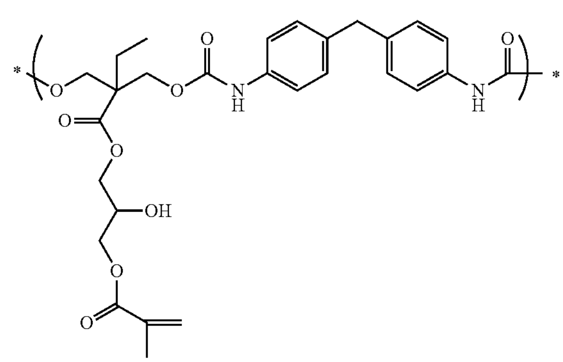

-continued (G-8)

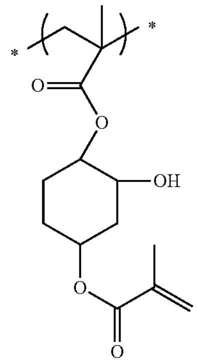

(G-9)

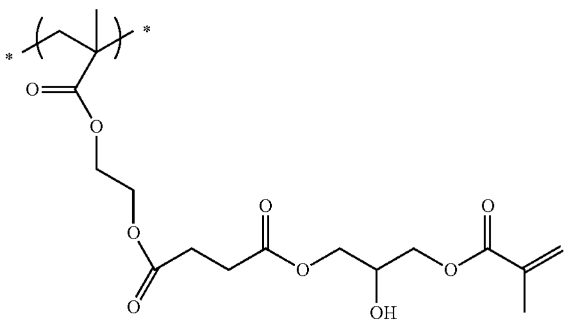

(G-10)

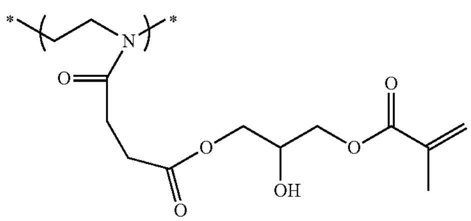

(G-11)

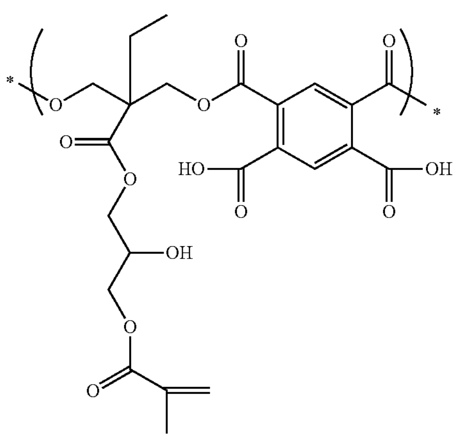

[Chem. 82]

(G-12)

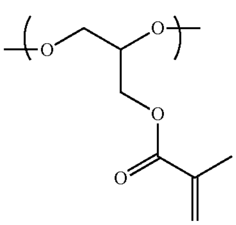

-continued (G-13)

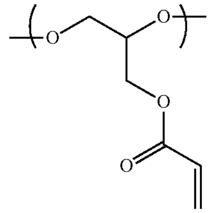

(G-14)

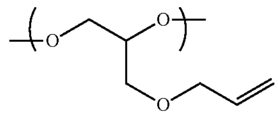

(G-15)

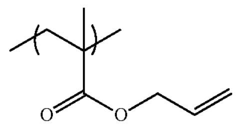

(G-16)

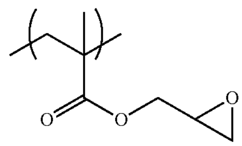

(G-17)

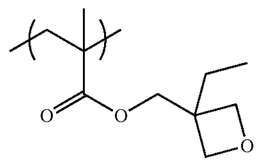

Among the above specific examples, from the viewpoint of substrate adhesiveness and surface roughness, dye monomers having an ethylenically unsaturated bond are preferable. Among these, a methacryloyl group, an acryloyl group, a styryl group, or a vinyloxy group is preferable, and a methacryloyl group is most preferable.

(Other Functional Groups that Dye Multimer (A) has)

The dye multimer (A) in the present invention may have other functional groups. The dye multimer (A) preferably has alkali-soluble groups such as a carboxylic acid, a sulfonic acid, a phosphoric acid, and a phenolic hydroxyl group as other functional groups. As the alkali-soluble group, a carboxylic acid is most preferable.

Examples of the method of introducing the alkali-soluble group to the dye multimer include a method of introducing in advance the alkali-soluble group to a dye monomer and a method of copolymerizing monomers (a caprolactone-modified derivative of a (meth)acrylic acid or an acrylic acid, a succinic anhydride-modified derivative of 2-hydroxyethyl (meth)acrylate, a phthalic anhydride-modified derivative of 2-hydroxyethyl (meth)acrylate, a 1,2-cyclohexanedicarboxylic anhydride-modified derivative of 2-hydroxyethyl (meth)acrylate, a carboxylic acid-containing monomer such as a styrene carboxylic acid, itaconic acid, maleic acid, or norbornene carboxylic acid, a phosphoric acid-containing monomer such as acid phosphoxy ethyl methacrylate or vinyl phosphonate and a sulfonic acid-containing monomer such as vinyl sulfonate 2-acrylamide-2-methyl phosphonate) other than the dye monomer having the alkali-soluble group. It is most preferable to use both the methods.

The amount (acid value) of the alkali-soluble group contained in the dye multimer (A) is preferably 0.3 mmol to 2.0 mmol, more preferably 0.4 mmol to 1.5 mmol, and most preferably 0.5 mmol to 1.0 mmol, with respect to 1 g of the dye multimer (A).

In the present invention, the acid value of the dye multimer can be calculated from, for example, the average content of the acid group contained in the dye multimer. Moreover, by varying the content of the monomer unit that contains the acid group constituting the dye multimer, a resin having an intended acid value can be obtained.

Examples of other functional groups that the dye multimer (A) has include a development accelerator such as lactone, acid anhydride, amide, —$COCH_2CO$—, or a cyano group, or a hydrophobicity or hydrophilicity-regulating group such as a long chain-alkyl group, a cyclic alkyl group, an aralkyl group, an aryl group, a polyalkylene oxide group, a hydroxyl group, a maleimide group, or an amino group, and the like. These can be appropriately introduced into the dye multimer.

Examples of the method of introducing the functional group include a method of introducing the functional group in advance to the dye monomer, a method of copolymerizing a monomer having the above functional group, and the like.

Specific examples of repeating units having other functional groups that the dye multimer (A) has will be shown below, but the present invention is not limited thereto.

[Chem. 83]

(H-1)

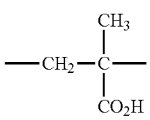

(H-2)

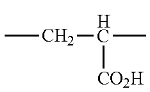

(H-3)

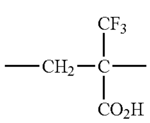

(H-4)

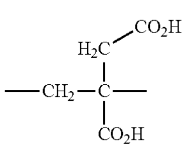

(H-5)

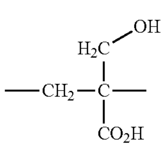

(H-6)

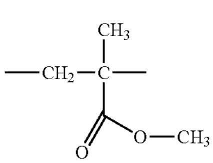

(H-7)

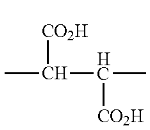

-continued (H-8)

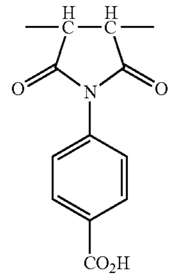

(H-9)

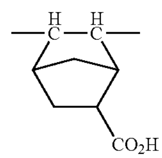

(H-10)

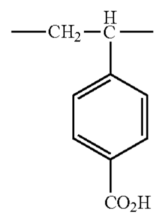

(H-11)

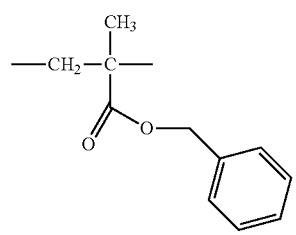

(H-12)

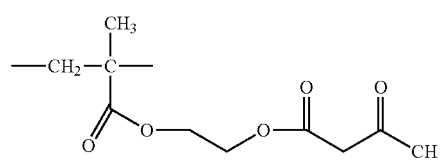

(H-13)

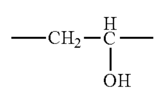

(H-14)

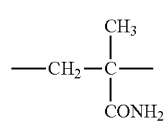

(H-15)

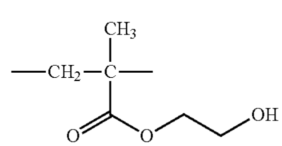

(H-16)

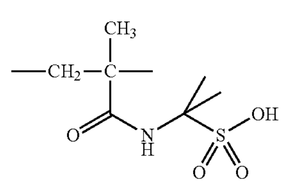

-continued (H-17)

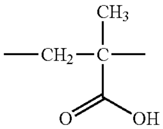

(H-18)

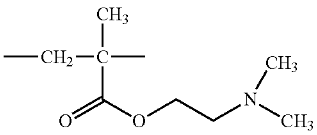

(H-19)

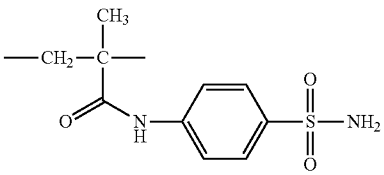

(H-20)

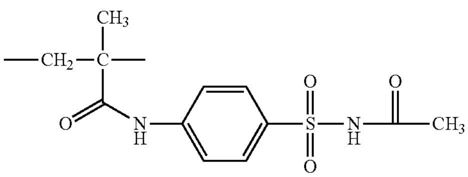

(H-21)

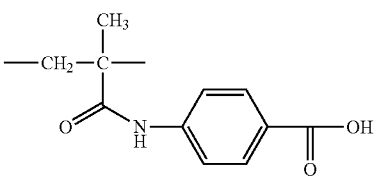

[Chem. 84]

(H-22)

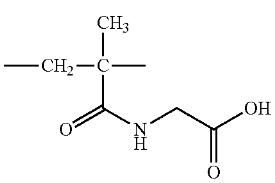

(H-23)

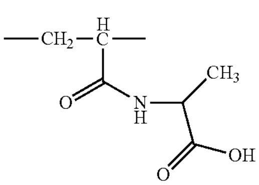

(H-24)

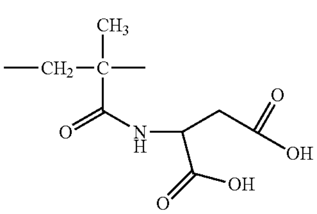

-continued (H-25)

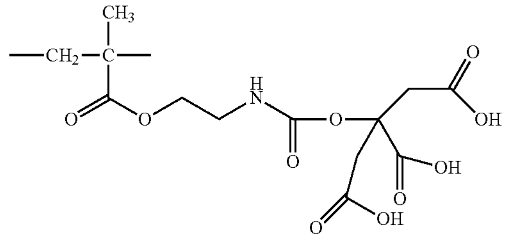

(H-26)

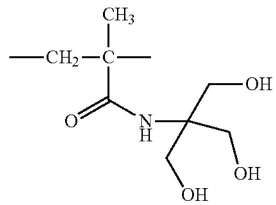

[Chem. 85]

(H-27)

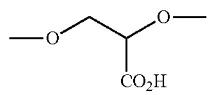

(H-28)

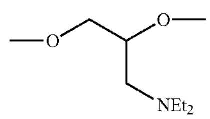

(H-29)

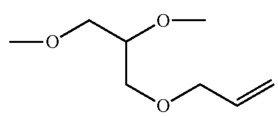

(H-30)

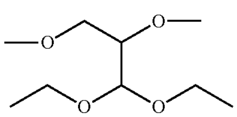

(H-31)

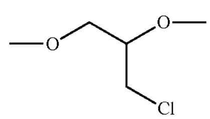

(H-32)

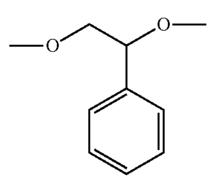

The weight average molecular weight of the dye multimer (A) is preferably 2,000 to 20,000, more preferably 3,000 to 15,000, and most preferably 4,000 to 10,000.

In the present invention, the weight average molecular weight and number average molecular weight are values measured by GPC and expressed in terms of styrene. For measuring the values, for example, it is possible to use HLC-8120 (manufactured by TOSOH CORPORATION), TSK gel Multipore HXL-M (manufactured by TOSOH CORPORATION, 7.8 mm ID x 30.0 cm) as a column, and tetrahydrofuran (THF) as an eluent.

Moreover, a ratio [(Mw)/(Mn)] between the weight average molecular weight (Mw) and number average molecular weight (Mn) of the dye multimer (A) is preferably 1.0 to 3.0, more preferably 1.6 to 2.5, and most preferably 1.6 to 2.0.

Tg of the dye multimer (A) according to the present invention is preferably 50° C. or higher and more preferably 100° C. or higher. Furthermore, a 5% weight reduction temperature measured by thermogravimetric analysis (TGA measurement) is preferably 120° C. or higher, more preferably 150° C. or higher, and even more preferably 200° C. or higher. If the temperature is in this range, when the colored radiation-sensitive composition of the present invention is used for preparing of a color filter or the like, change in concentration caused by a heating process can be reduced.

In addition, the absorption coefficient (hereinafter, described as ∈'. ∈'=∈/average molecular weight, unit: L/g·cm) per unit weight of the dye multimer according to the present invention is preferably 30 or greater, more preferably 60 or greater, and even more preferably 100 or greater. If the extinction coefficient is in this range, when a color filter is prepared using the colored radiation-sensitive composition of the present invention, a color filter having excellent color reproducibility can be prepared.

From the viewpoint of a coloring ability, it is preferable for the molar absorption coefficient of the dye multimer (A) used for the colored radiation-sensitive composition of the present invention to be as high as possible.

It is preferable for the dye multimer (A) according to the present invention to be a compound soluble in the following organic solvents.

Examples of the organic solvents include esters (for example, methyl 3-ethoxypropionate, ethyl 3-ethoxypropionate, ethyl lactate, butyl acetate, and methyl 3-methoxypropionate), ethers (for example, methyl cellosolve acetate, ethyl cellosolve acetate, propylene glycol monomethyl ether, and propylene glycol monomethyl ether acetate), ketones (methyl ethyl ketone, cyclohexanone, 2-heptanone, 3-heptanone, and the like), and aromatic hydrocarbons (for example, toluene and xylene). The dye multimer (A) dissolves preferably from 1% by mass to 50% by mass, more preferably from 5% by mass to 40% by mass, and even more preferably from 10% by mass to 30% by mass in these solvents. If the resin (A) dissolves in the organic solvent in this range, when the colored radiation-sensitive composition of the present invention is used for preparing a color filter or the like, preferable coating surface properties can be obtained or reduction in concentration caused by elution after coating of other colors can be decreased.

In the colored radiation-sensitive composition of the present invention, one kind of the dye multimer (A) may be used singly, or two or more kinds thereof may be used concurrently.

The content of the dye multimer (A) in the colored radiation-sensitive composition of the present invention is set in consideration of, for example, a ratio between the content of the dye multimer (A) and the content of the (E) pigment which will be described later and is concurrently used if necessary, or a ratio between the content of the dye multimer (A) and the content of the (B) specific alkali-soluble resin.

When the (E) pigment, which will be described later, is concurrently used as a colorant, a mass ratio of the dye multimer to the pigment (dye multimer (A)/pigment (E)) is preferably 0.1/1 to 5/1, more preferably 0.2/1 to 2/1, and even more preferably 0.3/1 to 1/1.

Moreover, a ratio between the content of the dye multimer (A) and the content of the (B) specific alkali-soluble resin is preferably 1/1 to 15/1, more preferably 1/1 to 10/1, and even more preferably 1.5/1 to 5/1, in terms of a mass ratio (dye multimer (A)/specific alkali-soluble resin (B))

It is preferable for the dye multimer (A) and the (B) specific alkali-soluble resin in the colored radiation-sensitive composition of the present invention to be used in the form of the following combination.

That is, it is preferable to use a combination of a pyromethene dye multimer or an azo dye multimer as the (A) dye multimer and an alkali-soluble resin containing the repeating unit represented by Formula (b1), and a combination of a triarylmethane dye multimer, an anthraquinone dye multimer, or a xanthene dye multimer as the (A) dye multimer and an alkali-soluble resin containing the repeating unit represented by Formula (b1).

[(C) Polymerizable Compound]

The colored radiation-sensitive composition of the present invention contains a polymerizable compound.

Known polymerizable compounds that can be crosslinked by a radical, an acid, or heat can be used, and examples thereof include polymerizable compounds having an ethylenically unsaturated bond, a cyclic ether (epoxy or oxetane), methylol, and the like. In view of sensitivity, the polymerizable compound is suitably selected from compounds having one and preferably two or more terminal ethylenically unsaturated bonds. Among these, polyfunctional polymerizable compounds having 4 or more functional groups are preferable, and polyfunctional polymerizable compounds having 5 or more functional groups are more preferable.

Such compound groups are widely known in the industrial field of the related art and can be used in the present invention without particular limitation. These may be in any type of chemical forms such as a monomer, a prepolymer, that is, dimer, a trimer, an oligomer, a mixture of these, and a multimer of these. One kind of the polymerizable compound in the present invention may be used singly, or two or more kinds thereof may be used concurrently.

More specifically, examples of the monomer and prepolymer include unsaturated carboxylic acids (for example, acrylic acid, methacrylic acid, itaconic acid, crotonic acid, isocrotonic acid, maleic acid, and the like) or esters thereof, amides, and multimers of these, and among these, an ester of unsaturated carboxylic acid and an aliphatic polyol compound, amides of unsaturated carboxylic acid and an aliphatic polyamine compound, and multimers of these are preferable. Moreover, products of an addition reaction between unsaturated carboxylic acid esters or amides having nucleophilic substituent such as a hydroxyl group, an amino group, or a mercapto group and monofunctional or polyfunctional isocyanates or epoxies, products of a dehydration condensation reaction between the unsaturated carboxylic acid esters or amides and a monofunctional or polyfunctional carboxylic acid, and the like are also suitably used. In addition, products of an addition reaction between unsaturated carboxylic acid esters or amides having an electrophilic substituent such as an isocyanate group or an epoxy group and monofunctional or polyfunctional alcohols, amines, or thiols, and products of a substitution reaction between unsaturated carboxylic acid esters or amides having an elimination substituent such as a halogen group or tosyloxy group and monofunctional or polyfunctional alcohols, amines, or thiols are also suitable. As other examples, instead of the above unsaturated carboxylic acid, vinyl benzene derivatives of unsaturated phosphonic acid, styrene, and the like and compound groups substituted with vinyl ether, allyl ether, or the like can also be used.

As these specific compounds, the compounds described in JP2009-288705A, paragraphs 0095 to 0108 can also be preferably used in the present invention.

As the polymerizable compound, compounds that have at least one addition-polymerizable ethylene group and have an ethylenically unsaturated group having a boiling point of 100° C. or higher under normal pressure are also preferable. Examples of the compounds include monofunctional acrylate or methacrylate such as polyethylene glycol mono(meth) acrylate, polypropylene glycol mono(meth)acrylate, and phenoxyethyl (meth)acrylate; compounds that are obtained by adding ethylene oxide or propylene oxide to a polyfunctional alcohol and then (meth)acrylating the resultant, such as polyethylene glycol di(meth)acrylate, trimethylolethane tri (meth)acrylate, neopentyl glycol di(meth)acrylate, pentaerythritol tri(meth)acrylate, pentaerythritol tetra(meth) acrylate, dipentaerythritol penta(meth)acrylate, dipentaerythritol hexa(meth)acrylate, hexanediol (meth) acrylate, trimethylolpropane tri(acryloyloxypropyl) ether, tri (acryloyloxyethyl) isocyanurate, glycerin, and trimethylolethane; urethane (meth)acrylates described in JP1973-41708B (JP-S48-41708B), JP1975-6034B (JP-S50-6034B), and JP1976-37193A (JP-S51-37193A); polyester acrylates described in JP1973-64183A (JP-S48-64183A), JP1974-43191B (JP-S49-43191B), and JP1977-30490B (JP-S52-30490B); polyfunctional acrylate or methacrylate such as epoxy acrylates as products of a reaction between an epoxy resin and (meth)acrylic acid; and mixtures of these.

The above examples also include polyfunctional (meth) acrylate and the like that is obtained by reacting polyfunctional carboxylic acid with a compound having a cyclic ether group such as glycidyl (meth)acrylate and an ethylenically unsaturated group.

Furthermore, as other preferable polymerizable compounds, compounds having a fluorene ring and an ethylenically unsaturated group having 2 or more functional groups described in JP2010-160418A, JP2010-129825A, and JP4364216B, and a cardo resin can also be used.

Moreover, as the compound that has a boiling point of 100° C. or higher under normal pressure and has at least one addition-polymerizable ethylenically unsaturated group, compounds described in JP2008-292970A, paragraphs 0254 to 0257 are also preferable.

In addition to the above, radically polymerizable monomers represented by the following Formulae (MO-1) to (MO-5) can also be used. In the formulae, when T is an oxyalkylene group, the terminal at a carbon atom side binds to R.

[Chem. 86]

(MO-1)

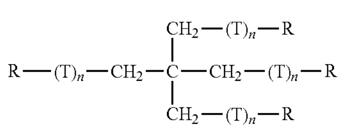

(MO-2)

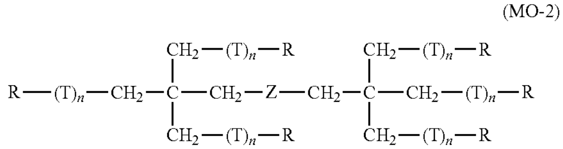

(MO-3)

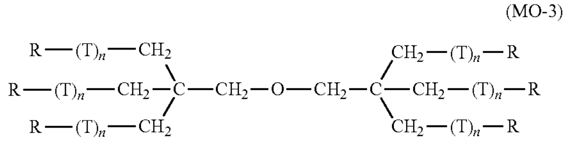

-continued (MO-4)

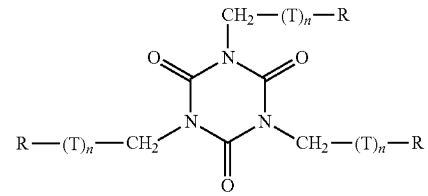

(MO-5)

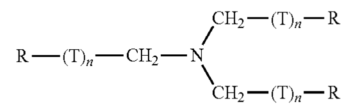

[Chem. 87]

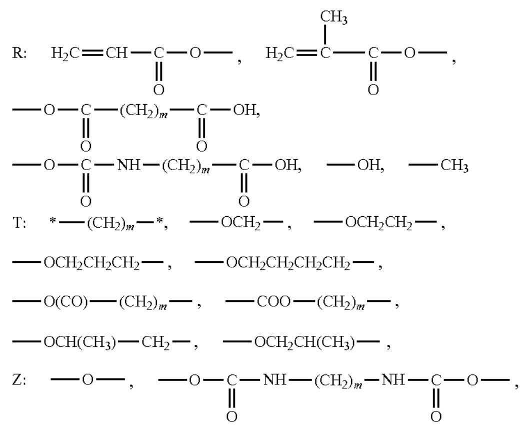

In the formula, n is 0 to 14, and m is 1 to 8. Each of plural Rs and Ts present in the same molecule may be the same as or different from each other.

In each of the polymerizable compounds represented by the Formulae (MO-1) to (MO-5), at least one of the plural Rs represents a group represented by —OC(═O)CH═$CH_2$ or —OC(═O)C($CH_3$)═$CH_2$.

Specific examples of the polymerizable compounds represented by the Formulae (MO-1) to (MO-5) include the compounds described in JP2007-269779A, paragraphs 0248 to 0251.

In addition, a compound that is obtained by adding ethylene oxide or propylene oxide to the polyfunctional alcohol, which is described as Formulae (1) and (2) in JP1998-62986A (JP-H10-62986A) together with the specific examples thereof, and then (meth)acrylating the resultant can also be used as a polymerizable compound.

Among these, as the polymerizable compound, dipentaerythritol acrylate (KAYARAD D-330 as a commercially available product; manufactured by NIPPON KAYAKU Co., Ltd.), dipentaerythritol tetraacrylate (KAYARAD D-320 as a commercially available product; manufactured by NIPPON KAYAKU Co., Ltd.), dipentaerythritol penta(meth)acrylate (KAYARAD D-310 as a commercially available product; manufactured by NIPPON KAYAKU Co., Ltd.), dipentaerythritol hexa(meth)acrylate (KAYARAD DPHA as a commercially available product; manufactured by NIPPON KAYAKU Co., Ltd.), and a structure in which ethylene glycol or a propylene glycol residue is interposed between these (meth)acryloyl groups are preferable. Oligomer type of these can also be used. Preferable embodiments of the polymerizable compound will be shown below.

The polymerizable compound is a polyfunctional monomer and may have an acid group such as a carboxyl group, a sulfonic acid group, or a phosphoric acid group. If an ethylenic compound has an unreacted carboxyl group as in a case where the ethylene compound is a mixture described above, this compound can be used as is. However, if necessary, a hydroxyl group of the above ethylenic compound may be reacted with an aromatic carboxylic anhydride so as to introduce an acid group. In this case, specific examples of the aromatic carboxylic anhydride used include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, as a monomer having an acid group, a polyfunctional monomer is preferable which is an ester obtained between an aliphatic polyhydroxy compound and an unsaturated carboxylic acid and obtains an acid group by reacting an unreacted hydroxyl group of the aliphatic polyhydroxy compound with a non-aromatic carboxylic anhydride.

Particularly, a monomer in which the aliphatic polyhydroxy compound in the ester is pentaerythritol and/or dipentaerythritol is preferable. Examples of commercially available products thereof include M-510, M-520, or the like which is a polybasic modified acryl oligomer manufactured by TOAGOSEI, CO., LTD.

One kind of these monomers may be used singly. However, it is difficult to use a single compound in production, and accordingly, two or more kinds thereof may be used as a mixture. Moreover, if necessary, a polyfunctional monomers not having an acid group and a polyfunctional monomer having an acid group may be used concurrently as the monomer.

The acid value of the polyfunctional monomer having an acid group is preferably 0.1 mg KOH/g to 40 mg KOH/g and particularly preferably 5 mg KOH/g to 30 mg KOH/g. If the acid value of the polyfunctional monomer is too low, characteristics of development solubility of the composition deteriorate. If the acid value is too high, difficulty is caused in production and handleability of the composition, hence a photopolymerization performance deteriorates, which leads to deterioration of curability such as surface smoothness of pixels. Therefore, when two or more kinds of polyfunctional monomers having different acid groups are used concurrently, or when a polyfunctional monomer not having an acid group is used concurrently, it is preferable to adjust the acid value such that the acid value of the whole polyfunctional monomers falls within the above range.

Moreover, an embodiment is also preferable in which the composition contains, as a polymerizable monomer, a polyfunctional monomer having a caprolactone structure.

The polyfunctional monomer having a caprolactone structure is not particularly limited as long as this monomer has a caprolactone structure in a molecule thereof, and examples thereof include ϵ-caprolactone-modified polyfunctional (meth)acrylates that are obtained by esterifying polyols such as trimethylolethane, ditrimethylolethane, trimethylolpropane, ditrimethylolpropane, pentaerythritol, dipentaerythritol, tripentaerythritol, glycerin, diglycerol, and trimethylolamine with (meth)acrylic acid and ϵ-caprolactone. Among these, a polyfunctional monomer having a caprolactone structure represented by the following Formula (Z-1) is preferable.

[Chem. 88]

(Z-1)

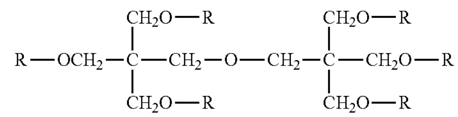

In Formula (Z-1), all of six Rs are a group represented by the following Formula (Z-2). Alternatively, one to five among six Rs are a group represented the following Formula (Z-2), and the remainder is a group represented by the following General Formula (Z-3).

[Chem. 89]

(Z-2)

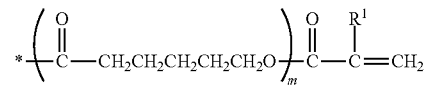

In Formula (Z-2), $R^1$ represents a hydrogen atom or a methyl group, m represents a number 1 or 2, and "*" represents a bond.

[Chem. 90]

(Z-3)

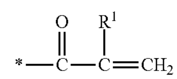

In Formula (Z-3), $R^1$ represents a hydrogen atom or a methyl group, and "*" represents a bond.

The polyfunctional monomer having such a caprolactone structure is commercially available from NIPPON KAYAKU Co., Ltd., as a KAYARAD DPCA series, and examples thereof include DPCA-20 (a compound in which m=1 in Formulae (1) to (3), the number of the group represented by Formula (2)=2, and all of $R^1$s are hydrogen atoms), DPCA-30 (a compound in which m=1 in Formulae (1) to (3), the number of the group represented by Formula (2)=3, and all of $R^1$s are hydrogen atoms), DPCA-60 (a compound in which m=1 in Formulae (1) to (3), the number of the group represented by Formula (2)=6, and all of $R^1$s are hydrogen atoms), DPCA-120 (a compound in which m=2 in Formulae (1) to (3), the number of the group represented by Formula (2)=6, and all of $R^1$s are hydrogen atoms), and the like.

In the present invention, one kind the polyfunctional monomer having a caprolactone structure can be used sigly, or two or more kinds thereof can be used by being mixed with each other.

Moreover, the specific monomer in the present invention is preferably at least one kind selected from a group of compounds represented by the following Formula (Z-4) or (Z-5).

[Chem. 91]

(Z-4)

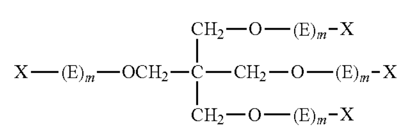

-continued (Z-5)

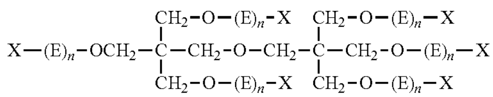

In the Formulae (Z-4) and (Z-5), each E independently represents —((CH$_2$)yCH$_2$O)— or —((CH$_2$)yCH(CH$_3$)O)—, each y independently represents an integer from 0 to 10, and each X independently represents an acryloyl group, a methacryloyl group, a hydrogen atom, or a carboxyl group.

In the Formula (Z-4), the sum of the acryloyl group and the methacryloyl group is 3 or 4, each m independently represents an integer from 0 to 10, and the sum of each m is an integer from 0 to 40. Here, when the sum of each m is 0, one of Xs is a carboxyl group.

In the Formula (ii), the sum of the acryloyl group and the methacryloyl group is 5 or 6, each n independently represents an integer from 0 to 10, and the sum of each n is an integer from 0 to 60. Here, when the sum of each n is 0, one of Xs is a carboxyl group.

In the Formula (Z-4), m is preferably an integer from 0 to 6, and more preferably an integer from 0 to 4.

Moreover, the sum of each m is preferably an integer from 2 to 40, more preferably an integer from 2 to 16, and particularly preferably an integer from 4 to 8.

In the Formula (Z-5), n is preferably an integer from 0 to 6, and more preferably an integer from 0 to 4.

Furthermore, the sum of each n is preferably an integer from 3 to 60, more preferably an integer from 3 to 24, and particularly preferably an integer from 6 to 12.

In addition, —((CH$_2$)yCH$_2$O)— or —((CH$_2$)yCH(CH$_3$)O)— in Formula (Z-4) or (Z-5) is preferably in the form in which the terminal at an oxygen atom side binds to X.

One kind of the compound represented by the Formula (Z-4) or (Z-5) may be used singly, or two or more kinds thereof may be used concurrently. Particularly, a form in which all of six Xs in Formula (ii) are an acryloyl group is preferable.

Moreover, the total content of the compound represented by the Formula (Z-4) or (Z-5) in the polymerizable compound is preferably 20% by mass or more, and more preferably 50% by mass or more.

The compound represented by the Formula (Z-4) or (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, so those skilled in the related art can easily synthesize the compound represented by General Formula (i) or (ii).

Among the compounds represented by the Formula (Z-4) or (Z-5), a pentaerythritol derivative and/or a dipentaerythritol derivative are/is more preferable.

Specific examples of the compounds include compounds represented by the following Formulae (a) to (f) (hereinafter, also referred to as "Examples Compounds (a) to (f)"). Among these, Examples Compounds (a), (b), (e), and (f) are preferable.

[Chem. 92]

(a)

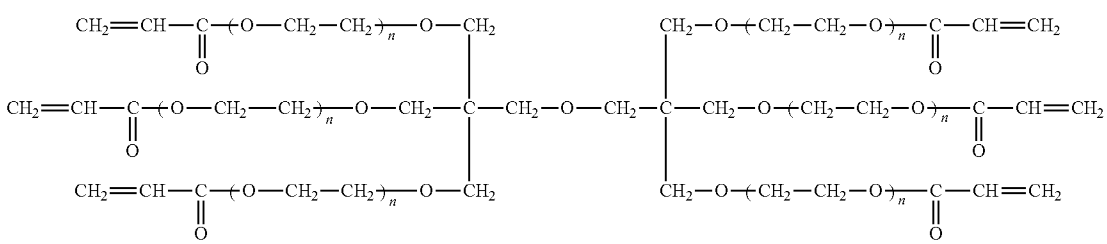

(Sum of each n is 6)

(b)

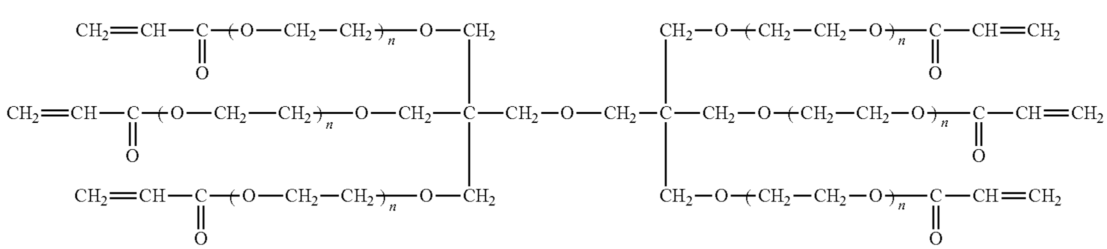

(Sum of each n is 12)

(c)

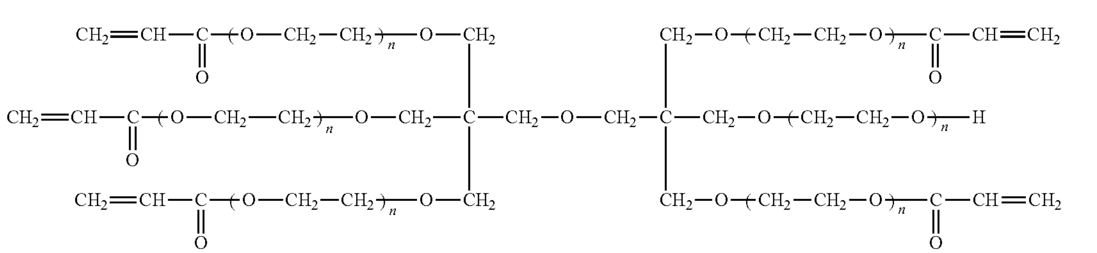

(Sum of each n is 12)

-continued

[Chem. 93]

(d)

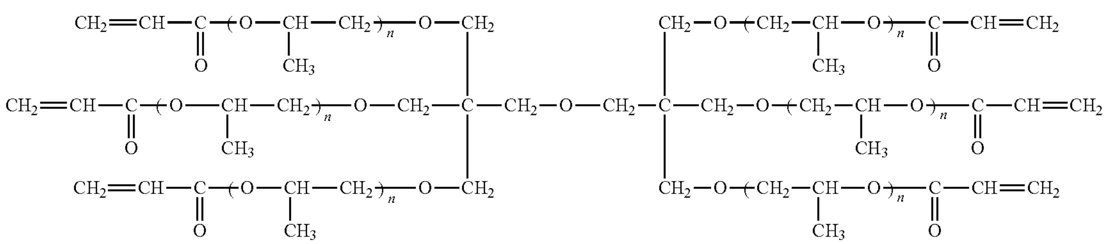

(Sum of each n is 6)

(e)

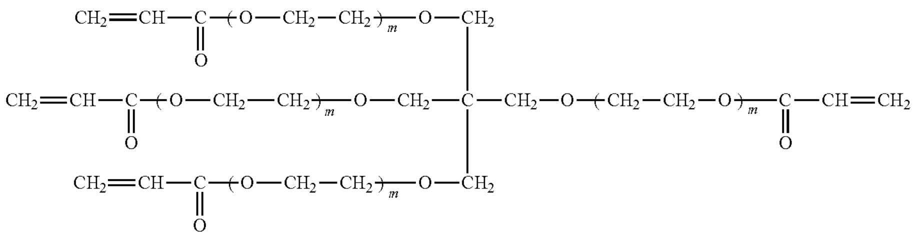

(Sum of each n is 4)

(f)

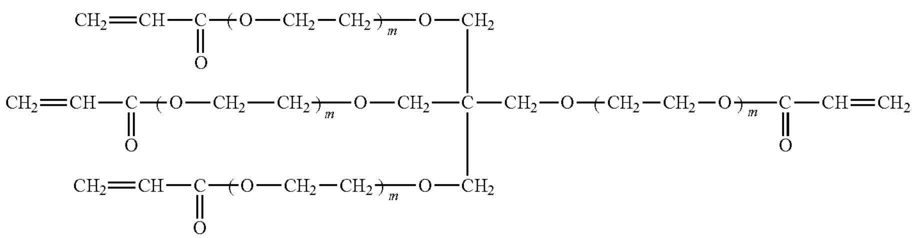

(Sum of each n is 12)

Examples of commercially available products of the polymerizable compounds represented by Formulae (Z-4) and (Z-5) include SR-494 which is manufactured by Sartomer and is tetrafunctional acrylate having four ethyleneoxy chains, DPCA-60 as hexafunctional acrylate having six pentyleneoxy chains and TPA-33 as trifunctional acrylate having three isobutyleneoxy chains, which are manufactured by NIPPON KAYAKU Co., Ltd., and the like.

Moreover, as the polymerizable compounds, urethane acrylates described in JP1973-41708B (JP-S48-41708B), JP1976-37193A (JP-S51-37193A), JP1990-32293B (JP-H2-32293B), and JP1990-16765B (JP-H2-16765B) or urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also preferable. Furthermore, if addition-polymerizable compounds, which have an amino structure or a sulfide structure in a molecule and are described in JP1988-277653A (JP-S63-277653A), JP1988-260909A (JP-S63-260909A), and JP1989-105238A (JP-H1-105238A), are used as the polymerizable compounds, a curable composition which is extremely excellent in photosensitization speed can be obtained.

Examples of commercially available products of the polymerizable compounds include urethane oligomers UAS-10 and UAB-140 (manufactured by Sanyo-Kokusaku Pulp, Co., Ltd.), "UA-7200" (manufactured by Shin-Nakamura Chemical Co., Ltd.), DPHA-40H (NIPPON KAYAKU Co., Ltd.), UA-306H, UA-306T, UA-306I, AH-600, T-600, and AI-600 (manufactured by KYOEISHA CHEMICAL Co., LTD.), M-460 (manufactured by TOAGOSEI CO., LTD.), and the like.

Details of how to use these polymerizable compounds, such as the structure, whether the polymerizable compounds are used singly or used concurrently, and the amount of the polymerizable compounds added, can be arbitrarily set according to the designed final performance of the colored radiation-sensitive composition. For example, from the viewpoint of sensitivity, a structure in which the content of an unsaturated group per molecule is large is preferable, and in many cases, it is preferable for the polymerizable compound to have 2 or more functional groups. Moreover, from the viewpoint of enhancing the strength of cured colored film formed of the colored radiation-sensitive composition, it is preferable for the polymerizable compound to have 3 or more functional groups. In addition, a method of adjusting both the sensitivity and strength by concurrently using compounds that differ in the number of functional groups and have different polymerizable groups (for example, an acrylic acid ester, a methacrylic acid ester, a styrene-based compound, and a vinylether based compound) is also effective. Furthermore, it is preferable to polymerizable compounds having 3 or more functional groups and differing in the length of an ethylene oxide chain, since the developability of the colored radiation-sensitive composition can be adjusted, and excellent pattern formability is obtained.

In addition, in view of the compatibility between the polymerizable compound and other components (for example, a photopolymerization initiator, a substance to be dispersed, and alkali-soluble resin) contained in the colored radiation-sensitive composition and dispersibility, how to select and use the polymerizable compound is an important factor. For example, if a low-purity compound is used, or two or more kinds thereof are used concurrently, the compatibility can be improved. Moreover, in view of improving adhesiveness of the composition to a hard surface of a support and the like, specific structures may be selected.

The content of the polymerizable compound in the colored radiation-sensitive composition of the present invention is preferably 0.1% by mass to 90% by mass, more preferably 1.0% by mass to 50% by mass, and particularly preferably 2.0% by mass to 30% by mass, with respect to the total solid contents of the colored radiation-sensitive composition.

[(D) Photopolymerization Initiator]

From the viewpoint of further improving sensitivity, the colored radiation-sensitive composition of the present invention must contain a photopolymerization initiator.

The photopolymerization initiator can be appropriately selected from known photopolymerization initiators without particular limitation, as long as the photopolymerization initiator has a function of initiating polymerization of the polymerizable compound. For example, photopolymerization initiators sensitive to light rays in a range from ultraviolet region to visible light are preferable. Moreover, the photopolymerization initiator may be either an activator that interacts with a photo-excited sensitizer in any way and generates active radicals or an initiator that initiates cationic polymerization according to the type of monomer.

It is preferable for the photopolymerization initiator to contain at least one kind of compound having at least a molecular absorption coefficient of about 50 in a range from about 300 nm to about 800 nm (more preferably 330 nm to 500 nm).

Examples of the photopolymerization initiator include halogenated hydrocarbon derivatives (for example, a derivative having a triazine skeleton, a derivative having an oxadiazole skeleton, and the like), acyl phosphine compounds such as acyl phosphine oxide, oxime compounds such as hexaaryl biimidazole, and oxime derivatives, organic peroxide, thio compounds, ketone compounds, aromatic onium salts, ketoxime ether, aminoacetophenone compounds, hydroxyacetophenone, and the like.

Furthermore, from the viewpoint of exposure sensitivity, a compound selected from a group consisting of a trihalomethyl triazine compound, a benzyl dimethyl ketal compound, an α-hydroxyketone compound, an α-aminoketone compound, an acyl phosphine compound, a phosphine oxide compound, a metallocene compound, an oxime compound, a triallyl imidazole dimer, an onium compound, a benzothiazole compound, a benzophenone compound, an acetophenone compound, and derivatives of these, a cyclopentadiene-benzene-iron complex and a salt thereof, a halomethyl oxadiazole compound, 3-aryl-substituted coumarin compound is preferable.

More preferably, at least one kind of compound that is a trihalomethyl triazine compound, an α-aminoketone compound, an acyl phosphine compound, a phosphine oxide compound, an oxime compound, a triallyl imidazole dimer, an onium compound, a benzophenone compound, or an acetophenone compound and selected from a group consisting of a trihalomethyl triazine compound, an α-aminoketone compound, an oxime compound, a triallyl imidazole dimer, and a benzophenone compound is most preferable.

Particularly, when the colored radiation-sensitive composition of the present invention is used for preparing a color filter of a solid-state image sensor, a fine pattern needs to be formed in a sharp shape. Accordingly, it is important for the composition to have curability and to be developed without residues in an unexposed portion. From this viewpoint, it is particularly preferable to use an oxime compound as a polymerization initiator. Particularly, when a fine pattern is formed in the solid-state image sensor, stepper exposure is used for exposure for curing. However, the exposure machine used at this time is damaged by halogen in many cases, so the amount of a polymerization initiator added needs to be reduced. Considering this point, for forming a fine pattern like a solid-state image sensor, it is most preferable to use an oxime compound as the (D) photopolymerization initiator.

Examples of the halogenated hydrocarbon compound having a triazine skeleton include the compound described in Wakabayashi et al., Bull. Chem. Soc. Japan, 42, 2924 (1969), the compound described in UK1388492B, the compound described in JP1978-133428A (JP-553-133428A), the compound described in GE3337024B, the compound described in F. C. Schaefer et al., J. Org. Chem.; 29, 1527 (1964), the compound described in JP1987-58241A (JP-562-58241A), the compound described in JP1993-281728A (JP-H5-281728A), the compound described in JP1993-34920A (JP-H5-34920A), the compound described in U.S. Pat. No. 4,212,976A, and the like.

Examples of the compound disclosed in the U.S. Pat. No. 4,212,976A include compounds having an oxadiazole skeleton (for example, 2-trichloromethyl-5-phenyl-1,3,4-oxadiazole, 2-trichloromethyl-5-(4-chlorophenyl)-1,3,4-oxadiazole, 2-trichloromethyl-5-(1-naphthyl)-1,3,4-oxadiazole, 2-trichloromethyl-5-(2-naphthyl)-1,3,4-oxadiazole, 2-tribromomethyl-5-phenyl-1,3,4-oxadiazole, 2-tribromomethyl-5-(2-naphthyl)-1,3,4-oxadizaole; 2-trichloromethyl-5-styryl-1,3,4-oxadiazole, 2-trichloromethyl-5-(4-chlorostyryl)-1,3,4-oxadiazole, 2-trichloromethyl-5-(4-methoxystyryl)-1,3,4-oxadiazole, 2-trichloromethyl-5-(1-naphthyl)-1,3,4-oxadiazole, 2-trichloromethyl-5-(4-n-butoxystyryl)-1,3,4-oxadiazole, and 2-tribromomethyl-5-styryl-1,3,4-oxadiazole) and the like.

Examples of photopolymerization initiators other than the above include acridine derivatives (for example, 9-phenylacridine and 1,7-bis(9,9'-acridinyl)heptane), N-phenylglycine, polyhalogen compounds (for example, carbon tetrabromide, phenyl tribromomethyl sulfone, and phenyl trichloromethyl ketone), coumarins (for example, 3-(2-benzofuranoyl)-7-diethylaminocoumarin, 3-(2-benzofuroyl)-7-(1-pyrrolidinyl)coumarin, 3-benzoyl-7-diethylaminocoumarin, 3-(2-methoxybenzoyl)-7-diethylaminocoumarin, 3-(4-dimethylaminobenzoyl)-7-diethylaminocoumarin, 3,3'-carbonyl bis(5,7-di-n-propoxycoumarin), 3,3'-carbonyl bis(7-diethylaminocoumarin), 3-benzoyl-7-methoxycoumarin, 3-(2-furoyl)-7-diethylaminocoumarin, 3-(4-diethylaminocinnamoyl)-7-diethylaminocoumarin, 7-methoxy-3-(3-pyridylcarbonyl)coumarin, 3-benzoyl-5,7-dipropoxycoumarin, 7-benzotriazol-2-ylcoumarin, and coumarin compounds described in JP1993-19475A (JP-H5-19475A), JP1995-271028A (JP-H7-271028A), JP2002-363206A, JP2002-363207A, JP2002-363208A, JP2002-363209A, and the like), acyl phosphine oxides (for example, bis(2,4,6-trimethylbenzoyl)-phenyl phosphine oxide, bis(2,6-dimethoxybenzoyl)-2,4,4-trimethyl-pentylphenyl phosphine oxide, and Lucirin TPO), metallocenes (for example, bis(η5-2,4-cyclopentadien-1-yl)-bis(2,6-difluoro-3-(1H-pyrrol-1-yl)-phenyl)titanium, and η5-cyclopentadienyl-η6-cumenyl-iron(1+)-hexafluorophosphate(1−)), the compounds described in JP1978-133428A (JP-S53-133428A), JP1982-1819B (JP-S57-1819B), JP1982-6096B (JP-S57-6296B), and U.S. Pat. No. 3,615,455A, and the like.

Examples of the ketone compounds include benzophenone, 2-methylbenzophenone, 3-methylbenzophenone, 4-methylbenzophenone, 4-methoxybenzophenone, 2-chlorobenzophenone, 4-chlorobenzophenone, 4-bromobenzophenone, 2-carboxybenzophenone, 2-ethoxycarbonylbenzophenone, benzophenone tetracarboxylic acid or a tetramethyl ester thereof, 4,4'-bis(dialkylamino)benzophenones (for example, 4,4'-bis(dimethylamino)benzophenone, 4,4'-bis(dicyclohexylamino)benzophenone, 4,4'-bis(diethylamino)benzophenone, 4,4'-bis(hydroxyethylamino)benzophenone, 4-methoxy-4'-dimethylaminobenzophenone, 4,4'-dimethoxybenzophenone, 4-dimethylaminobenzophenone, and 4-dimethylaminoacetophenone), benzyl, anthraquinone, 2-t-butylanthraquinone, 2-methylanthraquinone, phenanthraquinone, xanthone, thioxanthone, 2-chloro-thioxanthone, 2,4-diethylthioxanthone, fluorenone, 2-benzyl-dimethylamino-1-(4-morpholinophenyl)-1-butanone, 2-methyl-1-[4-(methylthio)phenyl]-2-morpholino-1-propanone, a 2-hydroxy-2-methyl-[4-(1-methylvinyl)phenyl]propanol oligomer, benzoin, benzoin ethers (for example, benzoin methyl ether, benzoin ethyl ether, benzoin propyl ether, benzoin isopropyl ether, benzoin phenyl ether, and benzyl dimethyl ketal), acridone, chloroacridone, N-methylacridone, N-butylacridone, N-butyl-chloroacridone, and the like.

As the photopolymerization initiator, a hydroxyacetophenone compound, an aminoacetophenone compound, and an acyl phosphine compound can also be suitably used. More specifically, for example, the aminoacetophenone-based initiator described in JP1998-291969A (JP-H10-291969A), and the acyl phosphine oxide-based initiator described in JP4225898B can also be used.

As the hydroxyacetophenone-based initiator, IRGACURE-184, DAROCUR-1173, IRGACURE-500, IRGACURE-2959, and IRGACURE-127 (trade names, all manufactured by BASF) can be used. As the aminoacetophenone-based initiator, IRGACURE-907, IRGACURE-369, and IRGACURE-379 (trade names, all manufactured by BASF) which are commercially available products can be used. In addition, as the aminoacetophenone-based initiator, the compound described in JP2009-191179A, of which an absorption wavelength matches with a light source of a long wavelength of 365 nm, 405 nm, or the like can be used. Moreover, as the acyl phosphine-based initiator, IRGACURE-819 or DAROCUR-TPO (trade name, all manufactured by BASF) which are commercially available products can be used.

Examples of the photopolymerization initiator more preferably include oxime compounds. Specific examples of the oxime compounds include the compound described in JP2001-233842A, the compound described in JP2000-80068A, and the compound described in JP2006-342166A can be used.

Examples of the oxime compound such as an oxime derivative that is preferably used as the photopolymerization initiator in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, 2-ethoxycarbonyloxyimino-1-phenylpropan-1-one, and the like.

Examples of the oxime compound include the compounds described in J. C. S. Perkin II (1979), pp 1653-1660, J. C. S. Perkin II (1979), pp 156-162, Journal of Photopolymer Science and Technology (1995), pp 202-232, and JP2000-66385A, the compounds described respectively in JP2000-80068A, JP2004-534797A, and JP2006-342166A, and the like.

As commercially available products, IRGACURE-OXE01 (manufactured by BASF) and IRGACURE-OXE02 (manufactured by BASF) are also preferably used.

As oxime compounds other than the above, the compound described in JP2009-519904A in which oxime is linked to an N-position of carbazole, the compound described in U.S. Pat. No. 7,626,957B in which a hetero-substituent is introduced into a benzophenone moiety, the compounds described in JP2010-15025A and US2009/292039A in which a nitro group is introduced into a dye moiety, the ketoxime compound described in WO2009/131189A, the compound described in U.S. Pat. No. 7,556,910B that contains a triazine skeleton and an oxime skeleton in the same molecule, the compound described in JP2009-221114A that exhibits maximum absorption at 405 nm and exhibits excellent sensitivity to a light source of a g-line, and the like may be used.

Moreover, the cyclic oxime compounds described in JP2007-231000A and JP2007-322744A can also be preferably used. Among the cyclic oxime compounds, the cyclic oxime compounds condensed to a carbazole dye, which are described in JP2010-32985A and JP2010-185072A, are preferable, since these compounds have a high degree of light absorptivity and make it possible to improve sensitivity.

Furthermore, the compound described in JP2009-242469A that is an oxime compound having an unsaturated bond in a specific moiety can also be preferably used since this compound makes it possible to improve sensitivity by reproducing active radicals from polymerization-inactive radicals.

The most preferable examples of the oxime compounds include the oxime compound having a specific substituent described in JP2007-269779A and the oxime compound having a thioaryl group described in JP2009-191061A.

Specifically, the oxime compound as a photopolymerization initiator is preferably a compound represented by the following Formula (OX-1). Moreover, the compound may be an oxime compound in which an N—O bonde of oxime forms an (E) isomer, an oxime compound in which the N—O bond forms a (Z) isomer, or a mixture in which the N—O bond forms a mixture of an (E) isomer and a (Z) isomer.

[Chem. 94]

(OX-1)

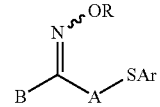

In Formula (OX-1), each of R and B independently represents a monovalent substituent, A represents a divalent organic group, and Ar represents an aryl group.

In Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, an arylthiocarbonyl group, and the like. These groups may have one or more substituents. Moreover, the above substituents may be further substituted with other substituents.

Examples of the substituents include a halogen atom, an aryloxy group, an alkoxycarbonyl group, an aryloxycarbonyl group, an acyloxy group, an acyl group, an alkyl group, an aryl group, and the like.

The alkyl group is preferably an alkyl group having 1 to 30 carbon atoms, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group is preferably an aryl group having 6 to 30 carbon atoms, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, an octaphenyl group, an o-tolyl group, an m-tolyl group, a p-tolyl group, a xylyl group, an o-cumenyl group, an m-cumemyl group, a p-cumenyl group, a mesityl group, a pentalenyl group, a binaphthalenyl group, a ternaphthalenyl group, an octanaphthalenyl group, a heptalenyl group, biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, an octaanthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group is preferably an acyl group having 2 to 20 carbon atoms, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group is preferably an alkoxycarbonyl group having 2 to 20 carbon atoms, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

As the heterocyclic group, aromatic or aliphatic heterocycles having a nitrogen atom, an oxygen atom, a sulfur atom, or a phosphorus atom are preferable.

Specific examples of the heterocyclic group include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathienyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxalinyl group, a quinazolinyl group, a cinnolinyl group, a pteridinyl group, a 4aH-carbazolyl group, a carbazolyl group, a β-carbolinyl group, a phenanthrydinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxantholyl group.

Specific examples of the alkylthiocarbonyl group include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenythiocarbonyl group.

In Formula (OX-1), the monovalent substituent represented by B represents an aryl group, a heterocyclic group, an arylcarbonyl group, or a heterocyclic carbonyl group. These groups may have one or more substituents, and examples of the substituents include the substituents described above. Moreover, the substituents described above may be further substituted with other substituents.

Among these, the following structures are particularly preferable.

In the following structures, each of Y, X, and n have the same definition as Y, X, and n in Formula (OX-2) which will be described later, and the preferable examples thereof are also the same.

[Chem. 95]

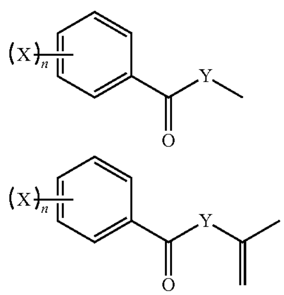

In Formula (OX-1), examples of the divalent organic group represented by A include an alkylene group having 1 to 12 carbon atoms, a cycloalkylene group, and an alkynylene group, and these groups may have one or more substituents. Examples of the substituents include the substituents described above. Furthermore, the substituents described above may further substituted with other substituents.

Among these, as A in Formula (OX-1), in view of improving sensitivity and inhibiting coloring caused by elapse of time during heating, an unsubstituted alkylene group, an alkylene group substituted with an alkyl group (for example, a methyl group, an ethyl group, a tert-butyl group, or a dodecyl group), an alkylene group substituted with an ankenyl group (for example, a vinyl group or an allyl group), and an alkylene group substituted with an aryl group (for example, a phenyl group, a p-tolyl group, a xylyl group, a cumenyl group, a naphthyl group, an anthryl group, a phenanthryl group, or a styryl group) are preferable.

In Formula (OX-1), the aryl group represented by Ar is preferably an aryl group having 6 to 30 carbon atoms, and may have a substituent. Examples of the substituent include the same ones as the substituents exemplified above as specific examples of the aryl group that may have a substituent and introduced into the substituted aryl group.

Among these, in view of improving sensitivity and inhibiting coloring caused by elapse of time during heating, a substituted or unsubstituted phenyl group is preferable.

In Formula (OX-1), in view of sensitivity, a structure "SAr" that is formed of Ar and S adjacent thereto in Formula (OX-1) is preferably the following structure. Moreover, Me represents a methyl group, and Et represents an ethyl group.

[Chem. 96]

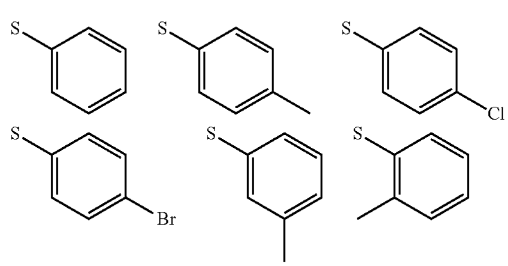

-continued

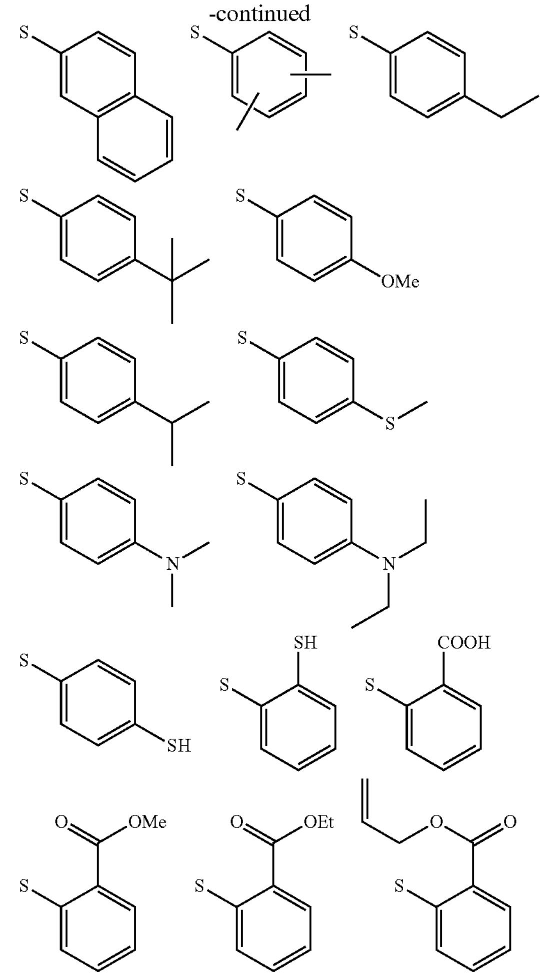

The oxime compound is preferably a compound represented by the following Formula (OX-2).

[Chem. 97]

(OX-2)

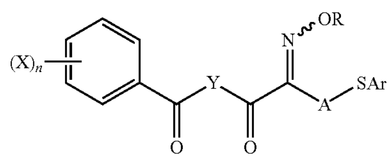

In Formula (OX-2), each of R and X independently represents a monovalent substituent, each of A and Y independently represents a divalent organic group, Ar represents an aryl group, and n represents an integer from 0 to 5. R, A, and Ar in Formula (OX-2) have the same definition as R, A, and Ar in Formula (OX-1), and the preferable examples thereof are also the same.

Examples of the monovalent substituent represented by X in Formula (OX-2) include an alkyl group, an aryl group, an alkoxy group, an aryloxy group, an acyloxy group, an acyl group, an alkoxycarbonyl group, an amino group, a heterocyclic group, and a halogen atom. These groups may have one or more substituents, and examples of the substituents include the substituents described above. Moreover, the substituents described above may be further substituted with other substituents.

Among these, in view of improving solvent solubility and absorption efficiency in a long-wavelength region, X in Formula (OX-2) is preferably an alkyl group.

Furthermore, n in Formula (OX-2) represents an integer from 0 to 5 and preferably represents an integer of 0 to 2.

Examples of the divalent organic group represented by Y in Formula (OX-2) include the following structures. In the following groups, "*" represents a position where Y binds to an carbon atom adjacent thereto in Formula (OX-2).

[Chem. 98]

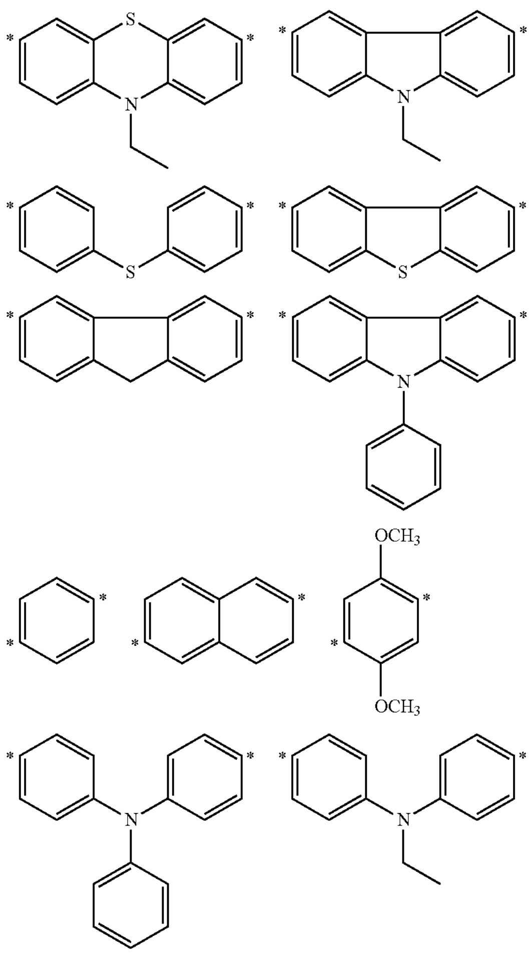

Among these, in view of improving sensitivity, the following structures are preferable.

[Chem. 99]

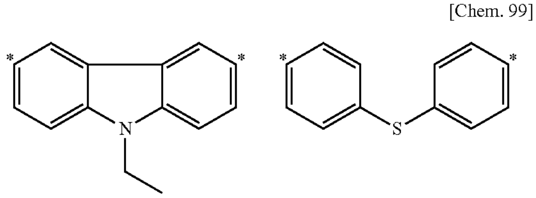

Moreover, the oxime compound is preferably a compound represented by the following Formula (OX-3) or (OX-4).

[Chem. 100]

(OX-3)

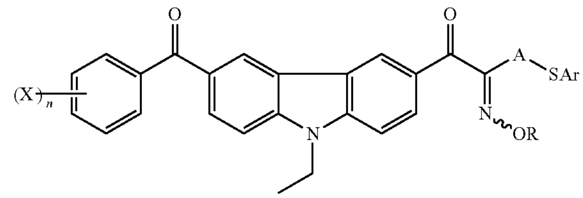

(OX-4)

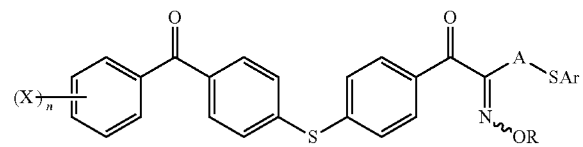

In Formula (OX-3) or (OX-4), each of R and X independently represents a monovalent substituent, A represents a divalent organic group, Ar represents an aryl group, an n represents an integer from 0 to 5.

Each of R, X, A, Ar, and n in Formula (OX-3) has the same definition as R, X, A, Ar, and n in the Formula (OX-2), and the preferable examples thereof are also the same.

Specific examples (C-4) to (C-13) of the oxime compound that are preferably used will be shown below, but the present invention is not limited thereto.

[Chem. 101]

(C-4)

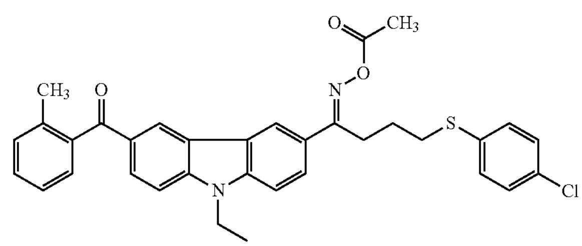

(C-5)

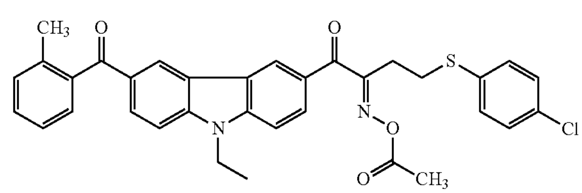

(C-6)

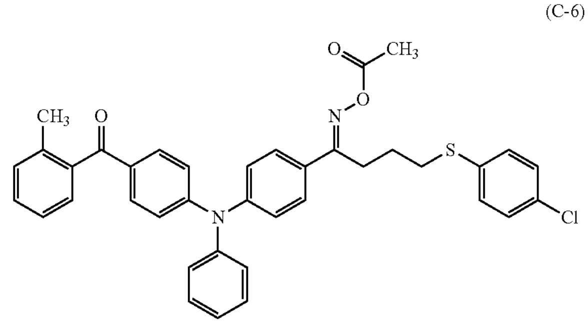

-continued (C-7)

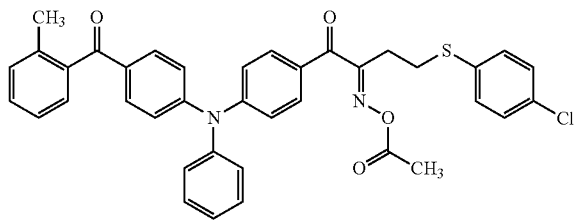

(C-8)

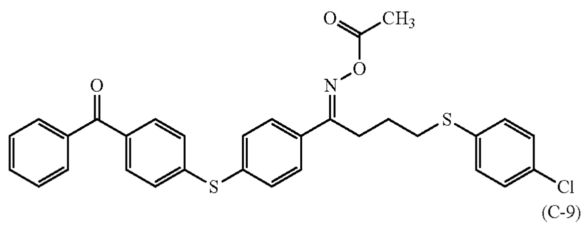

(C-9)

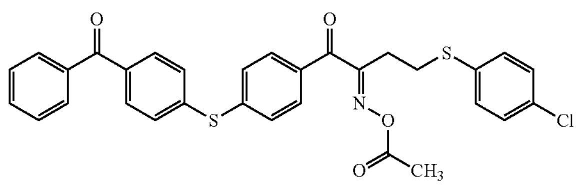

(C-10)

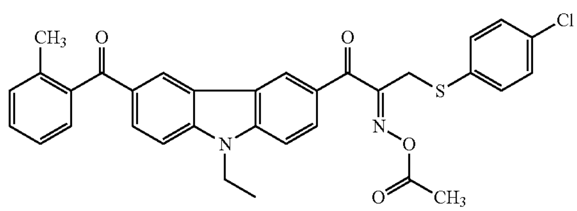

(C-11)

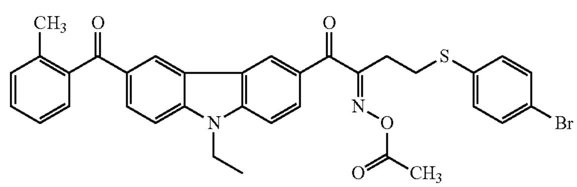

(C-12)

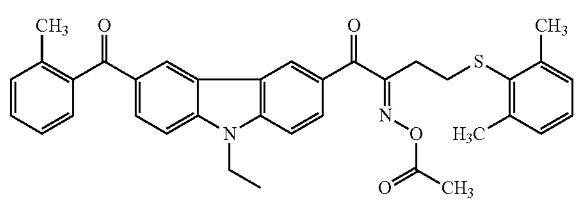

(C-13)

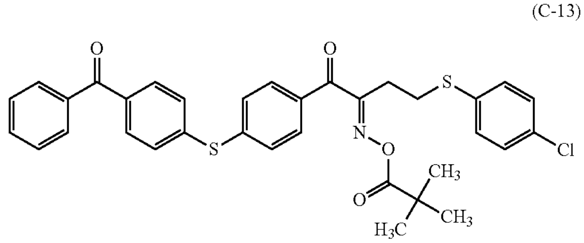

The oxime compound has a maximum absorption wavelength in a wavelength region of 350 nm to 500 nm and preferably in a wavelength region of 360 nm to 480 nm, and an oxime compound showing a high absorbance at 365 nm and 455 nm is particularly preferable.

In view of sensitivity, the molar absorption coefficient at 356 nm or 405 nm of the oxime compound is preferably 1,000 to 300,000, and more preferably 2,000 to 300,000, and particularly preferably 5,000 to 200,000.

The molar absorption coefficient of the compound can be measured using a known method. Specifically, it is preferable to measure the molar absorption coefficient by means of, for example, an ultraviolet and visible light spectrophotometer (Carry-5 spectrophotometer manufactured by Varian) by using an ethyl acetate solvent at a concentration of 0.01 g/L.

If necessary, the photopolymerization initiator used in the present invention may be used in combination of two or more kinds thereof The content of the (D) photopolymerization initiator contained in the colored radiation-sensitive composition of the present invention is preferably from 0.1% by mass to 50% by mass, more preferably from 0.5% by mass to 30% by mass, and even more preferably from 1% by mass to 20% by mass, with respect to the total solid contents of the colored radiation-sensitive composition. If the content of the photopolymerization initiator is within this range, better sensitivity and pattern formability are obtained.

[(E) Pigment]

The colored radiation-sensitive composition of the present invention may further contain, as a colorant, a pigment, in addition to the (A) dye multimer.

As the pigment used in the present invention, various inorganic or organic pigments known in the related art can be used, and it is preferable for the pigment to have a high degree of transmissivity.

Examples of the inorganic pigment include metal compounds represented by a metal oxide, a metal complex salt, and the like, and specific examples thereof include metal oxides of iron, cobalt, aluminum, cadmium, lead, copper, titanium, magnesium, chromium, zinc, antimony, and the like, and complex oxides of the above metals.

Examples of the organic pigment include C. I. Pigment Yellow 11, 24, 31, 53, 83, 93, 99, 108, 109, 110, 138, 139, 147, 150, 151, 154, 155, 167, 180, 185, 199; C. I. Pigment Orange 36, 38, 43, 71; C. I. Pigment Red 81, 105, 122, 149, 150, 155, 171, 175, 176, 177, 209, 220, 224, 242, 254, 255, 264, 270; C. I. Pigment Violet 19, 23, 32, 39; C. I. Pigment Blue 1, 2, 15, 15:1, 15:3, 15:6, 16, 22, 60, 66; C. I. Pigment Green 7, 36, 37, 58; C. I. Pigment Brown 25, 28; C. I. Pigment Black 1,7; and the like.

Examples of pigments that can be preferably used in the present invention include the following, but the present invention is not limited thereto.

C. I. Pigment Yellow 11, 24, 108, 109, 110, 138, 139, 150, 151, 154, 167, 180, 185; C. I. Pigment Orange 36, 71; C. I. Pigment Red 122, 150, 171, 175, 177, 209, 224, 242, 254, 255, 264; C. I. Pigment Violet 19, 23, 32; C. I. Pigment Blue 15:1, 15:3, 15:6, 16, 22, 60, 66; C. I. Pigment Green 7, 36, 37, 58; C. I. Pigment Black 1, 7

One kind of these organic pigments can be used singly, or alternatively, for spectral adjustment or improvement of color purity, various organic pigments described above can be used in combination. Specific examples of the combination will be shown below. For example, as a red pigment, an anthraquinone-based pigment, a perylene-based pigment, or a diketopyrrolopyrrole-based pigment can be used singly, or alternatively, a mixture of at least one kind of these with a disazo-based yellow pigment, an isoindoline-based yellow pigment, a quinophthalone-based yellow pigment, or a perylene-based red pigment can be used. Examples of the anthraquinone-based pigment include C. I. Pigment Red 177, examples of the perylene-based pigment include C. I. Pigment Red 155 and C. I. Pigment Red 224, and examples of the diketopyrrolopyrrole-based pigment include C. I. Pigment Red 254. In view of color separation properties, a mixture of the above pigment with C. I. Pigment Yellow 139 is preferable. The mass ratio between the red pigment and the yellow pigment is preferably 100:5 to 100:50. If the mass ratio is 100:4 or less, it is difficult to reduce a light transmissivity at 400 nm to 500 nm, and if it is 100:51 or higher, a dominant wavelength moves closer to a short wavelength, so a color separating ability cannot be improved in some cases. Particularly, the mass ratio is optimally in a range of 100:10 to 100:30. Moreover, in a case of a combination of red pigments, the mass ratio can be adjusted according to the required spectrum.

As a green pigment, a halogenated phthalocyanine-based pigment can be used singly, or alternatively, a mixture of this pigment with a disazo-based yellow pigment, a quinophthalone-based yellow pigment, an azomethine-based yellow pigment, or an isoindoline-based yellow pigment can be used. As an example of such pigments, a mixture of C. I. Pigment Green 7, 36, or 37 with C. I. Pigment Yellow 83, C. I. Pigment Yellow 138, C. I. Pigment Yellow 139, C. I. Pigment Yellow 150, C. I. Pigment Yellow 180, or C. I. Pigment Yellow 185 is preferable. The mass ratio between the green pigment and the yellow pigment is preferably 100:5 to 100:150. The mass ratio is particularly preferably in a range of 100:30 to 100:120.

As a blue pigment, a phthalocyanine-based pigment can be used singly, or a mixture of this pigment with a dioxazine-based violet pigment can be used. For example, a mixture of C. I. Pigment Blue 15:6 with C. I. Pigment Violet 23 is preferable. The mass ratio between the blue pigment and the violet pigment is preferably 100:0 to 100:100 and more preferably 100:10 or less.

Moreover, as a pigment for a black matrix, carbon, titanium black, iron oxide, or titanium oxide may be used singly or used as a mixture, and a combination of carbon with titanium black is preferable. The mass ratio between carbon and titanium black is preferably in a rage of 100:0 to 100:60.

When the colored radiation-sensitive composition is used for a color filter, the primary particle size of the pigment is preferably 100 nm or less from the viewpoint of color unevenness or contrast. From the viewpoint of dispersion stability, the primary particle size is preferably 5 nm or greater. The primary particle size of the pigment is more preferably 5 nm to 75 nm, even more preferably 5 nm to 55 nm, and particularly preferably 5 nm to 35 nm. The specific dispersion resin of the present invention can exert excellent effects particularly when it is combined with a pigment of which the average primary particle size is within a range of 5 nm to 35 nm.

The average primary particle size of the pigment can be measured by a known method such as an electron microscope. For example, it can be measured by a dynamic light scattering method by using an analyzer such as Microtrac Nanotrac UPA-EX150 (manufactured by NIKKISO CO., LTD).

It is preferable for the pigment, which is concurrently used as desired, to be a pigment selected from an anthraquinone pigment, a diketopyrrolopyrrole pigment, a phthalocyanine pigment, a quinophthalone pigment, an isoindoline pigment, an azomethine pigment, and a dioxazine pigment. Particularly, C. I. Pigment Red 177 (anthraquinone pigment), C. I. Pigment Red 254 (diketopyrrolopyrrole pigment), C. I. Pigment Green 7, 36, 58, C. I. Pigment Blue 15:6 (phthalocyanine pigment), C. I. Pigment Yellow 138 (quinophthalone pigment), C. I. Pigment Yellow 139, 185 (isoindoline pigments), C. I. Pigment Yellow 150 (azomethine pigment), and C. I. Pigment Violet 23 (dioxazine pigment) are most preferable.

If the pigment is concurrently used, the content thereof is preferably 5% by mass to 70% by mass, more preferably 10% by mass to 60% by mass, ad even more preferably 20% by mass to 60% by mass, with respect to the total amount of the colored radiation-sensitive composition.

When the (E) pigment is used for the colored radiation-sensitive composition of the present invention, it is preferable for the pigment to be used in a state of being dispersed in (E2) a pigment dispersant which will be described later.

[(E2) Dispersion Resin]

when the (E) pigment is used as desired for the colored radiation-sensitive composition of the present invention, a pigment dispersant may be concurrently used.

Examples of the pigment dispersant usable in the present invention include polymer dispersants (for example, polyamide amine and a salt thereof, polycarboxylic acid and a salt thereof, a high-molecular weight unsaturated acid ester, modified polyurethane, modified polyester, modified poly (meth)acrylate, a (meth)acrylic copolymer, and a naphthalene sulfonate formaldehyde condensate), surfactants such as a polyoxyethylene alkyl phosphoric acid ester, polyoxyethylene alkylamine, and alkanolamine, pigment derivatives, and the like.

The polymer dispersants can be classified into straight-chain polymers, terminal-modified polymers, graft polymers, and block polymers, according to the structure.

Examples of the terminal-modified polymers that has a moiety anchored to the pigment surface include a polymer having a phosphoric acid group in the terminal as described in JP1991-112992A (JP-H3-112992A), JP2003-533455A, and the like, a polymer having a sulfonic acid group in the terminal as described in JP2002-273191A, a polymer having a partial skeleton or a heterocycle of an organic dye as described in JP1997-77994A (JP-H9-77994), and the like. Moreover, a polymer obtained by introducing two or more moieties (acid groups, basic groups, partial skeletons of an organic dye, or heterocycles) anchored to the pigment surface into a polymer terminal as described in JP2007-277514A is also preferable since this polymer is excellent in dispersion stability.

Examples of the graft polymers having a moiety anchored to the pigment surface include polyester-based dispersant and the like, and specific examples thereof include a product of a reaction between poly(lower alkyleneimine) and polyester that is described in JP1979-37082A (JP-S54-37082A), JP1996-507960A (JP-H8-507960A), JP2009-258668A, and the like, a product of a reaction between polyallylamine and polyester that is described in JP1997-169821A (JP-H9-169821A) and the like, a copolymer of a macromonomer and a nitrogen atom monomer that is described in JP1998-339949A (JP-H10-339949A), JP2004-37986A, WO2010/110491, and the like, a graft polymer having a partial skeleton or a heterocycle of an organic dye that is described in JP2003-238837A, JP2008-9426A, JP2008-81732A, and the like, a copolymer of a macromonomer and an acid group-containing monomer that is described in JP2010-106268A, and the like. Particularly, from the viewpoint of dispersibility of a pigment dispersion, dispersion stability, and developability that the colored radiation-sensitive composition using the pigment exhibits, an amphoteric dispersion resin having basic and acid groups that is described in JP2009-203462A is preferable.

As the macromonomer used in producing a graft polymer having a moiety anchored to the pigment surface by radical polymerization, known macromonomers can be used, and examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile that has a methacryloyl group as a terminal group), and AB-6 (polybutyl acrylate having a methacryloyl group as a terminal group) manufactured by TOAGOSEI, CO., LTD., Placcel FM 5 (a product obtained by adding 5 molar equivalents of ϵ-caprolactone to 2-hydroxyethyl methacrylate) and FA10L (a product obtained by adding 10 molar equivalents of s-caprolactone to 2-hydroxyethyl acrylate) manufactured by DAICEL CORPORATION, a polyester-based macromonomer described in JP1990-272009A (JP-H2-272009A), and the like. Among these, from the viewpoint of dispersibility of the pigment dispersion, dispersion stability, and the developability that the colored radiation-sensitive composition using the pigment dispersion exhibits, the polyester-based macromonomer excellent in flexibility and solvent compatibility is particularly preferable. Furthermore, a polyester-based macromonomer represented by the polyester-based macromonomer described in JP1990-272009A (JP-H2-272009A) is most preferable.

As the block polymer having a moiety anchored to the pigment surface, block polymers described in JP2003-49110A, JP2009-52010A, and the like are preferable.

The pigment dispersant usable in the present invention can be obtained in the form of commercially available products, and specific examples thereof include "DA-7301" manufactured by Kusumoto Chemicals, Ltd., "Disperbyk-101 (polyamidamine phosphoric acid salt), 107 (carboxylic acid ester), 110 (copolymer including an acid group), 130 (polyamide), 161, 162, 163, 164, 165, 166, 170 (polymeric copolymer)" and "BYK-P104, P105 (high-molecular weight unsaturated polycarboxylic acid) manufactured by BYK-Chemie, "EFKA 4047, 4010 to 4050, 4050 to 4165 (polyurethane-based dispersant), FEKA 4330 to 4340 (block copolymer), 4400 to 4402 (modified polyacrylate), 5010 (polyesteramide), 5765 (high-molecular weight polycarboxylic acid salt), 6220 (aliphatic polyester), 6745 (phthalocyanine derivative), 6750 (azo pigment derivative)" manufactured by EFKA, "Ajisper PB821, PB822, PB880, PB881" manufactured by Ajinomoto Fine-Techno Co., Inc., "Flowlen TG-710 (urethane oligomer)" and "Polyflow No. 50E, No. 300 (acrylic copolymer) manufactured by KYOEISHA CHEMICAL Co., LTD., "Disparlon KS-860, 873 SN, 874, #2150 (aliphatic polyvalent carboxylic acid), #7004 (polyether ester), DA-703-50, DA-705, and DA-725" manufactured by Kusumoto Chemicals, Ltd., "Demol RN, N (naphthalene sulfonate formaldehyde condensate), MS, C, SN-B (aromatic sulfonate formaldehyde condensate)", "Homogenol L-18 (polymeric polycarboxylic acid), "Emulgen 920, 930, 935, 985 (polyoxyethylene nonyl phenyl ether)", and "Acetamine 86 (stearylamine acetate)" manufactured by Kao Corporation, "Solsperse 5000 (phthalocyanine derivative), 22000 (azo pigment derivative), 13240 (polyesteramine), 3000, 17000, 27000 (polymer having a functional portion in the terminal portion), 24000, 28000, 32000, 38500 (graft polymer)" manufactured by The Lubrizol Corporation, Japan, "Nikkol T106 (polyoxyethylene sorbitan monooleate) and MYS-IEX (polyoxyethylene monostearate)" manufactured by NIKKO CHEMICAL CO., LTD., Hinoact T-8000E and the like manufactured by Kawaken Fine Chemicals Co., Ltd., "organosiloxane polymer KP341" manufactured by Shin-Etsu Chemical Co., Ltd., "W001: cationic surfactant" and nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, ethylene glycol distearate, and sorbitan aliphatic acid ester, and anionic surfactants such as "W004, W005, and W017" manufactured by Yusho Co., Ltd., "EFKA-46, EFKA-47, EFKA-47EA, EFKA polymer 100, EFKA polymer 400, EFKA polymer 401, and EFKA polymer 450" manufactured by MORISHITA SANGYO CORPORATION, polymer dispersants such as "Disperse aid 6, Disperse aid 8, Disperse aid 15, and Disperse aid 9100" manufactured by SAN NOPCO LIMITED, "Adeka Pluronic L31, F38, L42, L44, L61, L64, F68, L72, P95, F77, P84, F87, P94, L101, P103, F108, L121, and P-123" manufactured by ADEKA CORPORATION, "Ionet (product name) S-20" manufactured by Sanyo Chemical Industries, Ltd., and the like.

These pigment dispersants may be used singly or used in combination of two or more kinds thereof. In the present invention, it is particularly preferable to use a combination of a pigment derivative and a polymer dispersant. Moreover, for the pigment dispersant, a terminal-modified polymer having a moiety anchored to the pigment surface, a graft polymer, and a block polymer may be used concurrently with an alkali-soluble resin. Examples of the alkali-soluble resin include a (meth)acrylic acid copolymer, an itaconic acid copolymer, a crotonic acid copolymer, a maleic acid copolymer, a partially esterified maleic acid copolymer, an acidic cellulose derivative having a carboxylic acid in a side chain, and a resin obtained by modifying an acid anhydride with a polymer having a hydroxyl group, and particularly, a (meth)acrylic acid copolymer is preferable. In addition, an N position-substituted maleimide monomer copolymer described in JP1998-300922A (JP-H10-300922A), an ether dimer copolymer described in JP2004-300204A, and an alkali-soluble resin containing a polymerizable group described in JP1995-319161A (JP-H7-319161A) are also preferable.

The content of the pigment dispersant in the colored radiation-sensitive composition is preferably 1 part by mass to 80 parts by mass, more preferably 5 parts by mass to 70 parts by mass, and even more preferably 10 parts by mass to 60 parts by mass, with respect to 100 parts by mass of the pigment.

Specifically, when a polymer dispersant is used, the amount of the dispersant used is preferably in a range from 5 parts to 100 parts, and more preferably in a range from 10 parts to 80 parts expressed in terms of mass, with respect to 100 parts by mass of the pigment.

Moreover, when a pigment derivative is concurrently used, the amount of the pigment derivative used is preferably in a range from 1 part to 30 parts, more preferably in a range from 3 parts to 20 parts, and particularly preferably in a range from 5 parts to 15 parts expressed in terms of mass, with respect to 100 parts by mass of the pigment.

In the colored radiation-sensitive composition, when the pigment dispersant is used together with the pigment as a colorant, from the viewpoint of curing sensitivity and color density, the total content of the colorant and the dispersant components (including the specific dispersion resin and other pigment dispersants) is preferably from 50% by mass to 90% by mass, more preferably from 55% by mass to 85% by mass, and even more preferably from 60% by mass to 80% by mass, with respect to the total solid contents constituting the colored radiation-sensitive composition.

[(B2) Other Alkali-Soluble Resins]

The colored radiation-sensitive composition of the present invention contains the (B) specific alkali-soluble resin as an essential component. Moreover, the colored radiation-sensitive composition may further contain alkali-soluble resins (hereinafter, referred to as "(B2) other alkali-soluble resins" in some cases) which do not contain the repeating unit represented by the Formula (b1) and Formula (b2), that is, alkali-soluble resins which are not included in the (B) specific alkali-soluble resin. In addition, the alkali-soluble resin mentioned herein is not included in the resin component which is contained in the colored radiation-sensitive composition of the present invention so as to function as a dispersant component such as a polymer dispersant contributing to dispersing of the (E) pigment concurrently used as desired.

The (B2) other alkali-soluble resins can be appropriately selected from alkali-soluble resins which are linear organic high molecular-weight polymers and have at least one group enhancing alkali solubility in a molecule (preferably, a molecule having an acrylic copolymer or a styrene-based copolymer as a main chain). From the viewpoint of heat resistance, a polyhydroxystyrene-based resin, a polysiloxane-based resin, an acrylic resin, an acrylamide-based resin, and an acryl/acrylamide copolymer resin are preferable. Furthermore, from the viewpoint of controlling developability, an acrylic resin, an acrylamide-based resin, an acryl/acrylamide copolymer resin are preferable.

Examples of the group enhancing alkali solubility (hereinafter, also referred to as an "acid group") include a carboxyl group, a phosphoric acid group, a sulfonic acid group, a phenolic hydroxyl group, and the like. The group enhancing alkali solubility is preferably a group that is soluble in an organic solvent and can be developed by an aqueous weak alkaline solution, and preferable examples thereof include (meth)acrylic acid. One kind of the acid groups may be used singly, or two or more kinds thereof may be used.

Examples of the monomer that can give the acid group after polymerization include monomers having a hydroxyl group, such as 2-hydroxyethyl(meth)acrylate, monomers having an epoxy group, such as glycidyl (meth)acrylate, monomers having an isocyanate group, such as 2-isocyanate ethyl(meth) acrylate, and the like. One kind of the monomers for introducing these acid groups may be used singly, or two or more kinds thereof may be used. In order to introduce the acid group into the alkali-soluble resin, for example, the monomer having the acid group and/or the monomer that can give the acid group after polymerization (hereinafter, referred to as a "monomer for introducing an acid group" in some cases) may be polymerized as a monomer component.

When the monomer that can give the acid group after polymerization is used as a monomer component to introduce the acid group, for example, a treatment for giving the acid group, which will be described later, needs to be performed after polymerization.

In order to produce the alkali-soluble resin, for example, a method implemented by known radical polymerization can be used. Various polymerization conditions for producing the alkali-soluble resin by radical polymerization, such as temperature, pressure, the type and amount of radical initiators, and the type of solvents, can be easily set by those skilled in the art, and the conditions can also be set experimentally.

It is also preferable for the colored radiation-sensitive composition to contain, as the (B2) other alkali-soluble resins, a polymer (a) which is obtained by polymerizing a monomer component containing a compound (hereinafter, referred to as an "ether dimer") represented by the following Formula (ED) as an essential component.

[Chem. 102]

Formula (ED)

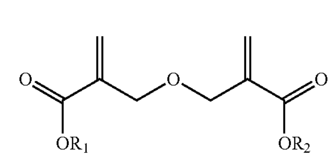

In Formula (ED), each of $R_1$ and $R_2$ independently represents a hydrogen atom or a hydrocarbon group having 1 to 25 carbon atoms that may have a substituent.

If the colored radiation-sensitive composition of the present invention contains the polymer (a), the composition can form a cured coating film having extremely excellent heat resistance and transparency. In the Formula (ED) that represents the ether dimer, the hydrocarbon group, which is represented by $R_1$ and $R_2$, has 1 to 25 carbon atoms, and may have a substituent, is not particularly limited, and examples thereof include linear or branched alkyl groups such as methyl, ethyl, n-propyl, isopropyl, n-butyl, isobutyl, t-butyl, t-amyl, stearyl, lauryl, and 2-ethylhexyl; aryl groups such as phenyl; alicyclic groups such as cyclohexyl, t-butylcyclohexyl, cyclopentadienyl, tricyclodecanyl, isobornyl, adamantyl, and 2-methyl-2-adamantyl; alkyl groups substituted with alkoxy such as 1-methoxyethyl and 1-ethoxyethyl; alkyl groups substituted with an aryl group such as benzyl; and the like. Among these, in view of heat resistance, substituents of primary or secondary carbon that are not easily eliminated by an acid or heat, such as methyl, ethyl, cyclohexyl, and benzyl, are preferable.

Specific examples of the ether dimer include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(cyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, di(2-methyl-2-adamantyl)-2,2'-[oxybis(methylene)] bis-2-propenoate, and the like. Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are particularly preferable. One kind of these ether dimers may be used singly, or two or more kinds thereof may be used. The structure derived from the compound represented by the Formula (ED) may be copolymerized with other monomers.

In order to improve crosslinking efficiency of the colored radiation-sensitive composition of the present invention, the (B2) other alkali-soluble resins having a polymerizable group may be used. As the alkali-soluble resins having a polymerizable group, alkali-soluble resins and the like containing an allyl group, a (meth)acryl group, an allyloxyalkyl group, and the like on a side chain thereof are useful. Examples of polymers containing the above polymerizable group include Dianal NR series (manufactured by Mitsubishi Rayon Co., Ltd.), Photomer 6173 (a polyurethane acrylic oligomer containing COOH, manufactured by Diamond Shamrock Co., Ltd.), Biscoat R-264 and KS Resist 106 (all manufactured by OSAKA ORGANIC CHEMICAL INDUSTRY LTD.), Cyclomer P series and Placcel CF200 series (all manufactured by DAICEL CORPORATION), Ebecryl 3800 (manufactured by DAICEL-UCB Co., Ltd.), and the like. As these alkali-soluble resins containing a polymerizable group, a polymerizable double bond-containing acrylic resin modified with urethane, which is a resin obtained by reacting an isocyanate group and an OH group in advance to leave an unreacted isocyanate group and causing a reaction between a compound having a (meth)acryloyl group and an acrylic resin having a carboxyl group, an unsaturated bond-containing acrylic resin which is obtained by a reaction between an acrylic resin having a carboxyl group and a compound having both an epoxy group and a polymerizable double bond in a molecule, a polymerizable double bond-containing acrylic resin which is obtained by a reaction between an acid pendant type epoxy acrylate resin, an acrylic resin having an OH group, and a dibasic acid anhydride having a polymerizable double bond, a resin obtained by a reaction between an acrylic resin having an OH group and a compound having isocyanate and a polymerizable group, a resin that is obtained by treating a resin, which has an ester group having an elimination group such as a halogen atom or a sulfonate group in an a-position or a β-position described in JP2002-229207A and JP2003-335814A on a side chain, with a base, and the like are preferable.

The acid value of the (B2) other alkali-soluble resins is preferably 30 mgKOH/g to 200 mgKOH/g, more preferably 50 mgKOH/g to 150 mgKOH/g, and most preferably 70 mgKOH/g to 120 mgKOH/g.

Moreover, the weight average molecular weight (Mw) of the alkali-soluble resins is preferably 2,000 to 50,000, more preferably 5,000 to 30,000, and most preferably 7,000 to 20,000.

When the colored radiation-sensitive composition contains the (B2) other alkali-soluble resins, the content of the resins is preferably 1% by mass to 15% by mass, more preferably 2% by mass to 12% by mass, and particularly preferably 3% by mass to 10% by mass, with respect to the total solid contents of the colored radiation-sensitive composition.

Furthermore, the content of the (B2) other alkali-soluble resins concurrently used is preferably 100 parts by mass or less, with respect to 100 parts by mass of the (B) specific alkali-soluble resin.

[Other Components]

The colored radiation-sensitive composition of the present invention may further contain other components such as an organic solvent and a crosslinking agent in addition to the respective components described above, within a range that does not diminish the effects of the present invention.

(Organic Solvent)

The colored radiation-sensitive composition of the present invention may contain an organic solvent.

Basically, the organic solvent is not particularly limited as long as the solvent satisfies the solubility of the respective components or the coating properties of the colored radiation-sensitive composition. Particularly, it is preferable to select the organic solvent in consideration of the solubility, coating properties, and safety of an ultraviolet absorber, the alkali-soluble resin, the dispersant, and the like. Moreover, when the colored radiation-sensitive composition of the present invention is prepared, the composition preferably contains at least two kinds of organic solvents.

Preferable examples of the organic solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (for example, methyl oxyacetate, ethyl oxyacetate, or butyl oxyacetate (specifically, methyl methoxyacetate, ethyl methoxyacetate, butyl methoxyacetate, methyl ethoxyacetate, or ethyl ethoxyacetate)), alkyl 3-oxypropionate esters (specifically, methyl 3-oxypropionate or ethyl 3-oxypropionate (for example, methyl 3-methoxypropionate, ethyl 3-methoxypropionate, methyl 3-ethoxypropionate, or ethyl 3-ethoxypropionate)), alkyl 2-oxypropionate esters (specifically, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methyl propionate and ethyl 2-oxy-2-methyl propionate (specifically, methyl 2-methoxy-2-methyl propionate or ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethy ether acetate, propylene glycol monoethyl ether acetate, and propylene glycol monopropyl ether acetate; ketones such as methyl ethyl ketone, cyclohexanone, 2-heptanone, and 3-butanone; aromatic hydrocarbons such as toluene and xylene; and the like.

From the viewpoint of solubility of an ultraviolet absorber and the alkali-soluble resin, and improvement of the shape of the coated surface, it is also preferable to mix two or more kinds of these organis solvents with each other. In this case, a mixed solution consisting of two or more kinds selected from the aforementioned methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate is particularly preferable.

From the viewpoint of coating properties, the content of the organic solvent in the colored radiation-sensitive composition is set such that the concentration of the total solid contents of the composition becomes preferably 5% by mass to 80% by mass, more preferably 5% by mass to 60% by mass, and particularly preferably 10% by mass to 50% by mass.

(Crosslinking Agent)

If a crosslinking agent is complementarily used for the colored radiation-sensitive composition of the present invention, hardness of the colored cured film obtained by curing the colored radiation-sensitive composition can be improved.

The crosslinking agent is not particularly limited as long as it makes it possible to cure a film by a crosslinking reaction, and examples thereof include (a) an epoxy resin, (b) a melamine compound, a guanamine compound, a glycoluril compound, or a urea compound substituted with at least one substituent selected from a methylol group, an alkoxymethyl group, and an acyloxymethyl group, and (c) a phenol compound, a naphthol compound, or a hydroxyanthracene compound substituted with at least one substituent selected from a methylol group, an alkoxymethyl group, and an acyloxymethyl group. Among these, a polyfunctional epoxy resin is preferable.

Regarding details of specific examples of the crosslinking agent, the disclosure of JP2004-295116A, paragraphs 0134 to 0147 can be referred to.

(Polymerization Inhibitor)

It is desirable to add a small amount of a polymerization inhibitor to the colored radiation-sensitive composition of the present invention so as to hinder the occurrence of unnecessary thermal polymerization of the polymerizable compound during production or storage of the colored radiation-sensitive composition.

Examples of the polymerization inhibitor usable in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine cerium (I) salt, and the like.

The amount of the polymerization inhibitor added is preferably about 0.01% by mass to about 5% by mass, with respect to the total mass of the composition.

(Surfactant)

From the viewpoint of further impriving coating properties, various surfactants may be added to the colored radiation-sensitive composition of the present invention. As the surfactants, it is possible to use various surfactants such as a fluorosurfactant, a nonionic surfactant, a cationic surfactant, an anionic surfactant, and silicone-based surfactant.

Particularly, if the colored radiation-sensitive composition of the present invention contains a fluorosurfactant, liquid characteristics (particularly, fluidity) are further improved when the composition is prepared as a coating liquid, and accordingly, evenness of coating thickness or liquid saving properties can be further improved.

That is, when a coating liquid, which is obtained using the colored radiation-sensitive composition containing a fluorosurfactant, is used to form a film, surface tension between a surface to be coated and the coating liquid is reduced. Consequently, wettability with respect to the surface to be coated is improved, and coating properties with respect to the surface to be coated is enhanced. Therefore, even when a thin film of about several μm is formed of a small amount of liquid, a film with a uniform thickness that exhibits a small extent of thickness unevenness is more preferably formed, and accordingly, the colored radiation-sensitive composition containing a fluorosurfactant is effective.

The fluorine content in the fluorosurfactant is preferably 3% by mass to 40% by mass, more preferably 5% by mass to 30% by mass, and particularly preferably 7% by mass to 25% by mass. The fluorosurfactant in which the fluorine content is in this range is effective in view of the thickness of the coating film or liquid saving properties, and solubility of the surfactant in the colored radiation-sensitive composition is also excellent.

Examples of the fluorosurfactant include Megaface F171, F172, F173, F176, F177, F141, F142, F143, F144, R30, F437, F475, F479, F482, F554, F780, and F781 (all manufactured by DIC CORPORATION), Fluorad FC430, FC431, and FC171 (all manufactured by Sumitomo 3M), Surflon S-382, SC-101, SC-103, SC-104, SC-105, SC1068, SC-381, SC-383, SC-393, and KH-40 (all manufactured by ASAHI GLASS CO., LTD.), PF636, PF656, PF6320, PF6520, and PF7002 (all manufactured by OMNOVA Solutions, Inc.), and the like.

Specific examples of the nonionic surfactant include glycerol, trimethylolpropane, trimethylolethane, and ethoxylate and propoxylate of these (for example, glycerol propoxylate and glycerin ethoxylate), polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (Pluronic L10, L31, L61, L62, 10R5, 17R2, and 25R2, Tetronic 304, 701, 704, 901, 904, and 150R1 manufactured by BASF), Solseperse 20000 manufactured by The Lubrizol Corporation, Japan, and the like.

Specific examples of the cationic surfactant include phthalocyanine derivatives (trade name: EFKA-745 manufactured by MORISHITA SANGYO CORPORATION), organosiloxane polymer KP341 (manufactured by Shin-Etsu Chemical Co., Ltd.), (meth)acrylic acid-based (co)polymer Polyflow No. 75, No. 90, and No. 95 (manufactured by KYOEISHA CHEMICAL Co., LTD.), W001 (manufactured by Yusho Co., Ltd.), and the like.

Specific examples of the anionic surfactant include W004, W005, and W017 (manufactured by Yusho Co., Ltd.), and the like.

Examples of the silicone-based surfactant include "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH3OPA", and "Toray Silicone SH8400"manufactured by Dow Corning Toray, "TSF-4440", "TSF-4300", "TSF-4445", "TSF-4460", and "TSF-4452" manufactured by Momentive Performance Materials Inc., "KP341", "KF6001", and "KF6002" manufactured by Shin-Etsu Silicones, "BYK307", "BYK323", and "BYK330" manufactured by BYK-Chemie, and the like.

One kind of the surfactant may be used singly, or two or more kinds thereof may be used in combination.

The amount of the surfactant added is preferably 0.01% by mass to 2.0% by mass and more preferably 0.005% by mass to 1.0% by mass, with respect to the total mass of the colored radiation-sensitive composition.

(Other Additives)

If necessary, various additives such as a filler, an adhesion promoting agent, an antioxidant, an ultraviolet absorber, and an anti-aggregation agent may be mixed in the colored radiation-sensitive composition. Examples of these additives include those described in JP2004-295116A, paragraphs 0155 and 0156.

The colored radiation-sensitive composition of the present invention can contain the sensitizer or a light stabilizer described in JP2004-295116A, paragraph 0078, and the thermal polymerization inhibitor described in JP2004-295116A, paragraph 0081.

(Organic Carboxylic Acid and Organic Carboxylic Anhydride)

The colored radiation-sensitive composition of the present invention may contain an organic carboxylic acid having a molecular weight of 1000 or less and/or an organic carboxylic anhydride.

Specific examples of the organic carboxylic acid compound include aliphatic carboxylic acid and aromatic carboxylic acid. Examples of the aliphatic carboxylic acid include monocarboxylic acids such as formic acid, acetic acid, propionic acid, butyric acid, valeric acid, pivalic acid, caproic acid, glycolic acid, acrylic acid, and methacrylic acid, dicarboxylic acids such as oxalic acid, malonic acid, succinic acid, glutaric acid, adipic acid, pimelic acid, cyclohexanedicarboxylic acid, cyclohexenedicarboxylic acid, itaconic acid, citraconic acid, maleic acid, and fumaric acid, tricarboxylic acids such as tricarballylic acid, and aconitic acid, and the like. Examples of the aromatic carboxylic acid include carboxylic acids in which a carboxyl group is directly bonded to a phenyl group such as a benzoic acid and a phthalic acid, and carboxylic acids in which a phenyl group is bonded to a carboxyl group via a carbon bond. Among these, carboxylic acids having a molecular weight of 600 or less, particularly having a molecular weight of 50 to 500, specifically, maleic acid, malonic acid, succinic acid, and itaconic acid are particularly preferable.

Examples of the organic carboxylic anhydride include aliphatic carboxylic anhydride and aromatic carboxylic anhydride. Specific examples thereof include aliphatic carboxylic anhydrides such as acetic anhydride, trichloroacetic anhydride, trifluoroacetic anhydride, tetrahydrophthalic anhydride, succinic anhydride, maleic anhydride, citraconic anhydride, itaconic anhydride, glutaric anhydride, 1,2-cyclohexenedicarboxylic anhydride, n-octadecylsuccinic anhydride, and 5-norbornene-2,3-dicarboxylic anhydride. Examples of the aromatic carboxylic anhydride include phthalic anhydride, trimellitic anhydride, pyromellitic anhydride, naphthalic anhydride, and the like. Among these, those having a molecular weight of 600 or less, particularly having a molecular weight of 50 to 500, specifically, for example, maleic anhydride, succinic anhydride, citraconic anhydride, and itaconic anhydride are preferable.

The amount of these organic carboxylic acids and/or the organic carboxylic anhydrides added is generally in a range from 0.01% by mass to 10% by mass, preferably in a range from 0.03% by mass to 5% by mass, and more preferably in a range from 0.05% by mass to 3% by mass in the total solid contents.

If these organic carboxylic acids and/or the organic carboxylic anhydrides having a molecular weight of 1000 or less are added, it is possible to greatly reduce the amount of the residual undissolved substance of the colored radiation-sensitive composition while maintaining a high degree of pattern adhesiveness.

[Method for Preparing Colored Radiation-Sensitive Composition]

The colored radiation-sensitive composition of the present invention is prepared by mixing the aforementioned components together.

When the colored radiation-sensitive composition is prepared, the respective components constituting the colored radiation-sensitive composition may be mixed together at the same time or mixed together sequentially after being dissolved and dispersed in a solvent. Moreover, during the mixing, the order of adding the components and operation conditions are not particularly restricted. For example, all components may be dissolved and dispersed in a solvent at the same time to prepare the composition. Alternatively, if necessary, the respective components may be appropriately prepared as two or more solutions and dispersions and mixed at the time of use (at the time of coating) to prepare the composition.

The colored radiation-sensitive composition prepared as above can be used after being filtered using a filter and the like of which a pore size is preferably about 0.01 μm to 3.0 μm and more preferably about 0.05 μm to 0.5 μM.

The colored radiation-sensitive composition of the present invention can form a colored cured film having excellent heat resistance and color characteristics. Accordingly, the colored radiation-sensitive composition is preferably used for forming a colored pattern (colored layer) of a color filter. Furthermore, the colored radiation-sensitive composition of the present invention can be preferably used for forming a colored pattern of a color filter and the like used in solid-state image sensors (for example, CCD, CMOS, and the like) or image display devices such as a liquid crystal display (LCD). Moreover, the composition can also be preferably used for preparing a print ink, an ink jet ink, a coating material, and the like. Particularly, the composition can be preferably used for preparing a color filter for solid-state image sensors such as CCD and CMOS.

<Colored Cured Film, Pattern Forming Method, Color Filter, and Color Filter Production Method>

Next, the colored cured film, pattern forming method, and color filter of the present invention will be described in detail by an explanation of these production methods.

The pattern forming method of the present invention includes a colored radiation-sensitive composition layer forming step of forming a colored radiation-sensitive composition layer by applying the colored radiation-sensitive composition of the present invention onto a support, a light exposure step of exposing the colored radiation-sensitive composition layer to light in the form of pattern, and a pattern forming step of forming a colored pattern by developing and removing an unexposed portion.

The pattern forming method of the present invention can be preferably used for forming a colored pattern (pixel) that a color filter has.

The support for forming a pattern by the pattern forming method of the present invention includes plate-like substances such as a substrate and is not particularly limited as long as the support can be used for forming a pattern.

Hereinafter, each step of the pattern forming method of the present invention will be described in detail by describing a method for producing a color filter for solid-state image sensor, but the present invention is not limited to the method.

The color filter production method of the present invention uses the pattern forming method of the present invention, and includes a step of forming a colored pattern on a support by using the pattern forming method of the present invention.

That is, the color filter production method of the present invention uses the pattern forming method of the present invention, and includes a colored radiation-sensitive composition layer forming step of forming a colored radiation-sensitive composition layer by applying the colored radiation-sensitive composition of the present invention onto a support, a light exposure step of exposing the colored radiation-sensitive composition layer to light in the form of pattern, and a pattern forming step of forming a colored pattern by developing and removing an unexposed portion. If necessary, the method may include a step of baking the colored radiation-sensitive composition layer (pre-baking step) and a step of baking the developed colored pattern (post-baking step). Hereinafter, these steps may be collectively referred to as a "pattern forming step" in some cases.

The color filter of the present invention can be preferably obtained by the above production method.

Hereinafter, the color filter for solid-state image sensor may be simply referred to as a "color filter" in some cases.

Each step in the pattern forming method of the present invention will be described in detail below by describing the color filter production method of the present invention.

The color filter production method of the present invention uses the pattern forming method of the present invention, and includes a step of forming a colored pattern onto a support by using the pattern forming method of the present invention.

[Colored Radiation-Sensitive Composition Layer Forming Step]

In the colored radiation-sensitive composition layer forming step, a colored radiation-sensitive composition layer is formed by applying the colored radiation-sensitive composition of the present invention onto a support.

As the support usable in this step, for example, it is possible to use a substrate for a solid-state image sensor that is formed by providing an image sensor (light-receiving element) such as Charge Coupled Device (CCD) or Complementary Metal-Oxide Semiconductor (CMOS) onto a substrate (for example, a silicon substrate).

The colored pattern of the present invention may be formed on the image sensor-formed surface (front surface) of the substrate for a solid-state image sensor or on the surface (rear surface) where the imaging sensor is not formed.

A light shielding film may be disposed between colored patterns in the solid-state image sensor or onto the rear surface of the substrate for a soli-state image sensor.

Moreover, if necessary, an undercoat layer may be disposed onto the support so as to improve adhesiveness between the support and the upper layer, prevent diffusion of substances, or planarize the surface of the substrate.

As the method of applying the colored radiation-sensitive composition of the present invention onto the support, various coating methods such as slit coating, inkjet coating, spin coating, cast coating, roll coating, and screen printing can be used.

Drying (pre-baking) of the colored radiation-sensitive composition layer coated onto the supporter can be performed using a hot plate, an oven, or the like at 50° C. to 140° C. for 10 seconds to 300 seconds.

[Light Exposure Step]

In the light exposure step, the colored radiation-sensitive composition layer formed in the colored radiation-sensitive composition layer forming step is exposed to light in patternwise through a mask having a predetermined mask pattern by using, for example, an exposure device such as a stepper. In this manner, a colored cured film is obtained.

As radiation (light) usable in light exposure, particularly, ultraviolet rays such as a g-line and an i-line are preferably used (particularly, an i-line is preferably used). The irradiation dose (exposure dose) is preferably 30 mJ/cm$^2$ to 1500 mJ/cm$^2$, more preferably 50 mJ/cm$^2$ to 1000 mJ/cm$^2$, and most preferably 80 mJ/cm$^2$ to 500 mJ/cm$^2$.

The film thickness of the colored cured film is preferably 1.0 μm or less, more preferably 0.1 μm to 0.9 μm, and even more preferably 0.2 μm to 0.8 μm.

It is preferable to set the film thickness to be 1.0 μm or less since a high degree of resolution and adhesiveness are obtained.

[Pattern Forming Step]

Thereafter, by performing alkali development treatment, the colored radiation-sensitive composition layer in a portion not irradiated with light in the light exposure step is eluted into an aqueous alkaline solution, and as a result, only a photocured portion remains.

As a developer, an organic alkaline developer not damaging the image sensor, a circuit, or the like in the underlayer is desirable. The development temperature is generally 20° C. to 30° C., and the development time is 20 seconds to 90 seconds. In order to further remove residues, development may be performed for 120 seconds to 180 seconds. Moreover, in order to improve residue removal properties, a step of shaking off the developer every 60 seconds and newly supplying a developer is repeated plural times in some cases.

Examples of alkaline agents used for the developer include organic alkaline compounds such as aqueous ammonia, ethylamine, diethylamine, dimethyl ethanolamine, tetramethyl ammonium hydroxide, tetraethyl ammonium hydroxide, choline, pyrrole, piperidine, and 1,8-diazabicyclo-[5,4,0]-7-undecene. As the developer, aqueous alkaline solutions obtained by diluting these alkaline agents with pure water so as to yield a concentration of the agent of 0.001% by mass to 10% by mass, more preferably 0.01% by mass to 1% by mass are preferably used.

In addition, inorganic alkalis may be used for the developer, and as the inorganic alkali, for example, sodium hydroxide, potassium hydroxide, sodium carbonate, sodium hydrogen carbonate, sodium silicate, sodium metasilicate, and the like are preferable.

When a developer formed of such an aqueous alkaline solution is used, generally, the pattern is washed (rinsed) with pure water after development.

Thereafter, it is preferable to perform a heating treatment (post-baking) after drying. If a multicolored pattern is formed, the above steps can be sequentially repeated for each color to produce a cured coat. In this manner, a color filter is obtained.

The post-baking is a heating treatment performed after development so as to complete curing, and in the post-baking, a thermal curing treatment is performed generally at 100° C. to 240° C. and preferably at 200° C. to 240° C.

The post-baking treatment can be performed on the coating film obtained after development consecutively or in a batch manner, by using heating means such as a hot plate, a convection oven (a hot-air circulation type drier), and a high-frequency heater under the conditions described above.

If necessary, the production method of the present invention may include, as a step other than the above steps, a step known as a production method of a color filter for a solid-state image sensor. For example, if necessary, in the production method, a curing step of curing the formed colored pattern by heating and/or light exposure may be performed after the colored radiation-sensitive composition layer forming step, the light exposure step, and the pattern forming step are conducted.

When the colored radiation-sensitive composition of the present invention is used, for example, a nozzle of an ejection portion or a piping portion of a coating device is clogged, or the colored radiation-sensitive composition or a pigment adhere to or are precipitated or dried inside the coating machine, and as a result, contamination and the like are caused in some cases. Therefore, in order to efficiently wash off the contamination caused by the colored radiation-sensitive composition of the present invention, it is preferable to use the aforementioned solvent relating to the present composition as a rinsing solution. In addition, rinsing solutions described in JP1995-128867A (JP-H7-128867A), JP1995-146562A (JP-H7-146562A), JP1996-278637A (JP-H8-278637A), JP2000-273370A, JP2006-85140A, JP2006-291191A, JP2007-2101A, JP2007-2102A, JP2007-281523A, and the like can also be preferably used to rinse and remove the colored radiation-sensitive composition according to the present invention.

Among the above, alkylene glycol monoalkyl ether carboxylate and alkylene glycol monoalkyl ether are preferable.

One kind of these solvents may be used singly, or two or more kinds thereof may be used as by being mixed with each other. When two or more kinds thereof are mixed with each other, it is preferable to mix a solvent having a hydroxyl group with a solvent not having a hydroxyl group. The mass ratio between the solvent having a hydroxyl group and the solvent not having a hydroxyl group is 1/99 to 99/1, preferably 10/90 to 90/10, and even more preferably 20/80 to 80/20. A mixed solvent in which propylene glycol monomethyl ether acetate (PGMEA) is mixed with propylene glycol monomethyl ether (PGME) at a ratio of 60/40 is particularly preferable. Moreover, in order to improve the permeability of the rinsing solution with respect to the contaminant, it is preferable to add the aforementioned surfactants relating to the composition to the rinsing solution.

The color filter of the present invention uses the colored radiation-sensitive composition of the present invention. Accordingly, light exposure forming excellent exposure margin can be performed, the formed colored pattern (colored pixel) is excellent in toughness, heat resistance, and linearity of the pattern, and generation of residues in the developed portion is inhibited. Therefore, the color filter has excellent color characteristics and heat resistance. Moreover, even when a heating process such as post-heating is performed for forming a multicolored pattern, color migration to the adjacent pattern is effectively inhibited. Consequently, the color filter of the present invention has excellent color characteristics.

The color filter of the present invention can be preferably used for solid-state image sensors such as CCD and CMOS, and is particularly preferable for CCD, CMOS, and the like with a high resolution that have more than 1,000,000 pixels. The color filter for a solid-state image sensor of the present invention can be used as, for example, a color filter disposed between a light-receiving portion of each pixel constituting CCD or CMOS and a microlens for condensing light.

The film thickness of the colored pattern (colored pixel) in the color filter of the present invention is preferably 2.0 μm or less and more preferably 1.0 μm or less.

Moreover, the size (pattern width) of the colored pattern (colored pixel) is preferably 2.5 μm or less, more preferably 2.0 μm or less, and particularly preferably 1.7 μm or less.

<Solid-State Image Sensor>

The solid-state image sensor of the present invention includes the aforementioned color filter of the present invention. The constitution of the solid-state image sensor of the present invention is not particularly limited, as long as the solid-state image sensor includes the color filter of the present invention and functions as a solid-state image sensor. However, for example, the solid-state image sensor can be constituted as below.

That is, the solid-state image sensor has a constitution in which transfer electrodes consisting of plural photodiodes and transfer electrodes formed of polysilicon or the like constituting a light-receiving area of a solid-state image sensor (a CCD image sensor, a CMOS image sensor, or the like) are arranged onto a supporter; a light shielding film that is opened only to the light-receiving portion of the photodiode and is formed of tungsten or the like is disposed onto the photodiodes and the transfer electrodes; a device protecting film that is formed for covering the entire surface of the light shielding film and the light receiving portion of the photodiodes and is formed of silicon nitride or the like is disposed onto the light shielding film; and the color filter for a solid-state image sensor of the present invention is disposed onto the device protecting film.

In addition, the solid-state image sensor may have a constitution in which light-condensing means (for example, a microlens or the like, the same shall be applied hereinafter) is disposed to a portion which is positioned on the device protecting portion and under the color filter (side close to the support), a constitution in which light-condensing means is disposed on the color filter, and the like.

<Image Display Device>

The color filter of the present invention can be used not only for the solid-state image sensor, but also for an image display device such as a liquid crystal display device or organic EL display device. Particularly, the color filter is preferable for a liquid crystal display device.

When the color filter is used for the liquid crystal display device, even if a dye is used as a colorant, spectral characteristics and heat resistance are excellent, and the formed pixel is excellent in linearity. Accordingly, residues do not remain in a pixel non-formation portion, and color shade of the display image is excellent, hence display characteristics become excellent.

Consequently, the liquid crystal display device having the color filter of the present invention is excellent in the color shade of the display image and can display high-quality images having excellent display characteristics over a long time.

The definition of display devices or details of the respective display devices are described in, for example, "Electronic display device (Akio Sasaki, Kogyo Chosakai Publishing Co., Ltd., 1990)", "Display device (Toshiyuki Ibuki, Sangyo-Tosho Publishing Co., Ltd., 1989), and the like. In addition, regarding a liquid crystal display device, for example, "Liquid crystal display technology for next generation (edited by Tatsuo Uchida, Kogyo Chosakai Publishing Co., Ltd., 1994)" includes a disclosure. The liquid crystal display device to which the present invention can be applied is not particularly limited. For example, the present invention can be applied to liquid crystal display devices employing various systems described in the "Liquid crystal display technology for next generation".

The color filter of the present invention may be used for a liquid crystal display device using a color TFT system. Regarding the liquid crystal display device using a color TFT system, for example, "Color TFT liquid crystal display (KYORITSU SHUPPAN CO., LTD., 1996" includes a disclosure. Moreover, the present invention can be applied to liquid crystal display devices that use an in-plane switching driving system such as IPS, a pixel division system such as MVA, and the like and have an enlarged viewing angle, STN, TN, VA, OCS, FFS, R-OCB, and the like.

In addition, the color filter of the present invention can be provided to a Color-filter On Array (COA) system that is a bright and high-definition system. In the liquid crystal display device of the COA system, the characteristics required for a color filter layer need to include characteristics required for an interlayer insulating film, that is, a low dielectric constant and remover resistance in some cases, in addition to the above characteristics that are generally required. In the color filter of the present invention, a dye having an excellent color hue is used. Accordingly, the color purity, light transmissivity, and the like are excellent, and the color shade of the colored pattern (pixel) is excellent. Consequently, a liquid crystal display device of a COA system that has a high resolution and is excellent in long-term durability can be provided. Moreover, in order to satisfy the requirement for the characteristic of a low dielectric constant, a resin coat may be disposed onto the color filter layer.

Regarding these image display systems, for example, "EL, PDP, and LCD display technologies and recent trend in market (TORAY RESEARCH CENTER, research department, 2001)" includes a disclosure on p. 43 and the like.

The liquid crystal display device having the color filter of the present invention is constituted with various members such as an electrode substrate, a polarizing film, a phase difference film, a backlight, a spacer, and a viewing anglecompensation film, in addition to the color filter of the present invention. The color filter of the present invention can be applied to a liquid crystal display device constituted with these known members. Regarding these members, for example, "'94 Market of peripheral materials and chemicals of liquid crystal display (Kentaro Shima, CMC Co., Ltd., 1994" and "2003 Current situation of market relating to liquid crystal and prospects (Vol. 2) (Yoshikichi Hyo, Fuji Chimera Research Institute, Inc., 2003)" include disclosures.

Regarding the backlight, SID meeting Digest 1380 (2005) (A. Konno et al.), December issue of monthly "Display", 2005, pp 18-24 (Yasuhiro Shima) and pp 25-30 (Takaaki Hagi), and the like include disclosures.

If the color filter of the present invention is used in a liquid crystal display device, high contrast can be realized when the color filter is combined with a three-wavelength tube of a cold cathode tube known in the related art. Moreover, if a light source of LED of red, green and blue (RGB-LED) is used as a backlight, a liquid crystal display device having a high luminance, high color purity, and an excellently high degree of color reproducibility can be provided.

EXAMPLES

Hereinafter, the present invention will be described in more detail based on examples, but the present invention is not limited to the examples as long as the object of the invention is not impaired. Moreover, "%" and "part(s)" are based on mass unless otherwise specified.

Synthesis Example 1

Based on the method described in JP2010-85758A, paragraphs 0186 to 0213, a dye a (dye monomer M1) was obtained according to the following scheme. Specifically, the scheme is as follows.

[Chem. 103]

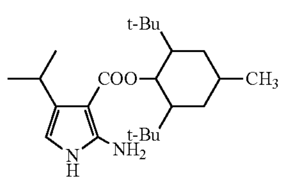

Intermediate 1

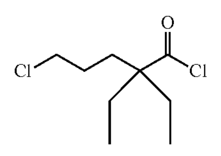

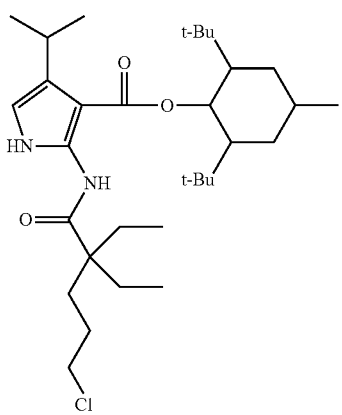

Intermediate 2

-continued

Intermediate 2

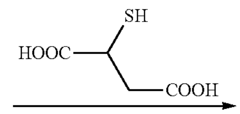

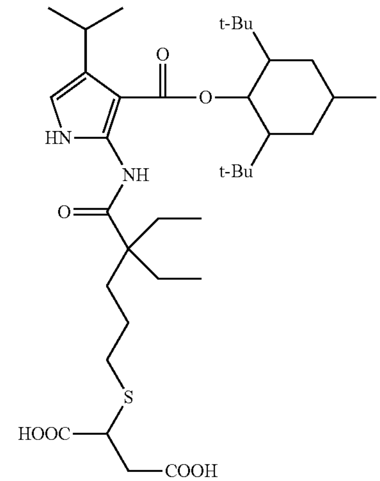

Intermediate 3

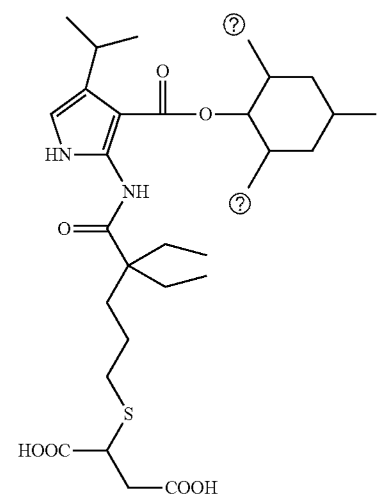

Intermediate 3

Intermediate 2

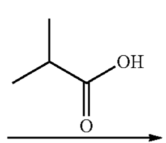

-continued

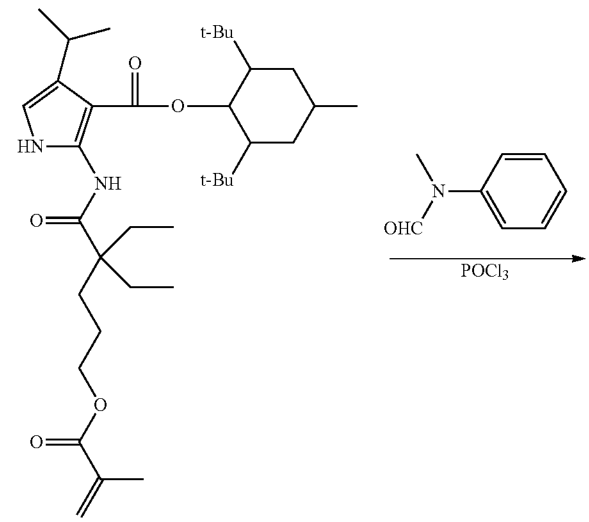

Intermediate 4

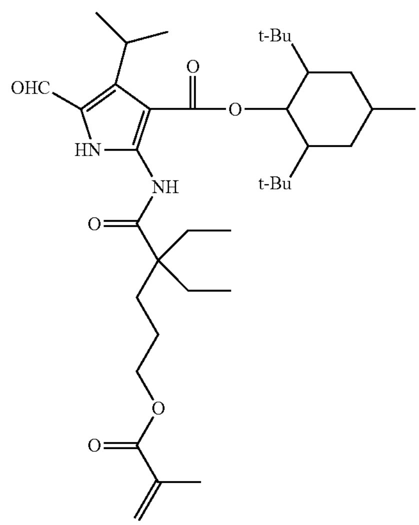

Intermediate 5

Intermediate 3 + Intermediate 5

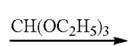

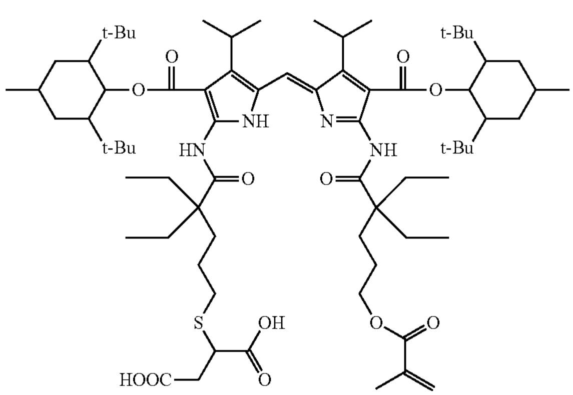

Intermediate 6

Intermediate 6

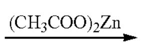

-continued

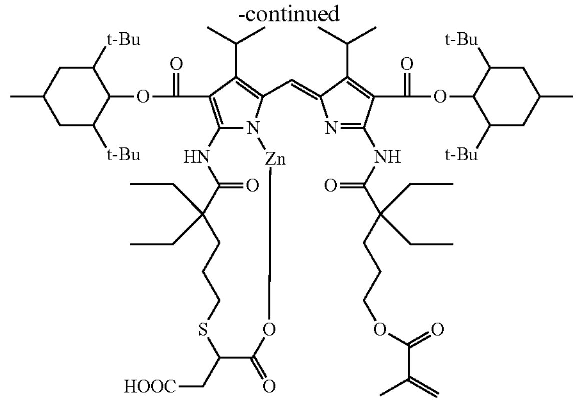

Dye 2

Synthesis of Intermediate 2

40 ml of acetonitrile was added to 10 g (42.7 mmol) of an intermediate 1 obtained by the method described in US2008/0076044A, and the resultant solution was stirred under ice cooling. To this solution, a solution obtained by dissolving 10.81 g (51.2 mmol) of 2,2-diethyl 5-chlorovaleryl chloride in 10 ml of acetonitrile was added dropwise. Thereafter, 5.1 g (64.7 mmol) of pyridine was added drowise thereto, the resultant solution was stirred for an hour at room temperature, and the obtained crystals were filtered, washed with acetonitrile, and then dried. In this manner, 19.5 g (yield: 83%) of an intermediate 2 was obtained.

Synthesis of Intermediate 3

The intermediate 2 (18.0 g, 32.7 mmol) and thiomalic acid (7.9 g, 52.6 mmol) were added to 70 mL of dimethylacetamide, and the resultant solution was stirred at room temperature. While the solution was being kept at 30° C. or a lower temperature, diazabicycloundecene (26.8 g) was added dropwise to the solution over 30 minutes. The solution was stirred for 12 hours at room temperature, and the thus obtained reaction solution was added dropwise to 400 mL of 0.5 N HClaq over 30 minutes in an ice bath. The precipitated solids were filtered and washed with water by sprinkling, and then stirred again in 400 mL of water, followed by filtering. The obtained solids were vacuum-dried (45° C., 12 hours), thereby obtaining an intermediate 3 (18.4 g, 27.7 mmol, yield of 85%).

Synthesis of Intermediate 4

The intermediate 2 (22.0 g, 39.9 mmol), methacrylic acid (6.9 g, 80.1 mmol), potassium iodide (6.6 g), and p-methoxyphenol (11.5 mg) were added to 50 mL of dimethylacetamide, and the resultant solution was stirred at room temperature. After triethylamine (10.1 g) was added to the solution, the solution was heated untile the internal temperature became 85° C. and then stirred for 4 hours at the same temperature. After the reaction ended, 75 mL of ethyl acetate was added thereto, and the resultant was washed with 50 mL of 1 N HClaq, water, and saturated aqueous sodium bicarbonate respectively and then concentrated under reduced pressure. The obtained solids were recrystallized using 100 mL of acetonitrile, thereby obtaining in intermediate 4 (16.5 g, 27.5 mmol, yield of 69%).

Synthesis of Intermediate 5

N-methylformanilide (4.3 g, 31.8 mmol) was stirred in 25 mL of acetonitrile at 5° C., and in this state, phosphorus oxychloride (4.9 g, 32.0 mmol) was added dropwise thereto. After the resultant solution was stirred for an hour, the intermediate 4 (16.0 g, 26.6 mmol) and 10 mL of acetonitrile were added thereto, and the resultant was stirred for 30 minutes at room temperature, followed by stirring for 5 hours at 40° C. The obtained reaction solution was poured into 300 mL of water, and the resultant was stirred for an hour. The precipitated solids were taken out and recrystallized using acetone, thereby obtaining an intermediate 5 (10.3 g, 16.8 mmol, yield of 63%).

Synthesis of Intermediate 6

The intermediate 3 (10.7 g, 16.1 mmol), the intermediate 5 (10.1 g, 16.1 mmol), and 10 ml of acetic anhydride were stirred at room temperature, 8.6 g of trifluoroacetic acid was added dropwise thereto, and the resultant was stirred for 4 hours at room temperature, thereby obtaining a reaction solution. The reaction solution was slowly poured into an aqueous solution obtained by stirring 700 mL of water and 170 g of sodium hydrogen carbonate at room temperature so as to neutralize the solution. After an hour of stirring, the precipitated crystals were filtered and washed with 300 mL of water by sprinkling. The obtained solids were dissolved again in 50 mL of tetrahydrofuran, and 50 mL of water and triethylamine (10.5 g) were added thereto to obtain a homogeneous solution, followed by stirring for 10 minutes at room temperature. 400 mL of ethyl acetate was added to the reaction solution, and the resultant was washed twice with 400 mL of 1N HClaq and 400 mL of water respectively and concentrated under reduced pressure. The obtained solids were dried by air blowing for 12 hours at 40° C., thereby obtaining an intermediate 6 (19.5 g, 15.3 mmol, yield of 95%).

Synthesis of Dye Monomer M1

The intermediate 6 (19.0 g, 14.9 mmol) was dissolved in 90 ml of tetrahydrofuran (THF) at room temperature under stirring, and 90 mL of methanol was added thereto. A solution obtained by dissolving zinc acetate dihydrate (3.3 g) in 90 mL of methanol was added dropwise thereto over 10 minutes, and the resultant was stirred for 1 hours. Thereafter, by using an evaporator, pressure thereof was reduced for 10 minutes at 30° C. and 1,000 Torr, thereby evaporating 90 mL of solvent from the reaction solution. The remaining solution was added dropwise to 500 ml of water, and the precipitated crystals were filtered and dried, thereby obtaining a dye a (dye monomer M1) (19.0 g, 14.2 mmol, yield of 95%).

Synthesis Example 2

A mixed solution consisting of 35 g of the dye a, 3.27 g of methacrylic acid, 1.30 g of dodecanethiol, 2.95 g of a polymerization initiator (V-601, manufactured by Wako Pure Chemical Industries, Ltd.), and 86.4 g of propylene glycol methyl ether acetate was prepared. Moreover, 129.6 g of propylene glycol methyl ether acetate was separately put into the reaction container and stirred under a nitrogen flow while being kept at 85° C. The mixed solution prepared as above was added dropwise thereto over 3 hours, followed by stirring for an hour. Subsequently, 0.88 g of a polymerization initiator (V-601, manufactured by Wako Pure Chemical Industries, Ltd.) was added thereto so as to cause the solution to further react for 2 hours, and then the reaction was ended. After the solution was cooled to room temperature, a solution, which was obtained by mixing the obtained reaction solution with 778 mL of propylene glycol methyl ether acetate and 1038 mL of methanol, was added dropwise to 4150 mL of acetonitrile over 20 minutes, followed by stirring for 10 minutes. The obtained precipitates were filtered and then dried, thereby obtaining 17 g of a dye c as a dye multimer.

Synthesis Example 3

14 g of the dye c, 1.31 g of glycidyl methacrylate, 0.239 g of tetrabutylammonium bromide, and 0.0153 g of p-methoxyphenol were added to 86.53 g of propylene glycol methyl ether acetate, and the resultant solution was heated and stirred for 8 hours at 100° C. The obtained dye solution was added dropwise to 1021 mL of acetonitrile, followed by filtering and drying, thereby obtaining 13 g of a dye e as a dye multimer.

The structure of the dye a (dye monomer M1), the structure of the dye c (Formula (101)), and the structure of the dye e (Formula (102)) are shown below.

[Chem. 104]

(101)

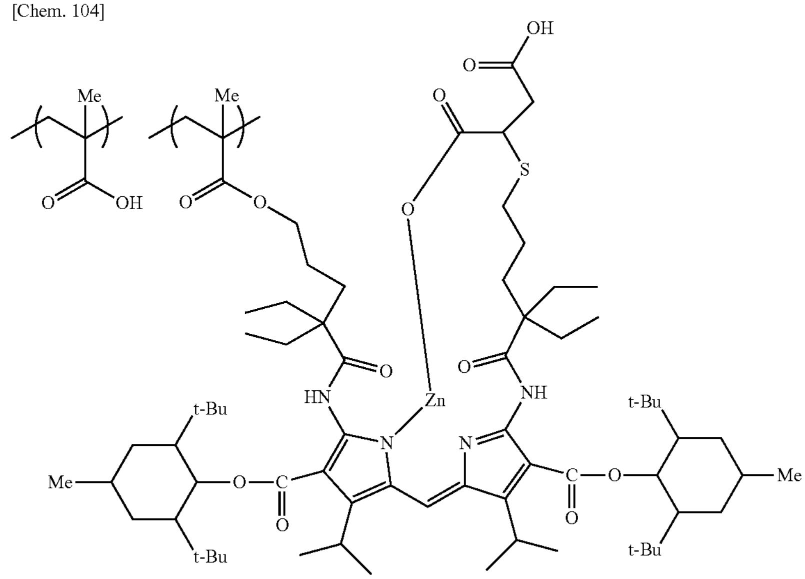

-continued
(102)
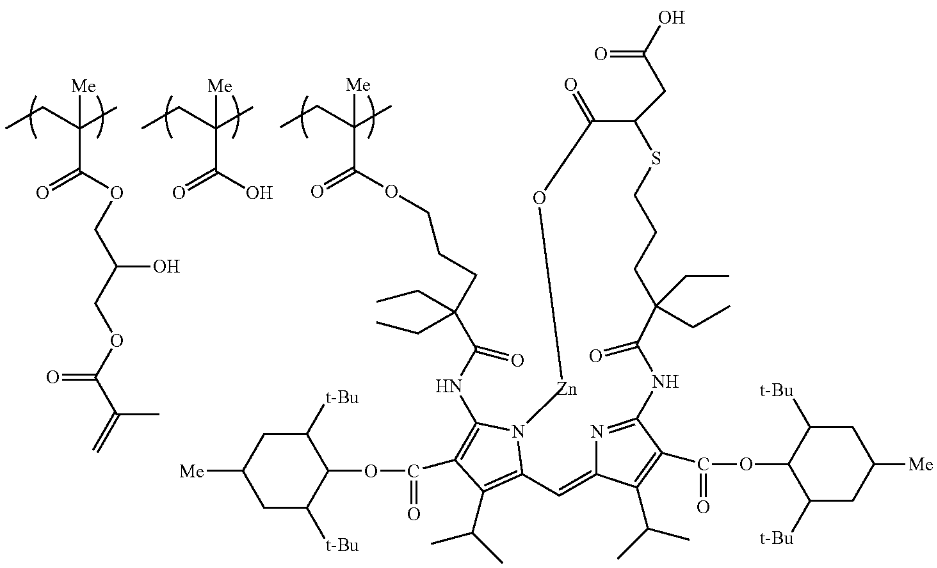
Dye monomer M1
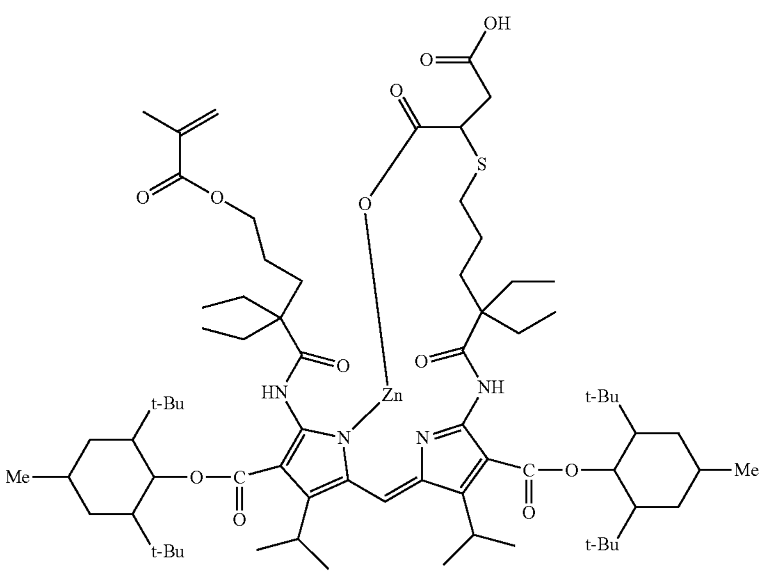

Synthesis of Dye f

As a dye, a dye monomer M2 which is a triphenylmethane dye was used to synthesize a dye f which is a dye multimer having a structure represented by the following Formula (103). Hereinafter, the synthesis operation thereof will be described in detail.

[Chem. 105]

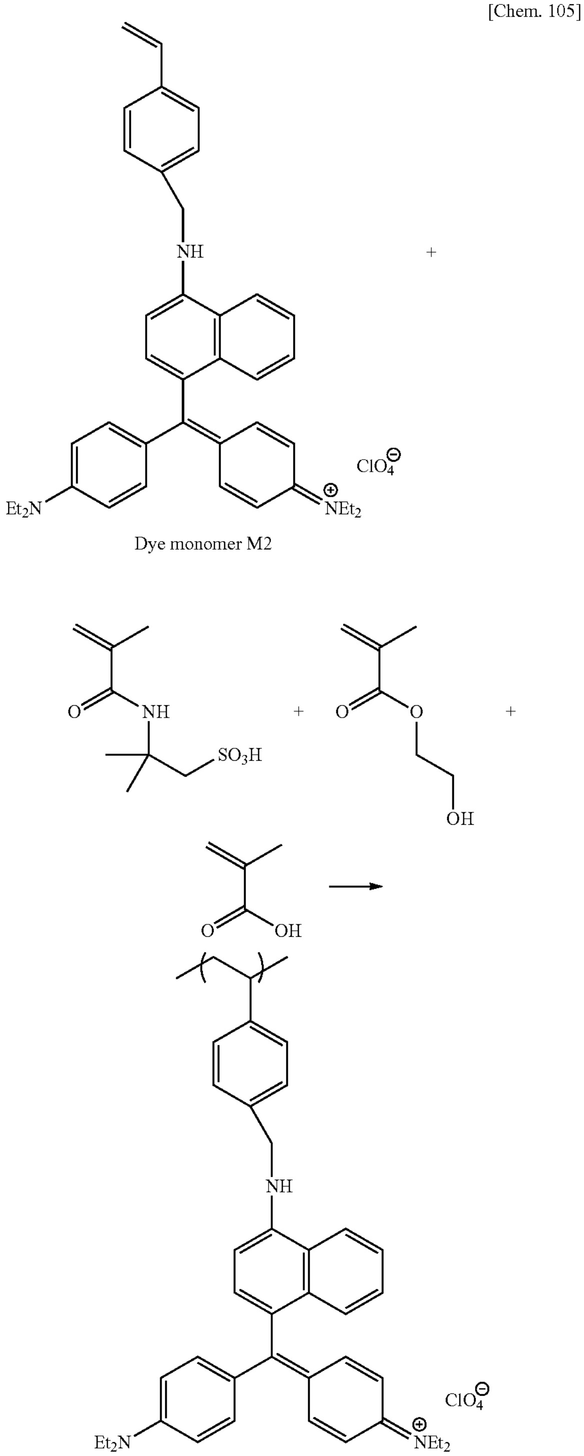

-continued

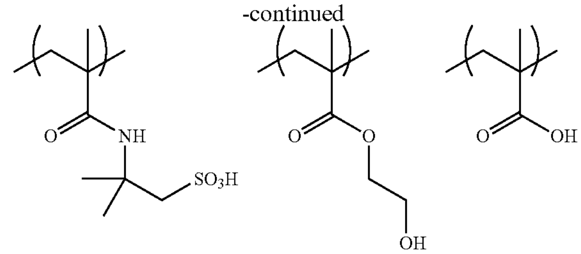

Formula (103)

The dye monomer M2 (15 g) synthesized by the method described in JP2000-162429A, 2-acrylamide-2-methylpropanesulfonic acid (6.5 g), hydroxyethyl methacrylate (23 g), methacrylic acid (5.5 g), 28% by mass aqueous ammona (2 g), and azobisisobutyronitrile (5 g) were added to N-ethylpyrrolidone (70 g) and dissolved under stirring for 30 minutes at room temperature (polymer solution for dropwise addition).

Separately, the dye monomer M2 (15 g), 2-acrylamide-2-methylpropanesulfonic acid (6.5 g), hydroxyethyl methacrylate (23 g), methacrylic acid (5.5 g), and 28% by mass aqueous ammonia (2 g) were dissolved in N-ethylpyrrolidone (70 g) and stirred at 95° C. To this solution, the polymer solution for dropwise addition prepared as above was added dropwise over 3 hours, and then the resultant solution was stirred for an hour. Thereafter, azobisisobutyronitrile (2.5 g) was added thereto. The obtained solution was further stirred for 2 hours and cooled to room temperature, and then the solvent was evaporated, thereby obtaining a copolymer (dye f). The weight average molecular weight (Mw) of the copolymer (dye f) was 28,000, and the acid value thereof measured by titration using a 0.1 N aqueous sodium hydroxide solution was 190 mg KOH/g.

Synthesis of Dye i

As a dye, a dye monomer M3 which is an anthraquinone dye was used to synthesize a dye i having a structure represented by Formula (104) in the following manner.

[Chem. 106]

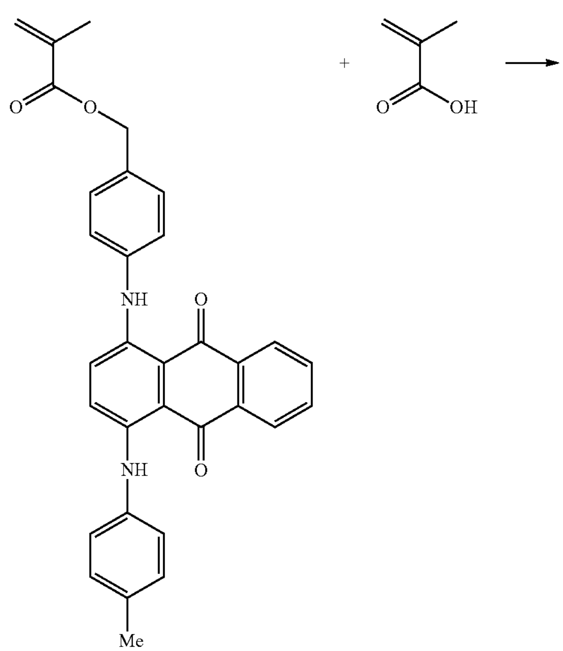

Dye monomer M3

-continued

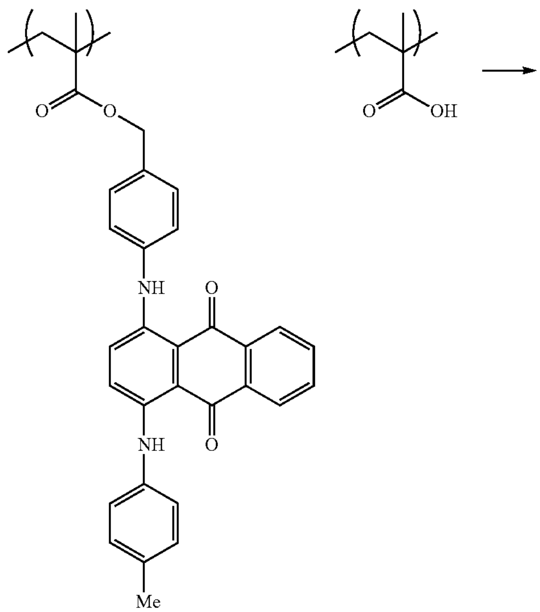

(MD-1)

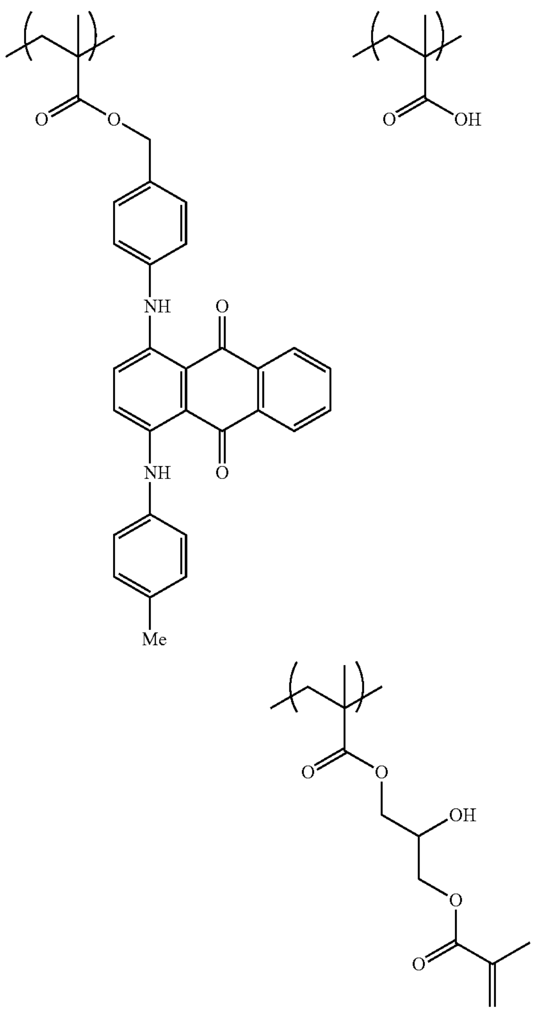

Formula (104)

The dye monomer M3 (8.21 g), methacrylic acid (1.08 g), dodecylmercaptan (0.25 g), and propylene glycol 1-monomethyl ether 2-acetate (PGMEA) (23.3 g) were added to a 100 mL three-neck flask, and the resultant solution was heated at 80° C. in a nitrogen atmosphere. To this solution, a mixed solution consisting of the dye monomer M3 (8.21 g), methacrylic acid (1.08 g), dodecyl mercaptan (0.25 g), dimethyl 2,2'-azobis(isobutyrate) (0.58 g), and PGMEA (23.3 g) was added dropwise over 2 hours (turbidity of the mixed solution was 8 ppm at room temperature). After being stirred for 3 hours, the obtained reaction solution was heated to 90° C. and heated and stirred for 2 hours. Thereafter, the solution was left to cool, thereby obtaining a PGMEA solution as (MD-1). Subsequently, glycidyl methacrylate (1.42 g), tetrabutylammonium bromide (80 mg), and p-methoxyphenol (20 mg) were added to the PGMEA solution as (MD-1), and the resultant was heated for 15 hours at 100° C. in the nitrogen atmosphere. As a result, glycidyl methacrylate was confirmed to be removed. After being cooled, the obtained reaction solution was added dropwise to a mixed solvent of methanol/deionized water=100 mL/10 mL for reprecipitation, thereby obtaining 17.6 g of the dye i as a dye multimer. The weight average molecular weight (Mw) of the dye measured by GPC was 6,000, and a ratio of the weight average molecular weight/number average molecular weight (Mw/Mn) was 1.9. Moreover, the acid value thereof measured by titration using a 0.1 N aqueous sodium hydroxide solution was 42 mg KOH/g. By NMR, the amount of polymerizable group contained in the dye multimer was measured to be 22 mg/g with respect to the dye i (1 g) as a dye multimer.

Synthesis of Dyes j to u

Dyes j to u were synthesized in the same manner as in Synthesis of Dye i, except that the type of dye monomer was changed as shown in the following Table 1.

In the following Table 1, dye monomers M4 to M15 and Formulae (105) to (116) are as shown below.

The dye monomer M4 and the dye monomer M5 are anthraquinone dyes. The dye monomer M6 is a squarylium dye, and the dye monomer M7 is a cyanine dye. The dye monomer M8 is a phthalocyanine dye, and the dye monomer M9 is a subphthalocyanine dye. The dye monomer M10 is a quinophthalone dye, and the dye monomer M11 is a xanthene dye. The dye monomers M12 to dye monomers M15 are azo dyes.

[Chem. 107]

M4

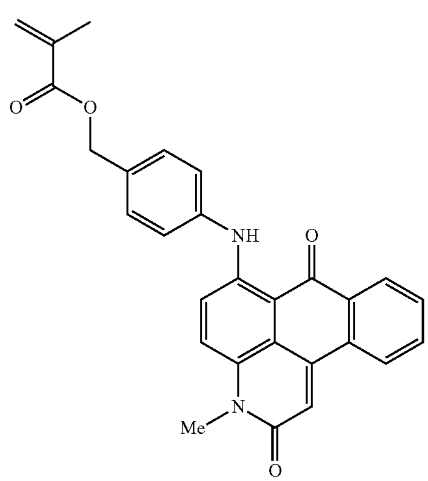

-continued
M5
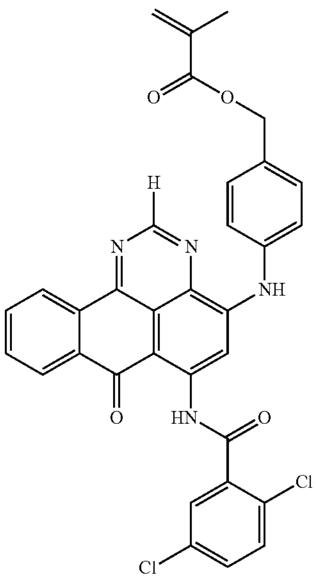
M6
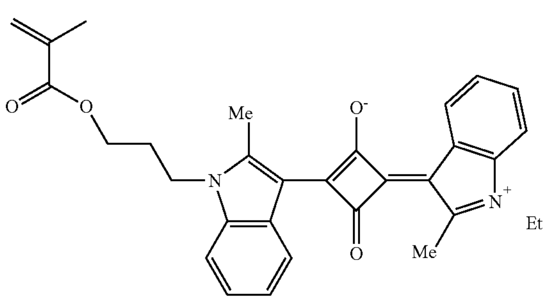
M7
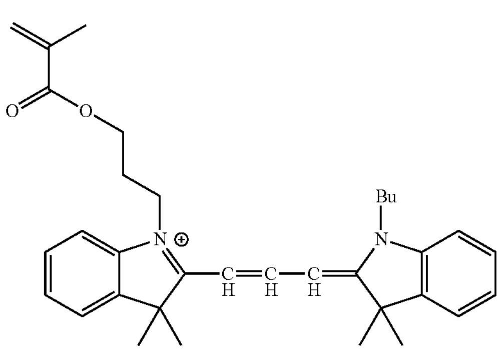
-continued
M8
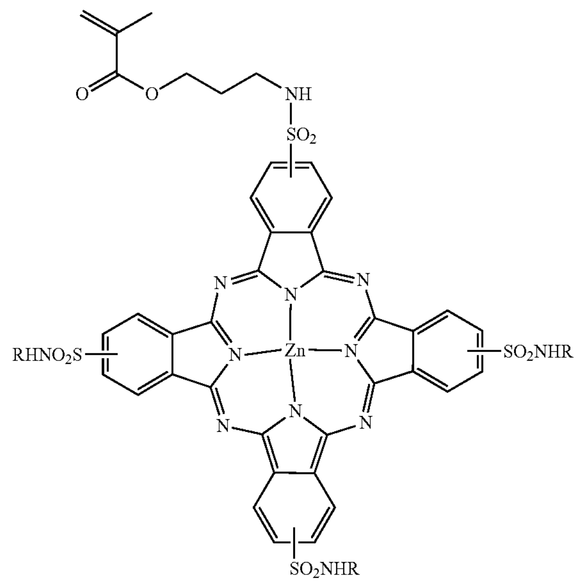
R = CH2CH2CH2OH
M9
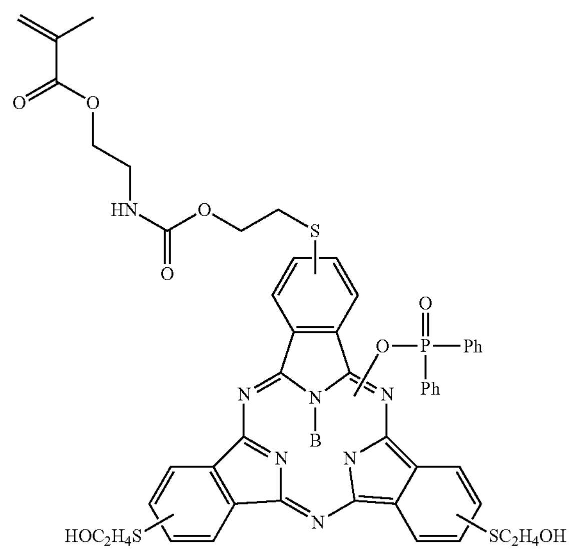
M10
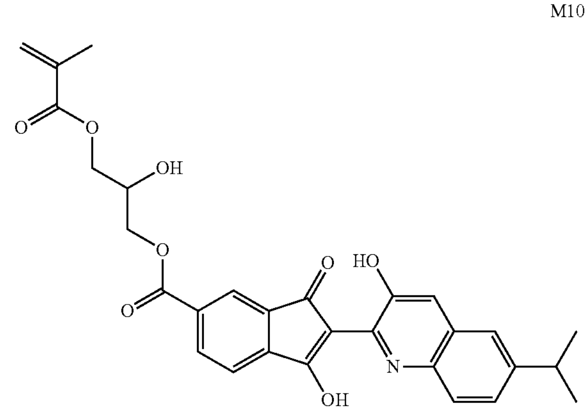

-continued
M11
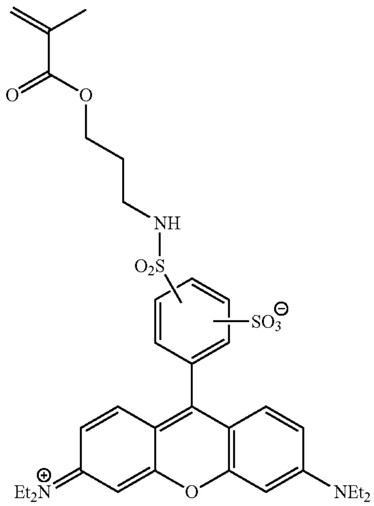
[Chem. 108]
M12
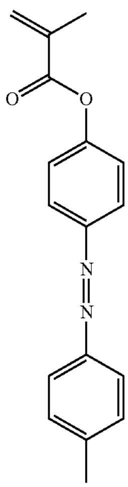
M13
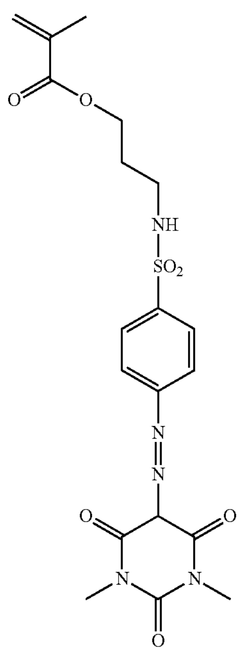
-continued
M14
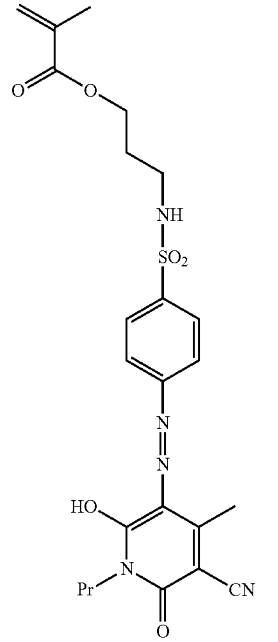
M15
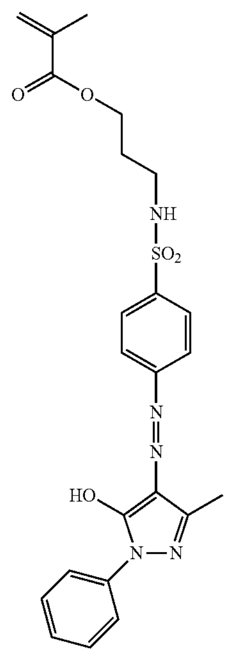
[Chem. 109]
—W—
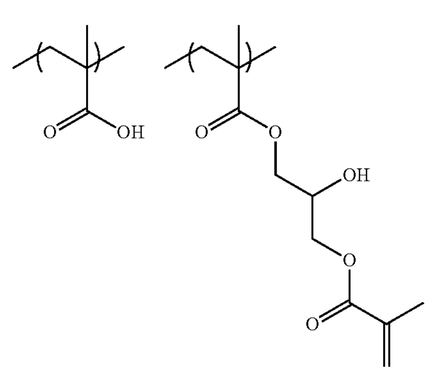

-continued
—W— =
Formula (105)
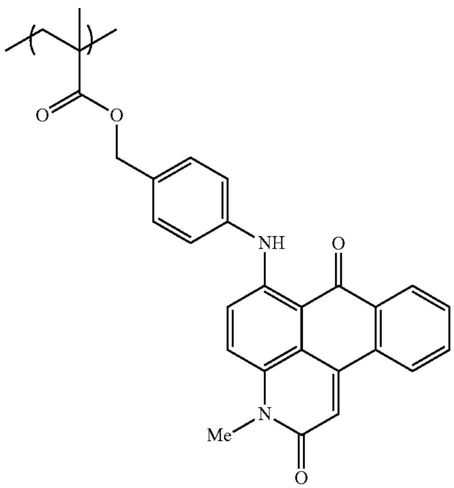
Formula (106)
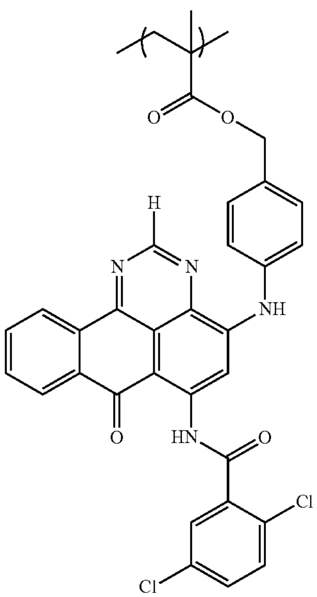
Formula (107)
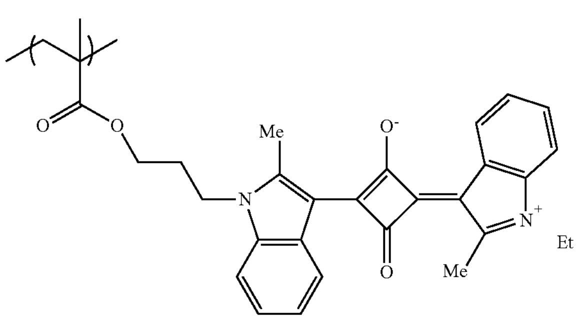
-continued
Formula (108)
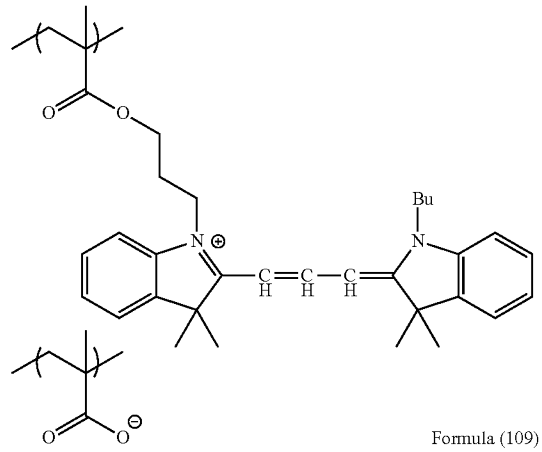
Formula (109)
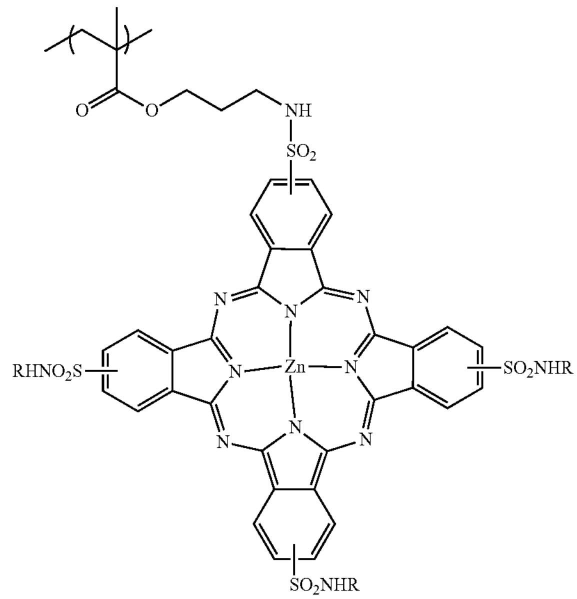
R = CH2CH2CH2OH
Formula (110)
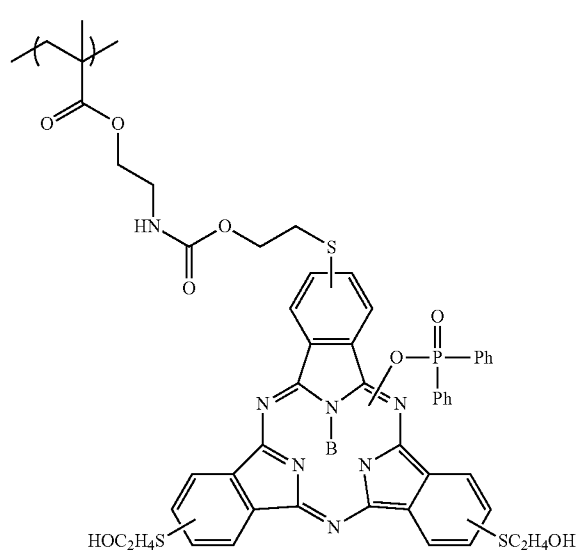

-continued
Formula (111)
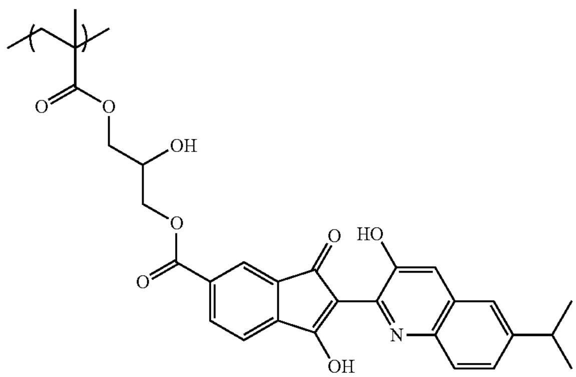
Formula (112)
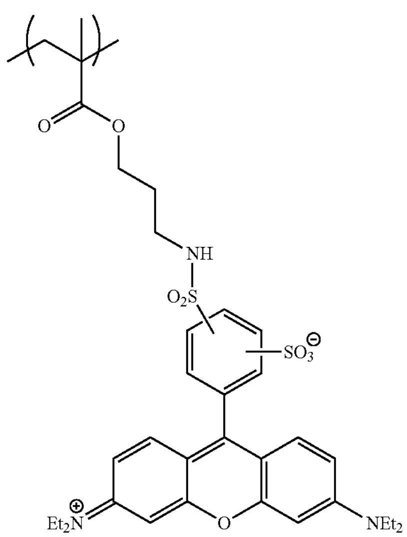
[Chem. 110]
—W— =
Formula (113)
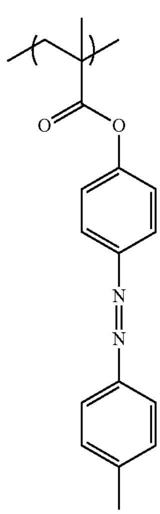
-continued
Formula (114)
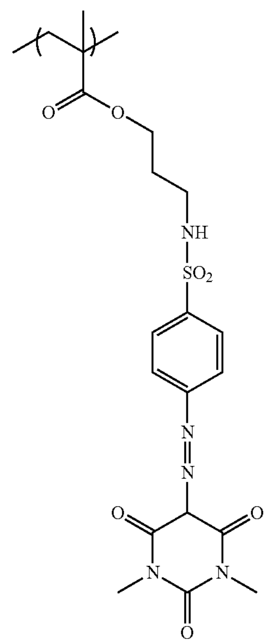
Formula (115)
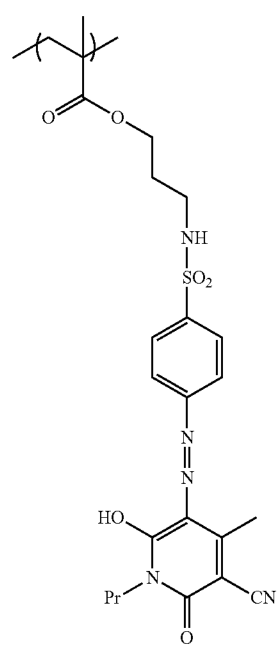

-continued

Formula (116)

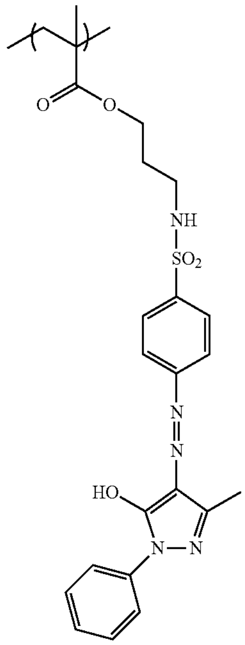

In the following Table 1, the type of dye monomers (M1 to M15) which are contained in the dye c to dye u as dye multimers and can form a dye structure, the structure [Formulae (101) to (116)] of the dye multimers, the acid value of the obtained dye multimer, and the weight average molecular weight (Mw) of the dye are described.

TABLE 1

| Dye | Structure | Dye monomer | Acid value (mg KOH/g) | Mw |
|---|---|---|---|---|
| Dye c | Formula (101) | M1 | 78 | 5000 |
| Dye e | Formula (102) | M1 | 30 | 7000 |
| Dye f | Formula (103) | M2 | 190 | 28000 |
| Dye i | Formula (104) | M3 | 42 | 8000 |
| Dye j | Formula (105) | M4 | 35 | 6400 |
| Dye k | Formula (106) | M5 | 48 | 6200 |
| Dye l | Formula (107) | M6 | 32 | 7500 |
| Dye m | Formula (108) | M7 | 38 | 6800 |
| Dye n | Formula (109) | M8 | 41 | 7700 |
| Dye o | Formula (110) | M9 | 53 | 4300 |
| Dye p | Formula (111) | M10 | 51 | 5500 |
| Dye q | Formula (112) | M11 | 35 | 5800 |
| Dye r | Formula (113) | M12 | 41 | 7000 |
| Dye s | Formula (114) | M13 | 36 | 6100 |
| Dye t | Formula (115) | M14 | 45 | 6000 |
| Dyt u | Formula (116) | M15 | 50 | 4900 |

Synthesis of (B) Specific Alkali-Soluble Resins J1 to J4

Alkali-soluble resins J1 to J4 are alkali-soluble resins having a repeating unit containing a maleimide structure represented by the Formula (b1).

Based on the method described in JP4752649B, paragraph 0108, specific alkali-soluble resins J1 to J4 having the following structure were obtained. Specifically, the resins were obtained in the following manner.

Synthesis Example B-1

2,2'-azobisvaleronitrile (5 g) and propylene glycol monomethyl ether acetate (200 g) were put into a 500 mL three-neck flask equipped with a cooling tube and a stirrer. Thereafter, methacrylic acid (20 g), mono(2-methacryloyloxyethyl) succinate (10 g), N-phenylmaleimide (31.2 g), benzyl methacrylate (20 g), styrene (18.8 g), and an α-methylstyrene dimer (7 g) were put into the flask, and nitrogen purging was performed. Subsequently, the reaction solution was heated to 70° C. while being gently stirred, and polymerized for 2 hours while being kept at the same temperature. Next, 2,2'-azobisvaleronitrile (2 g) was added thereto, and the solution was continuously polymerized for 2 hours, thereby obtaining a specific alkali-soluble resin solution (J1) (solid content concentration=32.8% by mass) having the following structure. The resin had Mw of 12,000 and (Mw/Mn) of 3.0. Moreover, the acid value thereof measured by titration using a 0.1 N aqueous sodium hydroxide solution was 150 mg KOH/g.

[Chem. 111]

J1

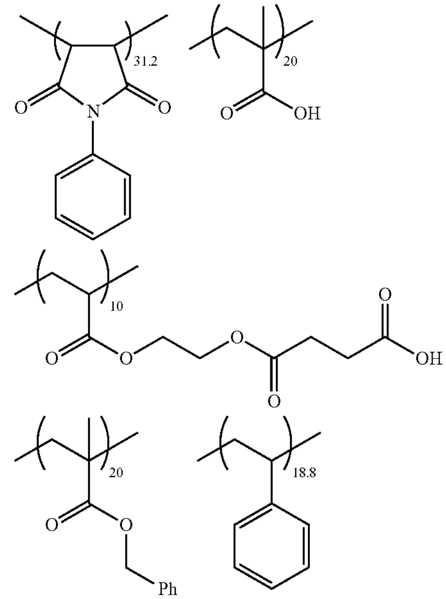

Synthesis Example B-2

2,2'-azobisvaleronitrile (3.5 g) and propylene glycol monomethyl ether acetate (200 g) were put into a 500 mL three-neck flask equipped with a cooling tube and a stirrer. Thereafter, methacrylic acid (30 g), N-phenylmaleimide (31.2 g), benzyl methacrylate (20 g), styrene (18.8 g), and an α-methylstyrene dimer (4.9 g) were put into the flask, and nitrogen purging was performed. Subsequently, the reaction solution was heated to 70° C. while being gently stirred, and polymerized for 2 hours while being kept at the same temperature. Next, 2,2'-azobisvaleronitrile (1.4 g) was added to the reaction solution, and the solution was continuously polymerized for 2 hours, thereby obtaining a specific alkali-soluble resin solution (J2) (solid content concentration=32.8% by mass) having the following structure. The resin had Mw of 25,000 and (Mw/Mn) of 2.3. Moreover, the acid value thereof measured by titration using a 0.1 N aqueous sodium hydroxide solution was 195 mg KOH/g.

[Chem. 112]

J2

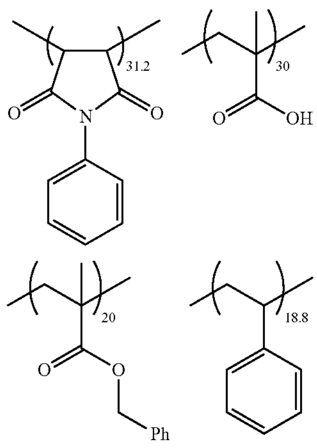

Synthesis Example B-3

2,2'-azobisvaleronitrile (3.5 g) and propylene glycol monomethyl ether acetate (200 g) were put into a 500 mL three-neck flask equipped with a cooling tube and a stirrer. Thereafter, methacrylic acid (15 g), N-phenylmaleimide (25 g), benzyl methacrylate (35 g), glycerin monomethacrylate (10 g), styrene (15 g), and an a-methylstyrene dimer (4.9 g) were put into the flask, and nitrogen purging was performed. Subsequently, the reaction solution was heated to 70° C. while being gently stirred, and polymerized for 2 hours while being kept at the same temperature. Next, 2,2'-azobisvaleronitrile (1.4 g) was added to the reaction solution, and the solution was continuously polymerized for 2 hours, thereby obtaining a maleimide-containing alkali-soluble resin solution (J3) (solid content concentration=32.8% by mass). The resin had Mw of 30,000 and (Mw/Mn) of 3. Moreover, the acid value thereof measured by titration using a 0.1 N aqueous sodium hydroxide solution was 95 mg KOH/g.

[Chem. 113]

J3

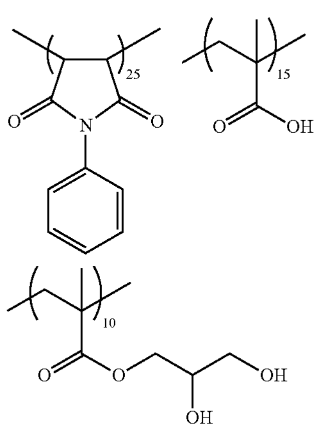

-continued

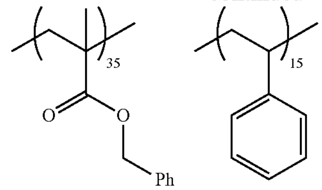

Synthesis Example B-4

2,2'-azobisvaleronitrile (5 g) and propylene glycol monomethyl ether acetate (200 g) were put into a 500 mL three-neck flask equipped with a cooling tube and a stirrer. Thereafter, methacrylic acid (20 g), mono(2-methacryloyloxyethyl) succinate (10 g), N-phenylmaleimide (31.2 g), allyl methacrylate (20 g), styrene (18.8 g), and an α-methylstyrene dimer (7 g) were put into the flask, and nitrogen purging was performed. Subsequently, the reaction solution was heated to 70° C. while being gently stirred, and polymerized for 2 hours while being kept at the same temperature. Next, 2,2'-azobisvaleronitrile (2 g) was added to the reaction solution, and the solution was continuously polymerized for 2 hours, thereby obtaining a maleimide-containing alkali-soluble resin solution (J4) (solid content concentration=32.8% by mass). The resin had Mw of 12,000 and (Mw/Mn) of 2.8. Moreover, the acid value thereof measured by titration using a 0.1 N aqueous sodium hydroxide solution was 150 mg KOH/g.

[Chem. 114]

J4

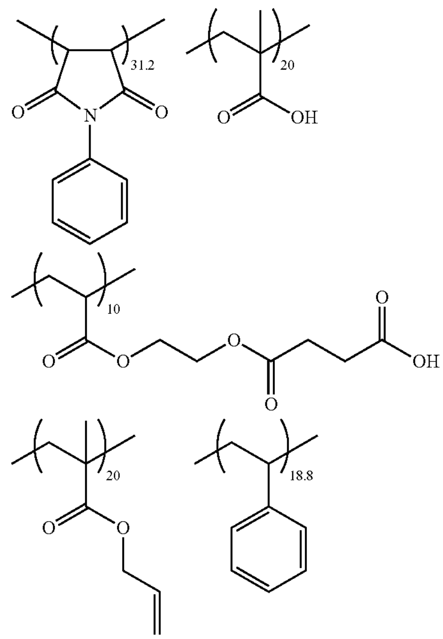

Synthesis of Alkali-Soluble Resins J5 to J8

Based on the method described in JP2009-282114A, paragraphs 0144 to 0148, the following alkali-soluble resins J5 to J9 were obtained. Specifically, the resins were obtained in the following manner.

The alkali-soluble resins J5 to J8 are alkali-soluble resins having the repeating unit represented by the Formula (b2). J10 is a specific alkali-soluble resin having both the repeating unit represented by the Formula (b1) and the repeating unit represented by the Formula (b2).

Synthesis Example B-5

Propylene glycol monomethyl ether acetate (200 g) was put into a reaction container, and the container was heated to 80° C. while nitrogen gas was being injected into the container. To the resultant solution, a mixture consisting of methacrylic acid (20 g), methyl methacrylate (30 g), p-cumylphenol ethylene oxide-modified acrylate ("Aronix M110" manufactured by TOAGOSEI CO., LTD.) (20 g) as the monomer (b2), glycerol monomethacrylate (30 g), and 4.0 parts of 2,2'-azobisisobutyronitrile was added dropwise over an hour at the same temperature so as to cause a polymerization reaction. After the dropwise addition ended, the reaction was further performed for 3 hours at 80° C. Subsequently, to the obtained reaction solution, a mixed solution obtained by dissolving 1.0 part of azobisisobutyronitrile in propylene glycol monomethyl ether acetate (33 g) was added so as to continue the reaction for an hour at 80° C. In this manner, a specific alkali-soluble resin solution (J5) (solid content concentration=30.4% by mass) having the following structure was obtained. This resin had Mw of 20,000 and (Mw/Mn) of 3.1. Moreover, the acid value thereof measured by titration using a 0.1 N aqueous sodium hydroxide solution was 130 mg KOH/g.

[Chem. 115]

J5

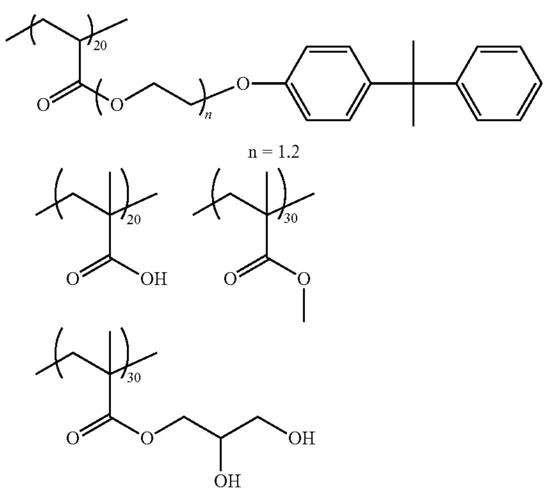

Synthesis Example B-6

Propylene glycol monomethyl ether acetate (200 g) was put into a reaction container, and the container was heated to 80° C. while nitrogen gas was being injected into the container. To the resultant solution, a mixture consisting of 2-methacryloyloxyethyl phthalate ("NK Ester CB-1" manufactured by SHIN-NAKAMURA CHEMICAL CO., LTD.) (50 g), p-cumylphenol ethylene oxide-modified acrylate ("Aronix M110" manufactured by TOAGOSEI CO., LTD.) (30 g) as the monomer (b2), benzyl methacrylate (20 g), and 4.0 parts of 2,2'-azobisisobutyronitrile was added dropwise over an hour at the same temperature so as to cause a polymerization reaction. After the dropwise addition ended, the reaction was further performed for 3 hours at 80° C. Subsequently, to the obtained reaction solution, a mixed solution obtained by dissolving 1.0 part of azobisisobutyronitrile in propylene glycol monomethyl ether acetate (33 g) was added, and the reaction was continued for 1 hour at 80° C. In this manner, a specific alkali-soluble resin solution (J6) (solid content concentration=30.3% by mass) having the following structure was obtained. This resin had Mw of 22,000 and (Mw/Mn) of 3.0. Moreover, the acid value thereof measured by titration using a 0.1 N aqueous sodium hydroxide solution was 95 mg KOH/g.

[Chem. 116]

J6

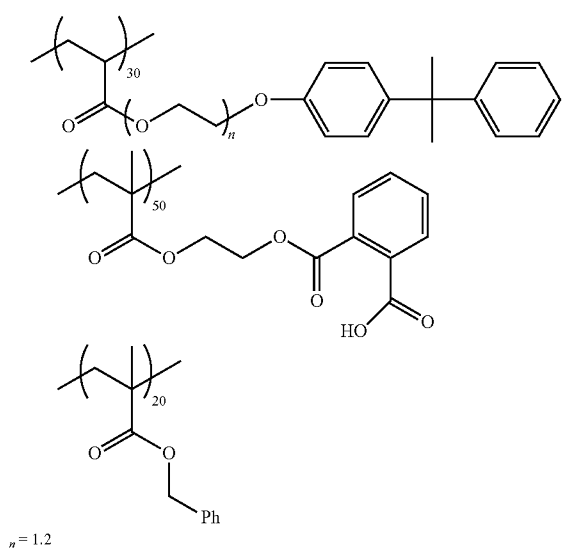

Synthesis Example B-7

A specific alkali-soluble resin solution (J7) (solid content concentration=30.3% by mass) having the following structure was synthesized by the same method as J5, except that the p-cumylphenol ethylene oxide-modified acrylate was replaced with phenol EO-modified acrylate ("Aronix M102" manufactured by TOAGOSEI CO., LTD.). This resin had Mw of 20,000 and (Mw/Mn) of 2.8. Moreover, the acid value thereof measured by titration using a 0.1 N aqueous sodium hydroxide solution was 130 mg KOH/g.

[Chem. 117]

J7

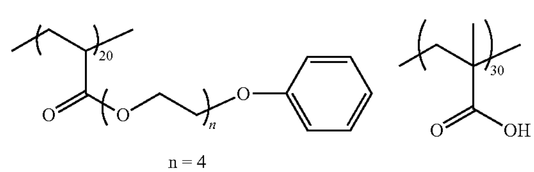

-continued

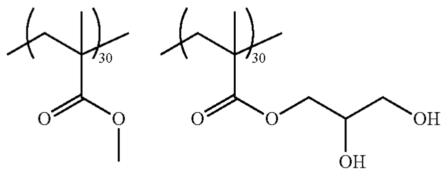

Synthesis Example B-8

A specific alkali-soluble resin solution (J8) (solid content concentration=30.2% by mass) having the following structure was synthesized by the same method as J5, except that the p-cumylphenol ethylene oxide-modified acrylate was replaced with nonylphenol PO-modified acrylate ("Aronix M117" manufactured by TOAGOSEI CO., LTD.). This resin had Mw of 19,000 and (Mw/Mn) of 2.8. Moreover, the acid value thereof measured by titration using a 0.1 N aqueous sodium hydroxide solution was 130 mg KOH/g.

[Chem. 118]

J8

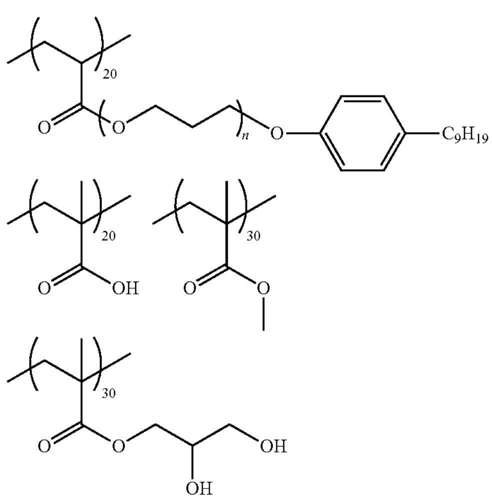

$n = 4$

Synthesis Example B-9

A specific alkali-soluble resin solution (J9) (solid content concentration=30.3% by mass) having the following structure was synthesized by the same method as J5, except that the p-cumylphenol ethylene oxide-modified acrylate was replaced with 2-ethylhexyl EO-modified acrylate ("Aronix M120" manufactured by TOAGOSEI CO., LTD.). This resin had Mw of 21,000 and (Mw/Mn) of 2.8. Moreover, the acid value thereof measured by titration using a 0.1 N aqueous sodium hydroxide solution was 130 mg KOH/g.

[Chem. 119]

J9

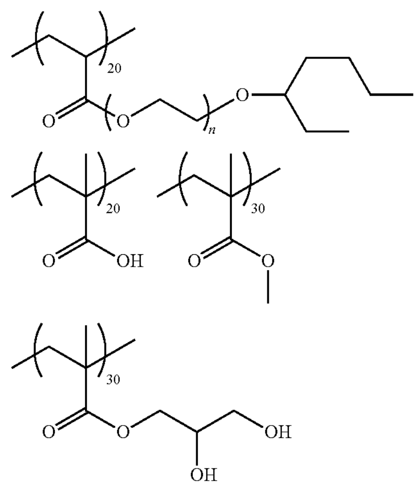

$n = 2$

Synthesis Example B-10

Propylene glycol monomethyl ether acetate (200 g) was put into a reaction container, and the container was heated to 80° C. while nitrogen gas was being injected into the container. To the resultant solution, a mixture consisting of methacrylic acid (20 g), methyl methacrylate (30 g), p-cumylphenol ethylene oxide-modified acrylate ("Aronix M110" manufactured by TOAGOSEI CO., LTD.) (10 g) as the monomer (b2), N-phenylmaleimide (10 g) as the monomer (b1), glycerol monomethacrylate (30 g), and 4.0 parts of 2,2'-azobisisobutyronitrile was added dropwise over an hour at the same temperature so as to cause a polymerization reaction. After the dropwise addition ended, the reaction was further performed for 3 hours at 80° C. Subsequently, to the obtained reaction solution, a mixed solution obtained by dissolving 1.0 part of azobisisobutyronitrile in propylene glycol monomethyl ether acetate (33 g) was added so as to continue the reaction for an hour at 80° C. In this manner, a specific alkali-soluble resin solution (J10) (solid content concentration=30.2% by mass) having the following structure was obtained. This resin had Mw of 20,000 and (Mw/Mn) of 3.2. Moreover, the acid value thereof measured by titration using a 0.1 N aqueous sodium hydroxide solution was 130 mg KOH/g.

[Chem. 120]

J10

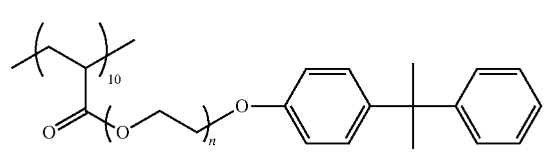

-continued

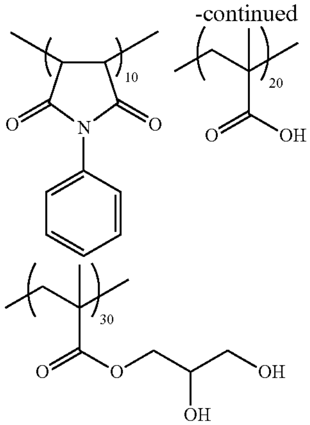

$_n$ = 1.2

Synthesis Example B-11

A specific alkali-soluble resin solution (J11) (solid content concentration=30.4% by mass) having the following structure was obtained by the same operation as in Synthesis Example B-5, except that ethylene oxide-modified acrylate having the following structure was used instead of p-cumylphenol ethylene oxide-modified acrylate ("Aronix M110" manufactured by TOAGOSEI CO., LTD.) as the monomer (b2). This resin had Mw of 21,000 and (Mw/Mn) of 3.3. Moreover, the acid value thereof measured by titration using a 0.1 N aqueous sodium hydroxide solution was 130 mg KOH/g.

[Chem. 121]

J11

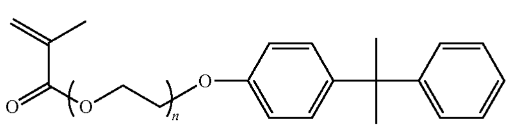

[Chem. 122]

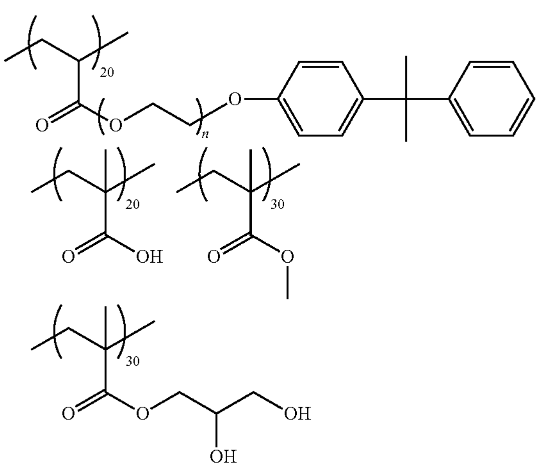

$_n$ = 10

Synthesis Example B-12

2,2'-azobisvaleronitrile (5 g) and propylene glycol monomethyl ether acetate (200 g) were put into a 500 mL three-neck flask equipped with a cooling tube and a stirrer. Thereafter, mono(2-methacryloyloxyethyl) succinate (30 g), N-phenylmaleimide (20 g), benzyl methacrylate (50 g), and an a-methylstyrene dimer (4.9 g) were put into the flask, and nitrogen purging was performed. Subsequently, the reaction solution was heated to 70° C. while being gently stirred, and polymerized for 2 hours while being kept at the same temperature. Next, to the obtained reaction solution, 2,2'-azobisvaleronitrile (2 g) was added, and the solution was continuously polymerized for 2 hours, thereby obtaining a specific alkali-soluble resin solution (J12) (solid content concentration=31.8% by mass) containing a repeating unit having a maleimide structure. The resin had Mw of 24,000 and (Mw/Mn) of 2.8. Moreover, the acid value thereof measured by titration using a 0.1 N aqueous sodium hydroxide solution was 75 mg KOH/g.

[Chem. 123]

J12

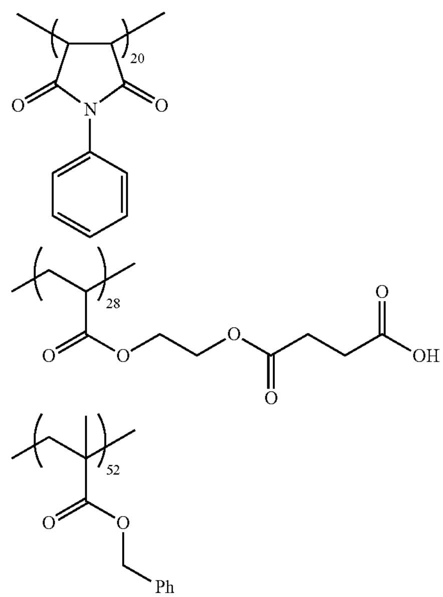

Synthesis Example B-13

A specific alkali-soluble resin solution (J13) (solid content concentration=30.4% by mass) was obtained by performing the same operation as B-12, except that the amount of 2,2'-azobisvaleronitrile was changed to 2 g and the amount of a-methylstyrene dimer was changed to 2 g. This resin had Mw of 100,000 and (Mw/Mn) of 3.0. Moreover, the acid value thereof measured by titration using a 0.1 N aqueous sodium hydroxide solution was 75 mg KOH/g.

Synthesis Example B-14

A specific alkali-soluble resin solution (J14) (solid content concentration=30.4% by mass) was obtained by performing the same operation as B-12, except that the amount of 2,2'-azobisvaleronitrile was changed to 3 g and the amount of a-methylstyrene dimer was changed to 3 g. This resin had Mw of 60,000 and (Mw/Mn) of 3.0. Moreover, the acid value thereof measured by titration using a 0.1 N aqueous sodium hydroxide solution was 75 mg KOH/g.

Synthesis Example B-15

A specific alkali-soluble resin solution (J15) (solid content concentration=30.4% by mass) was obtained by performing the same operation as B-12, except that the amount of 2,2'-azobisvaleronitrile was changed to 10 g and the amount of a-methylstyrene dimer was changed to 10 g. This resin had Mw of 5,000 and (Mw/Mn) of 3.5. Moreover, the acid value thereof measured by titration using a 0.1 N aqueous sodium hydroxide solution was 75 mg KOH/g.

Synthesis Example B-16

A specific alkali-soluble resin resin solution (J16) (solid content concentration=30.4% by mass) having the following structure was obtained by performing the same operation as B-12, except that cyclohexyl maleimide was used instead of phenyl maleimide as the monomer (b1). This resin had Mw of 25,000 and (Mw/Mn) of 3.0. Moreover, the acid value thereof measured by titration using a 0.1 N aqueous sodium hydroxide solution was 75 mg KOH/g.

[Chem. 124]

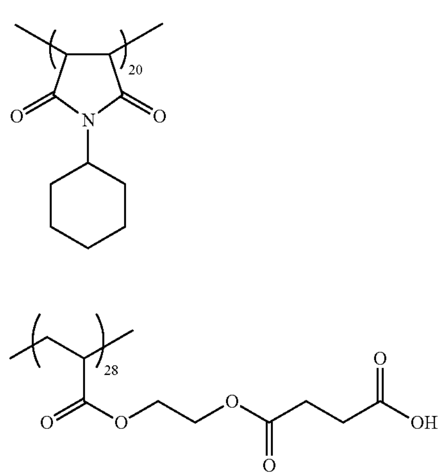

J16

-continued

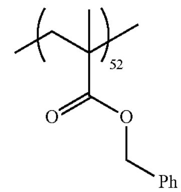

Synthesis of J17 to J22

Specific alkali-soluble resin solutions (J17 to J22) having the compositional ratio and physical properties described in the following Table 2 were obtained by performing the same operation as Synthesis Example B-12, except that the weight of the monomer added was changed as described in the following Table 2.

TABLE 2

| | Compositional ratio (% by mass) | | | Measured vaue | | |
|---|---|---|---|---|---|---|
| Alkali-soluble resin | Phenyl maleimide | Mono(2-methacryloyloxyethyl) succinate | Benzyl methacrylate | Acid value (mg KOH/g) | Mw | Mw/Mn |
| J12 | 20 | 30 | 50 | 75 | 24000 | 2.8 |
| J13 | 20 | 30 | 50 | 75 | 100000 | 3.0 |
| J14 | 20 | 30 | 50 | 75 | 60000 | 3.0 |
| J15 | 20 | 30 | 50 | 75 | 5000 | 3.5 |
| J17 | 20 | 16 | 64 | 40 | 25000 | 3.0 |
| J18 | 20 | 70 | 10 | 180 | 25000 | 2.7 |
| J19 | 20 | 80 | 0 | 210 | 25000 | 3.0 |
| J20 | 4 | 30 | 66 | 77 | 25000 | 2.8 |
| J21 | 40 | 30 | 30 | 75 | 25000 | 2.8 |
| J22 | 60 | 30 | 10 | 75 | 26000 | 3.0 |

Synthesis Example B-23

A specific alkali-soluble resin solution (J23) (solid content concentration=30.4% by mass) was obtained by performing the same operation as B-5, except that the amount of 2,2'-azobisisobutyronitrile in the solution for dropwise addition was changed to 0.5 g and the amount of 2,2'-azobisisobutyronitrile further added after the dropwise addition was changed to 0.125 g. This resin had Mw of 92,000 and (Mw/Mn) of 3.0. Moreover, the acid value thereof measured by titration using a 0.1 N aqueous sodium hydroxide solution was 130 mg KOH/g.

Synthesis Example B-24

A specific alkali-soluble resin solution (J24) (solid content concentration=30.4% by mass) was obtained by performing the same operation as B-5, except that the amount of 2,2'-azobisisobutyronitrile in the solution for dropwise addition was changed to 1 g and the amount of 2,2'-azobisisobutyronitrile further added after the dropwise addition was changed to 0.25 g. This resin had Mw of 55,000 and (Mw/Mn) of 3.1. Moreover, the acid value thereof measured by titration using a 0.1 N aqueous sodium hydroxide solution was 130 mg KOH/g.

Synthesis Example B-25

A specific alkali-soluble resin solution (J25) (solid content concentration=30.4% by mass) was obtained by performing the same operation as B-5, except that the amount of 2,2'-azobisisobutyronitrile in the solution for dropwise addition was changed to 12 g and the amount of 2,2'-azobisisobutyronitrile further added after the dropwise addition was changed to 3 g. This resin had Mw of 6,300 and (Mw/Mn) of 3.4. Moreover, the acid value thereof measured by titration using a 0.1 N aqueous sodium hydroxide solution was 130 mg KOH/g.

Synthesis of J26 to J32

Specific alkali-soluble resin solutions (J26 to J32) having the compositional ratio and physical properties described in the following Table 3 were obtained by performing the same operation as Synthesis Example B-5, except that the amount of the monomer added was changed as described in the following Table 3.

~Components of Colored Composition~

Cyclohexanone 1.063 parts

Alkali-soluble resin J1 (prepared in the form of a 30% PGMEA solution) 0.100 parts Solsperse 20000 (1% cyclohexane solution, manufactured by The Lubrizol Corporation, Japan) 0.125 parts Photopolymerization initiator I-1 (Irgacure OXE01 manufactured by BASF), compound name: 1,2-octanedione, 1-[4-(phenylthio)-2-(O-benzoyloxime) 0.012 parts The dye f 0.040 parts Pigment dispersion (dispersion of C. I. Pigment Blue 15:6) 0.615 parts (solid content concentration of 17.70%, pigment concentration of 11.80%: described as “PB15:6” in the table)

TABLE 3

| Alkali-soluble resin | Compositional ratio (% by mass) EO-modified acrylate | Methacrylic acid | Methyl methacrylate | Glycerol monomethacrylate | Measured value Acid value (mg KOH/g) | Mw | Mw/Mn |
|---|---|---|---|---|---|---|---|
| J5 | 20 | 20 | 30 | 30 | 130 | 20000 | 3.0 |
| J23 | 20 | 20 | 30 | 30 | 130 | 92000 | 3.0 |
| J24 | 20 | 20 | 30 | 30 | 130 | 55000 | 3.1 |
| J25 | 20 | 20 | 30 | 30 | 130 | 6300 | 3.4 |
| J26 | 20 | 6 | 44 | 30 | 40 | 22000 | 2.8 |
| J27 | 20 | 13 | 37 | 30 | 80 | 21000 | 2.8 |
| J28 | 20 | 26 | 24 | 30 | 170 | 20000 | 2.8 |
| J29 | 20 | 40 | 20 | 30 | 260 | 18000 | 3.2 |
| J30 | 4 | 20 | 46 | 30 | 130 | 19000 | 3.0 |
| J31 | 37 | 20 | 13 | 30 | 130 | 20000 | 2.8 |
| J32 | 60 | 20 | 10 | 10 | 130 | 21000 | 2.8 |

Example 1

<Preparation of Colored Composition>

(Preparation of Pigment Dispersion (Dispersion of C. I. Pigment Blue 15:6))

A pigment dispersion (dispersion of C. I. Pigment Blue 15:6) was prepared in the following manner.

That is, a mixed solution consisting of 11.8 parts by mass of C. I. Pigment Blue 15:6 (blue pigment; hereinafter, also referred to as “PB15:6”) (average primary particle size of 55 nm), 5.9 parts by mass of a pigment dispersant BY-161 (manufactured by BYK-Chemie), and 82.3 part by mass of PGMEA was mixed for 3 hours by using a beads mill (zirconia beads having a diameter of 0.3 mm), thereby dispersing PB 15:6. Thereafter, by using a depressurizing mechanism-attached high-pressure dispersing machine NANO-3000-10 (manufactured by Nihon B.E.E Co., Ltd.), a dispersing treatment was performed under a pressure of 2000 kg/cm$^3$ and at a flow rate of 500 g/min. The dispersing treatment was repeated 10 times, thereby obtaining a dispersion of C. I. Pigment Blue 15:6 as a pigment dispersion. For the obtained dispersion of C. I. Pigment Blue 15:6, an average primary particle size of the pigment was measured using a dynamic light scattering method (Microtrac Nanotrac UPA-EX150 manufactured by Nikkiso Co., Ltd.), and the particle size was confirmed to be 24 nm.

(Preparation of Colored Composition)

The respective components described below were mixed together, dispersed, and dissolved, thereby obtaining colored compositions (colored radiation-sensitive compositions).

Dipentaerythritol hexaacrylate (Kayarad DPHA; manufactured by Nippon Kayaku Co., Ltd.) 0.070 parts Glycerol propoxylate (1% cyclohexane solution) 0.048 parts <Preparation of Undercoat Layer-Attached Silicon Substrate>

(Preparation of Resist Solution for Undercoat Layer)

Components composed as below were mixed with each other and dissolved, thereby preparing a resist solution for undercoat layer.

~Composition of Resist Solution for Undercoat Layer~

Solvent: propylene glycol monomethyl ether acetate 19.20 parts

Solvent: ethyl lactate 36.67 parts

Alkali-soluble resin: 40% PGMEA solution of benzyl methacrylate/methacrylic acid/methacrylic acid-2-hydroxyethyl copolymer (molar ratio=60/22/18, weight average molecular weight of 15,000, number average molecular weight of 9,000) 30.51 parts Ethylenically unsaturated double bond-containing compound: dipentaerythritol hexaacrylate (Kayarad DPHA; manufactured by Nippon Kayaku Co., Ltd.) 12.20 parts Polymerization inhibitor: p-methoxyphenol 0.0061 parts Fluorosurfactant: F-475, manufactured by DIC CORPORATION 0.83 parts Photopolymerization initiator: trihalomethyl triazine-based photopolymerization initiator (TAZ-107 manufactured by Midori Kagaku Co., Ltd.) 0.586 parts (Preparation of Undercoat Layer-Attached Silicon Substrate)

A 6-inch silicon wafer was heated in an oven at 200° C. for 30 minutes. Thereafter, the resist solution for undercoat layer was coated onto this silicon wafer such that a dry film thickness became 1.5 μm. Moreover, the resultant was further heated in an oven at 220° C. for an hour to form an undercoat layer, thereby obtaining an undercoat layer-attached silicon wafer substrate.

<Preparation of Color Filter (Colored Pattern)>

The colored composition prepared as above was coated onto the undercoat layer of the undercoat layer-attached silicon wafer prepared as above, thereby forming a colored layer (coating film). Thereafter, the wafer was subjected to heating treatment (pre-baking) for 120 seconds by using a hot plate of 100° C. such that a dry film thickness of the coating film became 1 μm.

Next, by using an i-line stepper exposure device FPA-3000i5+ (manufactured by CANON INC.), the wafer was exposed to light at a wave length of 365 nm through an island pattern mask having a 1.2 μm×1.2 μm pattern, by varying the exposure dose in a range from 50 mJ/cm$^2$ to 1,200 mJ/cm$^2$.

Subsequently, the silicon wafer substrate, which had been irradiated with light and had a coating film formed thereon, was loaded onto a horizontal spin table of a spin shower developing machine (DW-30, manufactured by Chemitronics Co., Ltd.), and subjected to paddle development for 60 seconds at 23° C. by using CD-2000 (manufactured by FUJIFILM Electronic Materials Co., Ltd.), thereby forming a colored pattern on the undercoat layer of the undercoat layer-attached silicon wafer.

The silicon wafer on which the colored pattern had been formed was fixed onto the horizontal spin table by a vacuum chuck method, and the silicon wafer was rotated at a rotation frequency of 50 rpm by using a rotation device. In this state, from the position above the rotation center, pure water was supplied onto the wafer from a spray nozzle in the form of shower so as to perform rinsing treatment, and then the wafer was spray-dried.

In the manner described above, a silicon wafer having a colored pattern in which a colored pattern (color filter) was disposed on the undercoat layer of the undercoat layer-attached silicon wafer was obtained.

Thereafter, by using a length measuring SEM "S-9260A" (manufactured by Hitachi High-Technologies Corporation), size of the colored pattern was measured.

By using a colored pattern exposed to light at an exposure dose which yielded a pattern size of 1.2 μm, linearity and defect of the pattern were evaluated.

<Performance Evaluation>

Residue

The portion (unexposed portion) outside the region in which the above colored pattern formed was observed with a scanning electron microscope (SEM) (10,000× magnification), and development residue, defects, and linearity of pattern were evaluated based on the following evaluation criteria.

~Evaluation Criteria for Development Residue~

AA: No residues were observed in a portion (unexposed portion) outside the region in which the colored pattern was formed.

A: An extremely small amount of residues was observed in a portion (unexposed portion) outside the region in which the colored pattern was formed, but it was unproblematic for practical use.

B: A small amount of residues was observed in a portion (unexposed portion) outside the region in which the colored pattern was formed, but it was unproblematic for practical use.

D: Residues were markedly observed in a portion (unexposed portion) outside the region in which the colored pattern was formed.

~Evaluation Criteria for Defects~

AA: No defects were observed in the edge of the colored pattern.

A: An extremely small extent of defects was observed in the edge of the colored pattern, but it was unproblematic for practical use.

B: A small extent of defects was observed in the edge of the colored pattern, but it was unproblematic for practical use.

D: Defects were markedly observed in the edge of the colored pattern.

~Evaluation Criteria for Linearity of Pattern~

AA: A pattern which had a line width of 1.2 μm and was excellent in linearity was formed.

A: An extremely small extent of backlash was observed in a pattern having a line width of 1.2 μm, but it was unproblematic for practical use.

B: A small extent of backlash was observed in a pattern having a line width of 1.2 μm, but it was unproblematic for practical use.

D: A pattern having a line width of 1.2 μm could be formed; however, the pattern had an undeveloped portion and exhibited poor linearity.

[Heat Resistance]

A glass substrate coated with the colored radiation-sensitive composition obtained as above was loaded onto a hot plate of 200° C. in a state in which the surface of the substrate came into contact with the hot plate, and the substrate was heated for an hour. Thereafter, change in absorbance at a maximum absorption wavelength before and after heating was measured using a spectrophotometer Cary 5 (manufactured by Varian), and color difference (value of ΔE*ab) before and after heating was measured using a colorimeter MCPD-1000 (manufactured by OTSUKA ELECTRONICS CO., LTD.). The heat resistance was evaluated using the measurement results as indices.

The value of ΔE*ab is a value calculated from the following color difference formula based on CIE1976 (L*, a*, b*) color space ("New Edition, Color Science Handbook" edited by THE COLOR SCIENCE ASSOCIATION OF JAPAN (1985), p. 266).

$$\Delta E^*ab=\{(\Delta L^*)^2+(\Delta a^*)^2+(\Delta b^*)^2\}^{1/2}$$

~Evaluation Criteria for Heat Resistance~

A: There was practically no difference in absorbance and color before and after heating.

B: There was difference in absorbance and color before and after heating, but it was unproblematic for practical use.

C: There was marked difference in absorbance and color before and after heating, and it was problematic for practical use.

The evaluation results are shown in Tables 4 to 6.

Examples 2 to 63 and Comparative Examples 1 and 2

Colored compositions were prepared in the same manner as in Example 1, except that in Example 1, the dye f used for preparing a colored composition was replaced with the dyes shown in the following Tables 4 to 6; the pigment dispersion was replaced with dispersions of pigments shown in the following Tables 4 to 6; the specific alkali-soluble resin J1 was replaced with the specific alkali-soluble resin or the comparative alkali-soluble resin shown in the following Tables 4 to 6; and the polymerization initiator was changed. By using the obtained colored compositions, silicon wafers having a colored pattern were prepared in the same manner as in Example 1 and evaluated.

The evaluation results are shown in the following Tables 4 to 6.

The dispersions of pigments shown in the following Tables 4 to 6 was prepared in the same manner as in "Preparation of Dispersion of C. I. Pigment Blue 15:6" in Example 1, except that the following pigments were used instead of C. I. Pigment Blue 15:6 used as a blue pigment in "Preparation of Dispersion of C. I. Pigment Blue 15:6" in Example 1.

These dispersions are abbreviated as follows in Tables 4 to 6, just like "PR254" described in the parenthesis shown below.

Red pigment A (dispersion thereof is abbreviated to "PR254" in the table.)

C. I. Pigment Red 254 (PR254) (average primary particle size of 26 nm)

Red pigment B (dispersion thereof is abbreviated to "PR177" in the table.)

C. I. Pigment Red 177 (PR177) (average primary particle size of 28 nm)

Green pigment A

C. I. Pigment Green 36 (PG36) (average primary particle size of 25 nm)

Green pigment B

C. I. Pigment Green 58 (PG58) (average primary particle size of 30 nm)

Yellow pigment A

C. I. Pigment Yellow 139 (PY139) (average primary particle size of 27 nm)

Yellow pigment B

C. I. Pigment Yellow 150 (PY150) (average primary particle size of 26 nm)

Moreover, photopolymerization initiators (I-1) to (I-8) and comparative alkali-soluble resins (JC-1) and (JC-2) described in Tables 4 to 6 are as follows.

[Chem. 125]

(I-1)

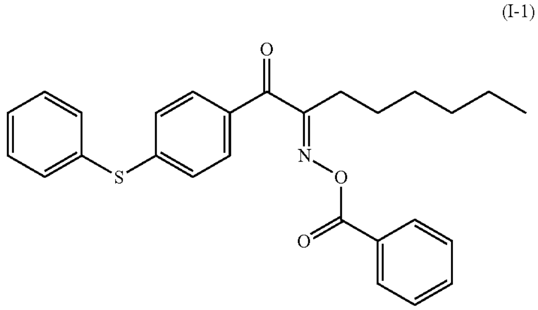

IRUGACURE OXEO1
(Manufactured by BASF)

-continued (I-2)

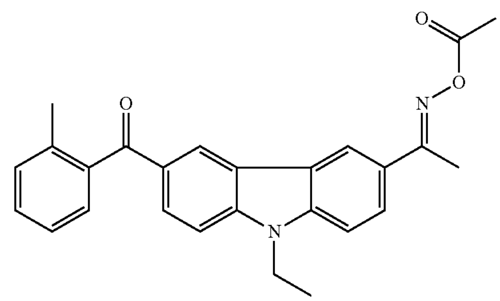

IRUGACURE OXE02
(Manufactured by BASF)

(I-3)

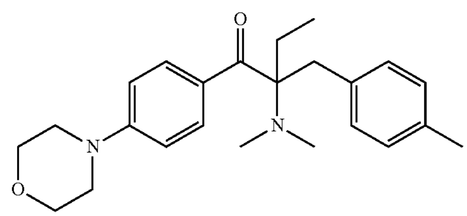

IRUGACURE OXE379
(Manufactured by BASF)

(I-4)

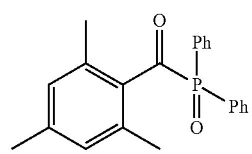

DAROCUR TPO
(Manufactured by BASF)

(I-5)

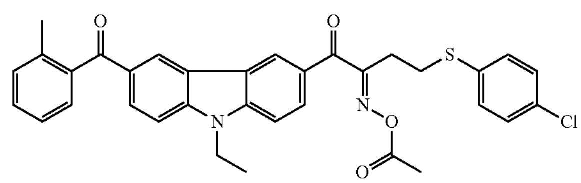

(I-6a)

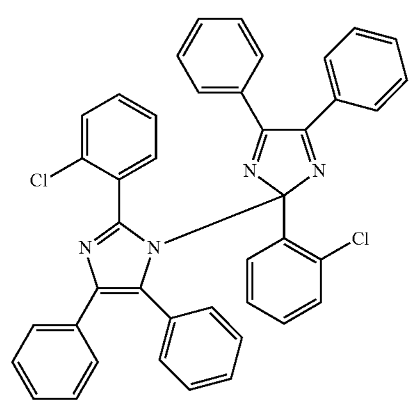

-continued (I-6b)

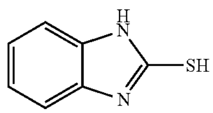

(I-6): (1-6a)/(1-6b) = 20/10 (Mass ratio)

(I-7)

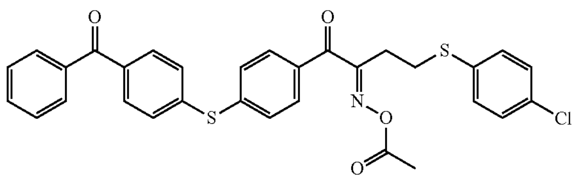

(I-8)

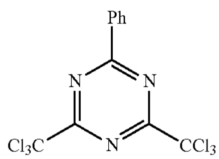

-continued

[Chem. 126]

Comparative resin JC-1

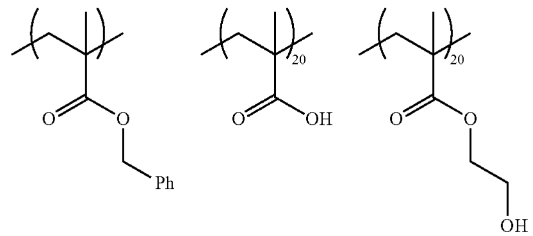

Comparative resin JC-2

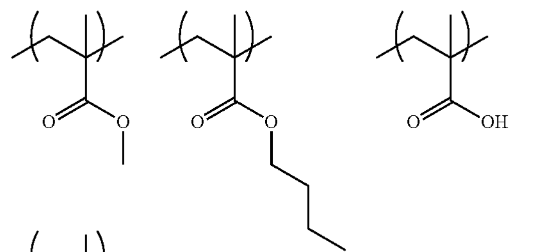

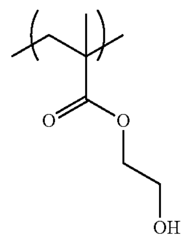

TABLE 4

| | Colored radiation-sensitive composition | | | | Evaluation result | | | |
|---|---|---|---|---|---|---|---|---|
| | Dye multimer | Pigment | Alkali-soluble resin | Photopolymerization initiator | Residue | Defect | Linearity of pattern | Heat resistance |
| Example 1 | Dye f | PB 15:6 | J1 | I-1 | A | A | A | A |
| Example 2 | Dye f | PB 15:6 | J2 | I-1 | A | B | B | A |
| Example 3 | Dye f | PB 15:6 | J3 | I-1 | A | A | A | A |
| Example 4 | Dye f | PB 15:6 | J4 | I-1 | A | A | A | A |
| Example 5 | Dye f | PB 15:6 | J5 | I-1 | AA | AA | AA | A |
| Example 6 | Dye f | PB 15:6 | J6 | I-1 | AA | AA | AA | A |
| Example 7 | Dye f | PB 15:6 | J7 | I-1 | A | A | A | A |
| Example 8 | Dye f | PB 15:6 | J8 | I-1 | A | A | A | A |
| Example 9 | Dye f | PB 15:6 | J9 | I-1 | B | B | B | B |
| Example 10 | Dye f | PB 15:6 | J10 | I-1 | AA | AA | AA | A |
| Example 11 | Dye f | PB 15:6 | J11 | I-1 | B | B | B | A |
| Example 12 | Dye f | PB 15:6 | J23 | I-1 | A | B | B | A |
| Example 13 | Dye f | PB 15:6 | J24 | I-1 | A | B | B | A |
| Example 14 | Dye f | PB 15:6 | J25 | I-1 | A | B | B | A |
| Example 15 | Dye f | PB 15:6 | J26 | I-1 | A | B | B | A |
| Example 16 | Dye f | PB 15:6 | J27 | I-1 | A | A | A | A |
| Example 17 | Dye f | PB 15:6 | J28 | I-1 | A | A | A | A |
| Example 18 | Dye f | PB 15:6 | J29 | I-1 | A | B | B | A |
| Example 19 | Dye f | PB 15:6 | J30 | I-1 | B | A | A | B |
| Example 20 | Dye f | PB 15:6 | J31 | I-1 | AA | A | A | A |
| Example 21 | Dye f | PB 15:6 | J32 | I-1 | A | B | B | A |

TABLE 5

| | Colored radiation-sensitive composition | | | | Evaluation result | | | |
|---|---|---|---|---|---|---|---|---|
| | Dye multimer | Pigment | Alkali-soluble resin | Photopolymerization initiator | Residue | Defect | Linearity of pattern | Heat resistance |
| Example 22 | Dye s | PG 58 | J4 | I-1 | AA | AA | AA | A |
| Example 23 | Dye s | PG 58 | J5 | I-1 | A | A | A | A |
| Example 24 | Dye s | PG 58 | J12 | I-1 | AA | AA | AA | A |
| Example 25 | Dye s | PG 58 | J13 | I-1 | A | B | B | A |
| Example 26 | Dye s | PG 58 | J14 | I-1 | A | B | B | A |
| Example 27 | Dye s | PG 58 | J15 | I-1 | A | B | B | A |
| Example 28 | Dye s | PG 58 | J16 | I-1 | B | B | B | B |
| Example 29 | Dye s | PG 58 | J17 | I-1 | A | B | B | A |
| Example 30 | Dye s | PG 58 | J18 | I-1 | A | A | A | A |
| Example 31 | Dye s | PG 58 | J19 | I-1 | A | B | B | A |
| Example 32 | Dye s | PG 58 | J20 | I-1 | B | A | A | B |
| Example 33 | Dye s | PG 58 | J21 | I-1 | AA | A | A | A |
| Example 34 | Dye s | PG 58 | J22 | I-1 | A | B | B | A |
| Example 35 | Dye c | PB 15:6 | J4 | I-1 | AA | AA | AA | A |
| Example 36 | Dye c | PB 15:6 | J5 | I-1 | A | A | A | A |
| Example 37 | Dye e | PB 15:6 | J4 | I-1 | AA | AA | AA | A |
| Example 38 | Dye e | PB 15:6 | J5 | I-1 | A | A | A | A |
| Example 39 | Dye i | PY 139 | J4 | I-1 | A | A | A | A |
| Example 40 | Dye i | PY 139 | J5 | I-1 | AA | AA | AA | A |
| Example 41 | Dye j | PY 139 | J4 | I-1 | A | A | A | A |
| Example 42 | Dye j | PY 139 | J5 | I-1 | AA | AA | AA | A |

TABLE 6

| | Colored radiation-sensitive composition | | | | Evaluation result | | | |
|---|---|---|---|---|---|---|---|---|
| | Dye multimer | Pigment | Alkali-soluble resin | Photopolymerization initiator | Residue | Defect | Linearity of pattern | Heat resistance |
| Example 43 | Dye k | PB 15:6 | J4 | I-1 | A | A | A | A |
| Example 44 | Dye k | PB 15:6 | J5 | I-1 | AA | AA | AA | A |
| Example 45 | Dye l | PB 15:6 | J4 | I-1 | AA | AA | AA | A |
| Example 46 | Dye m | PB 15:6 | J4 | I-1 | AA | AA | AA | A |
| Example 47 | Dye n | PB 15:6 | J4 | I-1 | AA | AA | AA | A |
| Example 48 | Dye o | PG 36 | J4 | I-1 | AA | AA | AA | A |
| Example 49 | Dye p | PB 15:6 | J4 | I-1 | AA | AA | AA | A |
| Example 50 | Dye q | PR 254 | J4 | I-1 | A | A | A | A |
| Example 51 | Dye q | PR 254 | J5 | I-1 | AA | AA | AA | A |
| Example 52 | Dye r | PR 177 | J4 | I-1 | AA | AA | AA | A |
| Example 53 | Dye s | PG 58 | J4 | I-1 | AA | AA | AA | A |
| Example 54 | Dye t | PG 36 | J4 | I-1 | AA | AA | AA | A |
| Example 55 | Dye u | PG 36 | J4 | I-1 | AA | AA | AA | A |
| Example 56 | Dye u | PG 36 | J5 | I-1 | A | A | A | A |
| Example 57 | Dye q | PR 254 | J5 | I-2 | AA | AA | AA | A |
| Example 58 | Dye q | PR 254 | J5 | I-3 | A | A | A | A |
| Example 59 | Dye q | PR 254 | J5 | I-4 | A | A | A | A |
| Example 60 | Dye q | PR 254 | J5 | I-5 | AA | AA | AA | A |
| Example 61 | Dye q | PR 254 | J5 | I-6 | A | A | A | A |
| Example 62 | Dye q | PR 254 | J5 | I-7 | AA | AA | AA | A |
| Example 63 | Dye q | PR 254 | J5 | I-8 | A | A | A | A |
| Comparative Example 1 | Dye f | PB 15:6 | JC-1 (for comparison) | I-1 | D | D | D | B |
| Comparative Example 2 | Dye f | PB 15:6 | JC-2 (for comparison) | I-1 | D | D | D | C |

From Tables 4 to 6, it is clearly understood that although the color filters obtained using the colored radiation-sensitive composition of the present invention contain the same dye multimer, heat resistance of the color filters is better than that of Comparative Examples 1 and 2 using alkali-soluble resins other than the specific alkali-soluble resin, a pattern excellent in linearity and not have defects is formed in the color filters, and residues are inhibited from being generated in the unexposed portion.

Example 64

—Preparation of Color Filter of Full Color for Solid-State Image Sensor—

By using the colored radiation-sensitive composition prepared in Example 23, green pixels were formed using an island bayer pattern of 1.0 μm×1.0 μm. Thereafter, by using the colored radiation-sensitive composition for red prepared in Example 50, red pixels were formed using an island pattern of 1.0 μm×1.0 μm. Moreover, in the remaining grids, blue pixels in the form of an island pattern of 1.0 μm×1.0 μm were formed using the colored radiation-sensitive composition for blue prepared in Example 5. In this manner, a color filter for a solid-state image sensor for a light shielding portion was prepared.

—Evaluation—

The obtained color filter of full color for a solid-state image sensor was installed in a solid-state image sensor, and as a result, it was confirmed that the solid-state image sensor has high resolution and exhibits excellent color characteristics.

—Preparation of Color Filter for Liquid Crystal Display Device—

By using the colored radiation-sensitive composition for red prepared in Example 51, a red (R)-colored pattern of 80 μm×80 μm was formed on a black matrix. Likewise, by using the colored radiation-sensitive composition for green prepared in Example 22 and using the colored radiation-sensitive composition for blue prepared in Example 5, a green (G)-colored pattern and a blue (B)-colored pattern were sequentially formed to prepare a color filter for a liquid crystal display device.

—Evaluation—

An ITO transparent electrode, an alignment layer, and the like were provided to the color filter of full color, thereby preparing a liquid crystal display device. The colored radiation-sensitive composition of the present invention is excellent in the coating surface uniformity, and the formed color filter has an excellent pattern shape. Accordingly, it was confirmed that the liquid crystal display device having the color filter does not exhibit display unevenness and showing excellent image quality.

What is claimed is:

1. A colored radiation-sensitive composition comprising:

(A) a dye multimer;

(B) an alkali-soluble resin containing a repeating unit represented by the following Formula (b2);

(C) a polymerizable compound; and (D) a photopolymerization initiator, (b2)

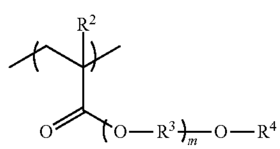

in the Formula (b2), $R^2$ represents a hydrogen atom or a methyl group; $R^3$ represents an alkylene group having 2 or 3 carbon atoms; $R^4$ represents a hydrogen atom, an aryl group, or an alkyl group; m represents an integer from 2 to 15; and plural $R^3$s may be the same as or different from each other, wherein the (A) dye multimer has a partial structure derived from a dye selected from a dipyrromethene dye, an azo dye, a xanthene dye, a cyanine dye, a squarylium dye, a quinophthalone dye, a phthalocyanine dye, and a subphthalocyanine dye.

2. The colored radiation-sensitive composition according to claim 1, wherein the (B) alkali-soluble resin is a polymer containing a repeating unit represented by the following Formula (b2'), (b2')

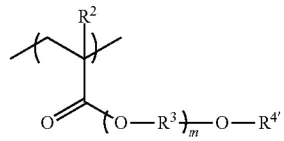

in the Formula (b2'), $R^2$ represents a hydrogen atom or a methyl group; $R^3$ represents an alkylene group having 2 or 3 carbon atoms; $R^{4'}$ represents an aryl group; m represents an integer from 2 to 15; and plural $R^3$s may be the same as or different from each other.

3. The colored radiation-sensitive composition according to claim 2, wherein m in the Formula (b2') represents an integer from 2 to 5.

4. The colored radiation-sensitive composition according to claim 1, wherein m in the Formula (b2) represents an integer from 2 to 5.

5. The colored radiation-sensitive composition according to claim 1, wherein the (B) alkali-soluble resin is a copolymer containing at least one kind of repeating unit represented by the Formula (b2).

6. The colored radiation-sensitive composition according to claim 1, wherein the acid value of the (B) alkali-soluble resin is 50 mg KOH/g to 200 mg KOH/g.

7. The colored radiation-sensitive composition according to claim 1, further comprising (E) a pigment.

8. The colored radiation-sensitive composition according to claim 7, wherein the (E) pigment is at least one kind of pigment selected from an anthraquinone pigment, a diketopyrrolopyrrole pigment, a phthalocyanine pigment, a quinophthalone pigment, an isoindoline pigment, an azomethine pigment, and a dioxazine pigment.

9. The colored radiation-sensitive composition according to claim 1, wherein the (D) photopolymerization initiator is an oxime compound.

10. The colored radiation-sensitive composition according to claim 1, that is used for forming a colored layer of a color filter.

11. A colored cured film obtained by curing the colored radiation-sensitive composition according to claim 1.

12. A color filter comprising the colored cured film according to claim 11.

13. A solid-state image sensor comprising:

the color filter according to claim 12.

14. An image display device comprising:

the color filter according to claim 12.

15. A colored pattern forming method comprising:

forming a colored radiation-sensitive composition layer by applying the colored radiation-sensitive composition according to claim 1 onto a support;

exposing the colored radiation-sensitive composition layer in the form of a pattern; and forming a colored pattern by developing and removing an unexposed portion.

16. A color filter production method comprising:

forming a colored radiation-sensitive composition layer by applying the colored radiation-sensitive composition according to claim 1 onto a support;

exposing the colored radiation-sensitive composition layer in the form of a pattern; and forming a colored pattern by developing and removing an unexposed portion.

17. The colored radiation-sensitive composition according to claim 1, wherein the (A) dye multimer contains at least one of the structural units represented by the following Formulae (A) and Formula (C);

Formula (A)

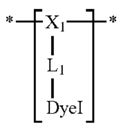

in the Formula (A), $X_1$ represents a linking group formed by polymerization; $L_1$ represents a single bond or a divalent linking group; and DyeI represents a dye structure, Formula (C)

$$*\!-\!\!\left[\text{DyeIII}\!-\!\!\left(L_3\right)_m\right]\!\!-\!*$$

in the Formula (C), $L_3$ represents a single bond or a divalent linking group; DyeIII represents a partial structure of a dye; and m represents 0 or 1.

18. The colored radiation-sensitive composition according to claim 1, wherein the (A) dye multimer has an ethylenically unsaturated bond after polymerization.

19. The colored radiation-sensitive composition according to claim 18, wherein the (A) dye multimer has at least one of the structural units represented by the following Formulae (G-1) to (G-15):

(G-1)

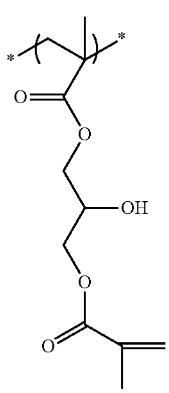

-continued (G-2)

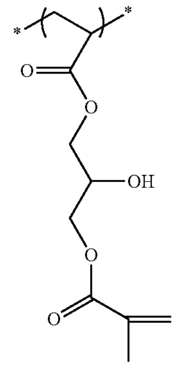

(G-3)

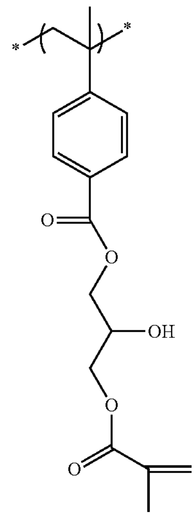

(G-4)

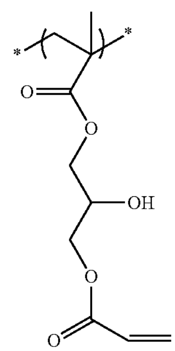

(G-5

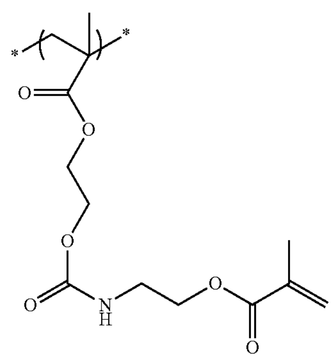

-continued (G-6)

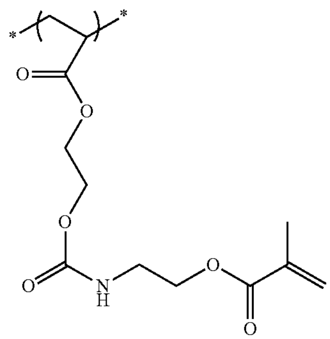

(G-7)

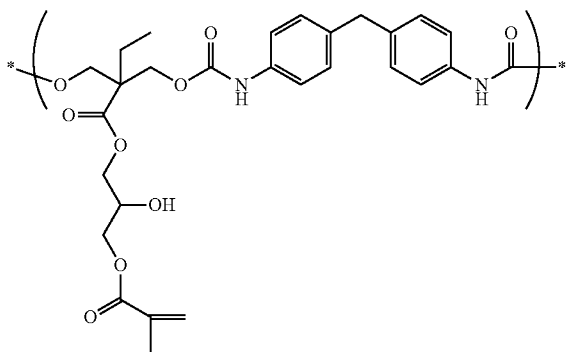

(G-8)

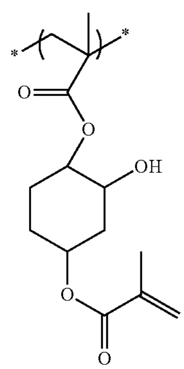

(G-9)

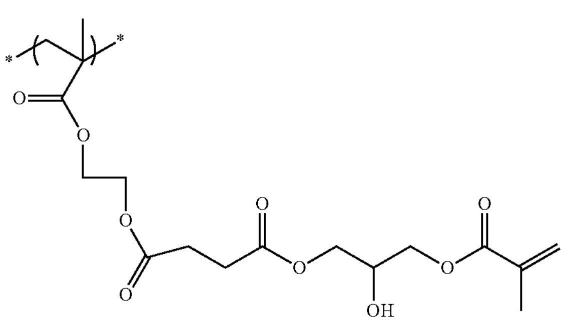

(G-10)

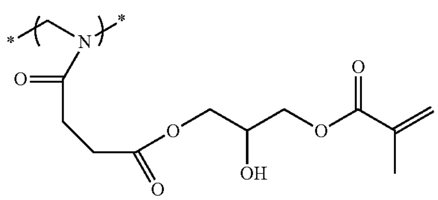

-continued (G-11)

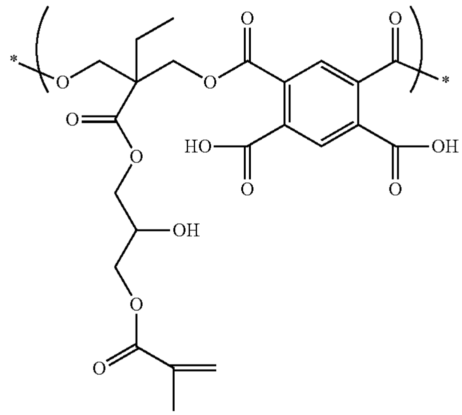

(G-12)

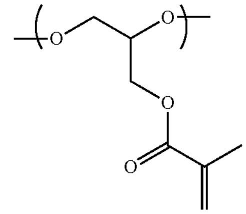

(G-13)

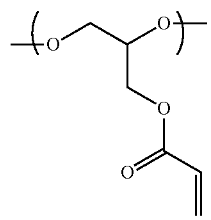

(G-14)

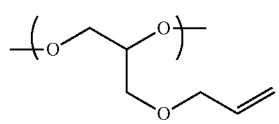

(G-15)

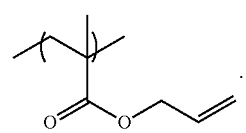

20. The colored radiation-sensitive composition according to claim 1, wherein $R^4$ in Formula (b2) represents a group of the following structure:

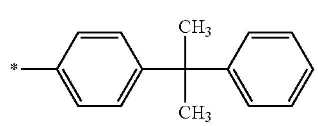

21. A colored radiation-sensitive composition comprising:

(A) a dye multimer;

(B) an alkali-soluble resin represented by the following Formula (b2);

(C) a polymerizable compound; and (D) a photopolymerization initiator, (b2)

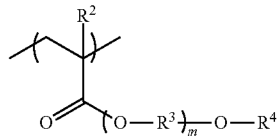

in the Formula (b2), $R^2$ represents a hydrogen atom or a methyl group; $R^3$ represents an alkylene group having 2 or 3 carbon atoms; $R^4$ represents group of the following structure:

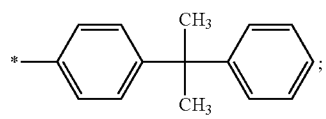

m represents an integer from 1 to 15; and when m is 2 to 15, plural $R^3$s may be the same as or different from each other, wherein the (A) dye multimer has a partial structure derived from a dye selected from a dipyrromethene dye, an azo dye, a xanthene dye, a cyanine dye, a squarylium dye, a quinophthalone dye, a phthalocyanine dye, and a subphthalocyanine dye.

22. The colored radiation-sensitive composition according to claim 21, wherein m in the Formula (b2) represents an integer from 1 to 5.

23. The colored radiation-sensitive composition according to claim 21, wherein the (B) alkali-soluble resin is a copolymer containing at least one kind of repeating unit represented by the Formula (b2).

24. The colored radiation-sensitive composition according to claim 21, wherein the acid value of the (B) alkali-soluble resin is 50 mg KOH/g to 200 mg KOH/g.

25. The colored radiation-sensitive composition according to claim 21, further comprising (E) a pigment.

26. The colored radiation-sensitive composition according to claim 25, wherein the (E) pigment is at least one kind of pigment selected from an anthraquinone pigment, a diketopyrrolopyrrole pigment, a phthalocyanine pigment, a quinophthalone pigment, an isoindoline pigment, an azomethine pigment, and a dioxazine pigment.

27. The colored radiation-sensitive composition according to claim 21, wherein the (D) photopolymerization initiator is an oxime compound.

28. The colored radiation-sensitive composition according to claim 21, which is used for forming a colored layer of a color filter.

29. A colored cured film obtained by curing the colored radiation-sensitive composition according to claim 21.

30. A color filter comprising the colored cured film according to claim 29.

31. A solid-state image sensor comprising:

the color filter according to claim 30.

32. An image display device comprising:

the color filter according to claim 30.

33. A colored pattern forming method comprising:

forming a colored radiation-sensitive composition layer by applying the colored radiation-sensitive composition according to claim 21 onto a support;

exposing the colored radiation-sensitive composition layer in the form of a pattern; and forming a colored pattern by developing and removing an unexposed portion.

34. A color filter production method comprising:

forming a colored radiation-sensitive composition layer by applying the colored radiation-sensitive composition according to claim 21 onto a support;

exposing the colored radiation-sensitive composition layer in the form of a pattern; and forming a colored pattern by developing and removing an unexposed portion.

35. The colored radiation-sensitive composition according to claim 21, wherein the (A) dye multimer contains at least one of the structural units represented by the following Formulae (A) and Formula (C):

Formula (A)

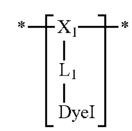

in the Formula (A), $X_1$ represents a linking group formed by polymerization; $L_1$ represents a single bond or a divalent linking group; and DyeI represents a dye structure, Formula (C)

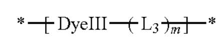

in the Formula (C), $L_3$ represents a single bond or a divalent linking group; DyeIII represents a partial structure of a dye; and m represents 0 or 1.

36. The colored radiation-sensitive composition according to claim 21, wherein the (A) dye multimer has an ethylenically unsaturated bond after polymerization.

37. The colored radiation-sensitive composition according to claim 36, wherein the (A) dye multimer has at least one of the structural units represented by the following Formulae (G-1) to (G-15):

(G-1)

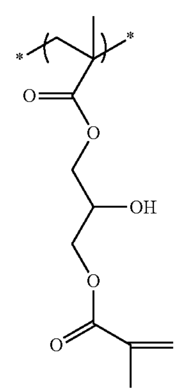

-continued
(G-2)
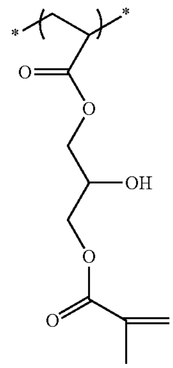
(G-3)
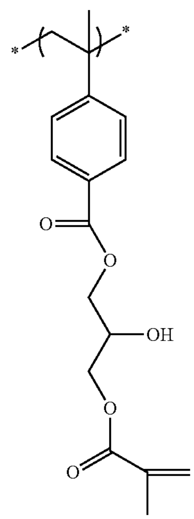
(G-4)
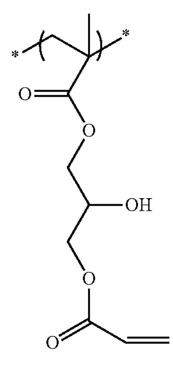
(G-5
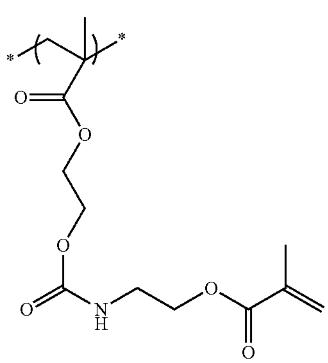
-continued
(G-6)
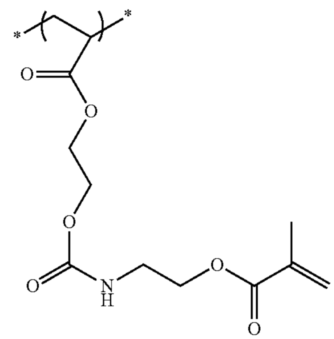
(G-7)
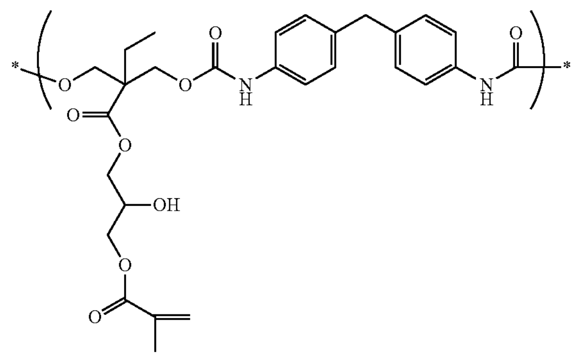
(G-8)
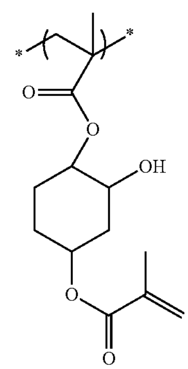
(G-9)
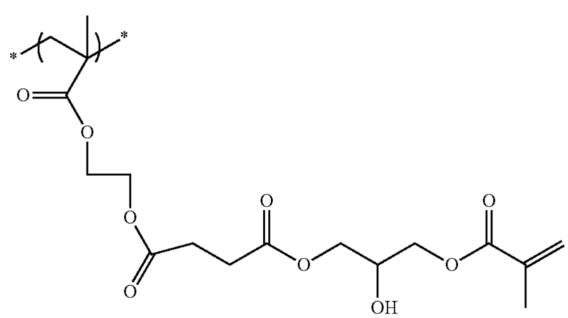
(G-10)
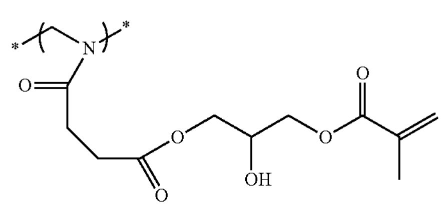

-continued
(G-11)
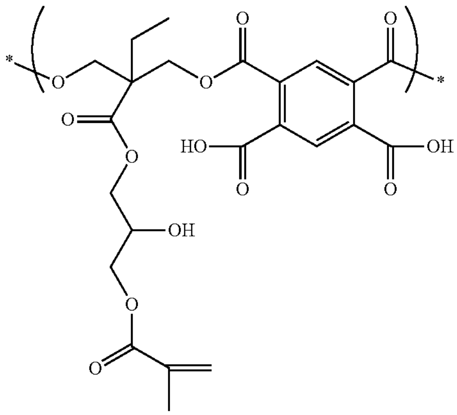
(G-12)
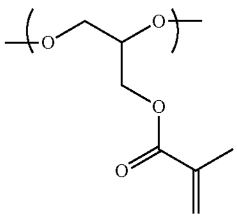
-continued
(G-13)
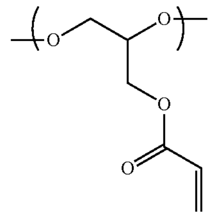
(G-14)
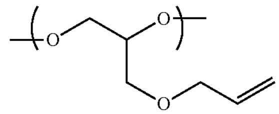
(G-15)
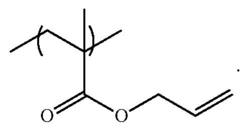
* * * * *